United States Patent
Konishi et al.

(10) Patent No.: US 12,328,887 B2
(45) Date of Patent: Jun. 10, 2025

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Kazuya Konishi, Tokyo (JP); Shinya Soneda, Tokyo (JP); Koichi Nishi, Tokyo (JP); Tetsuya Nitta, Tokyo (JP); Akihiko Furukawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 558 days.

(21) Appl. No.: 17/543,102

(22) Filed: Dec. 6, 2021

(65) Prior Publication Data

US 2022/0310829 A1    Sep. 29, 2022

(30) Foreign Application Priority Data

Mar. 26, 2021 (JP) ................. 2021-053169

(51) Int. Cl.
*H10D 12/00* (2025.01)
*H10D 12/01* (2025.01)
(Continued)

(52) U.S. Cl.
CPC ......... *H10D 12/481* (2025.01); *H10D 12/038* (2025.01); *H10D 62/107* (2025.01); *H10D 84/811* (2025.01)

(58) Field of Classification Search
CPC ............ H01L 29/7397; H01L 29/0727; H01L 29/0623; H01L 29/66348; H10D 12/481; H10D 12/038; H10D 62/107; H10D 84/811
USPC ........................................................ 257/288
See application file for complete search history.

(56) References Cited

U.S. PATENT DOCUMENTS

| 9,048,218 B2 * | 6/2015 | Lee ...................... H01L 29/165 |
| 2007/0138546 A1 * | 6/2007 | Kawamura ......... H01L 29/0634 |
| | | 257/E27.06 |

(Continued)

FOREIGN PATENT DOCUMENTS

| CN | 111081770 A | 4/2020 |
| EP | 2200089 A1 | 6/2010 |

(Continued)

OTHER PUBLICATIONS

An Office Action; "Notice of Reasons for Refusal," mailed by the Japanese Patent Office on Feb. 27, 2024, which corresponds to Japanese Patent Application No. 2021-053169 and is related to U.S. Appl. No. 17/543,102; with English language translation.

(Continued)

*Primary Examiner* — Igwe U Anya
(74) *Attorney, Agent, or Firm* — Studebaker Brackett PLLC

(57) ABSTRACT

There is provided a technique capable of reducing turn-on power losses. A semiconductor device includes: a semiconductor substrate including a drift layer; and a base layer, a contact layer, and a source layer which are provided in the semiconductor substrate. A gate portion is provided in a first trench, with a first gate insulation film therebetween. The first trench is in contact with the contact layer, the source layer, the base layer, and the drift layer. The gate portion is provided with a recessed portion with a bottom farther away from the base layer than a side thereof. A first insulation portion is provided in the recessed portion of the gate portion in the first trench.

48 Claims, 135 Drawing Sheets

(51) Int. Cl.
    *H10D 62/10*     (2025.01)
    *H10D 84/80*     (2025.01)

(56)     References Cited

U.S. PATENT DOCUMENTS

| | | |
|---|---|---|
| 2010/0052044 A1 | 3/2010 | Hirler |
| 2015/0102403 A1 | 4/2015 | Kuruc et al. |
| 2020/0066887 A1* | 2/2020 | Imai .................. H01L 29/66348 |
| 2020/0126973 A1 | 4/2020 | Kamibaba |
| 2020/0287044 A1* | 9/2020 | Hikasa .............. H01L 29/66348 |
| 2022/0140141 A1* | 5/2022 | Nasu .................. H01L 29/7834 |
| | | 257/77 |
| 2023/0290854 A1* | 9/2023 | Tomita .................. H01L 29/401 |

FOREIGN PATENT DOCUMENTS

| | | |
|---|---|---|
| JP | 2003-303967 A | 10/2003 |
| JP | 2005-150246 A | 6/2005 |
| JP | 2010-062557 A | 3/2010 |
| JP | 2015-095466 A | 5/2015 |
| WO | 2019/103135 A1 | 5/2019 |

OTHER PUBLICATIONS

An Office Action mailed by The State Intellectual Property Office of People's Republic of China on Apr. 22, 2025, which corresponds to Chinese Patent Application No. 202210276732.8 and is related to U.S. Appl. No. 17/543,102; with English language translation.

\* cited by examiner

F I G. 1 3
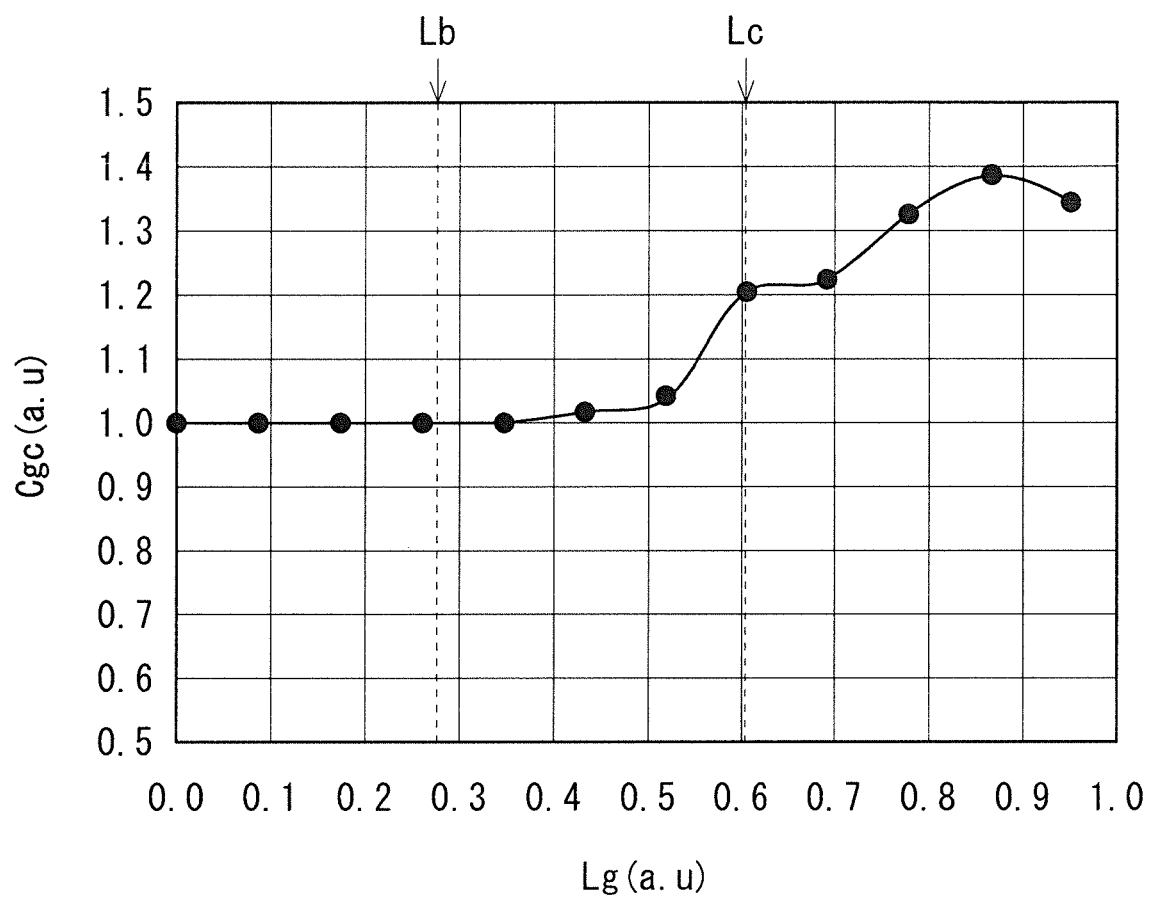

F I G. 2 8
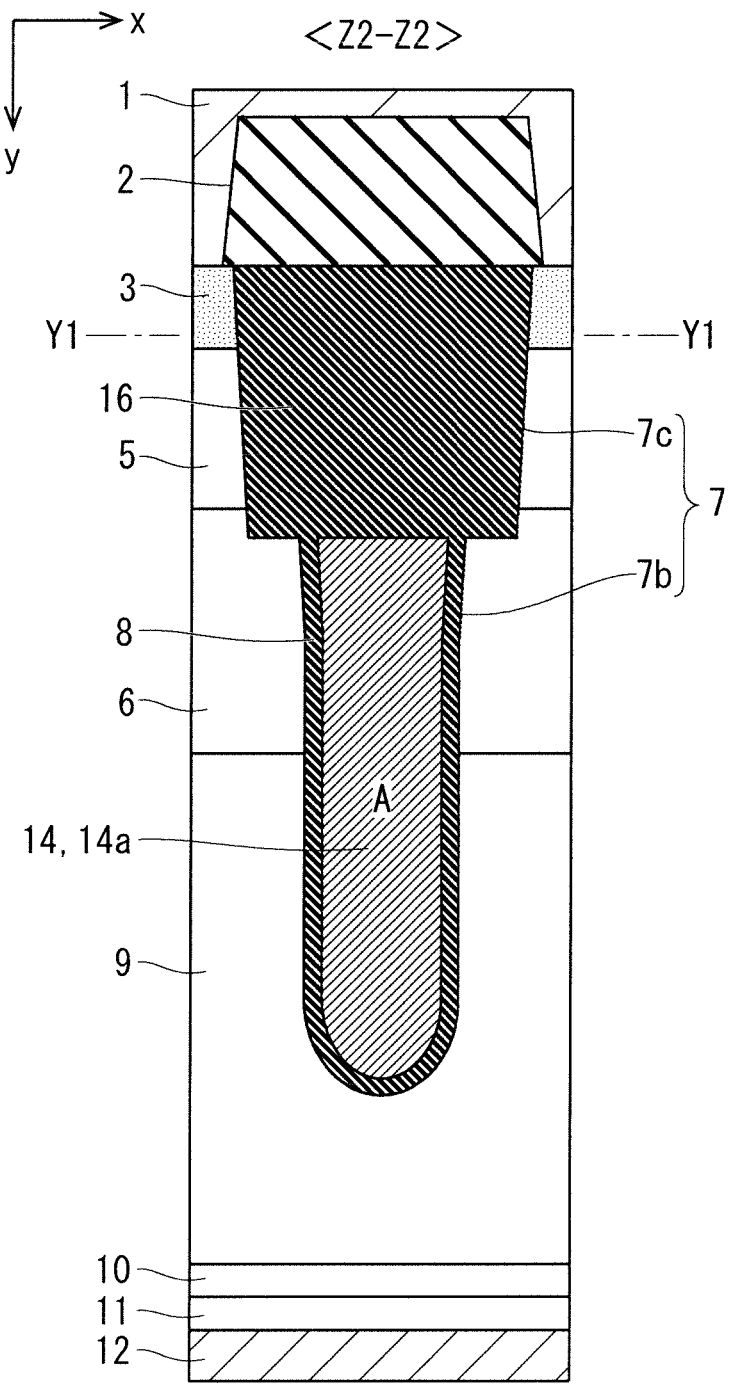

F I G. 3 3
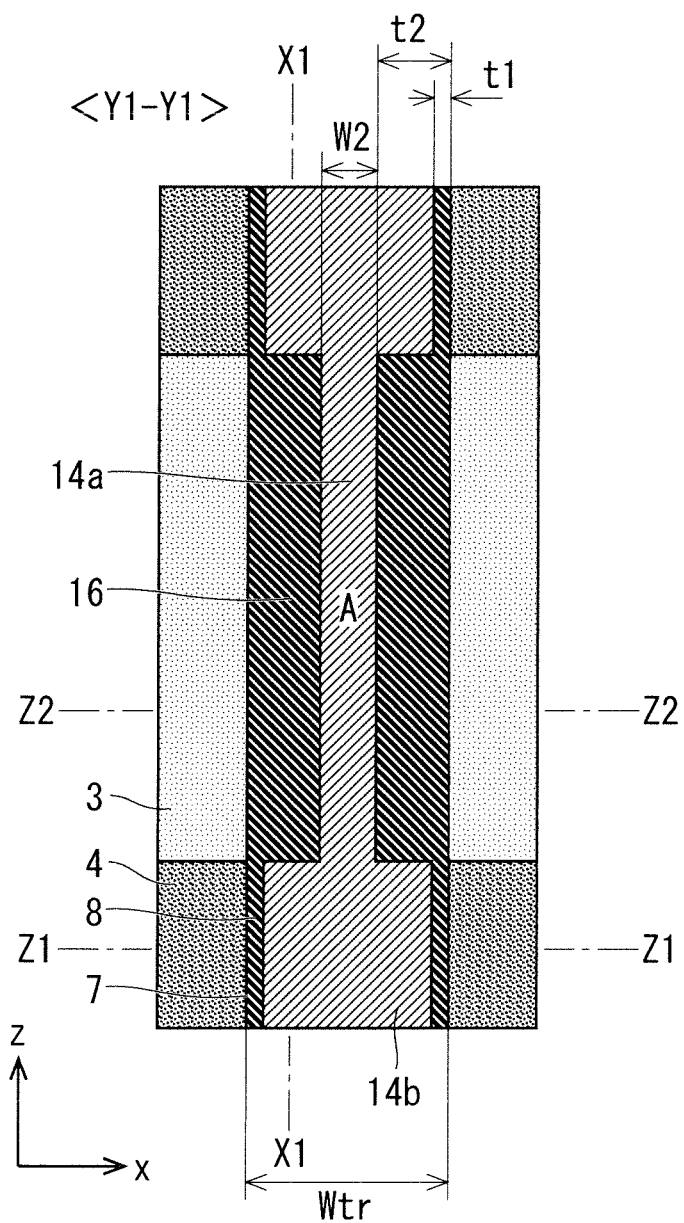

F I G. 3 9
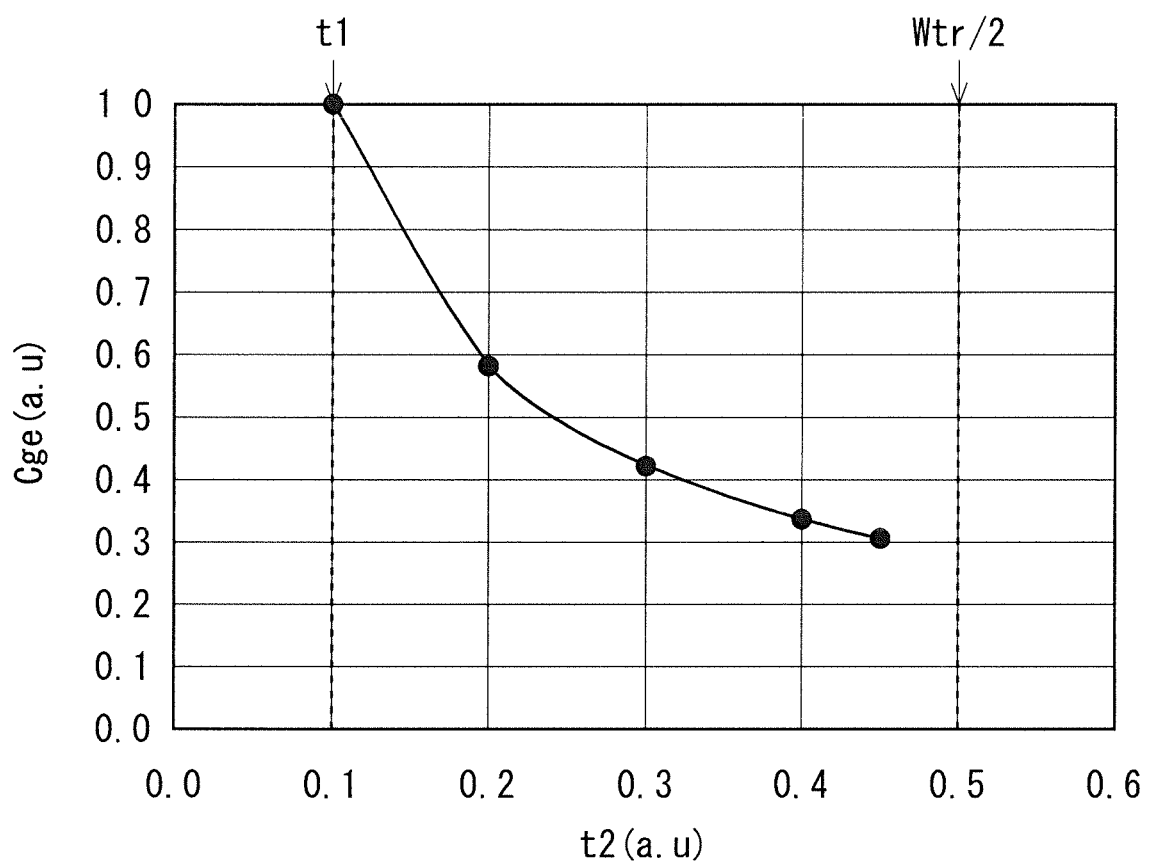

F I G. 6 0
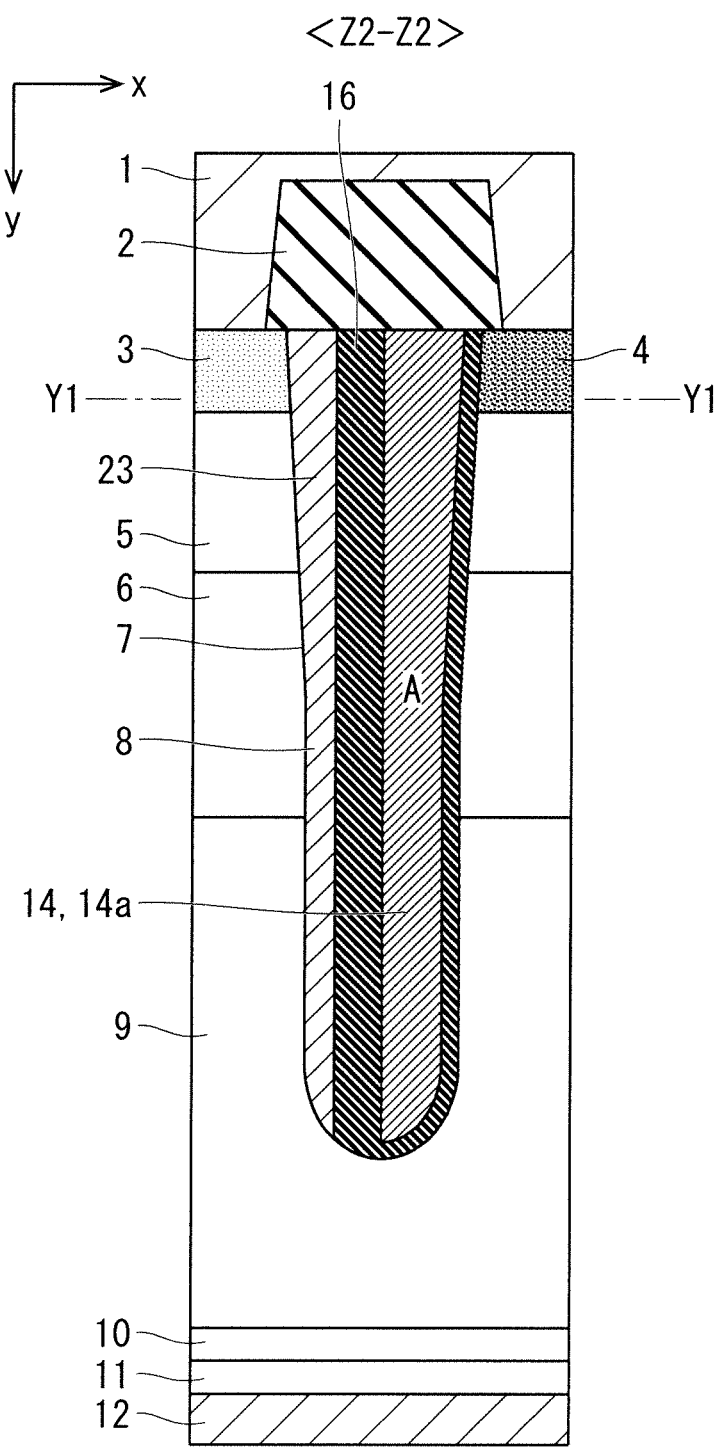

F I G. 6 8
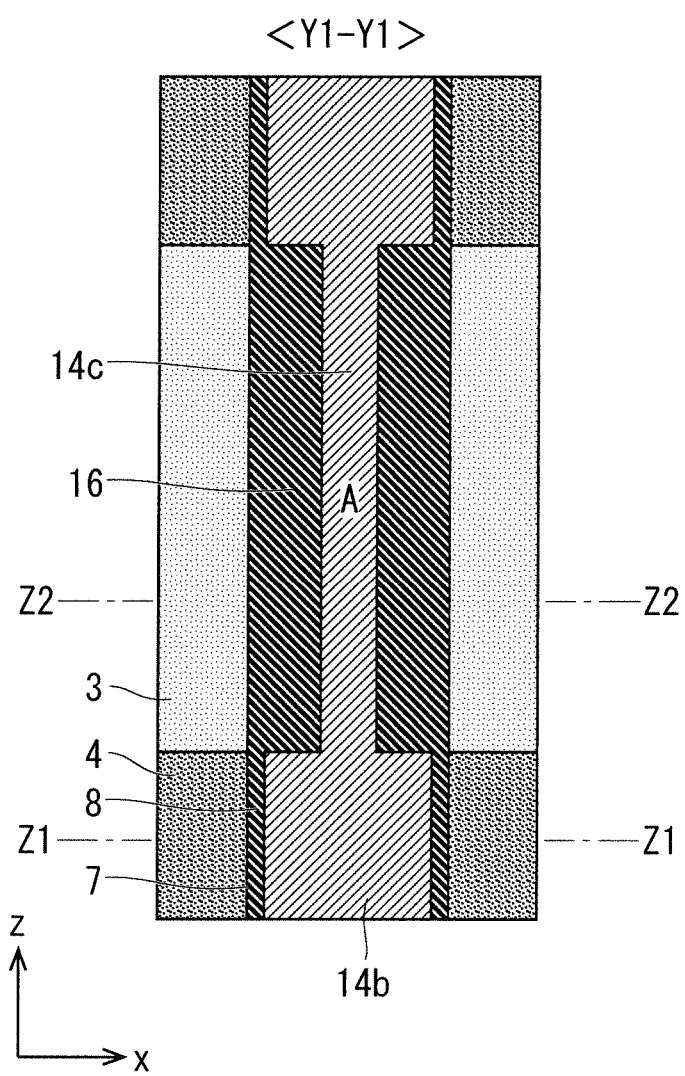

F I G. 85
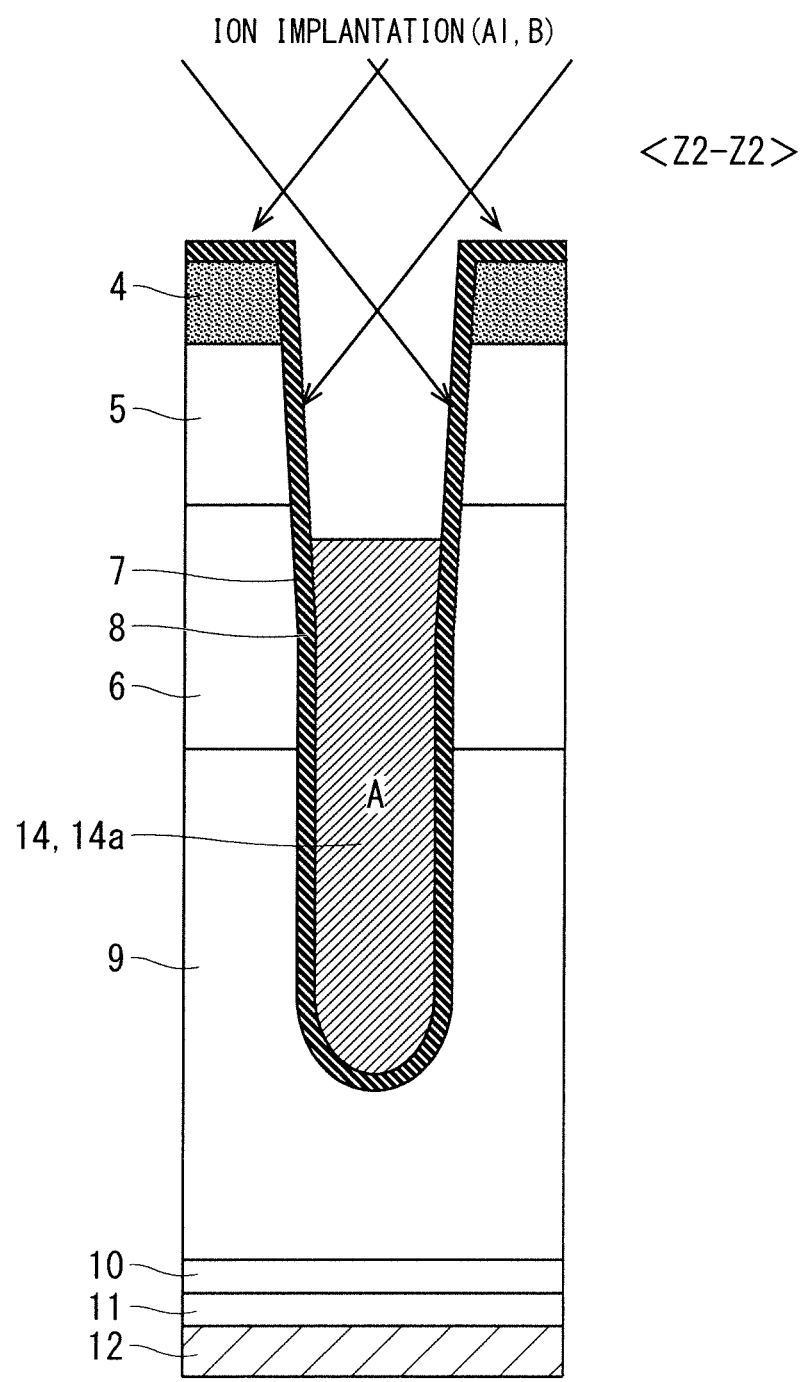

F I G. 1 0 1
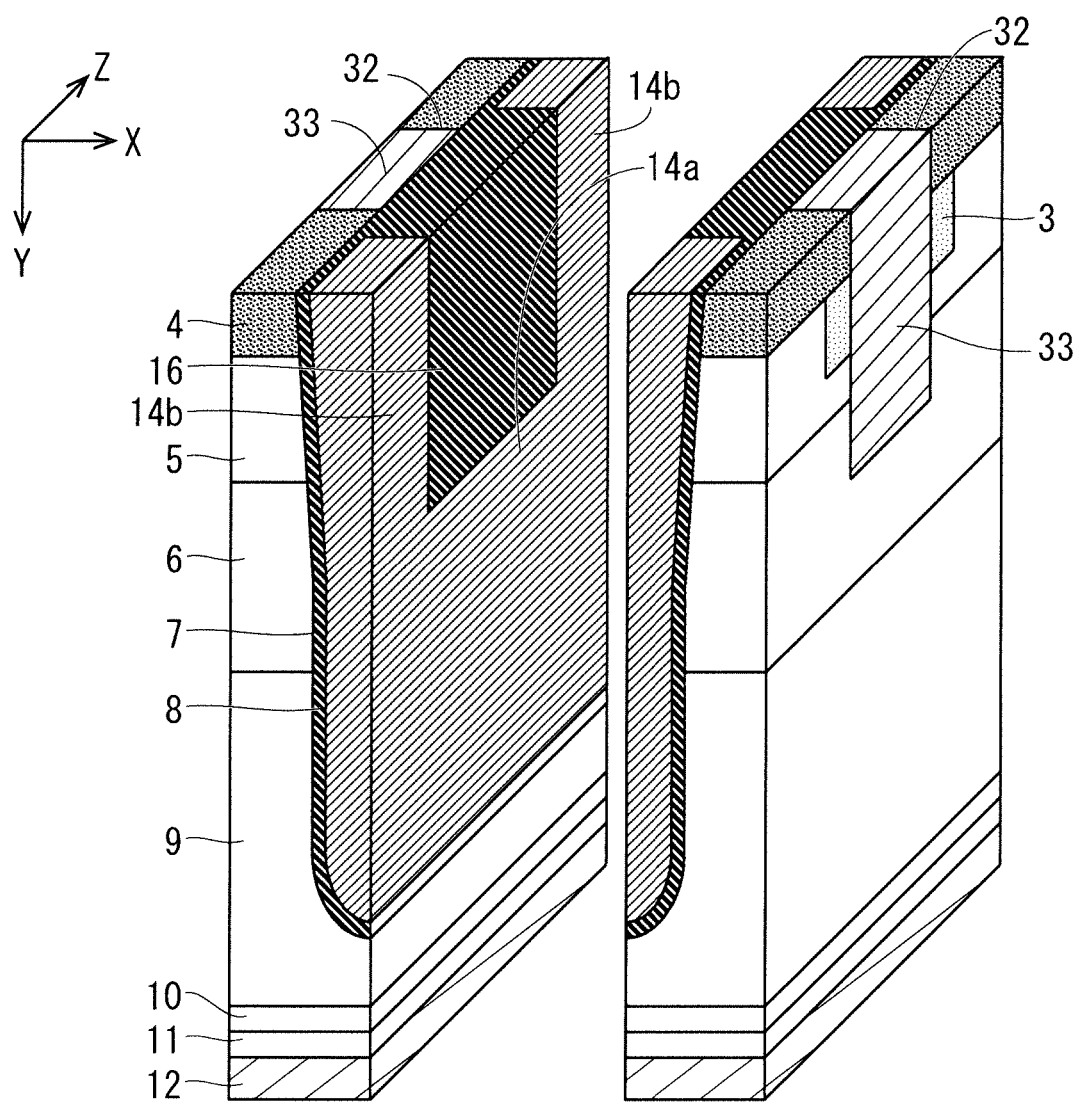

F I G. 1 2 8
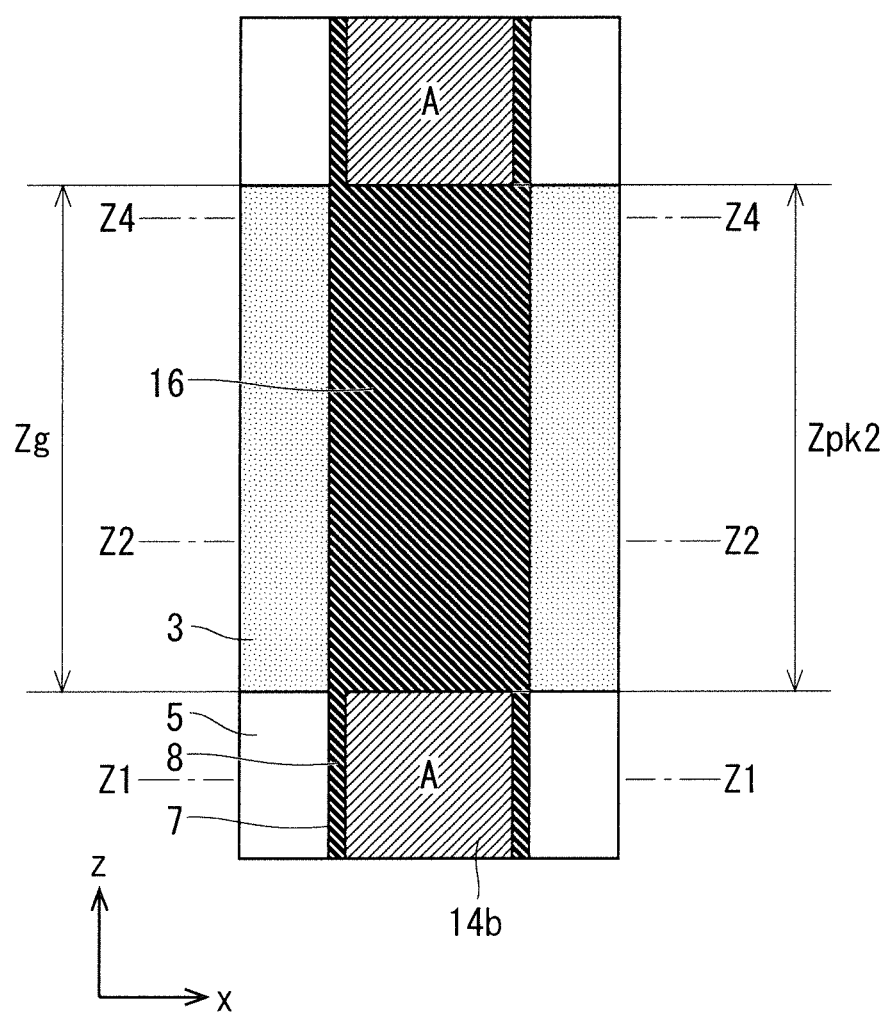

F I G. 1 3 5
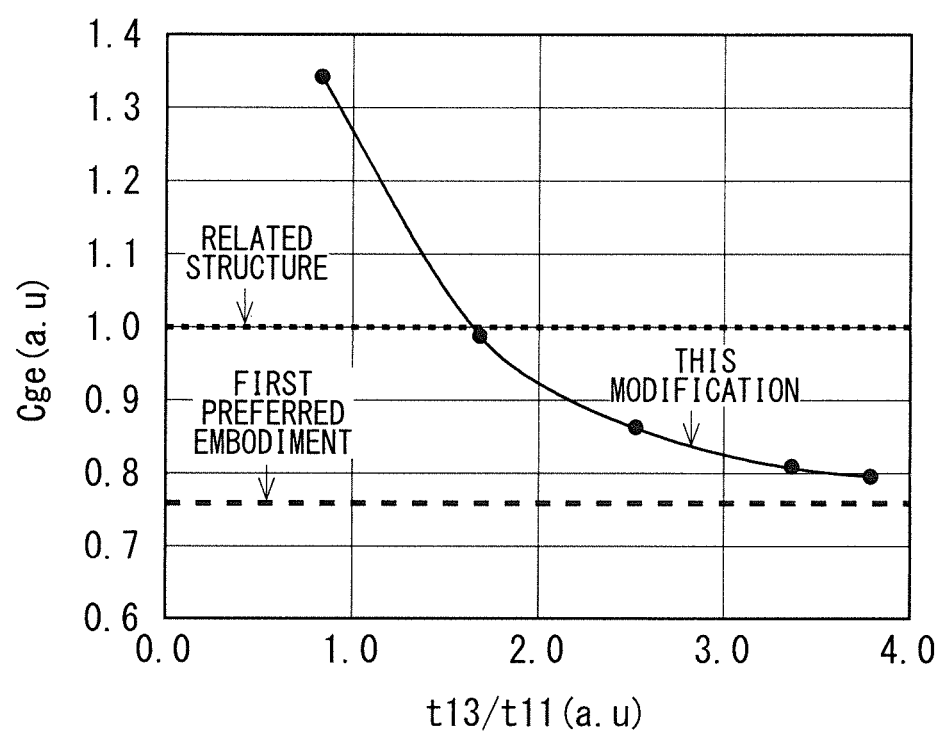

SEMICONDUCTOR DEVICE AND METHOD OF MANUFACTURING SEMICONDUCTOR DEVICE

BACKGROUND OF THE INVENTION

Field of the Invention

The present disclosure relates to a semiconductor device and a method of manufacturing a semiconductor device.

Description of the Background Art

In a conventional semiconductor device, an upper part of a gate portion made of polysilicon inside a trench is formed in a position deeper than an upper surface of a semiconductor substrate and shallower than a lower part of a source layer (as disclosed, for example, in Japanese Patent Application Laid-Open No. 2003-303967). Such a configuration is capable of reducing a gate-emitter capacitance to thereby reduce, for example, a turn-on period and losses during the period, as compared with a configuration in which the upper part of the gate portion is at the same depth as the upper surface of the semiconductor substrate.

In a conventional IGBT (Insulated Gate Bipolar Transistor), an upper part of a gate portion made of polysilicon inside a trench is formed in a position deeper than an upper surface of a semiconductor substrate and shallower than a lower part of a source layer. However, such a configuration has a problem in that a gate-emitter capacitance generated between the gate portion and a base layer which are insulated from each other by a gate insulation film is still not sufficiently reduced, so that turn-on power losses are not sufficiently reduced.

SUMMARY

In view of the foregoing, it is therefore an object of the present disclosure to provide a technique capable of reducing turn-on power losses.

A semiconductor device according to the present disclosure includes: a semiconductor substrate having an upper surface and a lower surface and including a drift layer of a first conductivity type provided between the upper and lower surfaces; a base layer of a second conductivity type provided on the upper surface side of the drift layer in the semiconductor substrate; a contact layer of the second conductivity type provided selectively on the upper surface side of the drift layer or the base layer in the semiconductor substrate and having an impurity concentration higher than that of the base layer; a source layer of the first conductivity type provided selectively on the upper surface side of the base layer in the semiconductor substrate and having an impurity concentration higher than that of the drift layer; a gate portion provided in a first trench, with a first gate insulation film therebetween, the first trench being in contact with the contact layer, the source layer, the base layer, and the drift layer, the gate portion being electrically connected to a gate electrode, the gate portion being provided with a recessed portion with a bottom farther away from the base layer than a side thereof; and a first insulation portion provided in the recessed portion of the gate portion in the first trench.

The semiconductor device is capable of reducing turn-on power losses.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 13 is a graph showing a relationship between the distance Lg and a gate-collector capacitance Cgc;

FIG. 28 is a sectional view showing a configuration of a semiconductor element according to a seventh modification of the first preferred embodiment;

FIG. 33 is a plan view showing the configuration of the semiconductor element according to the second preferred embodiment;

FIG. 39 is a graph showing a relationship between a thickness t2 and the gate-emitter capacitance Cge;

FIG. 60 is a sectional view showing the configuration of the semiconductor element according to the first modification of the second preferred embodiment;

FIG. 68 is a plan view showing the configuration of the semiconductor element according to the fourth preferred embodiment;

FIG. 85 is a sectional view for illustrating a method of manufacturing the semiconductor element according to the first modification of the fifth preferred embodiment;

FIG. 101 is a perspective view showing the configuration of the semiconductor element according to the fifth modification of the fifth preferred embodiment;

FIGS. 127 and 128 are plan views showing the configuration of the semiconductor element according to the third modification of the first preferred embodiment;

FIG. 135 is a graph showing a relationship between t13/t11 and the gate-emitter capacitance Cge.

DESCRIPTION OF THE PREFERRED EMBODIMENTS

Figure 1:
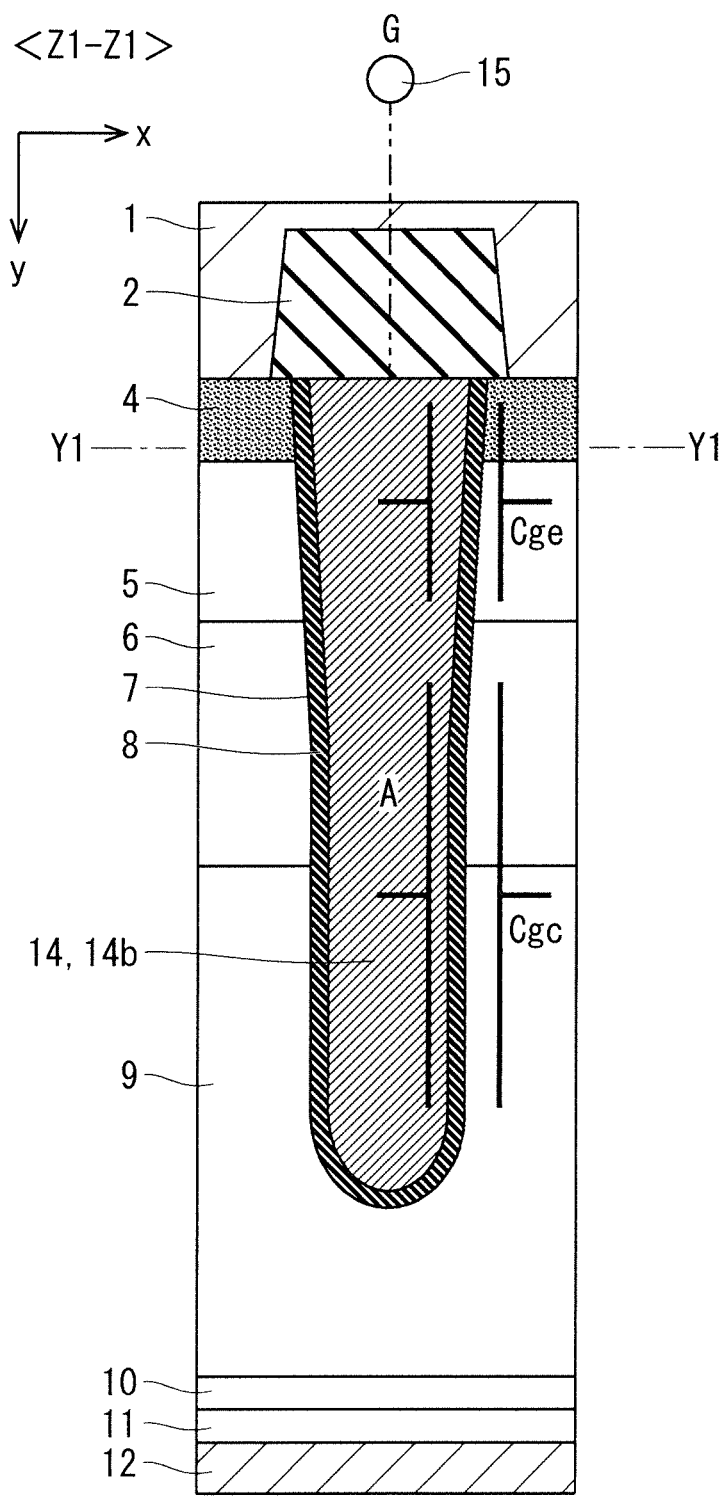
FIGS. 1 and 2 are sectional views showing a configuration of a semiconductor element according to a first preferred embodiment.

Preferred embodiments will now be described with reference to the accompanying drawings. Features described in the following preferred embodiments are illustrative, and all of the features are not necessarily essential. In the following description, the same or similar reference numerals or characters will be used to designate similar components in the preferred embodiments, and different components will be mainly described. Specific positions and directions such as "upper", "lower", "left", "right", "front", and "back" in the following description need not always coincide with the positions and directions used when the preferred embodiments are actually practiced.

The expression "the concentration of a first portion is higher than that of a second portion" shall mean, for example, that the average concentration of the first portion is higher than the average concentration of the second portion. Conversely, the expression "the concentration of a first portion is lower than that of a second portion" shall mean, for example, that the average concentration of the first portion is lower than the average concentration of the second portion. A first conductivity type and a second conductivity type will be taken as an n type and a p type, respectively, in the following description, but may be taken as the p type and the n type, respectively. Also, an $n^-$ type indicates that the impurity concentration thereof is lower than that of the n type, and an $n^+$ type indicates that the impurity concentration thereof is higher than that of the n type. Similarly, a $p^-$ type indicates that the impurity concentration thereof is lower than that of the p type, and a $p^+$ type indicates that the impurity concentration thereof is higher than that of the p type.

First Preferred Embodiment

Figure 2:
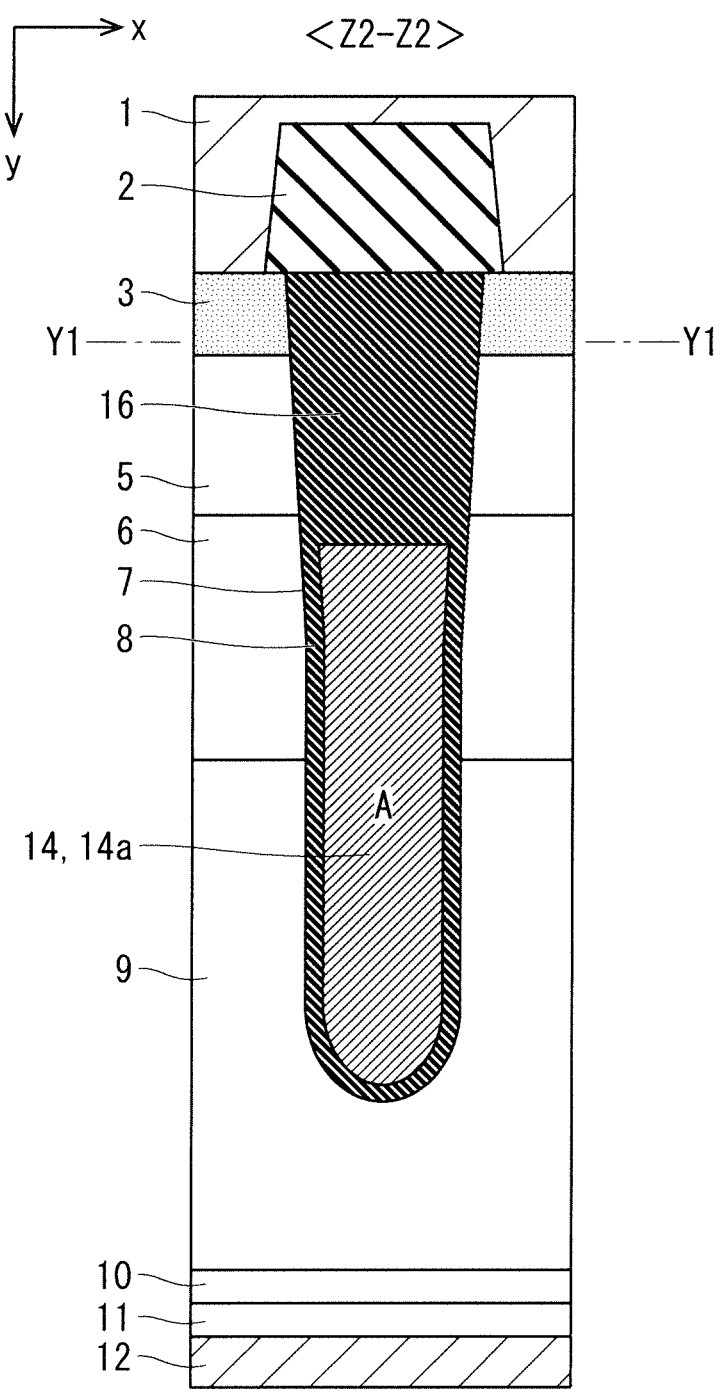
Figure 3:
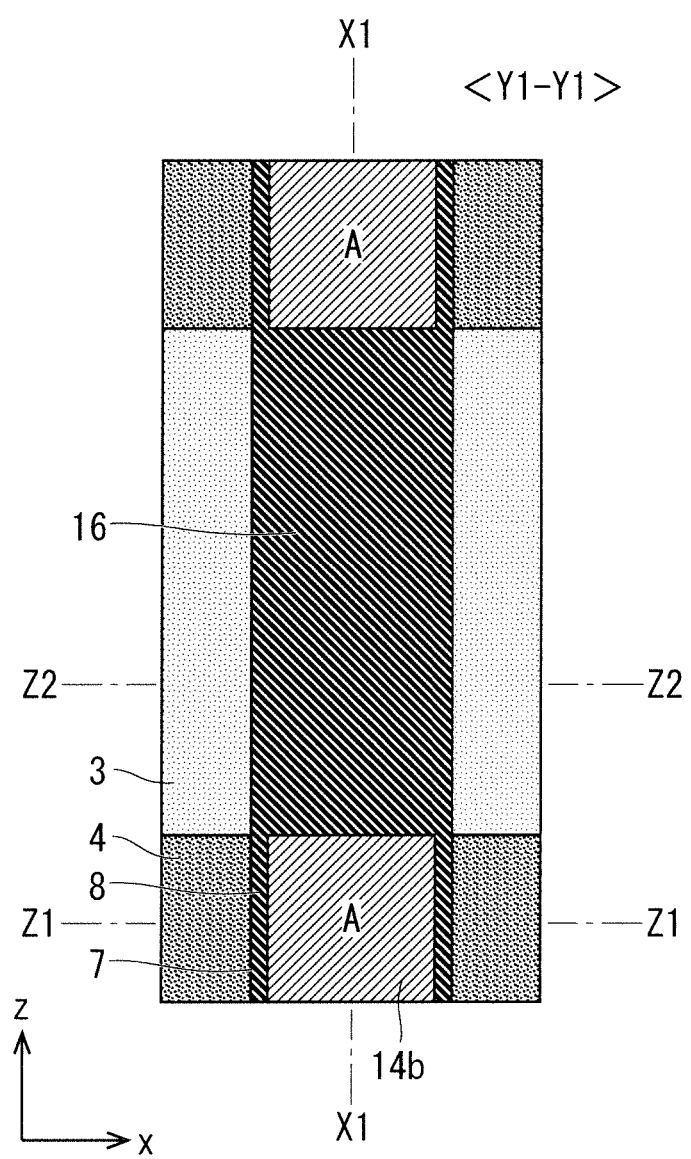
FIG. 3 is a plan view showing the configuration of the semiconductor element according to the first preferred embodiment.
Figure 4:
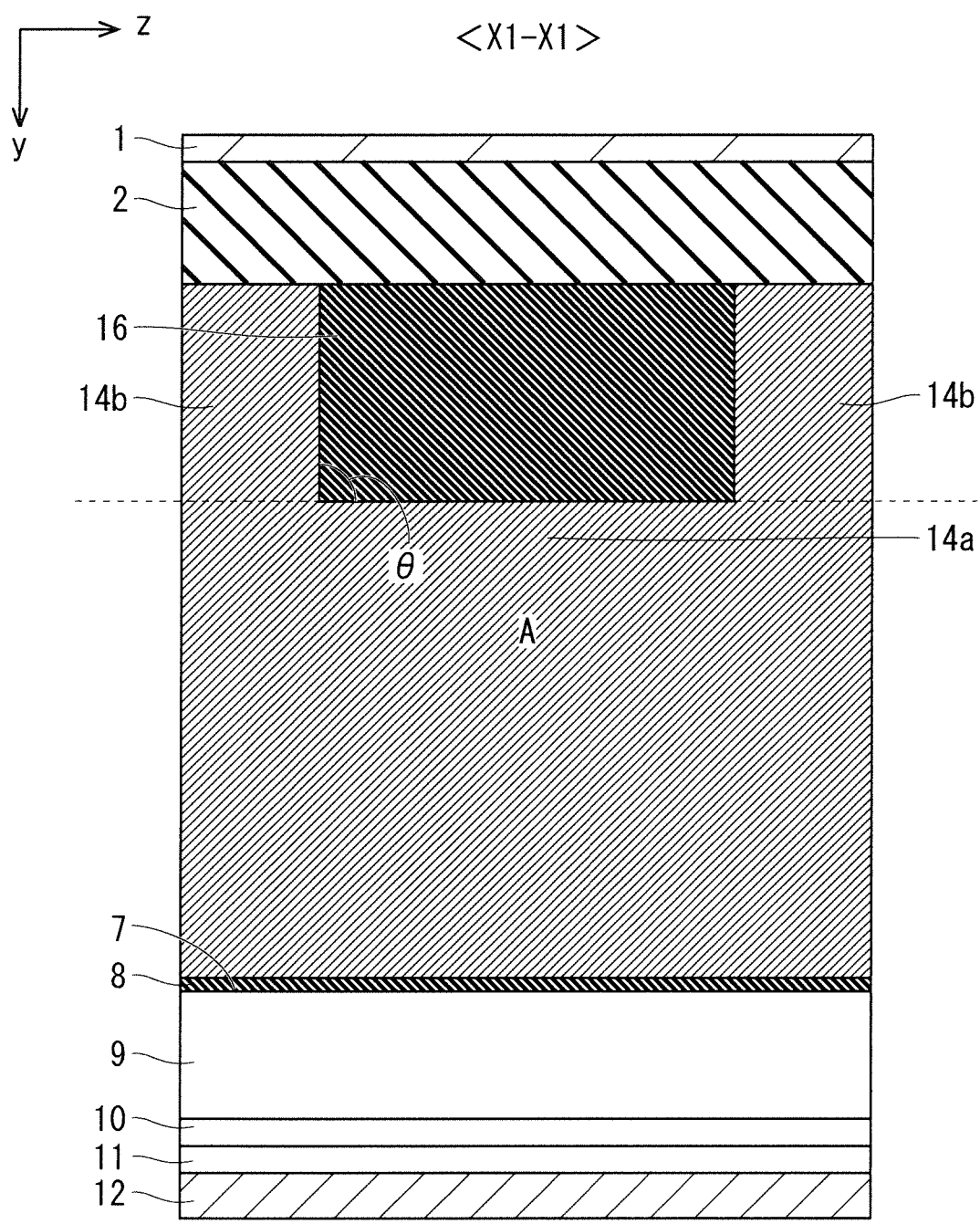
FIG. 4 is a sectional view showing the configuration of the semiconductor element according to the first preferred embodiment.
Figure 5:
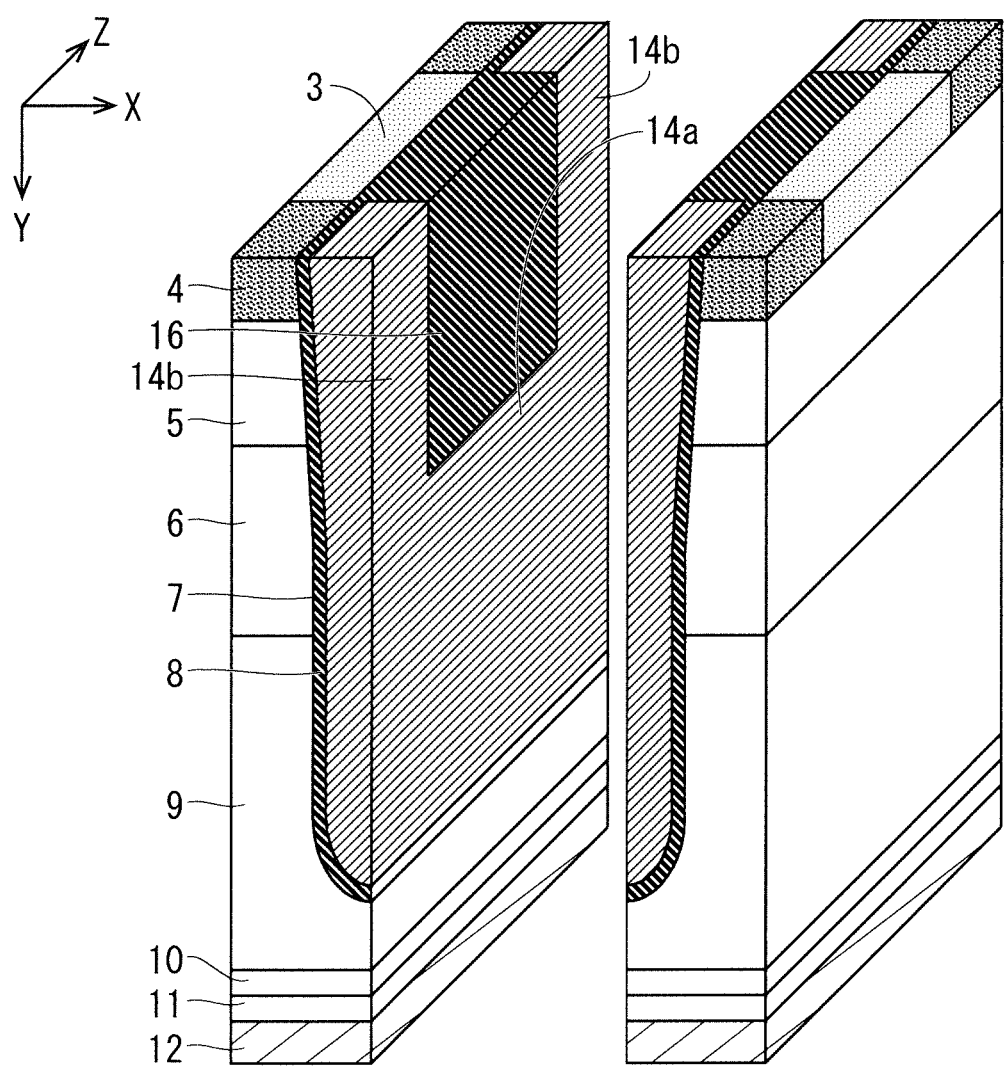
FIG. 5 is a perspective view showing the configuration of the semiconductor element according to the first preferred embodiment.

FIGS. 1 and 2 are sectional views showing a configuration of a semiconductor element included in a semiconductor device according to a first preferred embodiment. FIG. 3 is a plan view showing the configuration of the semiconductor element. FIG. 4 is a sectional view showing the configuration of the semiconductor element. Specifically, FIG. 1 is a sectional view taken along a line Z1-Z1 of FIG. 3, and FIG. 2 is a sectional view taken along a line Z2-Z2 of FIG. 3. FIG. 4 is a sectional view taken along a line X1-X1 of FIG. 3, and FIG. 3 is a plan view taken along a line Y1-Y1 of FIGS. 1 and 2. FIG. 5 is a cutaway perspective view showing the configuration of the semiconductor element.

In the first preferred embodiment, as an active trench A, a gate portion 14 is provided in a first trench 7 of a semiconductor substrate, with a gate oxide film 8 as a first gate insulation film therebetween. The gate portion 14 is electrically connected to a gate electrode 15 shown in FIG. 1. For simplicity, the gate electrode 15 is not shown in some cases in figures other than FIG. 1.

In the example of FIG. 3, the first trench 7 is provided in a striped pattern. However, a trench in a meshed pattern comprised of the first trench 7 and another trench intersecting the first trench 7 may be provided, as will be described later.

In the example of FIGS. 1 to 5, only the active trench A is shown. However, a dummy portion or the like electrically connected to an emitter electrode 1 may be provided in the trench of the semiconductor substrate, as will be described later. For example, active trenches A and dummy trenches D may be arranged alternately, or groups of active trenches A and groups of dummy trenches D may be arranged alternately. The number of active trenches A included in each group of active trenches A may be one or other than one. Similarly, the number of dummy trenches D included in each group of dummy trenches D may be one or other than one.

For example, groups each including three active trenches A and groups each including three dummy trenches D may be arranged alternately. Also, groups each including one active trench A and groups each including five dummy trenches D may be arranged alternately. A region of the semiconductor substrate which is sandwiched between dummy trenches D may be a floating region that is not electrically connected to the emitter electrode 1. The number of dummy trenches D may be zero.

In the first preferred embodiment, an upper end of a source layer 4 as seen in FIG. 1 and an upper end of a contact layer 3 as seen in FIG. 2 correspond to a first main surface of the semiconductor substrate, and a lower end of a collector layer 11 as seen in FIGS. 1 and 2 corresponds to a second main surface of the semiconductor substrate. In other words, the semiconductor substrate ranges from the source layer 4 to the collector layer 11. The semiconductor substrate has an upper surface as the first main surface on the front side of the semiconductor element and a lower surface as the second main surface on the back side of the semiconductor element.

The semiconductor substrate includes an n⁻ type drift layer 9 between the upper and lower surfaces thereof. The drift layer 9 is a semiconductor layer having, for example, arsenic (As) or phosphorus (P) as n type impurities, and has an n type impurity concentration of $1.0E+12/cm^3$ to $1.0E+15/cm^3$, for example.

As shown in FIGS. 1 and 2, an n type carrier storage layer 6 having an n type impurity concentration higher than that of the drift layer 9 is provided on the upper surface side of the drift layer 9, specifically between a base layer 5 and the drift layer 9. The carrier storage layer 6 is a semiconductor layer having, for example, arsenic (As) or phosphorus (P) as n type impurities, and has an n type impurity concentration of $1.0E+13/cm^3$ to $1.0E+18/cm^3$, for example. The carrier storage layer 6 is formed by implanting ions of n type impurities into the semiconductor substrate including the drift layer 9, and then diffusing the implanted n type impurities in the semiconductor substrate by annealing.

The provision of the carrier storage layer 6 reduces conduction losses when a current flows. However, if the reduction in conduction losses is not necessary, the semiconductor element may be configured not to include the carrier storage layer 6 but to include the drift layer 9 provided also in the region of the carrier storage layer 6 shown in FIGS. 1 and 2. For this reason, the carrier storage layer 6 and the drift layer 9 together may be referred to as a drift layer.

The p type base layer 5 is provided on the upper surface side of the carrier storage layer 6 in the semiconductor substrate. The base layer 5 is a semiconductor layer having, for example, boron (B) or aluminum (Al) as p type impurities, and has a p type impurity concentration of $1.0E+12/cm^3$ to $1.0E+19/cm^3$, for example.

As shown in FIG. 2, the p⁺ type contact layer 3 is selectively provided on the upper surface side of the base layer 5 in the semiconductor substrate. However, the contact layer 3 may be selectively provided on the upper surface side of the drift layer 9, rather than the base layer 5, in the semiconductor substrate, as will be described later. The contact layer 3 is a semiconductor layer having, for example, boron (B) or aluminum (Al) as p type impurities, and has a p type impurity concentration of $1.0E+15/cm^3$ to $1.0E+20/cm^3$, for example. The p type impurity concentration of the contact layer 3 is higher than that of the base layer 5.

As shown in FIG. 1, the n type source layer 4 is selectively provided on the upper surface side of the base layer 5 in the semiconductor substrate. In the first preferred embodiment, the source layer 4 is generally provided in a region where the contact layer 3 is not provided. The source layer 4 is a semiconductor layer having, for example, arsenic (As) or phosphorus (P) as n type impurities, and has an n type impurity concentration of $1.0E+17/cm^3$ to $1.0E+20/cm^3$, for example. The n type impurity concentration of the source layer 4 is higher than that of the drift layer 9.

An n type buffer layer 10 having an n type impurity concentration higher than that of the drift layer 9 is provided on the lower surface side of the drift layer 9. The buffer layer 10 is provided to suppress the punch through of a depletion layer extending from the base layer 5 toward the lower surface side when the semiconductor element is in an off state. The buffer layer 10 may be formed, for example, by implanting phosphorus (P) or protons (H⁺) or by implanting both phosphorus (P) and protons (H⁺). The semiconductor element may be configured not to include the buffer layer 10 but to include the drift layer 9 provided also in the region of the buffer layer 10 shown in FIGS. 1 and 2. For this reason, the buffer layer 10 and the drift layer 9 together may be referred to as a drift layer.

The p type collector layer 11 is provided on the lower surface side of the buffer layer 10. For example, the collector layer 11 is provided between the drift layer 9 and the lower surface of the semiconductor substrate.

As shown in FIGS. 1 and 2, the first trench 7 has an opening in the upper surface of the semiconductor substrate, and is in contact with the contact layer 3, the source layer 4, the base layer 5, and the drift layer 9. In the example of FIGS. 1 and 2, the first trench 7 extends from the upper surface of the semiconductor substrate through the base layer 5 to the drift layer 9.

As the active trench A, the gate portion 14 is provided in the first trench 7 of the semiconductor substrate, with the gate oxide film 8 therebetween. The gate portion 14 includes a first gate sub-portion 14a shown in FIG. 2, and a second gate sub-portion 14b shown in FIG. 1 and protruding upwardly (e.g., in the y direction) above the first gate sub-portion 14a. The second gate sub-portion 14b is connected to the first gate sub-portion 14a in the direction of extension (e.g., in the z direction) of the first trench 7 of FIG. 3 as seen in plan view, and faces the source layer 4 and the base layer 5 across the gate oxide film 8, as shown in FIG. 1. The gate portion 14 is made of polysilicon in the first preferred embodiment, but is not limited to this.

As shown in FIGS. 2 to 5, a buried insulation portion 16 that is a first insulation portion is provided in the first trench 7. This buried insulation portion 16 will be described in detail later.

As shown in FIGS. 1 and 2, an interlayer insulation film 2 is provided on the gate portion 14. The emitter electrode 1 is provided on part of the upper surface of the semiconductor substrate where the interlayer insulation film 2 is not provided and on top of the interlayer insulation film 2. In the first preferred embodiment, the emitter electrode 1 is in ohmic contact with the source layer 4 and the contact layer 3, and is electrically connected to the source layer 4 and the contact layer 3.

The emitter electrode 1 may be made of an aluminum alloy such as an aluminum-silicon alloy (Al—Si alloy), for example. Alternatively, the emitter electrode 1 may be comprised of a plurality of metal films obtained by forming plating films by electroless plating or electroplating on an electrode made of an aluminum alloy. The plating films formed by electroless plating or electroplating may be nickel (Ni) plating films, for example. If there are small regions, such as regions between adjacent ones of interlayer insulation films 2, where good embedding cannot be obtained by the emitter electrode 1, a tungsten film having better embeddability than the emitter electrode 1 may be placed in the small regions and the emitter electrode 1 may be provided on the tungsten film.

A barrier metal may be provided between the interlayer insulation film 2 and the emitter electrode 1. The barrier metal may be, for example, an electric conductor containing titanium (Ti) such as titanium nitride, or TiSi obtained by alloying titanium and silicon (Si). The barrier metal may be provided only on n type semiconductor layers such as the source layer 4. The barrier metal and the emitter electrode 1 together may be referred to as an emitter electrode.

A collector electrode 12 is provided on the lower surface side of the collector layer 11. Like the emitter electrode 1, the collector electrode 12 may be made of an aluminum alloy or formed by an aluminum alloy and a plating film. The collector electrode 12 may be different in configuration from the emitter electrode 1. The collector electrode 12 is in ohmic contact with the collector layer 11 and is electrically connected to the collector layer 11.

In the first preferred embodiment, the gate portion 14 has a recessed portion. As shown in FIG. 5, the first gate sub-portion 14a includes the bottom of the recessed portion of the gate portion 14, and the second gate sub-portion 14b includes the sides of the recessed portion of the gate portion 14. The bottom of the recessed portion is farther away from the base layer 5 than the sides of the recessed portion. In other words, the distance between the bottom of the recessed portion and the base layer 5 is greater than the distance between the sides of the recessed portion and the base layer 5.

The buried insulation portion 16 is provided in the recessed portion of the gate portion 14. The buried insulation portion 16 may or may not include part of the gate oxide film 8, so long as the buried insulation portion 16 is thicker than the gate oxide film 8. The buried insulation portion 16 faces the contact layer 3 and the base layer 5. Second gate sub-portions 14b and buried insulation portions 16 are arranged alternately in the direction of extension (e.g., in the z direction of FIG. 3) of the first trench 7 as seen in plan view. As will be described in detail later, the buried insulation portion 16 is capable of reducing a gate-emitter capacitance Cge.

Figure 6:
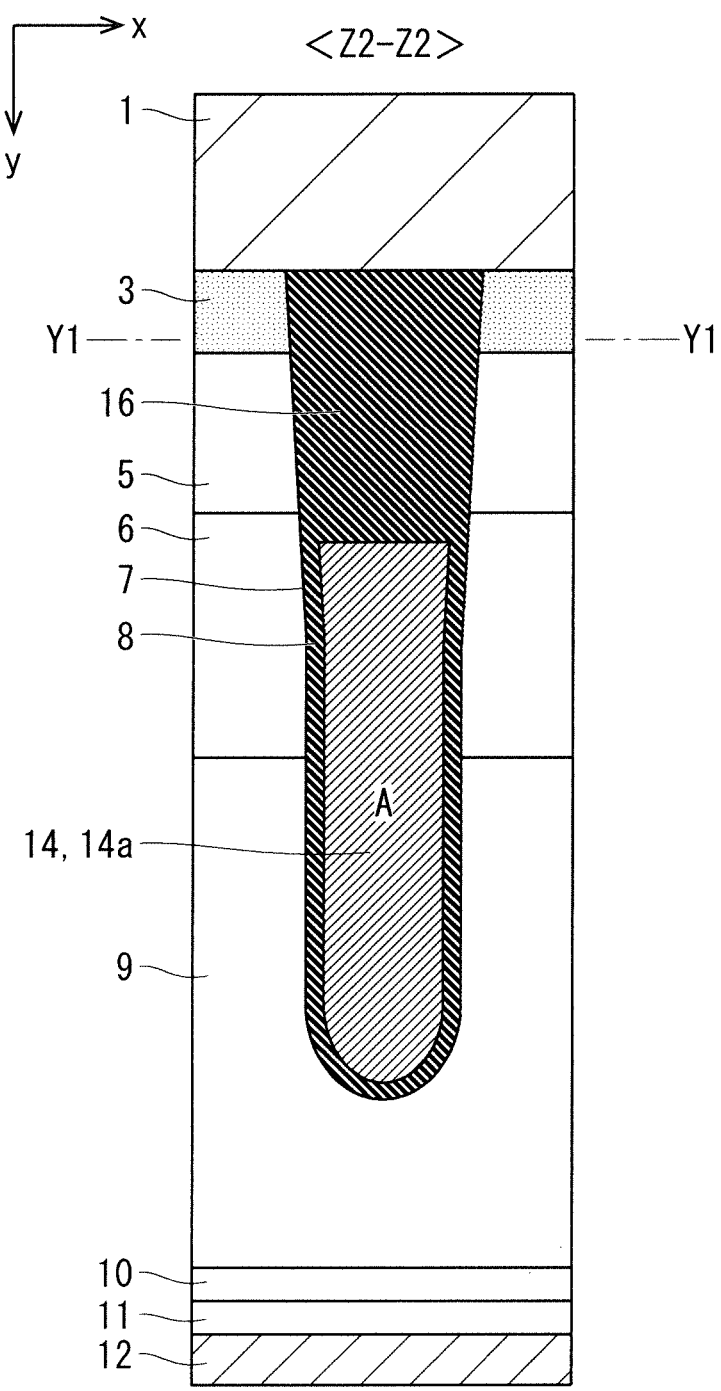
FIGS. 6 and 7 are sectional views showing the configuration of the semiconductor element according to the first preferred embodiment.

Although shown in FIG. 2 as provided on top of the buried insulation portion 16, the interlayer insulation film 2 need not be provided on top of the buried insulation portion 16, as shown in FIG. 6. The configuration as shown in FIG. 6 increases the degree of flexibility in arrangement of a contact hole for electrical connection between the emitter electrode 1 and the semiconductor substrate in the interlayer insulation film 2 because the emitter electrode 1 can be placed on the buried insulation portion 16. For example, this configuration allows contact holes of the emitter electrode 1 to be provided in a mesa region between first trenches 7 in a striped pattern in a direction (e.g., in the x direction) orthogonal to the direction of extension of the first trenches 7, rather than in a striped pattern in a direction parallel to the direction (e.g., in the z direction) of extension of the first trenches 7. Such an arrangement reduces the width of the mesa region to reduce an on-state voltage.

Figure 7:
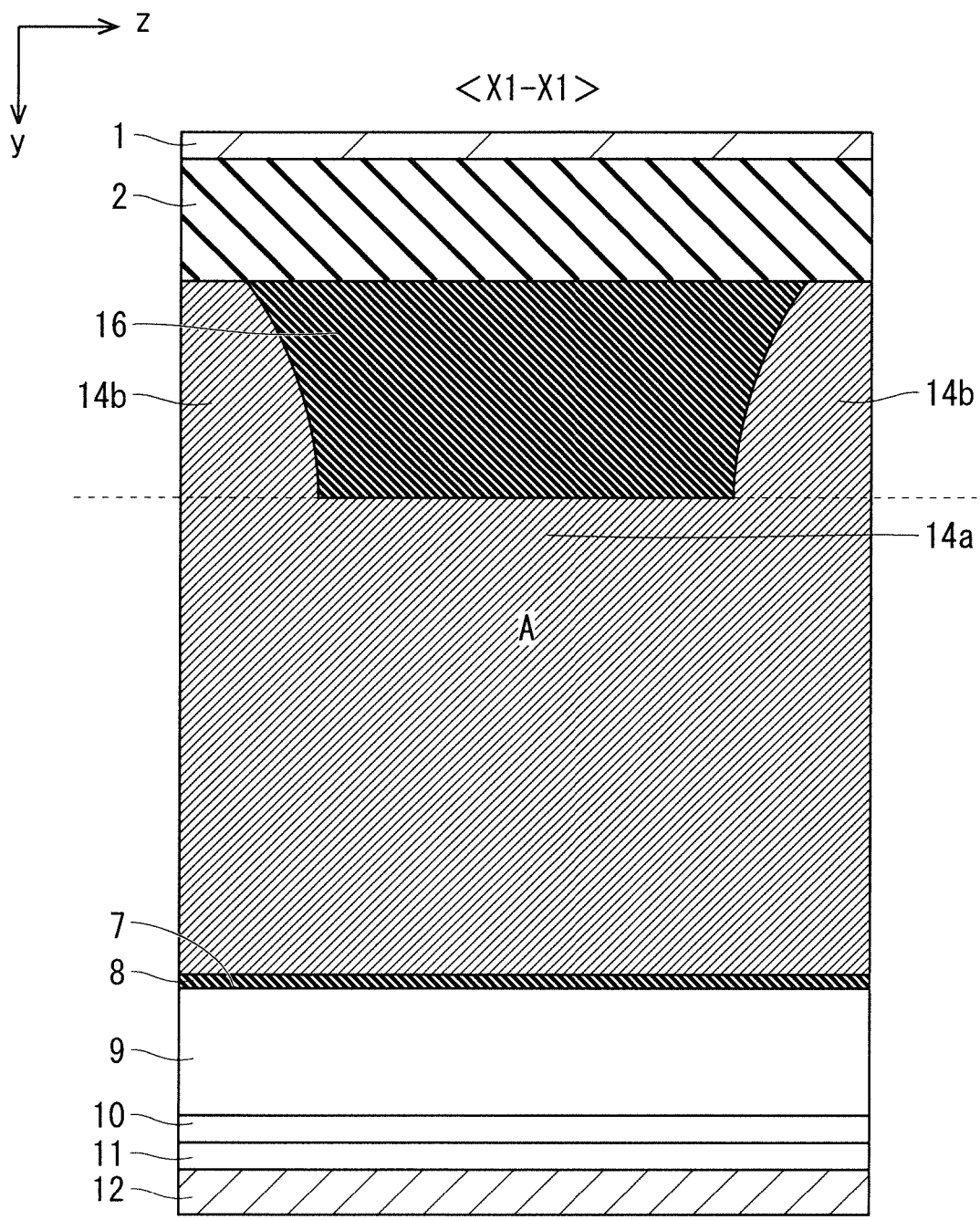

The angle θ formed between the top of the first gate sub-portion 14a and the sides of the second gate sub-portion 14b is 90 degrees in FIG. 4, but may be adjusted as appropriate for easy burying of the buried insulation portion 16. For example, the angle θ may range from 45 degrees to 100 degrees. As shown in FIGS. 7 and 12S, the cross-sectional shape of the sides of the second gate sub-portion 14b as seen in cross section may be an arcuate shape. Also, the angle formed between the top of the first gate sub-portion 14a and the inner wall of the first trench 7 may be adjusted as appropriate for easy burying of the buried insulation portion 16.

<Manufacturing Method>

An example of a method of manufacturing the semiconductor element according to the first preferred embodiment will be described. First, a semiconductor substrate constituting the n⁻ type drift layer 9 is prepared. An n type wafer containing n type impurities, such as an FZ wafer produced by an FZ (Floating Zone) method or an MCZ wafer produced by an MCZ (Magnetic field applied Czochralski) method, for example, may be used for the semiconductor substrate.

The concentration of the n type impurities contained in the semiconductor substrate is selected, as appropriate, depending on the breakdown voltage of the semiconductor device to be produced. For a semiconductor device with a breakdown voltage of 1200 V, the n type impurity concentration is adjusted so that the resistivity of the drift layer 9 constituting the semiconductor substrate is on the order of 40 to 120 Ω·cm. The entire semiconductor substrate is the drift layer 9 in the step of preparing the semiconductor substrate. P type or n type impurity ions are implanted from the upper surface side or the lower surface side of such a semiconductor substrate and are then diffused in the semiconductor substrate by heat treatment and the like to form p type or n type semiconductor layers in the semiconductor substrate, whereby a semiconductor element is manufactured.

Although not shown, a region which becomes a termination region is provided around a cell region in which the semiconductor element is provided. A method of manufacturing the configuration of the cell region of the semiconductor element will be mainly described below. The termination region of the semiconductor element may be produced by a known manufacturing method. For example, an FLR (Field Limiting Ring) including a p type termination well layer may be formed as a breakdown voltage maintaining structure in the termination region. In this case, the FLR may be formed by implanting p type impurity ions before the processing of the cell region of the semiconductor element or by implanting p type impurity ions at the same time that ions of p type impurity are implanted into the cell region of the semiconductor element.

Next, n type impurities such as phosphorus (P) are implanted from the upper surface side of the semiconductor substrate to form the carrier storage layer 6. P type impurities such as boron (B) are implanted from the upper surface side of the semiconductor substrate to form the base layer 5. The carrier storage layer 6 and the base layer 5 are formed by implanting impurity ions into the semiconductor substrate and then diffusing the impurity ions by heat treatment. The carrier storage layer 6 and the base layer 5 are selectively formed on the upper surface side of the semiconductor substrate because ions of n type impurities and p type impurities are implanted after a mask process is performed on the first main surface of the semiconductor substrate. Specifically, the carrier storage layer 6 and the base layer 5 are formed in the cell region, and are connected to the p type termination well layer in the termination region. The mask process refers to the process of forming on the semiconductor substrate a mask, the process including applying a resist on the semiconductor substrate and forming an opening in a predetermined region of the resist by photolithography, the mask being used for implanting ions into the predetermined region of the semiconductor substrate through the opening or performing etching in the predetermined region.

Next, n type impurities are selectively implanted into the upper surface side of the base layer 5 in the cell region by means of the mask process to form the source layer 4. The n type impurities to be implanted may be arsenic (As) or phosphorus (P), for example. The same mask may be used for the formation of the base layer 5 and for the formation of the source layer 4 to reduce the number of masks and the number of photolithographic steps, thereby reducing manufacturing costs.

Next, the first trench 7 extending from the upper surface side of the semiconductor substrate through the source layer 4, the base layer 5, and the carrier storage layer 6 to the drift layer 9 is formed. In the cell region, part of side walls of the first trench 7 extending through the source layer 4 becomes part of the source layer 4. The first trench 7 is formed, for example, by depositing an oxide film of $SiO_2$ and the like serving as a mask on the semiconductor substrate, forming an opening in part of the oxide film where the first trench 7 is to be formed by means of the mask process, and etching the semiconductor substrate using the oxide film having the opening as a mask.

Thereafter, the semiconductor substrate is heated in an oxygen-containing atmosphere, so that the gate oxide film 8 is formed on the inner wall of the first trench 7 and on the upper surface of the semiconductor substrate. The gate oxide film 8 formed on the upper surface of the semiconductor substrate is removed in a subsequent step.

Figure 8:
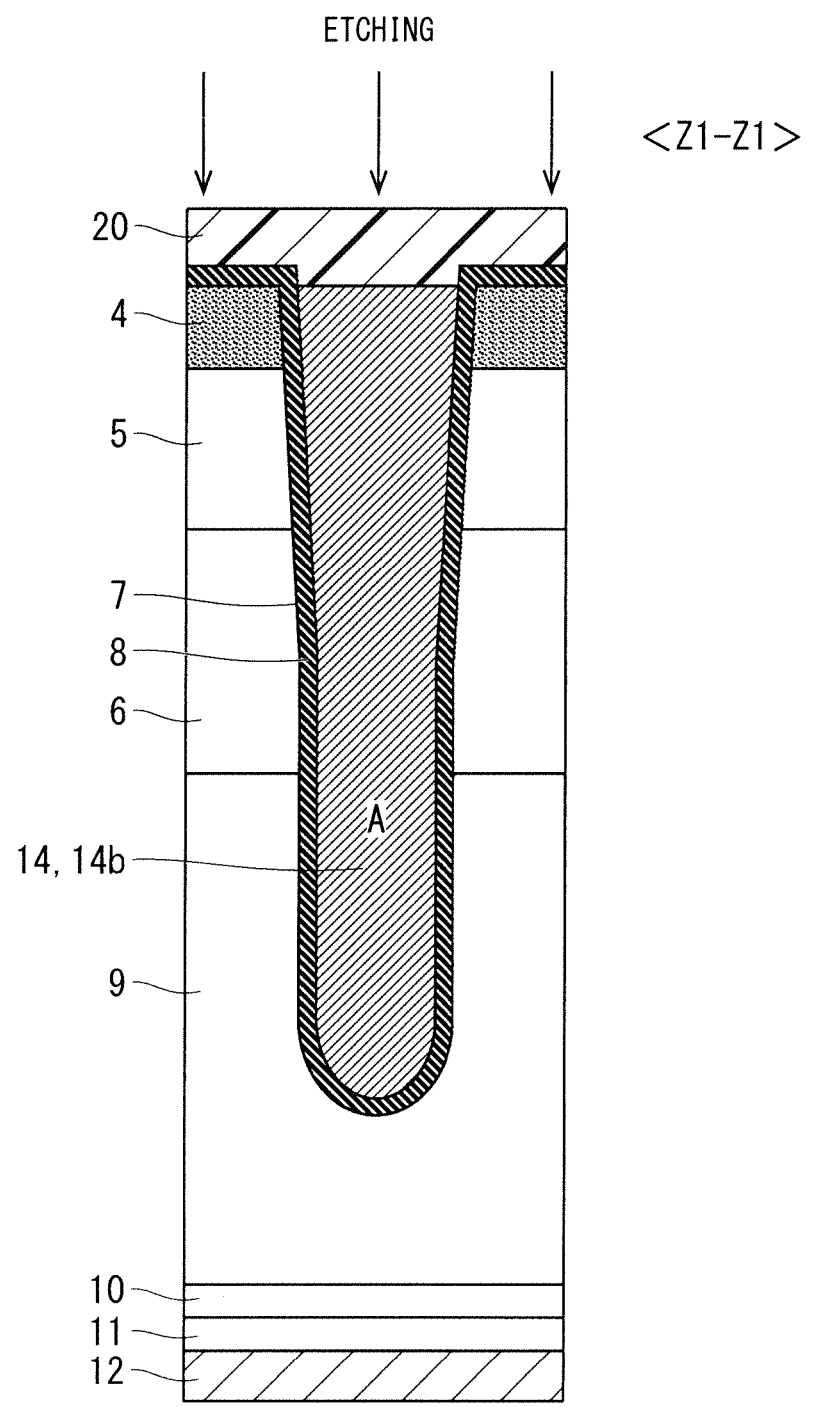
FIGS. 8 and 9 are sectional views for illustrating a method of manufacturing the semiconductor element according to the first preferred embodiment.
Figure 9:
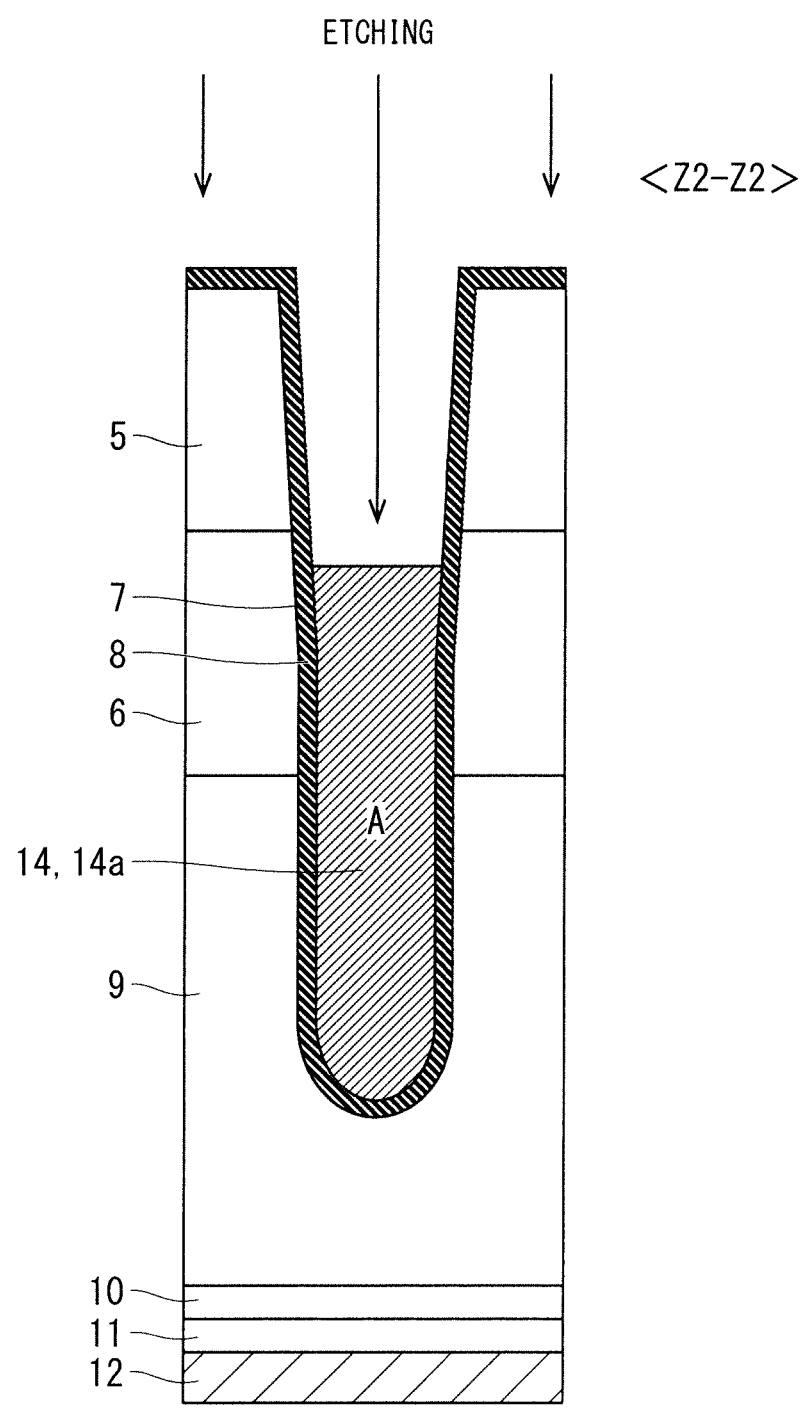

Next, polysilicon doped with n type or p type impurities is deposited by a CVD (chemical vapor deposition) process and the like into the first trench 7 with the gate oxide film 8 formed therein. Then, as shown in FIG. 8, a mask 20 comprised of a resist or an oxide film is formed in a region where the recessed portion is to be formed. As shown in FIG. 9, the mask 20 is removed from a region where the first gate sub-portion 14*a* is to be formed. Then, the mask process using the mask 20 is performed to selectively etch the polysilicon, thereby forming the recessed portion in the gate portion 14. In other words, the first gate sub-portion 14*a* and the second gate sub-portion 14*b* are formed.

Next, p type impurities such as boron (B) or aluminum (Al) are selectively implanted by the mask process to form the contact layer 3. The contact layer 3 is formed by implanting impurity ions into the semiconductor substrate and then diffusing the impurity ions by heat treatment.

Next, the buried insulation portion 16 is formed in part of the first trench 7 which lies on the first gate sub-portion 14*a*, and the interlayer insulation film 2 is formed at least on the second gate sub-portion 14*b*. The buried insulation portion 16 and the interlayer insulation film 2 may be made of $SiO_2$, for example.

Next, the emitter electrode 1 is formed on the upper surface of the semiconductor substrate and on the interlayer insulation film 2. The emitter electrode 1 may be formed by depositing an aluminum-silicon alloy (Al—Si alloy) by a PVD (physical vapor deposition) process such as sputtering or evaporation, for example. Also, a nickel alloy (Ni alloy) may be further formed on the formed aluminum-silicon alloy by electroless plating or electroplating, whereby the emitter electrode 1 is formed. The formation of the emitter electrode 1 by plating facilitates the formation of a thick metal film as the emitter electrode 1. This increases the heat capacity of the emitter electrode 1 to improve the heat resistance thereof. For the further formation of the nickel alloy by the plating process after the formation of the emitter electrode 1 made of the aluminum-silicon alloy by the PVD process, the plating process for the formation of the nickel alloy may be performed after the processing on the lower surface side of the semiconductor substrate.

Next, the lower surface side of the semiconductor substrate is ground, whereby the semiconductor substrate is thinned to a designed predetermined thickness. The thickness of the semiconductor substrate after the grinding may be 80 to 200 μm, for example.

Then, n type impurities are implanted from the lower surface side of the semiconductor substrate to form the buffer layer 10 shown in FIGS. 1 and 2. Further, p type impurities are implanted from the lower surface side of the semiconductor substrate to form the collector layer 11 shown in FIGS. 1 and 2.

The buffer layer 10 may be formed, for example, by implanting phosphorus (P) ions, by implanting protons ($H^+$), or by implanting both protons and phosphorus. The protons are implanted to a deep position from the lower surface of the semiconductor substrate at a relatively low acceleration energy. The depth to which protons are implanted is changed relatively easily by changing the acceleration energy. Thus, implanting protons a plurality of times at different acceleration energies for the formation of the buffer layer 10 allows the formation of the buffer layer 10 thicker in the thickness direction of the semiconductor substrate than implanting phosphorus.

Phosphorus has a higher activation rate as n type impurities than protons. For this reason, the formation of the buffer layer 10 made of phosphorus suppresses the punch through of a depletion layer even in the thinned semiconductor substrate. To make the semiconductor substrate further thinner, it is preferable that both protons and phosphorus are implanted to form the buffer layer 10 in which protons are implanted into a position deeper from the lower surface than phosphorus.

The collector layer 11 may be formed, for example, by implanting boron (B). Boron ions are implanted from the lower surface side of the semiconductor substrate, and laser annealing is thereafter performed by irradiating the lower surface with a laser. This activates the implanted boron to form the collector layer 11. At this time, phosphorus in the buffer layer 10 implanted in a relatively shallow position from the lower surface of the semiconductor substrate is activated at the same time.

It is necessary to prevent the temperature of the entire semiconductor substrate from increasing to a temperature higher than 350° to 500° C. except in the step for activation of protons after the implantation of protons because protons in the buffer layer 10 are activated at a relatively low annealing temperature of 350° to 500° C. The aforementioned laser annealing, which is capable of increasing the temperature of only the vicinity of the lower surface of the semiconductor substrate, may be used for the activation of n type impurities and p type impurities after the implantation of protons.

Next, the collector electrode 12 shown in FIGS. 1 and 2 is formed on the lower surface of the semiconductor substrate. The collector electrode 12 may be formed by depositing an aluminum-silicon alloy (Al—Si alloy) or titanium (Ti) by a PVD process such as sputtering or evaporation. Alternatively, the collector electrode 12 may be formed by laminating a plurality of layers of metals such as an aluminum-silicon alloy, titanium, nickel, and gold. Also, the collector electrode 12 may be formed by further forming a metal film by electroless plating or electroplating on the metal film formed by the PVD process.

A plurality of semiconductor elements are produced in the form of a matrix in a single n type wafer by the aforementioned steps. Laser dicing or blade dicing is performed to cut the wafer into the individual semiconductor elements, whereby each of the semiconductor elements is completed.

<Operation>

Figure 10:
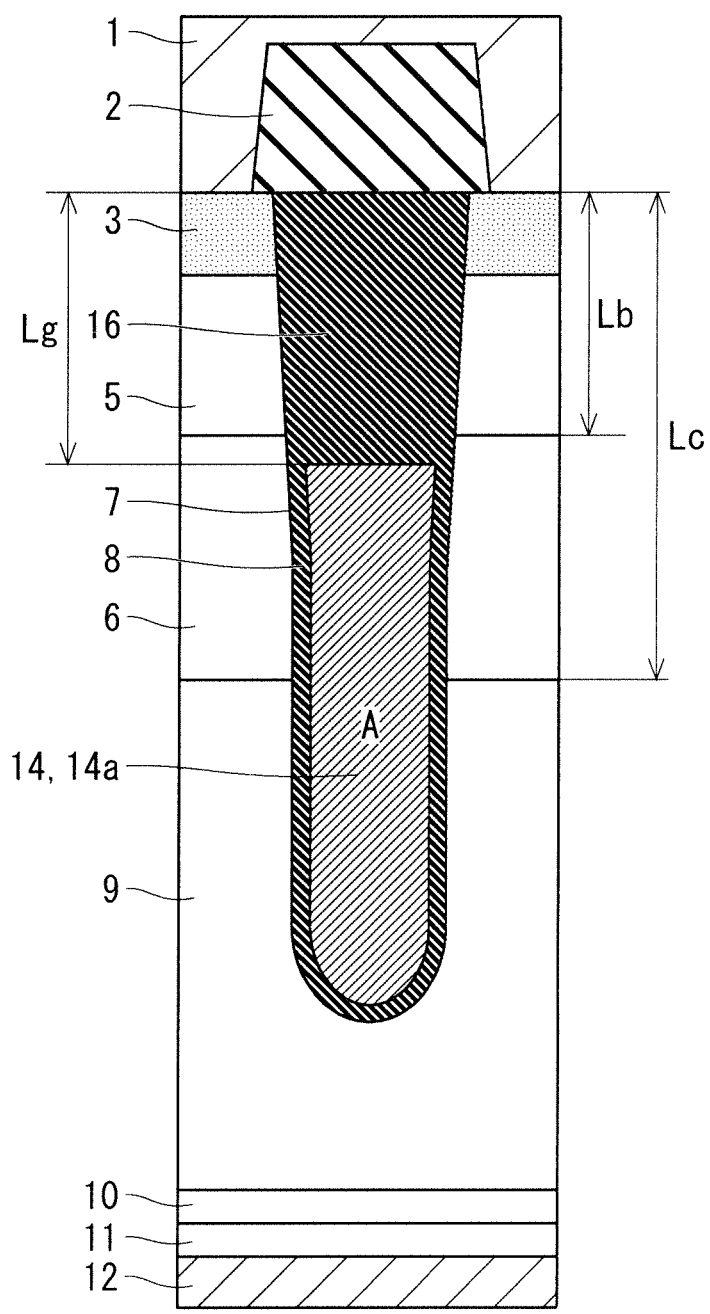
FIG. 10 is a sectional view showing the configuration of the semiconductor element according to the first preferred embodiment.

In FIG. 10, a distance Lg from the upper surface of the semiconductor substrate to an upper part of the first gate sub-portion 14a, a distance Lb from the upper surface of the semiconductor substrate to a lower part of the base layer 5, and a distance Lc from the upper surface of the semiconductor substrate to a lower part of the carrier storage layer 6 are shown in addition to the structure of FIG. 2.

Figure 11:
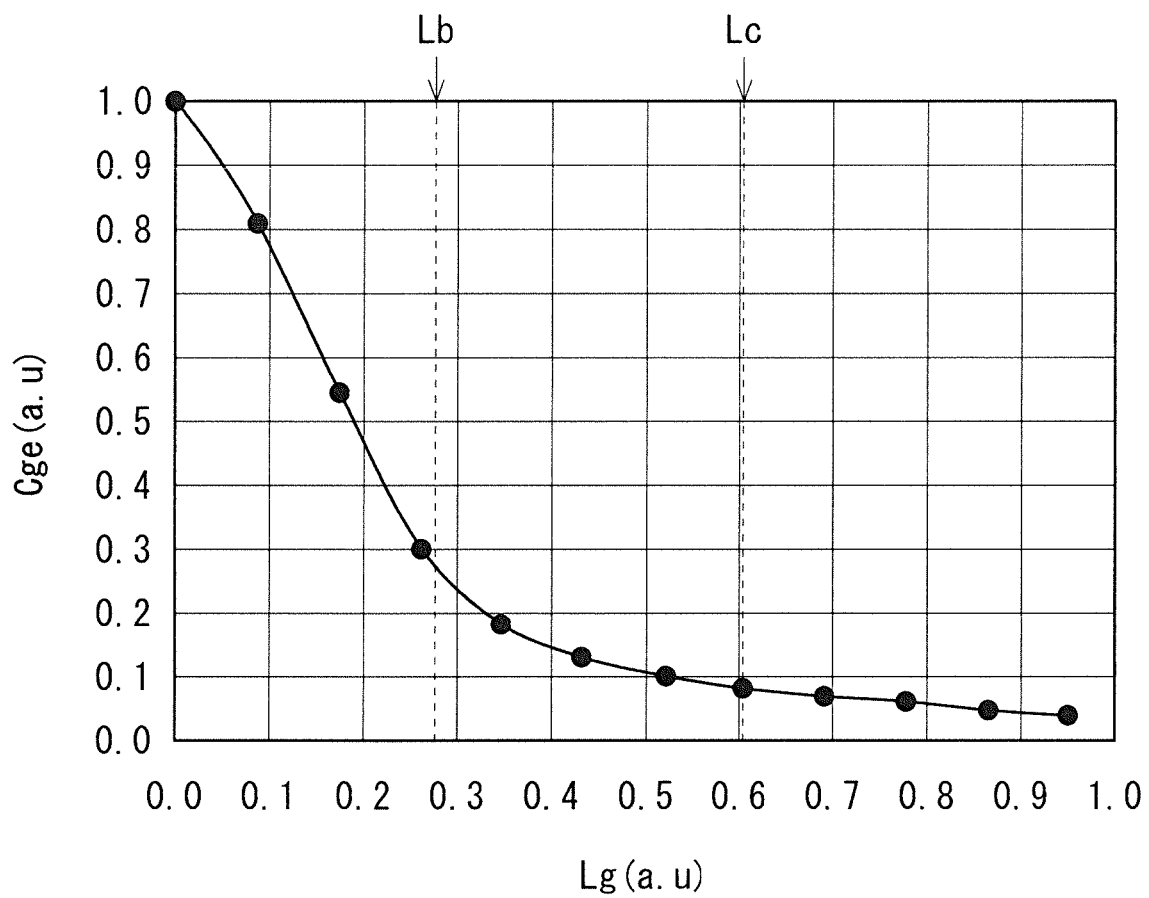
FIG. 11 is a graph showing a relationship between a distance Lg and a gate-emitter capacitance Cge.

FIG. 11 shows changes in gate-emitter capacitance Cge when the distance Lg is varied. As shown in FIG. 11, the gate-emitter capacitance Cge decreases steeply as the distance Lg increases in a region where Lg<Lb. The reason why the gate-emitter capacitance Cge decreases as the distance Lg increases is considered to be that the gate-emitter capacitance Cge is generated mainly between the gate portion 14 and the base layer 5, and that the first gate sub-portion 14a of the gate portion 14 becomes farther from the base layer 5 as the distance Lg increases.

The gate-emitter capacitance Cge in a region where Lb<Lg<Lc is not greater than 30% of the value of the gate-emitter capacitance Cge for Lg=0, and decreases gradually as the distance Lg increases. The gate-emitter capacitance Cge in a region where Lg>Lc is not less than 10% of the value of the gate-emitter capacitance Cge for Lg=0, and hardly decreases as the distance Lg increases. In the first preferred embodiment, Lg>Lb, that is, the buried insulation portion 16 faces the base layer 5. This allows the reduction in gate-emitter capacitance Cge.

In conventional IGBTs, if the entire gate portion 14 is provided below a lower part of the source layer 4 for purposes of reducing the gate-emitter capacitance Cge, a channel is not connected to the source layer 4 serving as an electron supply source, so that the on-state voltage increases. In the first preferred embodiment, on the other hand, the second gate sub-portion 14b faces the source layer 4 across the gate oxide film 8, so that the increase in on-state voltage is suppressed.

<Summary of First Preferred Embodiment>

Based on the trends described above, the inventors have considered that making part of the gate portion 14 farther from the upper surface of the semiconductor substrate is effective for the reduction in gate-emitter capacitance Cge, and found the gate portion 14 having the recessed portion. The configuration of the first preferred embodiment, in which the gate portion 14 has the recessed portion with the bottom farther away from the base layer 5 than the sides thereof, is capable of reducing the gate-emitter capacitance Cge. The reduction in gate-emitter capacitance Cge increases dI/dt that is variations over time in collector current during a turn-on time period to shorten the turn-on time period, thereby achieving low turn-on power losses.

Also, the configuration in which the second gate sub-portion 14b faces the source layer 4 across the gate oxide film 8 suppresses the increase in on-state voltage.

<First Modification>

Figure 12:
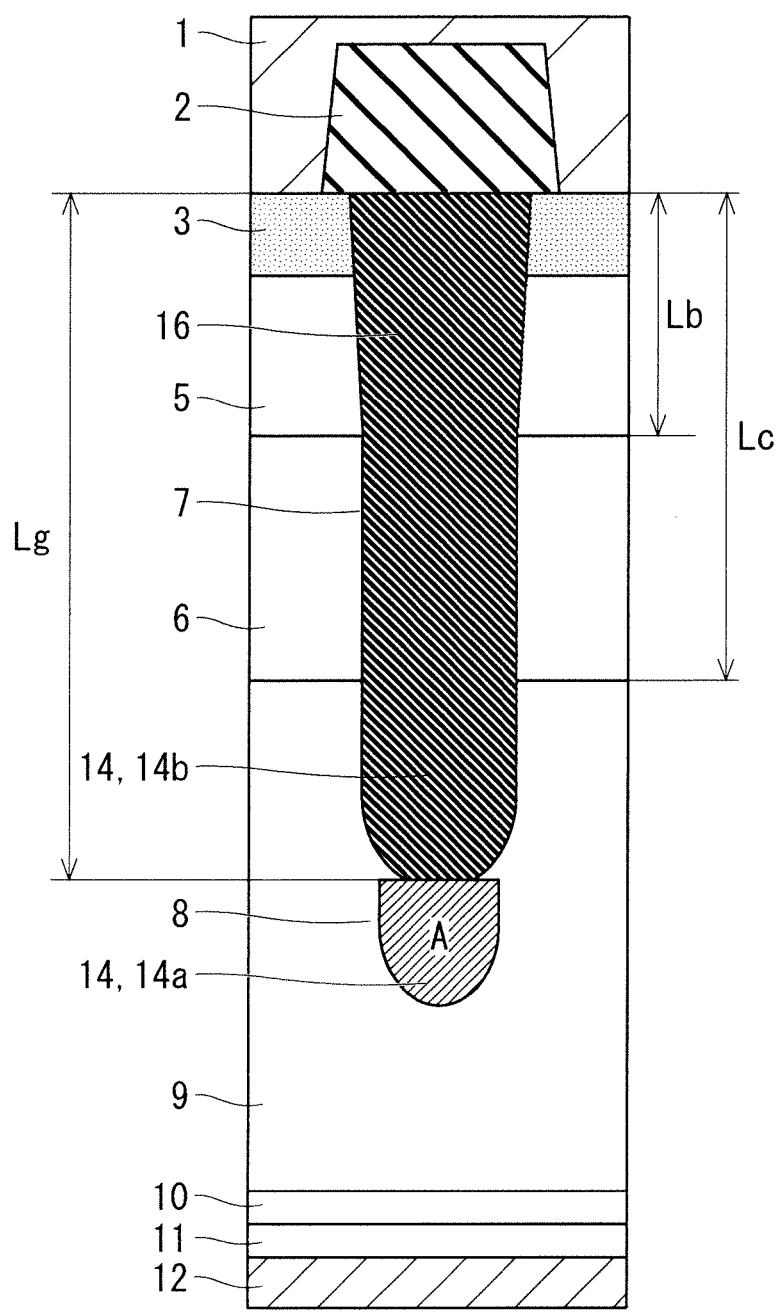
FIG. 12 is a sectional view showing a configuration of a semiconductor element according to a first modification of the first preferred embodiment.

In a configuration provided with the carrier storage layer 6 as in the first preferred embodiment, it is preferable that the upper part of the first gate sub-portion 14a is positioned below an upper part of the carrier storage layer 6, as shown in FIG. 10. It is more preferable that the upper part of the first gate sub-portion 14a is positioned below the lower part of the carrier storage layer 6, as shown in FIG. 12.

<Operation>

FIG. 13 is a graph showing changes in gate-collector capacitance Cgc when the distance Lg is varied. As shown in FIG. 13, the gate-collector capacitance Cgc increases as the distance Lg increases in a region where Lg>Lb. The reason why the gate-collector capacitance Cgc increases as the distance Lg increases is considered to be that the upper part of the first gate sub-portion 14a positioned below the upper part of the carrier storage layer 6 makes it difficult for a depletion layer to expand within the carrier storage layer 6 to prevent a depletion capacitance from lowering.

As the gate-collector capacitance Cgc increases, dV/dt that is variations over time in voltage between the collector and the emitter during the turn-on time period decreases. If a gate resistance Rg is decreased so that dV/dt reaches a predetermined value, dI/dt increases. Thus, the increase in gate-collector capacitance Cgc increases dI/dt to thereby reduce the turn-on power losses.

On the other hand, as the gate-emitter capacitance Cge decreases, dI/dt increases, as mentioned above. For this reason, an increase in Cgc/Cge that is the ratio of the gate-collector capacitance Cgc to the gate-emitter capacitance Cge allows the reduction in turn-on power losses. According to the first modification of the first preferred embodiment, the gate-emitter capacitance Cge is reduced by providing the recessed portion with the bottom farther away from the base layer 5 than the sides thereof in the gate portion 14, and the gate-collector capacitance Cgc is increased by positioning the upper part of the first gate sub-portion 14a below the lower part of the carrier storage layer 6. That is, the first modification of the first preferred embodiment is capable of increasing the ratio Cgc/Cge to thereby reduce the turn-on power losses.

The configuration in which the carrier storage layer 6 is provided is described above. In a configuration in which the carrier storage layer 6 is not provided, it is only necessary that the upper part of the first gate sub-portion 14a is positioned below an upper part of the drift layer 9. Such a configuration is capable of reducing the gate-emitter capacitance Cge to thereby reduce the turn-on power losses.

<Second Modification>

Although the second gate sub-portion 14b faces the source layer 4 across the gate oxide film 8 in the first preferred embodiment as shown in FIG. 1, the present disclosure is not limited to this. For example, the second gate sub-portion 14b may face the contact layer 3 across the gate oxide film 8, as shown in FIG. 14.

Figure 14:
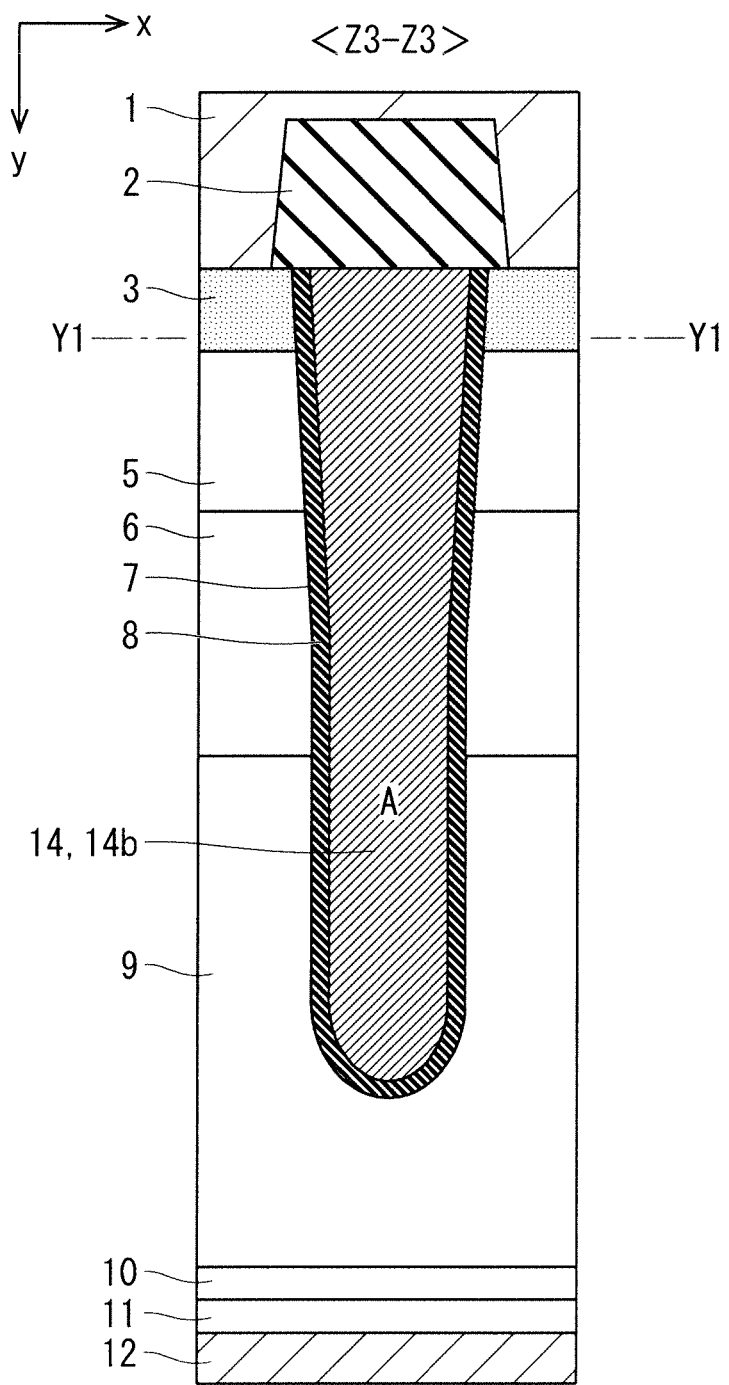
FIG. 14 is a sectional view showing a configuration of a semiconductor element according to a second modification of the first preferred embodiment.
Figure 15:
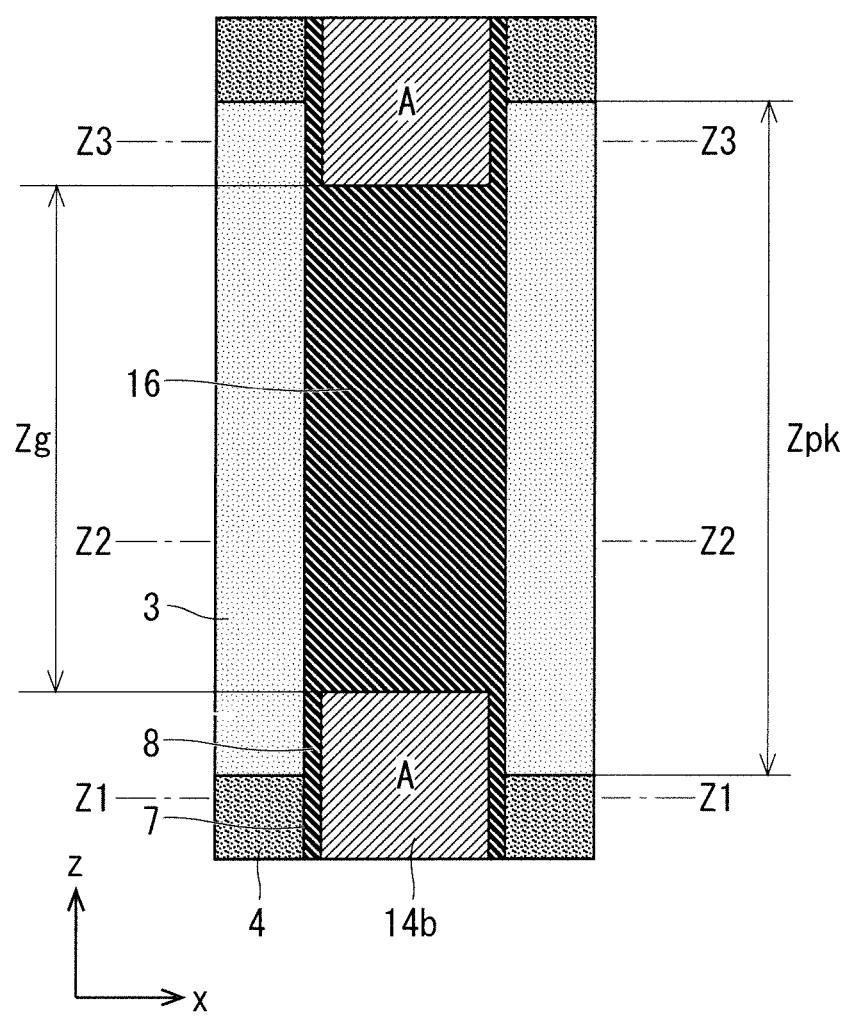
FIGS. 15 and 16 are plan views showing the configuration of the semiconductor element according to the second modification of the first preferred embodiment.
Figure 16:
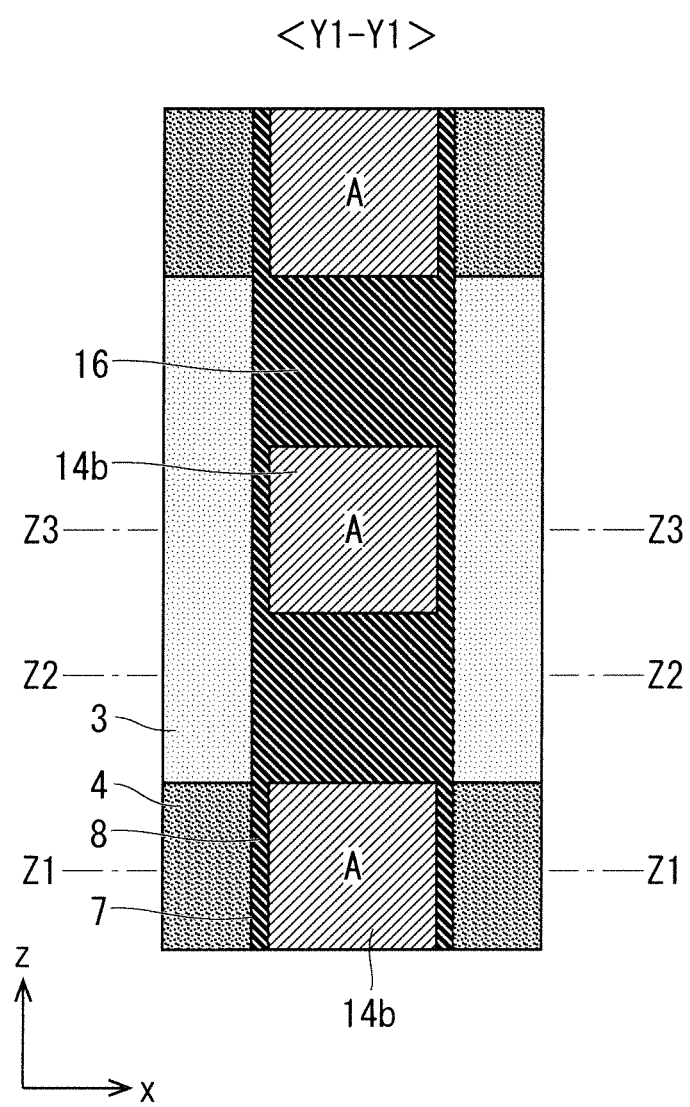

A configuration as shown in FIG. 15 may be made so that the relational expression Zpk>Zg is satisfied where Zpk is the length of the contact layer 3 as measured in the direction of extension (e.g., in the z direction) of the first trench 7 as seen in plan view and Zg is the length of the buried insulation portion 16 as measured in that direction. Also, as shown in FIG. 16, the second gate sub-portion 14b may be provided in the buried insulation portion 16 facing the contact layer 3. The configuration of FIG. 14 corresponds to the configuration of a cross section taken along a line Z3-Z3 in FIGS. 15 and 16.

In the configuration as described above, a p type channel is formed in the base layer 5 facing the second gate sub-portion 14b of FIG. 14 as a path for discharging holes from the drift layer 9 to the contact layer 3 during a turn-off time period. This promotes the discharge of holes to increase latch-up resistance.

<Third Modification>

Figure 17:
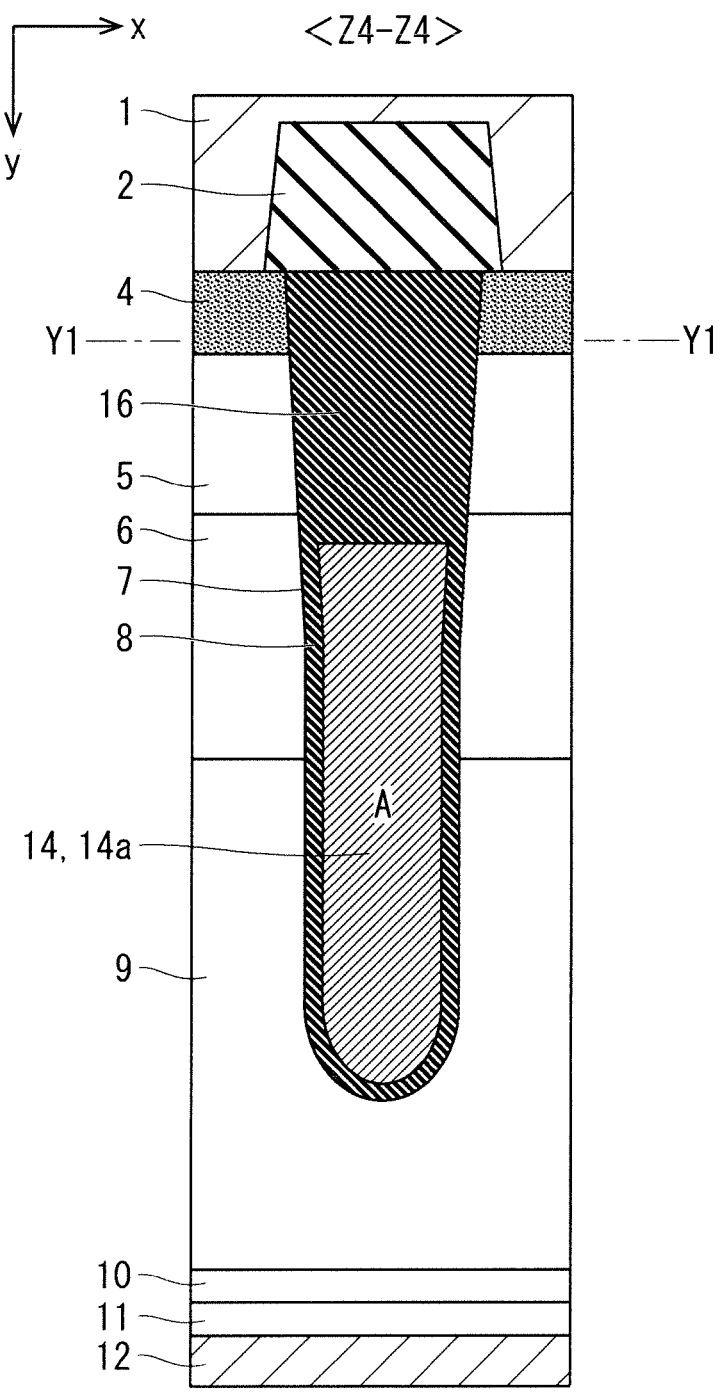
FIG. 17 is a sectional view showing a configuration of a semiconductor element according to a third modification of the first preferred embodiment.

Although the buried insulation portion 16 faces the contact layer 3 in the first preferred embodiment as shown in FIG. 2, the present disclosure is not limited to this. For example, the buried insulation portion 16 may face the source layer 4, as shown in FIG. 17.

Figure 18:
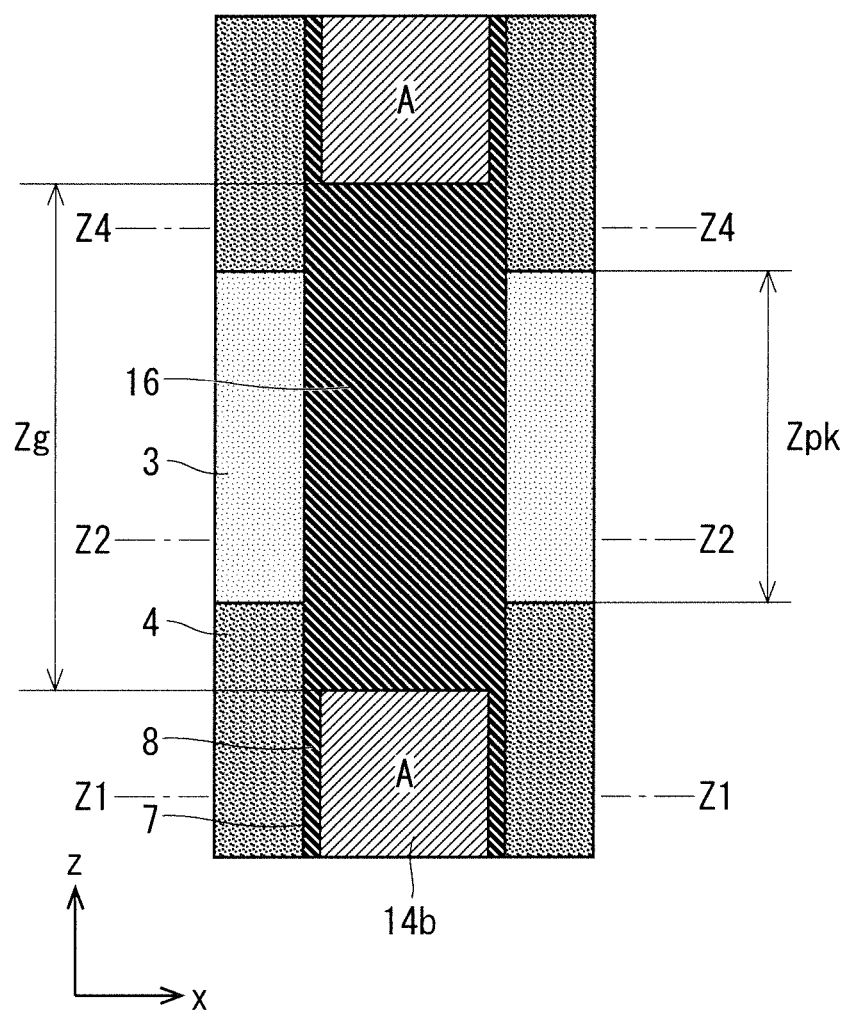
FIGS. 18 to 20 are plan views showing the configuration of the semiconductor element according to the third modification of the first preferred embodiment.

A configuration as shown in FIG. 18 may be made so that the relational expression Zpk<Zg is satisfied where Zpk is the length of the contact layer 3 as measured in the direction of extension (e.g., in the z direction) of the first trench 7 as seen in plan view and Zg is the length of the buried insulation portion 16 as measured in that direction. In other words, the contact layer 3 and the source layer 4 may be disposed to face the single buried insulation portion 16. The configuration of FIG. 17 corresponds to the configuration of a cross section taken along a line Z4-Z4 in FIG. 18.

Figure 127:
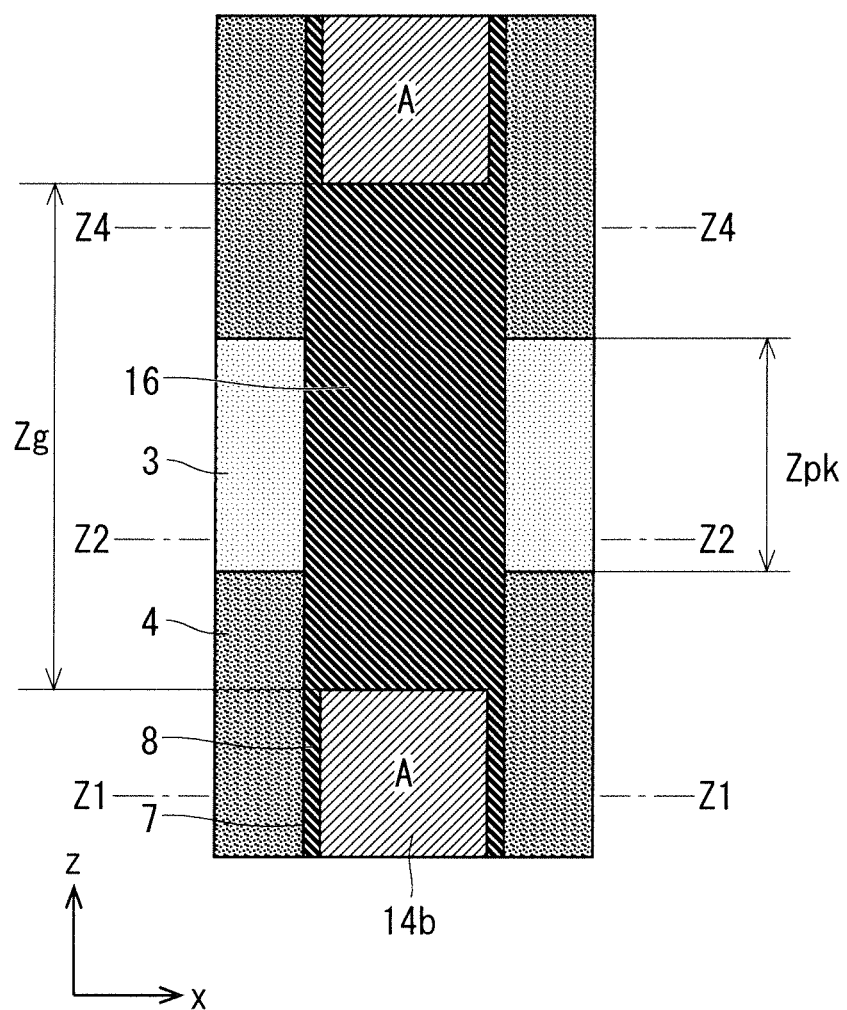
Figure 129:
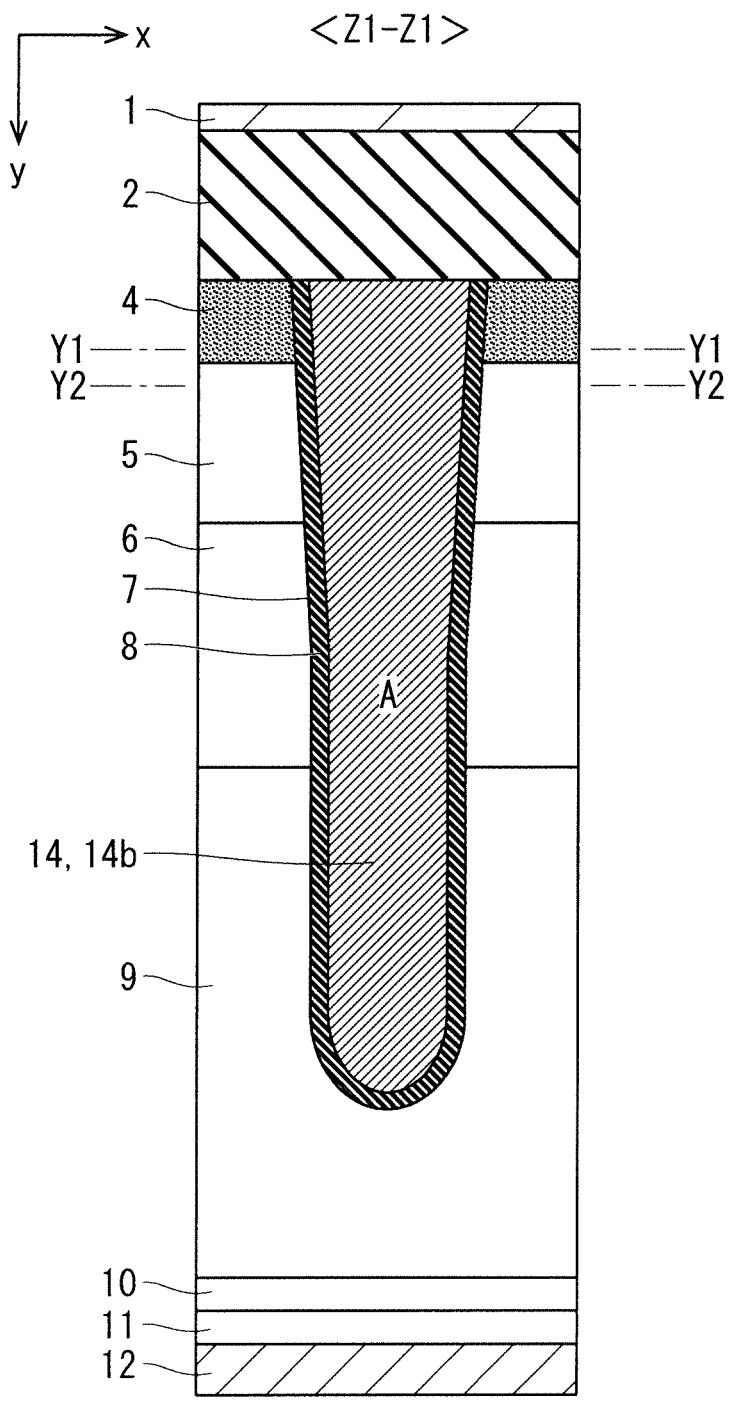
FIGS. 129 to 131 are sectional views showing the configuration of the semiconductor element according to the third modification of the first preferred embodiment.

As shown in FIGS. 126 to 131, the contact layer 3 may be formed deeper than the source layer 4. Then, a configuration may be made so that the relational expressions Zpk<Zg and Zpk<Zpk2 are satisfied where Zpk is the length of part of the contact layer 3 which is positioned at the same depth as the source layer 4 as measured in the direction of extension of the first trench 7 as shown in FIG. 127 and Zpk2 is the length of part of the contact layer 3 which is positioned deeper than the source layer 4 as measured in that direction as shown in FIG. 128. The length Zpk2 may be greater than, less than, or equal to the length Zg.

When the relational expression Zpk<Zg is satisfied so that the length Zpk of the contact layer 3 becomes shorter, the latch-up resistance decreases. However, this configuration is capable of suppressing the decrease in latch-up resistance because the length Zpk2 of part of the contact layer 3 which is positioned deeper than the source layer 4 is longer as shown in FIG. 128.

The upper part of the first gate sub-portion 14a is positioned below an upper part of the second gate sub-portion 14b. For this reason, the emitter electrode 1 does not contact the gate electrode even if the emitter electrode 1 is provided on the buried insulation portion 16 so as to face the first gate sub-portion 14a across the buried insulation portion 16.

Figure 130:
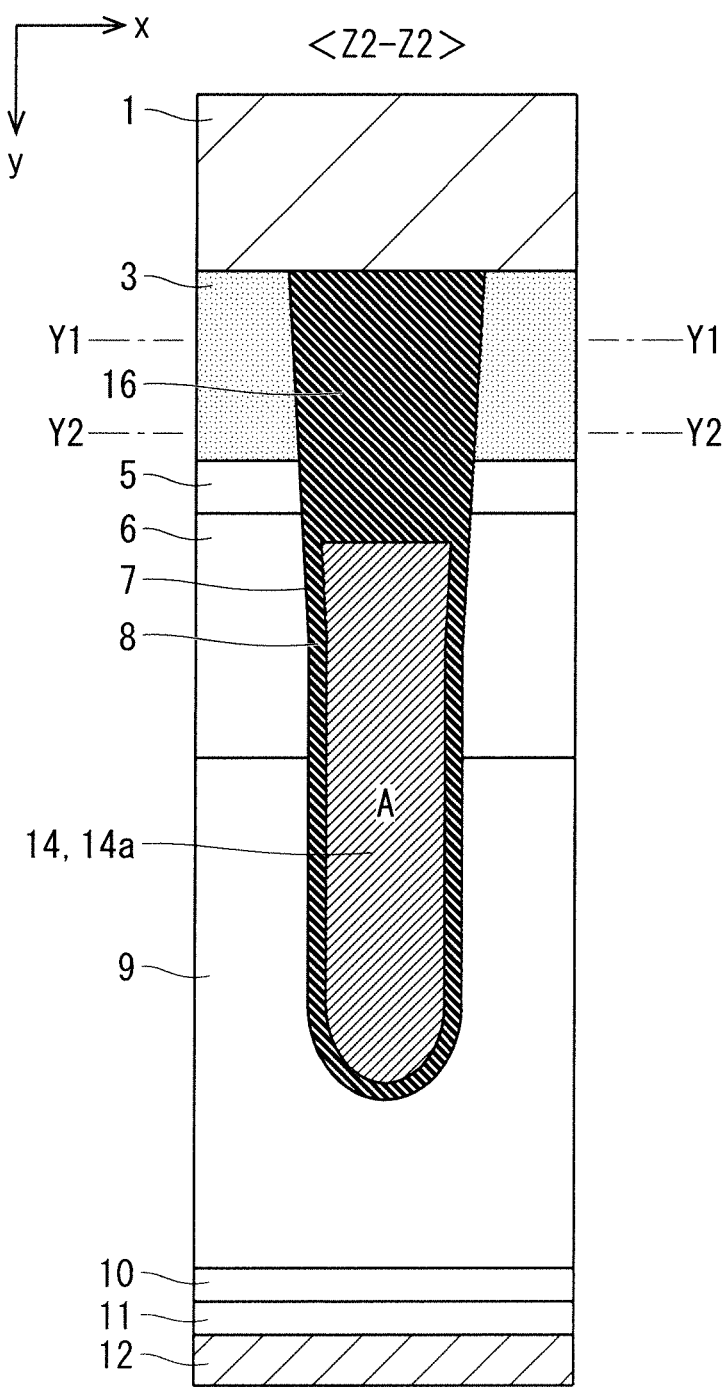
Figure 131:
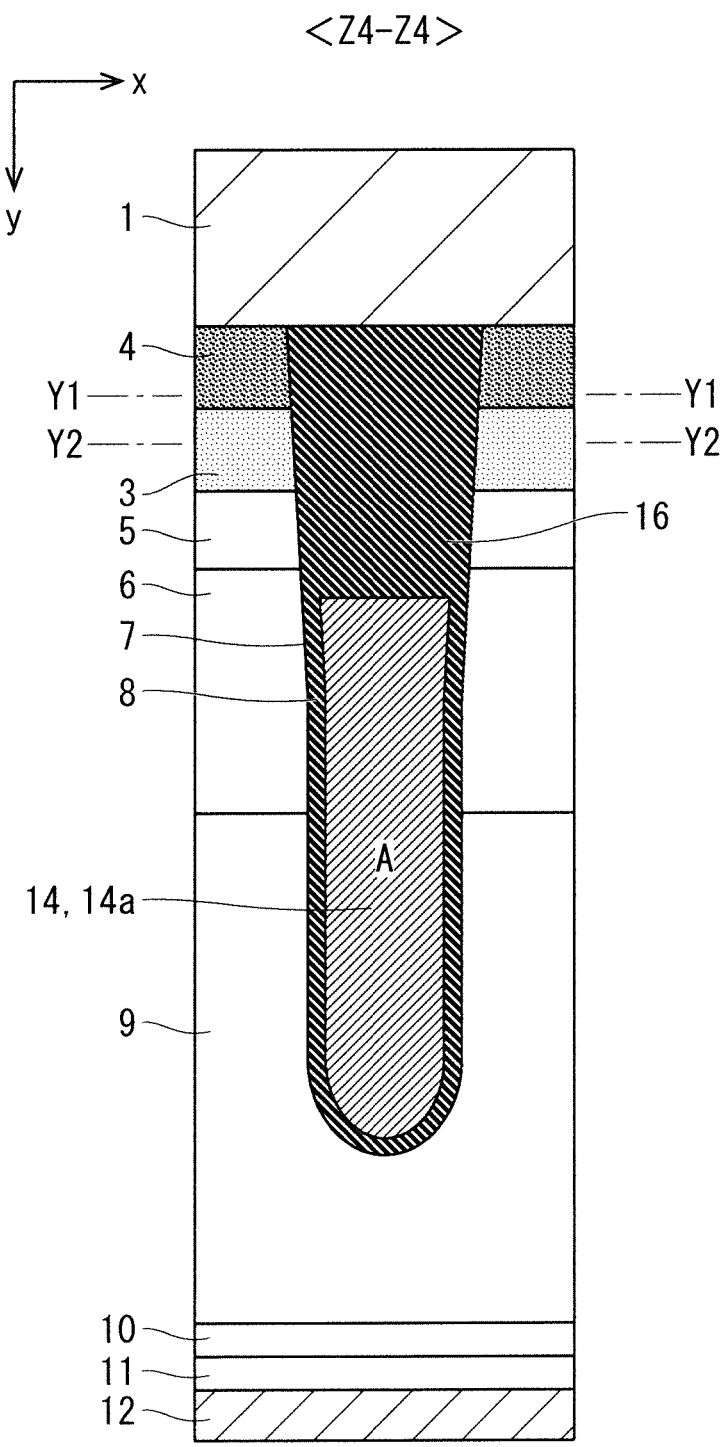

Thus, as shown in FIGS. 130 and 131, the emitter electrode 1 may be provided on the buried insulation portion 16 so as to face the first gate sub-portion 14a across the buried insulation portion 16. In that configuration, the emitter electrode 1 may be in ohmic contact with the source layer 4 and the contact layer 3. Such a configuration substantially eliminates the limitations caused by the distance between the emitter electrode 1 and the gate portion 14 and caused by the distance between the emitter electrode 1 and the first trench 7. This accordingly reduces the mesa width to consequently reduce the on-state voltage.

Figure 19:
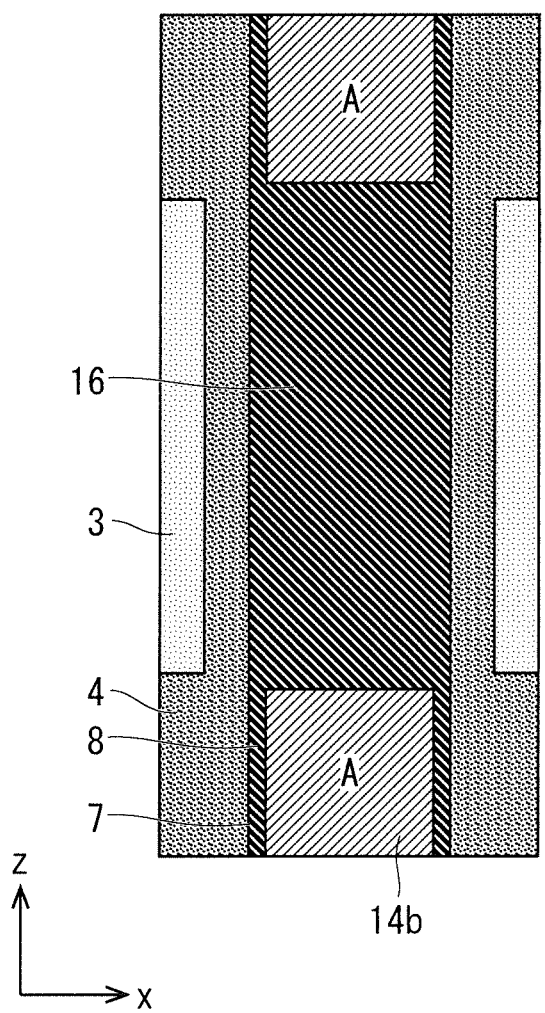
Figure 20:
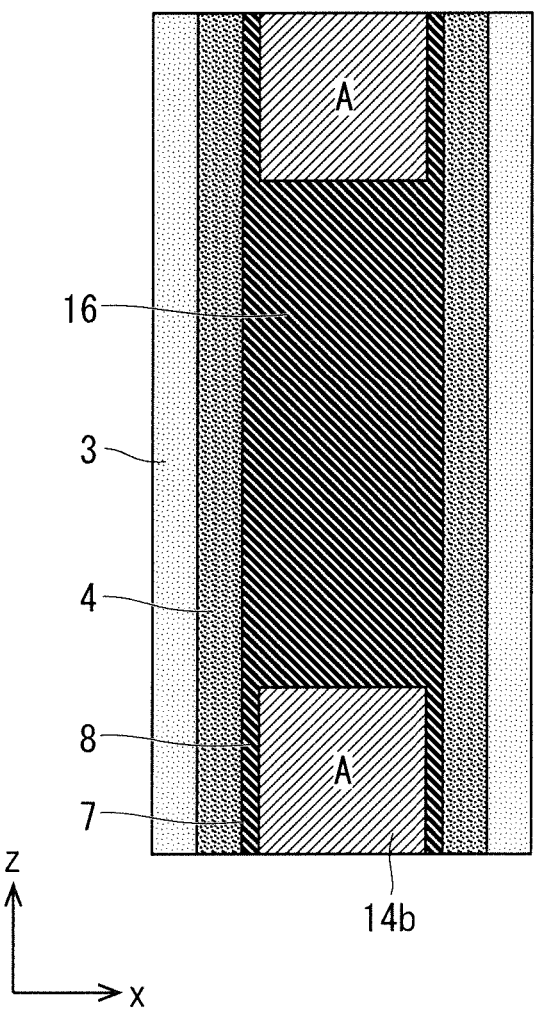

As shown in FIGS. 19 and 20, a planar layout may be used in which the buried insulation portion 16 faces the contact layer 3 across the source layer 4.

In the configuration as described above, even if the source layer 4 is formed out of position due to manufacturing variations in the photolithographic step, variations in channel width are suppressed because the source layer 4 is provided also on the first gate sub-portion 14a side. This suppresses fluctuations in properties such as a threshold voltage Vth.

<Fourth Modification>

Figure 21:
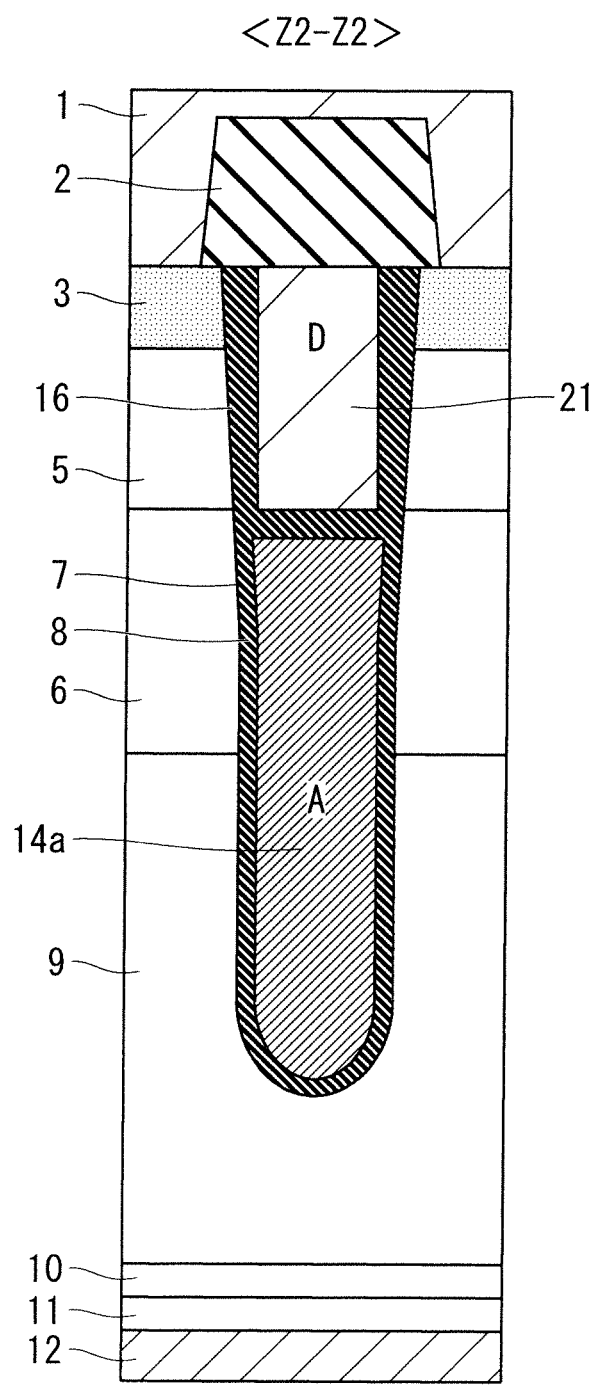
FIGS. 21 to 23 are sectional views showing a configuration of a semiconductor element according to a fourth modification of the first preferred embodiment.

Although the gate portion 14 and the buried insulation portion 16 are provided in the first trench 7 in the first preferred embodiment as shown in FIG. 2, the present disclosure is not limited to this. For example, as shown in FIG. 21, a dummy portion 21 made of polysilicon, insulated from the gate portion 14, and electrically connected to the emitter electrode 1 may be further provided in the first trench 7. In that configuration, the dummy portion 21 may be insulated from the gate portion 14 by the buried insulation portion 16. The provision of the dummy portion 21 achieves better burying in the first trench 7. In the configurations described above, the recessed portion of the gate portion 14 is buried with an insulator such as an oxide film. However, a cavity is formed in the buried insulation portion 16 in some cases depending on process conditions. On the other hand, the formation of the aforementioned cavity is suppressed by burying the dummy portion 21 made of polysilicon or the like having good filling properties in the buried insulation portion 16 as in the fourth modification of the first preferred embodiment.

Although the interlayer insulation film 2 is provided on the dummy portion 21 in the example of FIG. 21, the present disclosure is not limited to this. For example, the dummy portion 21 may be electrically connected to the emitter electrode 1 without providing the interlayer insulation film 2 on the dummy portion 21.

Figure 132:
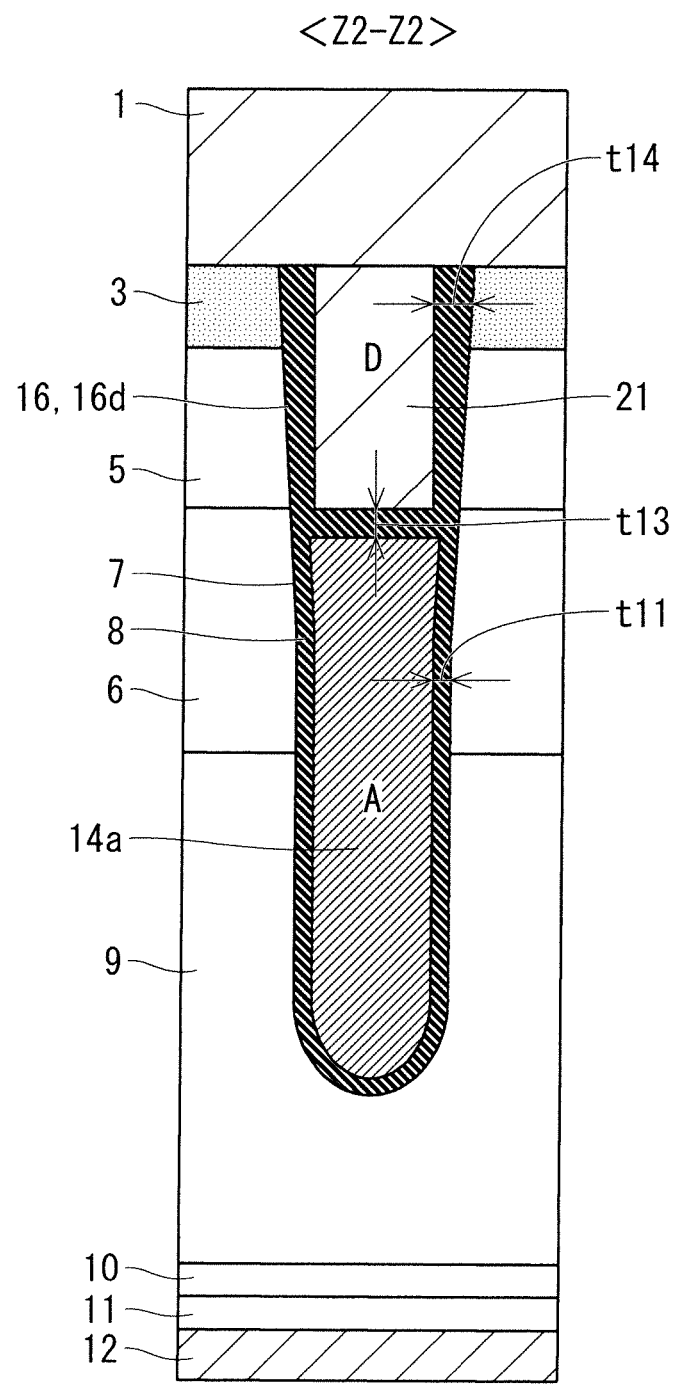
FIGS. 132 and 133 are sectional views showing the configuration of the semiconductor element according to the fourth modification of the first preferred embodiment.
Figure 133:
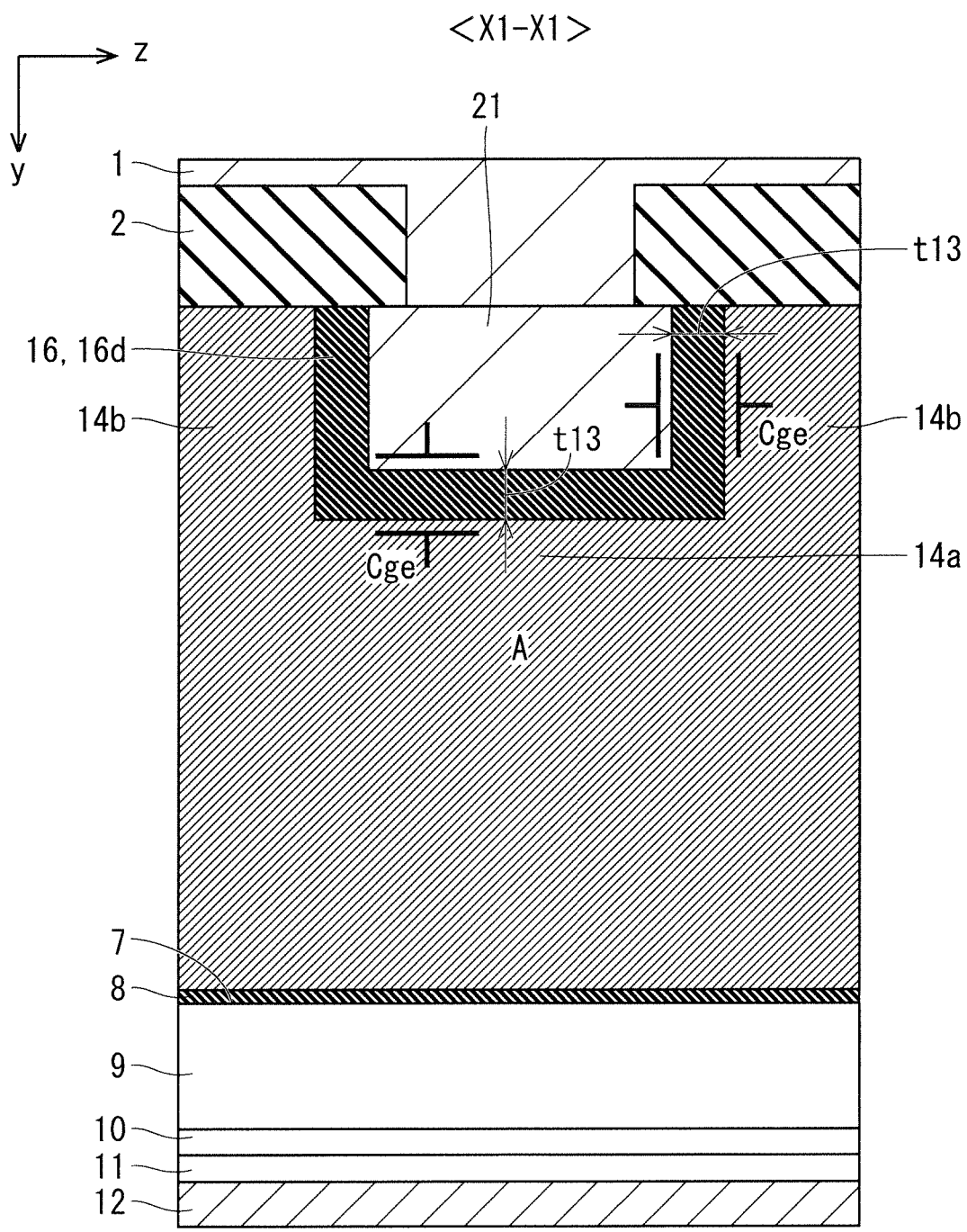
Figure 134:
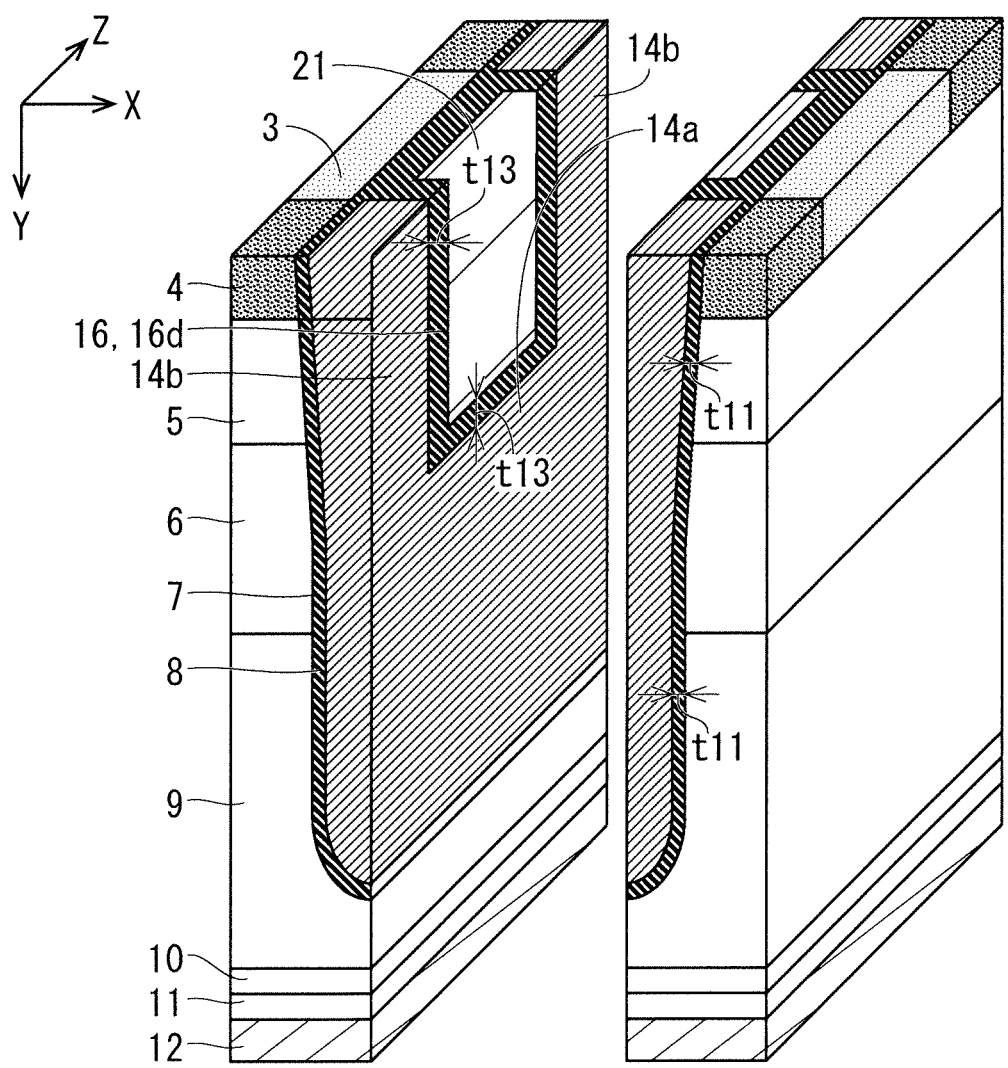
FIG. 134 is a perspective view showing the configuration of the semiconductor element according to the fourth modification of the first preferred embodiment.

As shown in FIG. 132, part of the buried insulation portion 16 which is in contact with the dummy portion 21 may be formed as a dummy oxide film 16d which has a thickness greater than that of the gate oxide film 8. The reason therefor is that the gate-emitter capacitance Cge is generated between the bottom and side portions of the dummy portion 21 and the recessed portion of the gate portion 14, as shown in FIG. 133. The gate-emitter capacitance Cge is reduced by making the thickness t13 of the dummy oxide film 16d greater than the thickness t11 of the gate oxide film 8, as shown in FIGS. 132 to 134.

Also, the burying width of the dummy portion 21 is decreased by making the thickness t14 of the dummy oxide film 16d between the dummy portion 21 and the source layer 4 greater than the thickness t11 of the gate oxide film 8. This suppresses the formation of the cavity in the polysilicon of the dummy portion 21. In other words, this achieves better burying of polysilicon.

FIG. 135 is a graph showing changes in gate-emitter capacitance Cge when the thickness t13 is varied. The abscissa of FIG. 135 represents the value obtained by dividing the thickness t13 by the thickness t11. When the thickness t13 is equal to the thickness t11, that is, when the value on the abscissa of FIG. 135 is 1, the gate-emitter capacitance Cge is higher than that in a related structure provided with no recessed portion in the gate portion 14 because of the gate-emitter capacitance Cge between the dummy portion 21 and the gate portion 14. For reduction in gate-emitter capacitance Cge below that in the related structure, a range satisfying t13/t11≥2 is preferable, and a range satisfying t13/t11≥3 is more preferable. This approaches the gate-emitter capacitance Cge of the first preferred embodiment in which no dummy portion 21 is provided to generate no gate-emitter capacitance Cge between the dummy portion 21 and the gate portion 14. In other words, this sufficiently reduces the gate-emitter capacitance Cge between the dummy portion 21 and the gate portion 14. The thickness t13 may be greater than, less than, or equal to the thickness t14.

Figure 22:
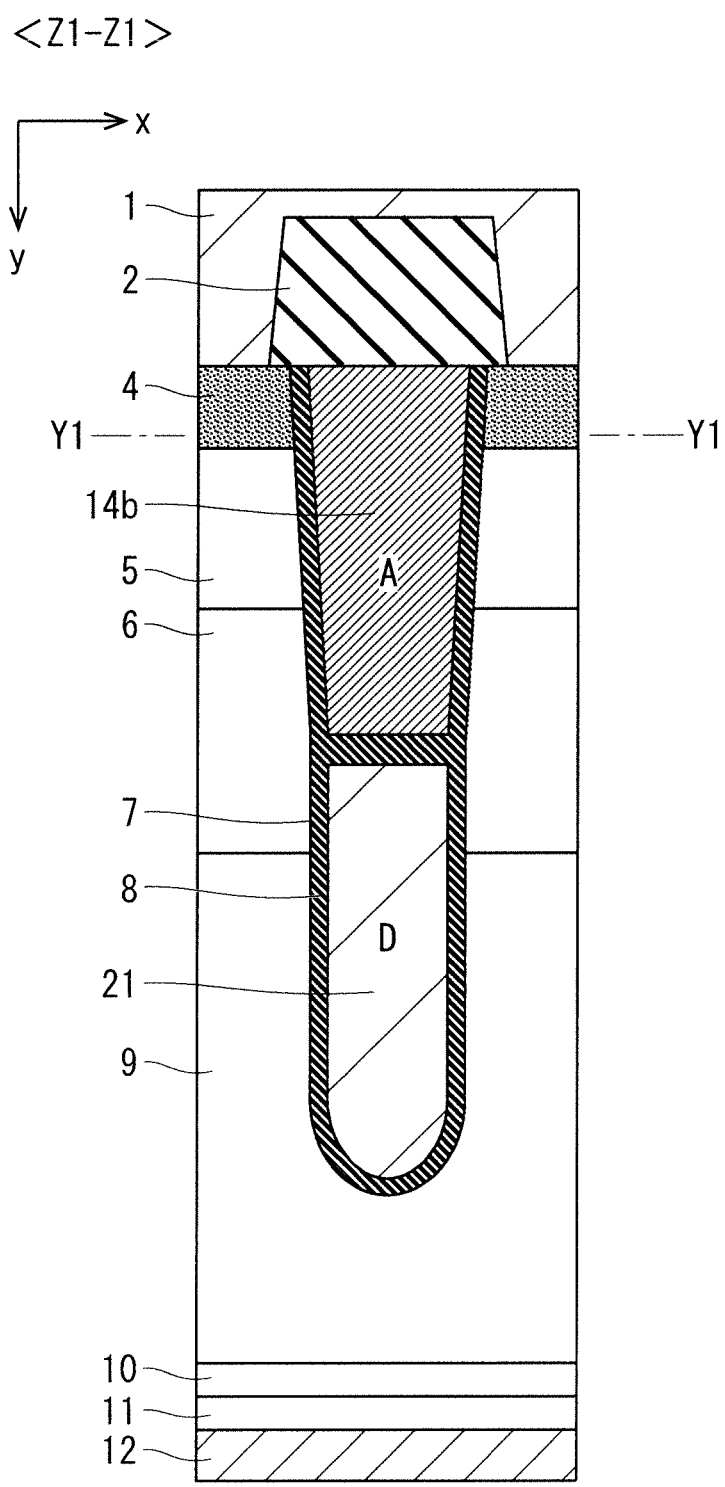
Figure 23:
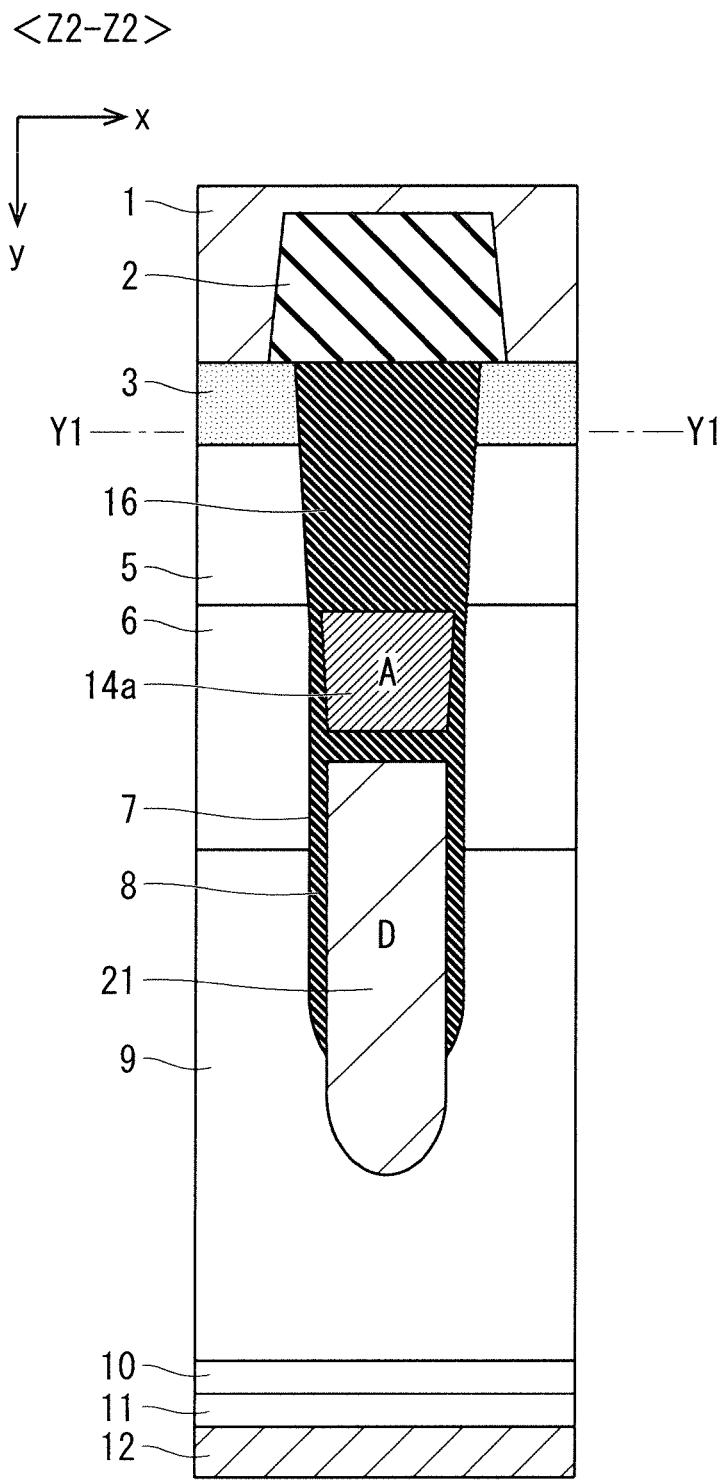

As shown in FIGS. 22 and 23, the dummy portion 21 may be provided below the gate portion 14 while being insulated from the gate portion 14 by the gate oxide film 8 or the like.

The aforementioned configuration is also capable of reducing the gate-emitter capacitance Cge.

<Fifth Modification>

Figure 24:
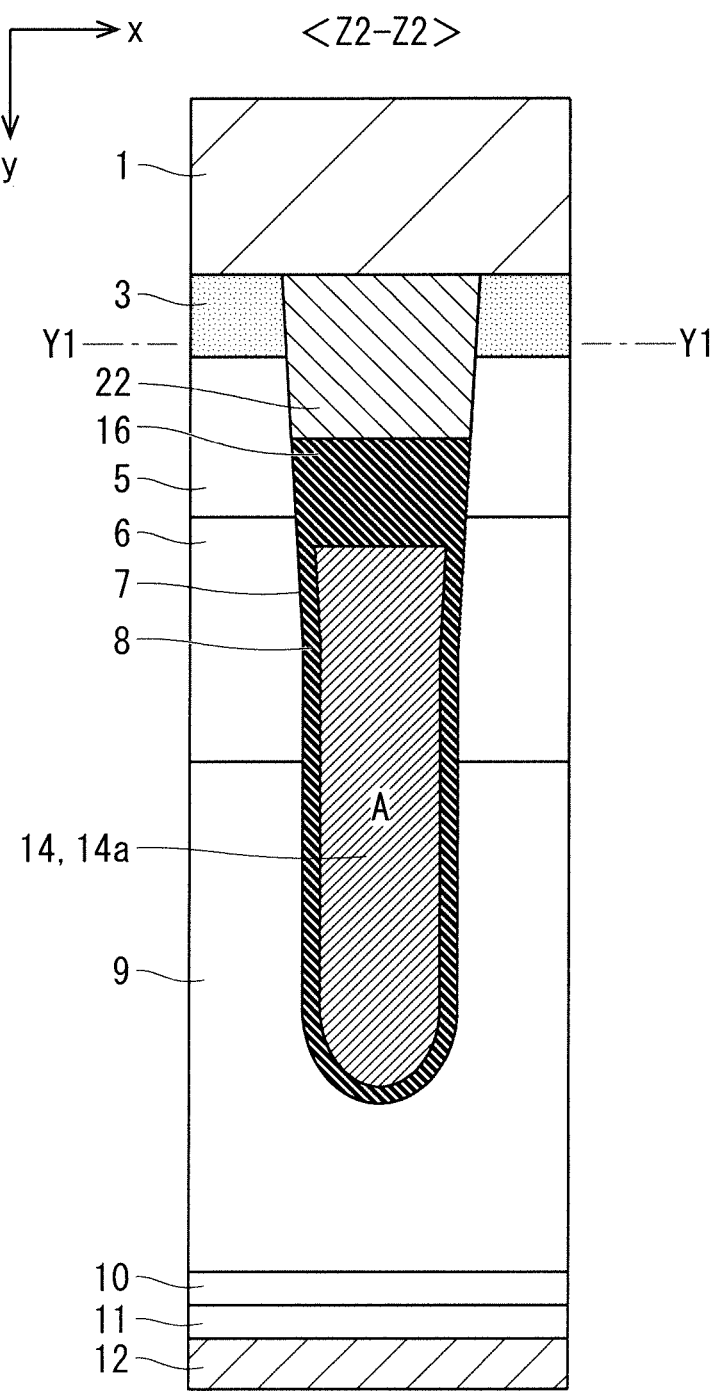
FIG. 24 is a sectional view showing a configuration of a semiconductor element according to a fifth modification of the first preferred embodiment.
Figure 25:
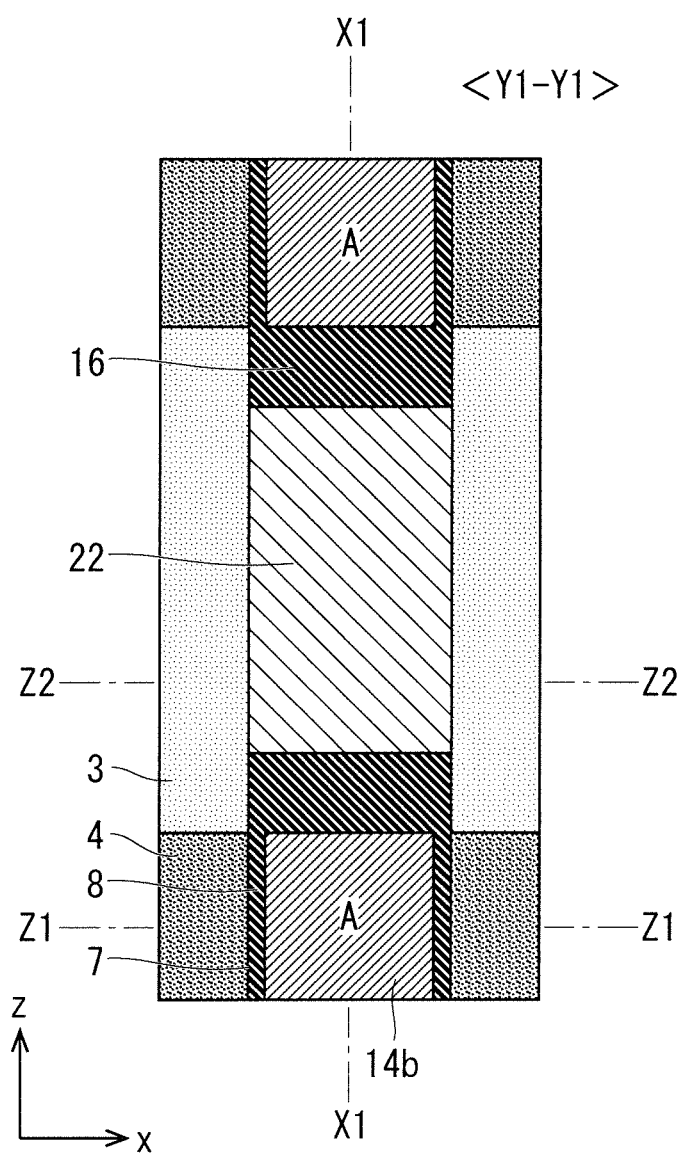
FIG. 25 is a plan view showing the configuration of the semiconductor element according to the fifth modification of the first preferred embodiment.
Figure 26:
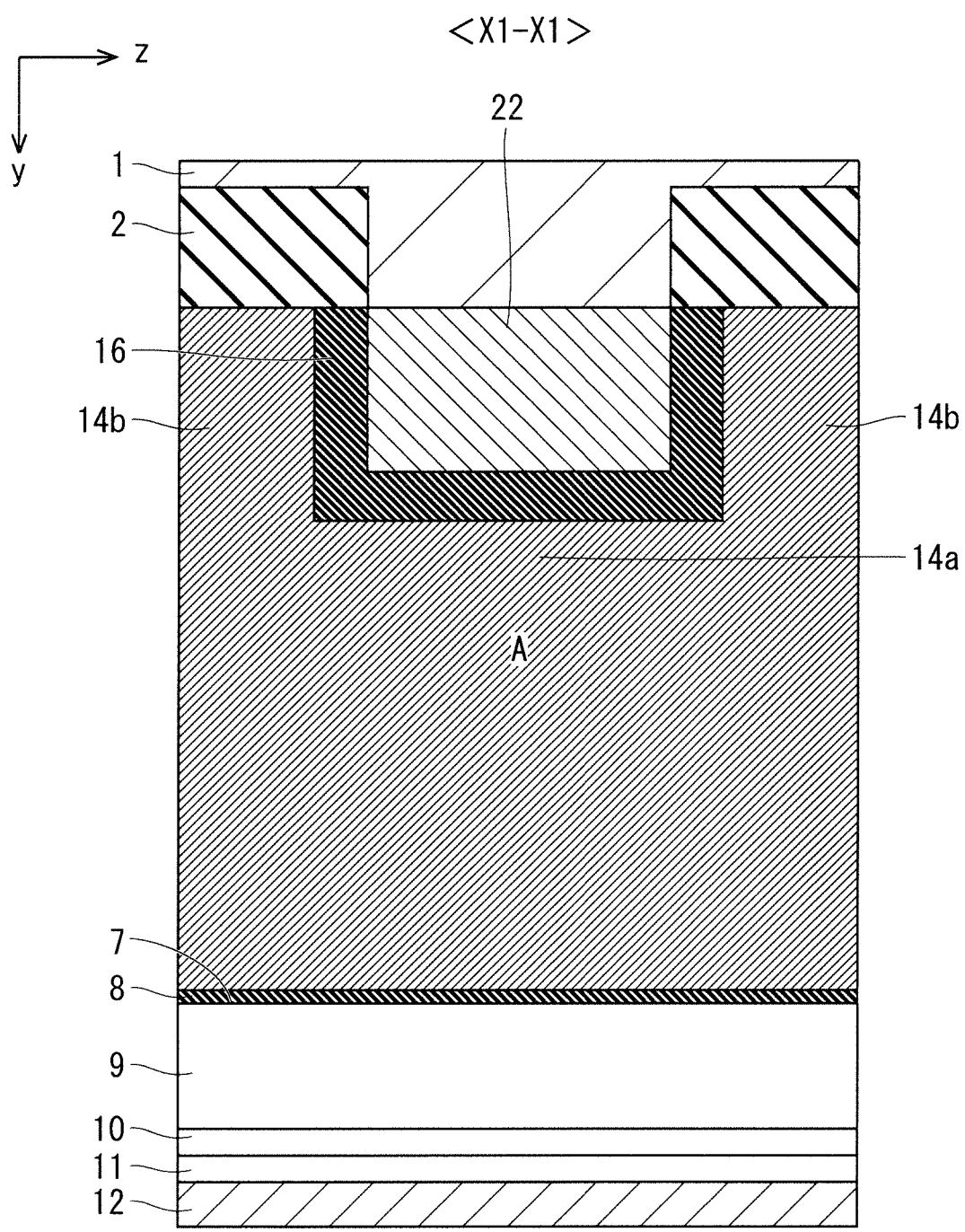
FIG. 26 is a sectional view showing the configuration of the semiconductor element according to the fifth modification of the first preferred embodiment.

Although the gate portion 14 and the buried insulation portion 16 are provided in the first trench 7 in the first preferred embodiment as shown in FIG. 2, the present disclosure is not limited to this. For example, as shown in FIG. 24, a buried metal portion 22 that is a metal portion insulated from the gate portion 14 by the buried insulation portion 16 and electrically connected to the emitter electrode 1 may be further provided in the first trench 7. The buried metal portion 22 may or may not be part of the emitter electrode 1. FIG. 25 is a sectional view similar to FIG. 3 and showing a configuration of a fifth modification of the first preferred embodiment, and FIG. 26 is a sectional view similar to FIG. 4 and showing the configuration of the fifth modification.

In the configuration of FIG. 24, the buried metal portion 22 may be in ohmic contact with at least one of the contact layer 3 and the source layer 4. In this manner, the configuration in which the buried metal portion 22 is in ohmic contact with at least one of the contact layer 3 and the source layer 4 increases a contact area to reduce a contact resistance.

<Sixth Modification>

Figure 27:
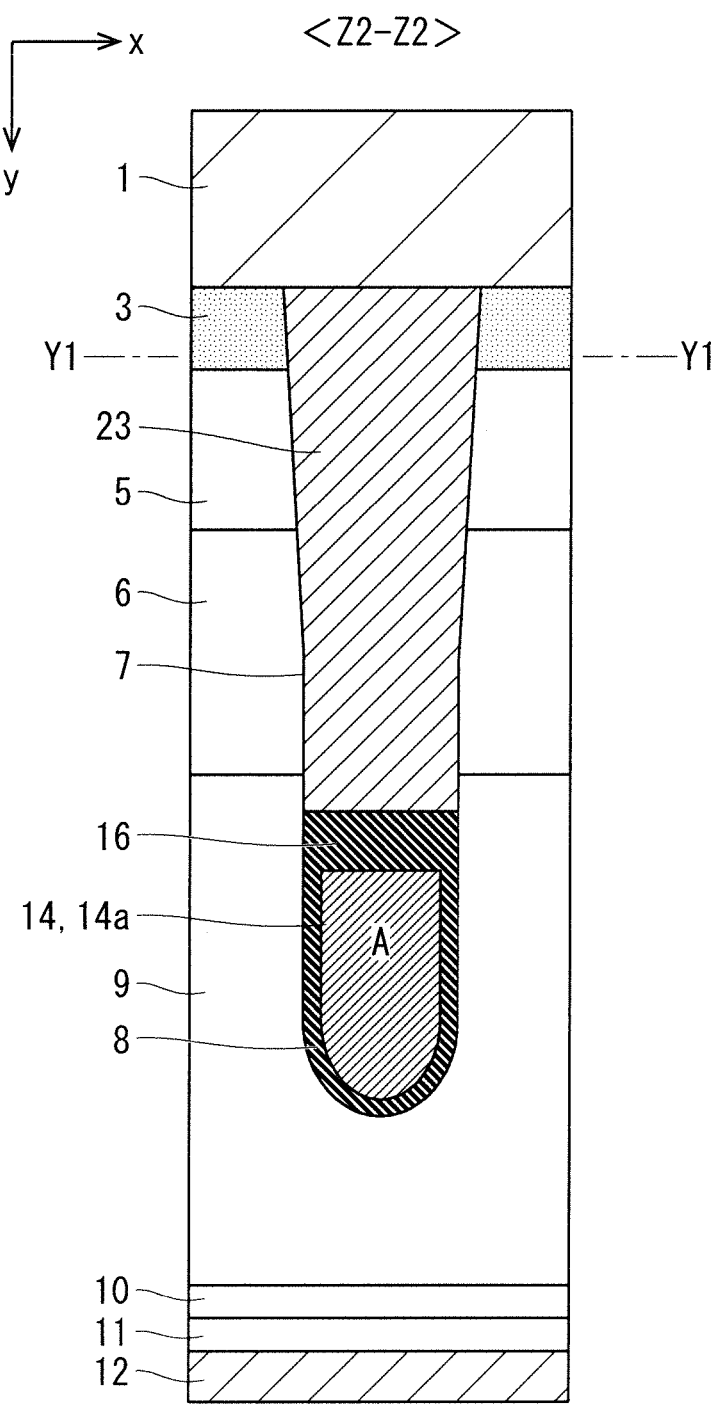
FIG. 27 is a sectional view showing a configuration of a semiconductor element according to a sixth modification of the first preferred embodiment.

Although the gate portion 14 and the buried insulation portion 16 are provided in the first trench 7 in the first preferred embodiment as shown in FIG. 2, the present disclosure is not limited to this. For example, as shown in FIG. 27, a Schottky metal portion 23 that is a metal portion insulated from the gate portion 14 by the buried insulation portion 16 and electrically connected to the emitter electrode 1 may be further provided in the first trench 7.

The Schottky metal portion 23 is in Schottky contact with at least one of the carrier storage layer 6 and the drift layer 9. The Schottky metal portion 23 may have the function of a diode. Such a configuration, which allows a Schottky current to flow, is capable of reducing a hole density to reduce recovery losses.

<Seventh Modification>

As shown in FIG. 28, the first trench 7 as seen in cross section may include a first portion 7b in which the first gate sub-portion 14a is positioned, and a second portion 7c in which the buried insulation portion 16 is positioned. The second portion 7c is wider than the first portion 7b. Such a configuration, which reduces the width of the mesa region between first trenches 7, is capable of enhancing an electron injection promoting effect (i.e., an IE effect) to reduce the on-state voltage.

<Eighth Modification>

Figure 29:
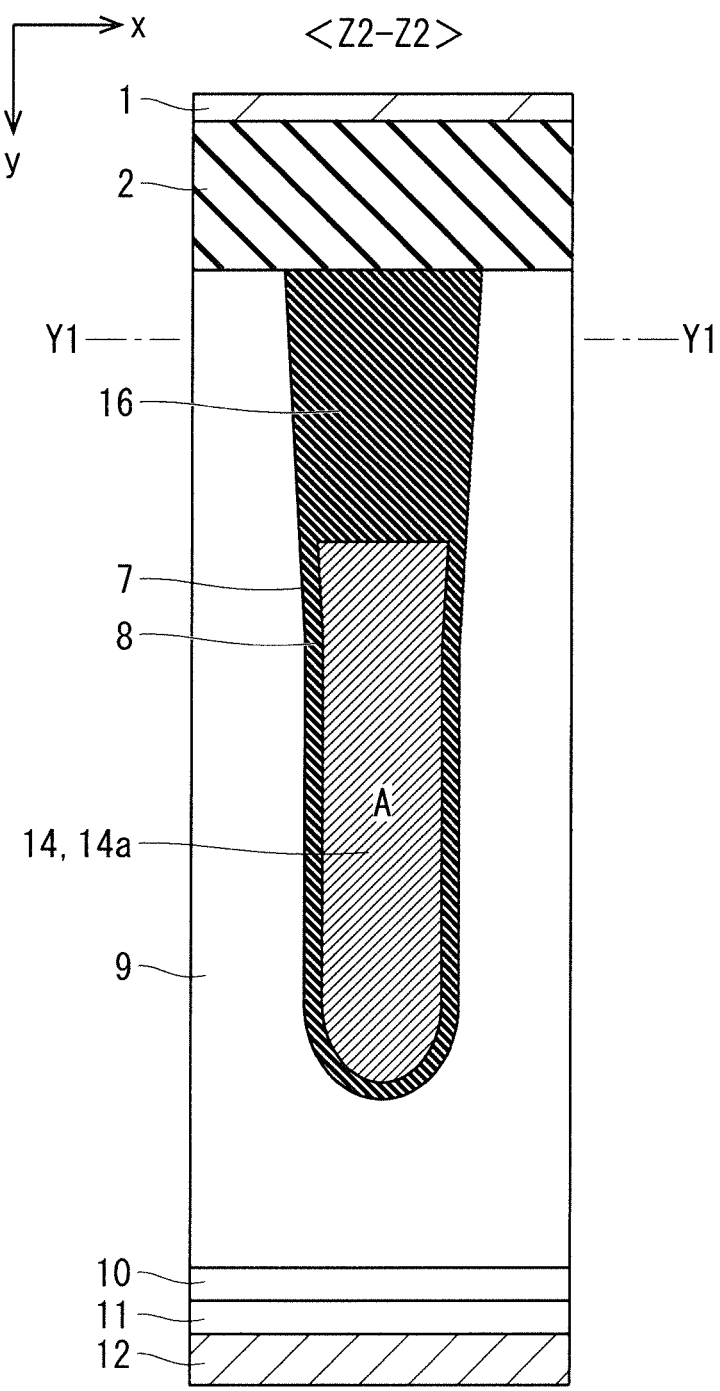
FIGS. 29 and 30 are sectional views showing a configuration of a semiconductor element according to an eighth modification of the first preferred embodiment.

As shown in FIG. 29, the buried insulation portion 16 may be configured to contact part of the semiconductor substrate other than the base layer 5, for example, the drift layer 9. In general, during the turn-on time period, holes fluctuate a potential in and below the base layer 5 to generate a displacement current flowing into the gate portion 14, thereby fluctuating a gate potential in some cases. On the other hand, the configuration as shown in FIG. 29 is capable of suppressing the fluctuations in gate potential by selectively thinning out the base layer 5 in which a channel is formed.

Figure 30:
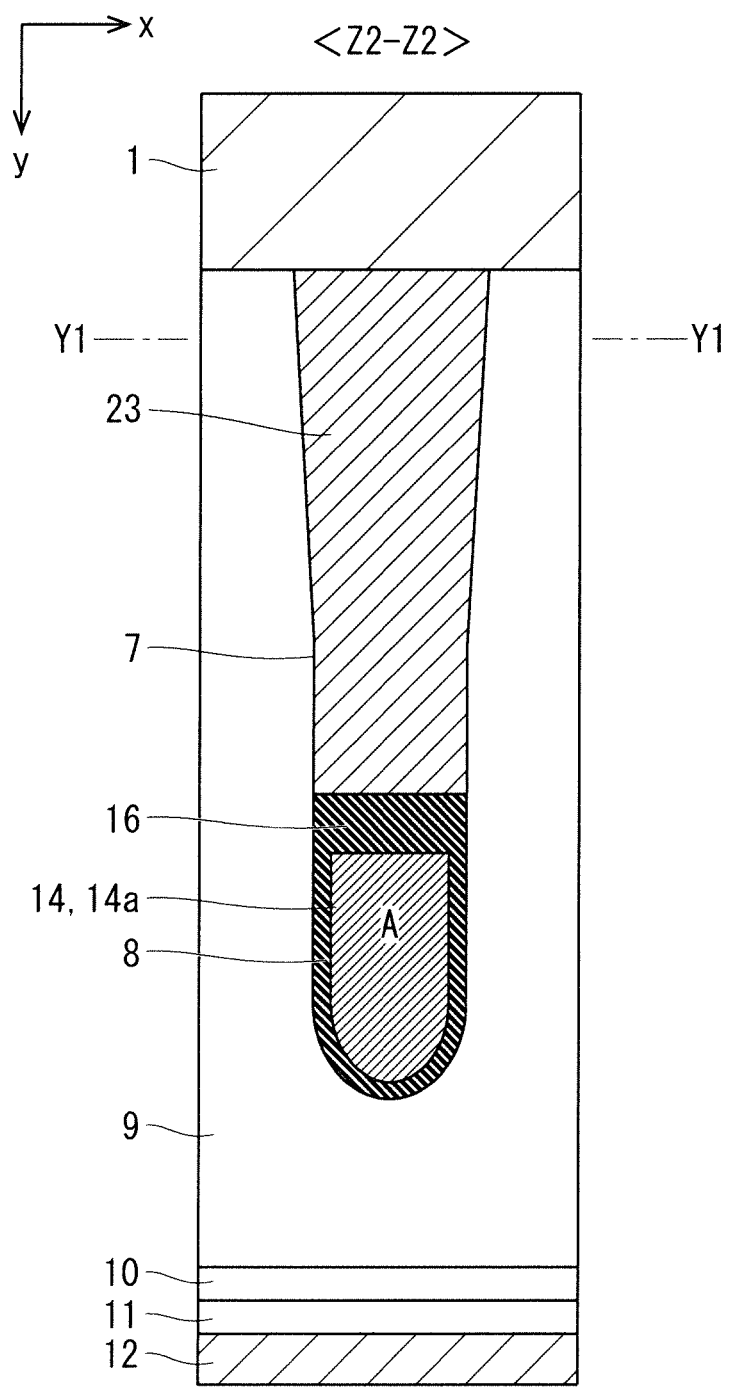

As shown in FIG. 30, the Schottky metal portion 23 of FIG. 27 may be configured to be in Schottky contact with part of the semiconductor substrate other than the base layer 5, for example, the drift layer 9. Such a configuration increases a Schottky junction area to allow a Schottky current to flow, thereby reducing the recovery losses.

Second Preferred Embodiment

Figure 31:
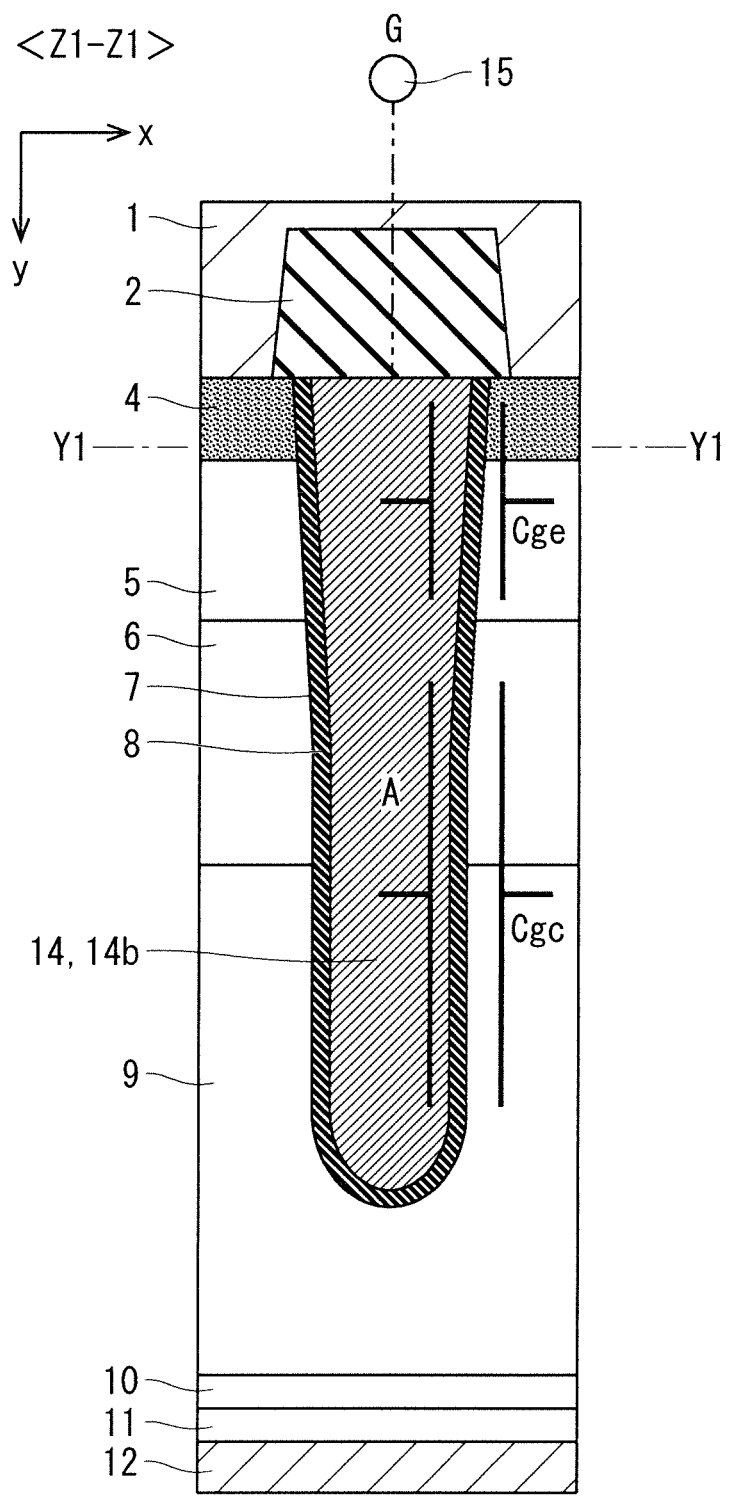
FIGS. 31 and 32 are sectional views showing a configuration of a semiconductor element according to a second preferred embodiment.
Figure 32:
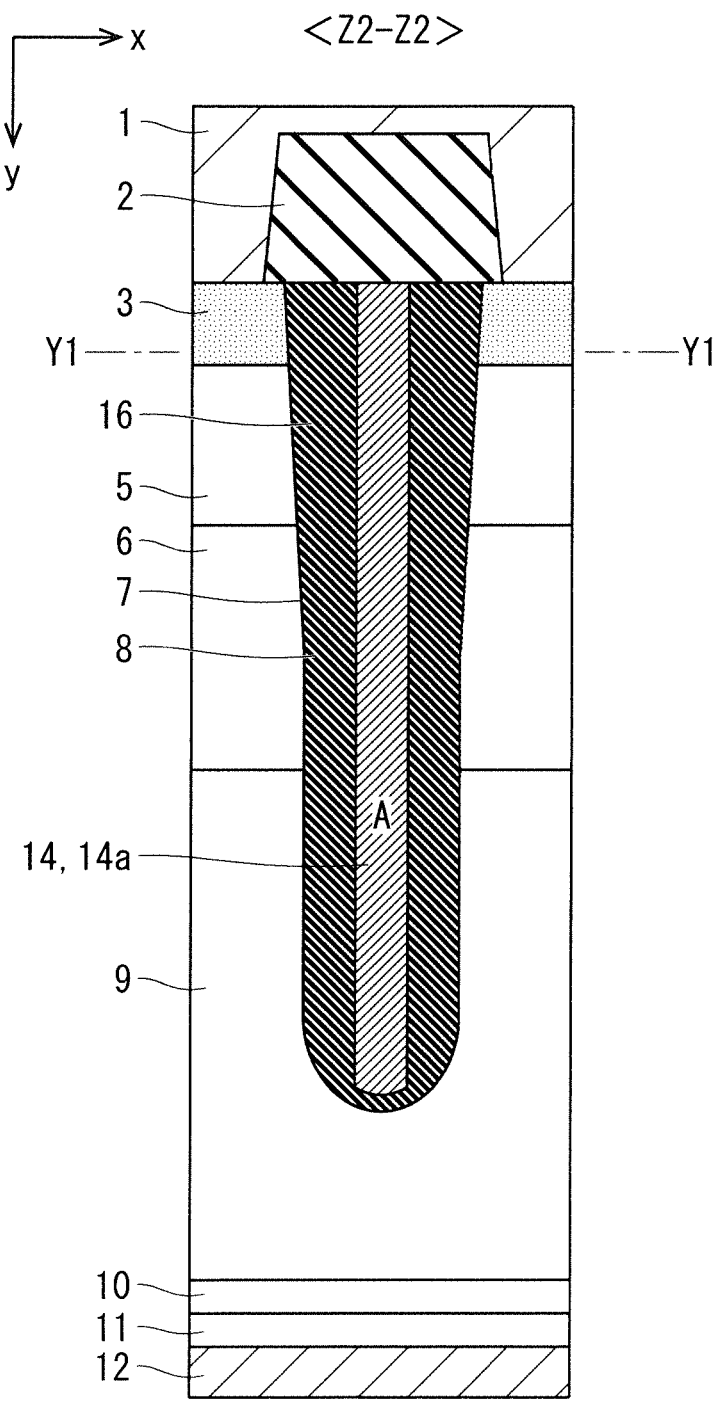
Figure 34:
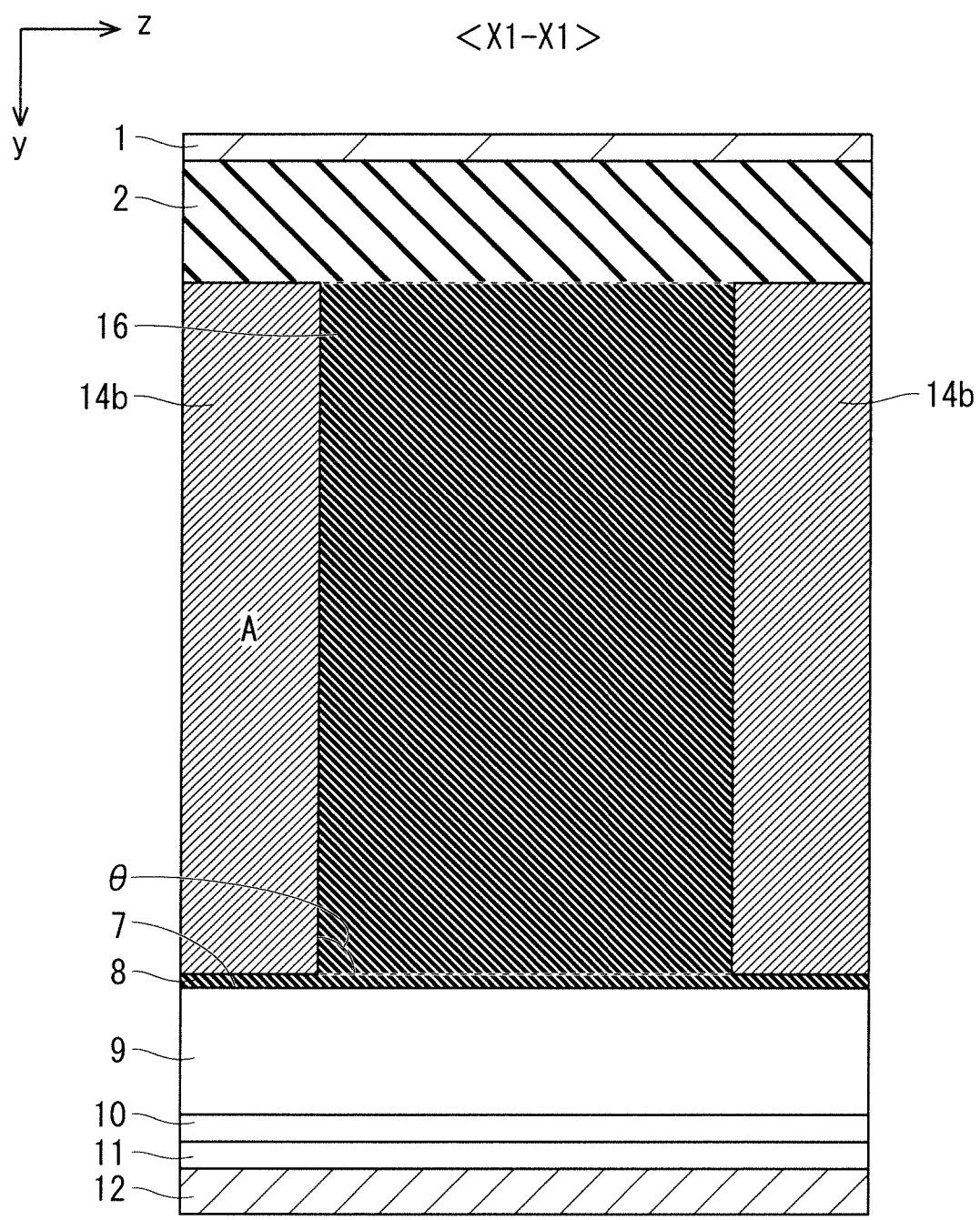
FIG. 34 is a sectional view showing the configuration of the semiconductor element according to the second preferred embodiment.

FIGS. 31 and 32 are sectional views showing a configuration of a semiconductor element included in a semiconductor device according to a second preferred embodiment. FIG. 33 is a plan view showing the configuration of the semiconductor element. FIG. 34 is a sectional view showing the configuration of the semiconductor element. Specifically, FIG. 31 is a sectional view taken along the line Z1-Z1 of FIG. 33, and FIG. 32 is a sectional view taken along the line Z2-Z2 of FIG. 33. FIG. 34 is a sectional view taken along the line X1-X1 of FIG. 33, and FIG. 33 is a plan view taken along the line Y1-Y1 of FIGS. 31 and 32.

As in the first preferred embodiment, the gate portion 14 in the second preferred embodiment has a recessed portion, and the bottom of the recessed portion is farther away from the base layer 5 than the sides of the recessed portion. While the recessed portion has an opening facing upward in the first preferred embodiment, the recessed portion has an opening facing sideward in the second preferred embodiment. The second preferred embodiment will be described below.

As the active trench A, the gate portion 14 is provided in the first trench 7 of the semiconductor substrate, with the gate oxide film 8 therebetween. The gate portion 14 includes the first gate sub-portion 14a shown in FIGS. 32 and 33, and the second gate sub-portion 14b shown in FIGS. 31 and 33 and protruding sidewardly (e.g., in the x direction) beyond the first gate sub-portion 14a. The second gate sub-portion 14b is connected to the first gate sub-portion 14a in the direction of extension (e.g., in the z direction) of the first trench 7 shown in FIG. 33 as seen in plan view, and faces the source layer 4 and the base layer 5 across the gate oxide film 8, as shown in FIG. 31. The gate portion 14 is made of polysilicon in the second preferred embodiment, but is not limited to this.

The gate portion 14 has the recessed portion. As shown in FIG. 33, the first gate sub-portion 14a includes the bottom of the recessed portion of the gate portion 14, and the second gate sub-portion 14b includes the sides of the recessed portion of the gate portion 14. The bottom of the recessed portion is farther away from the base layer 5 than the sides of the recessed portion. In other words, the distance between the bottom of the recessed portion and the base layer 5 is greater than the distance between the sides of the recessed portion and the base layer 5. In the second preferred embodiment, the second gate sub-portion 14b protrudes from both sides of the first gate sub-portion 14a as seen in plan view, and the recessed portion is provided on each side of the gate portion 14.

The buried insulation portion 16 is provided in the recessed portion of the gate portion 14. The buried insulation portion 16 may or may not include part of the gate oxide film 8, so long as the buried insulation portion 16 is thicker than the gate oxide film 8. The buried insulation portion 16 faces the contact layer 3, the base layer 5, the carrier storage layer 6, and the drift layer 9.

The buried insulation portion 16 is capable of reducing not only the gate-emitter capacitance Cge but also the gate-collector capacitance Cgc. In the first preferred embodiment, it is described that the gate-collector capacitance Cgc is increased by adjusting the gate resistance Rg so that dV/dt reaches a predetermined value, whereby the turn-on power losses are reduced. On the other hand, the reason why the gate-collector capacitance Cgc is made smaller in the second preferred embodiment is that the use to which the second preferred embodiment is applied is to adjust the gate resistance Rg so that dI/dt reaches a predetermined value, and the turn-on power losses are reduced by making the gate-collector capacitance Cgc smaller for this use.

<Manufacturing Method>

Next, principal parts of an example of a method of manufacturing the semiconductor element according to the second preferred embodiment will be described.

Figure 35:
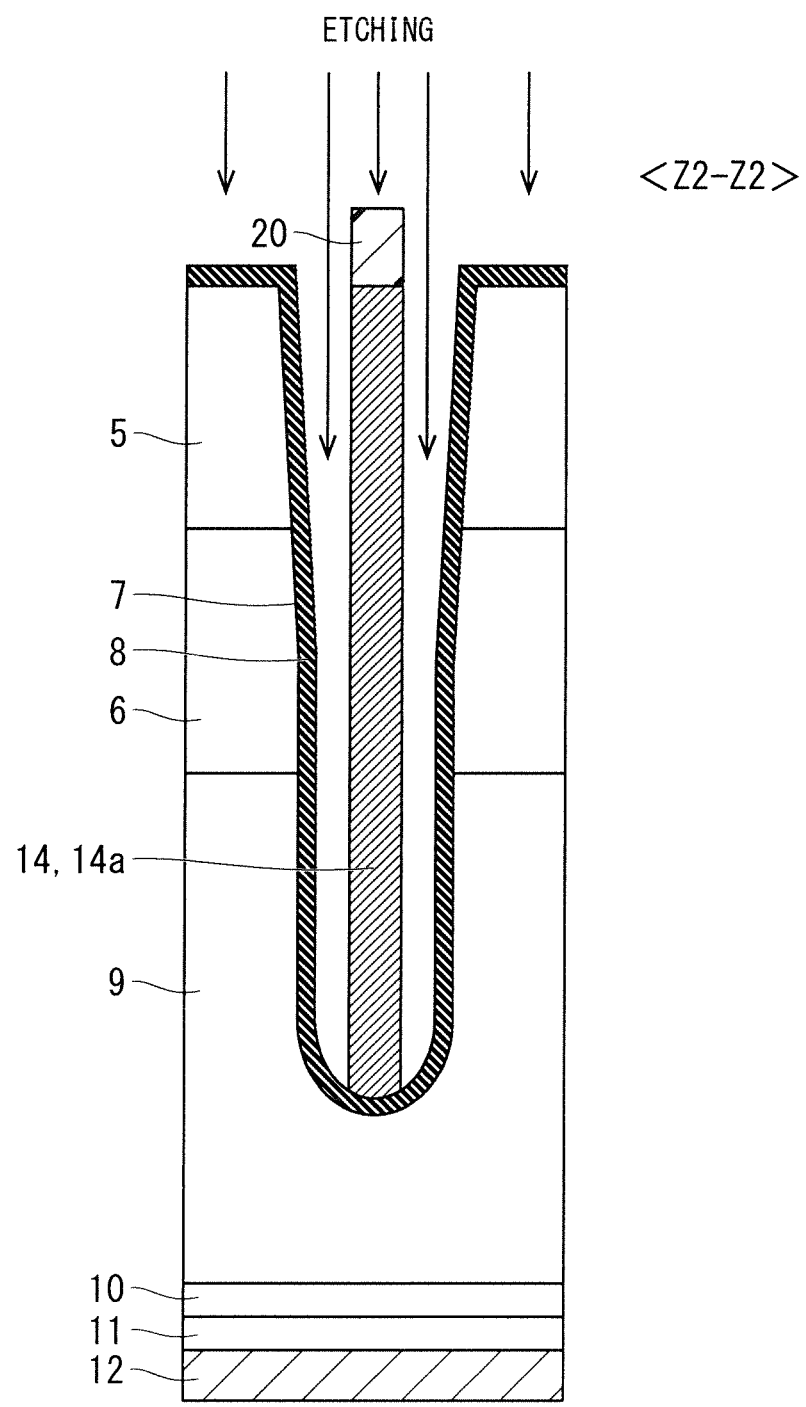
FIG. 35 is a sectional view for illustrating a method of manufacturing the semiconductor element according to the second preferred embodiment.

First, as in the first preferred embodiment, the carrier storage layer 6, the base layer 5, the source layer 4, the first trench 7, and the gate oxide film 8 are formed in the semiconductor substrate, and polysilicon doped with impurities is thereafter deposited into the first trench 7 with the gate oxide film 8 formed therein. Then, as shown in FIG. 35, the mask 20 is formed in a region where the recessed portion is to be formed, and the mask process using the mask 20 is performed to selectively etch the polysilicon, thereby forming the recessed portion in the gate portion 14. In other words, the first gate sub-portion 14a and the second gate sub-portion 14b are formed.

Figure 36:
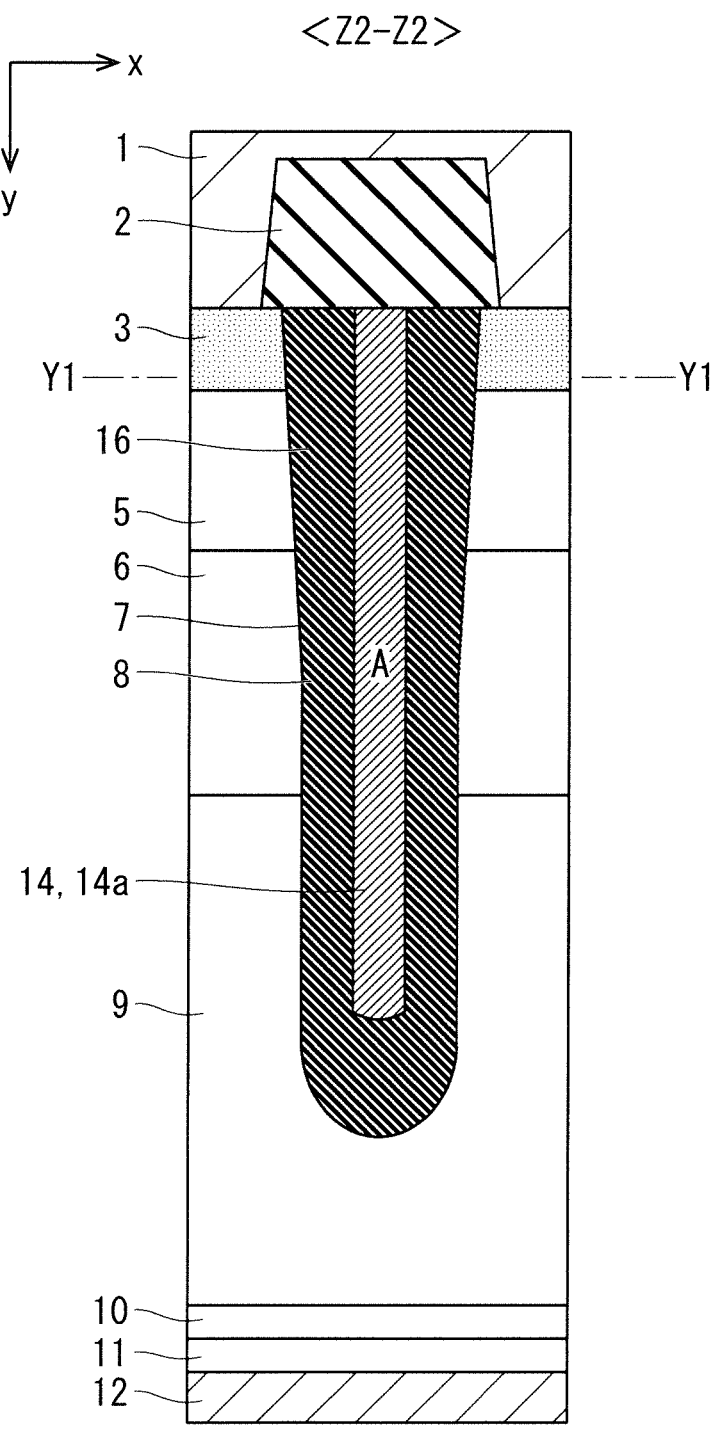
FIG. 36 is a sectional view showing the configuration of the semiconductor element according to the second preferred embodiment.

As shown in FIG. 36, the thickness of a lower part of the gate oxide film 8 may be greater than the thickness of part of the gate oxide film 8 other than the lower part as seen in cross section. For example, the thickness of the lower part of the gate oxide film 8 which lies under the first gate sub-portion 14a may be greater than the thickness of part of the gate oxide film 8 other than the lower part. Such a configuration is capable of reducing the gate-collector capacitance Cgc parasitic in the lower part of the gate oxide film 8.

Figure 37:
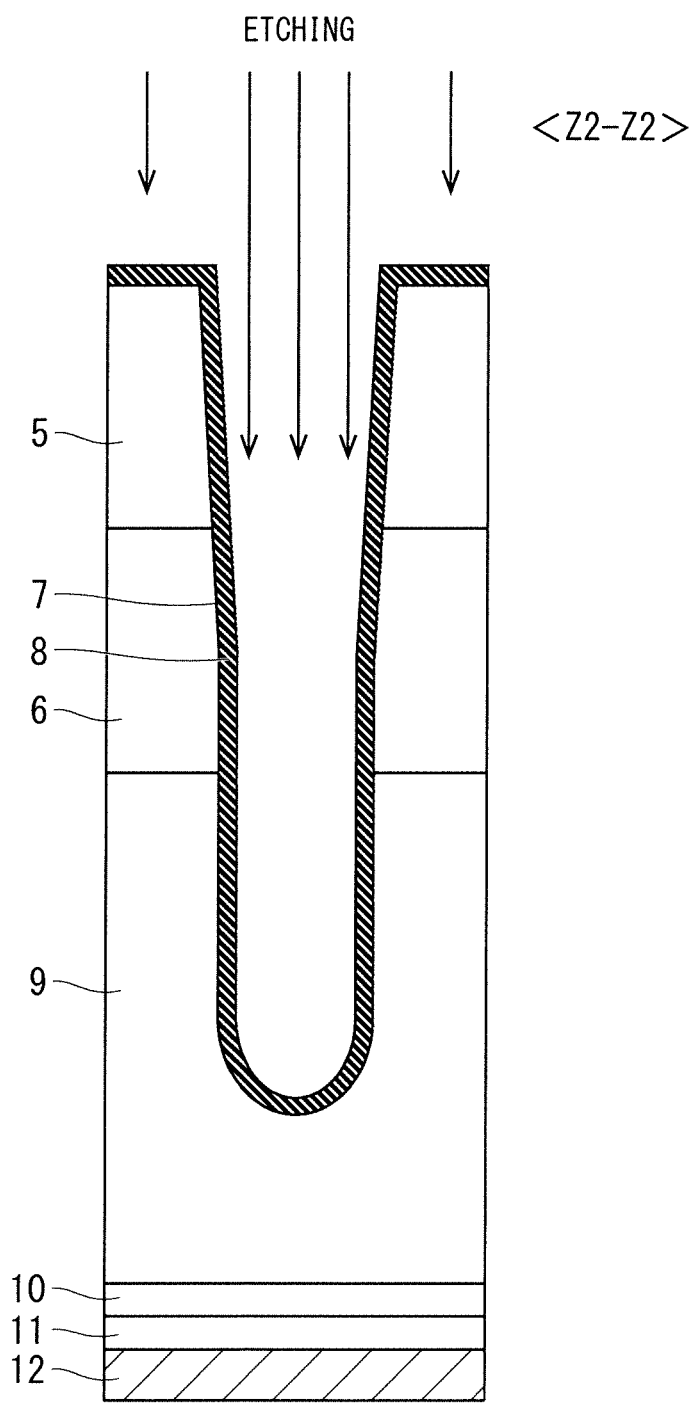
FIGS. 37 and 38 are sectional views for illustrating the method of manufacturing the semiconductor element according to the second preferred embodiment.

Principal parts of an example of a method of manufacturing the configuration of FIG. 36 will be described below. First, as in the first preferred embodiment, the carrier storage layer 6, the base layer 5, the source layer 4, the first trench 7, and the gate oxide film 8 are formed in the semiconductor substrate, and polysilicon doped with impurities is thereafter deposited into the first trench 7 with the gate oxide film 8 formed therein. Then, as shown in FIG. 37, while the polysilicon that becomes the second gate sub-portion 14b is left, other parts are removed, so that the gate oxide film 8 on which the first gate sub-portion 14a is to be formed is exposed.

Figure 38:
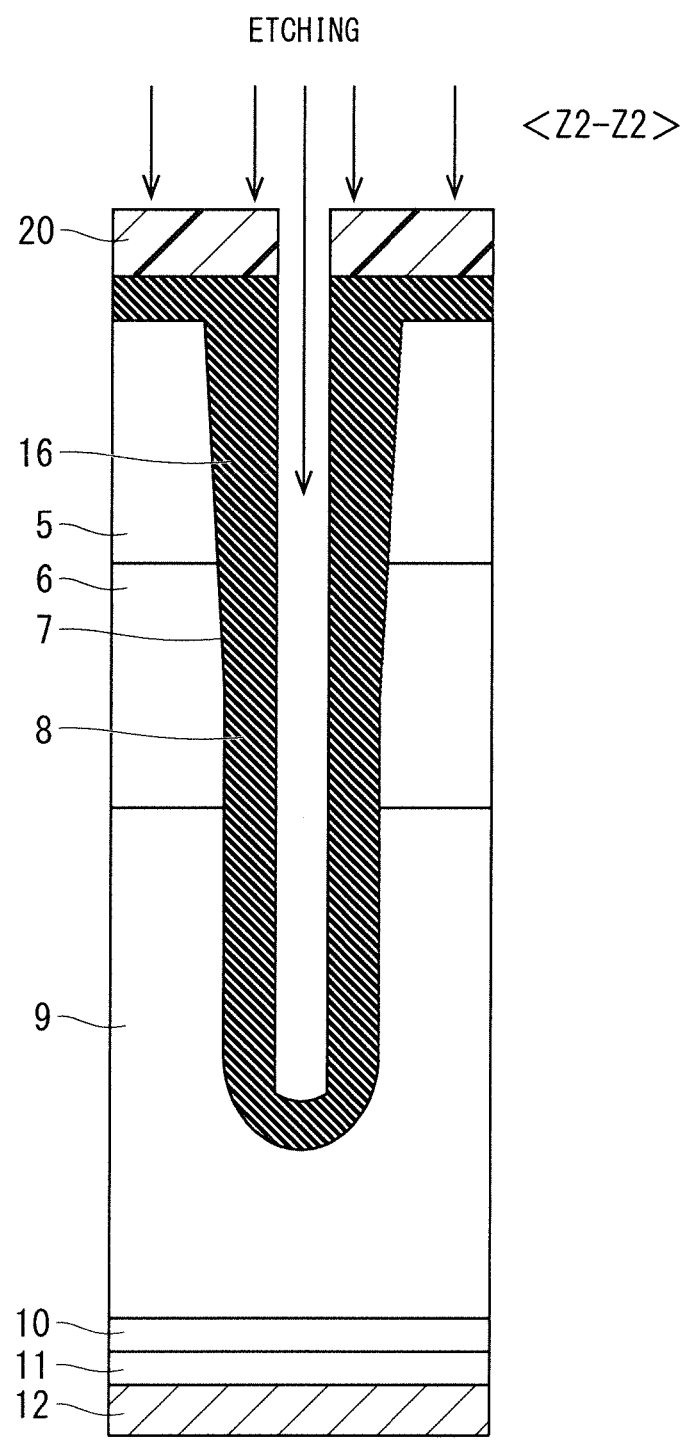

Then, an insulating portion is formed in the exposed gate oxide film 8. Then, as shown in FIG. 38, the mask 20 for the formation of the first gate sub-portion 14a is formed, and the mask process using the mask 20 is performed to selectively etch the insulating portion to a predetermined depth, thereby forming the buried insulation portion 16 having a trench. Then, polysilicon is buried into the trench of the buried insulation portion 16 to form the first gate sub-portion 14a. The thick lower part of the gate oxide film 8 may be formed by a single insulating portion or a multi-layer structure comprised of a plurality of insulating portions.

<Summary of Second Preferred Embodiment>

The reference character Wtr designates a dimension of the first trench 7 as measured in the width direction (e.g., in the x direction) of the first trench 7 as seen in plan view as shown in FIG. 33, the reference character W2 designates a dimension of the first gate sub-portion 14a as measured in the aforementioned width direction, the reference character t1 designates a dimension of the gate oxide film 8 as measured in the aforementioned width direction, and the reference character t2 designates a dimension of the buried insulation portion 16 as measured in the aforementioned width direction. These dimensions may also be referred to as thicknesses.

FIG. 39 shows changes in gate-emitter capacitance Cge when the thickness t2 of the buried insulation portion 16 is varied. As shown in FIG. 39, increasing the thickness t2 of the buried insulation portion 16 increases the distance between the base layer 5 and the first gate sub-portion 14a of the gate portion 14 which form the gate-emitter capacitance Cge to thereby reduce the gate-emitter capacitance Cge. If the dimension W2 of the first gate sub-portion 14a is made too small by increasing the thickness t2 of the buried insulation portion 16, the gate portion 14 will be disconnection. It is hence necessary that the dimension W2 is at least approximately 0.2 μm. In consideration of this, the thickness t2 of the buried insulation portion 16 is adjusted so that the relational expression t1<t2≤Wtr/2−W2 is satisfied.

As shown in FIG. 39, if the thickness t2 is 0.1 when the thickness t2 is equal to the thickness t1, the gate-emitter capacitance Cge reduces rapidly as the thickness t2 varies from 0.1 to 0.2, and changes in gate-emitter capacitance Cge decrease slowly as the thickness t2 varies from 0.2 to 0.3. Then, as the thickness t2 increases from 0.3, the degree of reduction in gate-emitter capacitance Cge becomes more gradual.

This is because the thickness W2 of the first gate sub-portion 14a does not become zero, so that the gate-emitter capacitance Cge can only be reduced to a certain value that is the minimum value, and the degree of reduction becomes smaller toward the minimum value. Thus, the thickness t2 of the buried insulation portion 16 may be adjusted preferably so that the relational expression t1×2<t2≤Wtr/2−W2 is satisfied, and more preferably so that the relational expression t1×3<t2≤Wtr/2−W2 is satisfied. For example, the thickness t1 is on the order of 30 to 300 nm, and the thickness Wtr is on the order of 0.3 to 3 μm. More preferably, the thickness t1 is on the order of 70 to 130 nm, and the thickness Wtr is on the order of 0.7 to 1.2 μm.

In the configuration of the second preferred embodiment, not only the gate-emitter capacitance Cge but also the gate-collector capacitance Cgc is reduced as described above by the buried insulation portion 16 provided in the recessed portion of the gate portion 14. This reduces the turn-on power losses. The configuration of the first preferred embodiment and the configuration of the second preferred embodiment may be combined together.

<First Modification>

In the second preferred embodiment, the second gate sub-portion 14b protrudes from both sides of the first gate sub-portion 14a, and the recessed portion is provided on each side of the gate portion 14, as shown in FIG. 33. However, the present disclosure is not limited to this. For example, as shown in FIG. 40 and in FIG. 41 showing a cross section of FIG. 40, the recessed portion may be provided on only one side of the gate portion 14, and the second gate sub-portion 14b may be configured to protrude from only one side of the first gate sub-portion 14a.

Such a configuration is capable of increasing the thickness t2 of the buried insulation portion 16 to further reduce the gate-emitter capacitance Cge. Such a configuration is also capable of increasing the thickness W2 of the first gate sub-portion 14a to reduce the wiring resistance of the gate portion 14. In this configuration, the relational expression $t1<t2\leq Wtr-W2$ may be satisfied by replacing Wtr/2 in the relational expression described above with Wtr.

Figure 40:
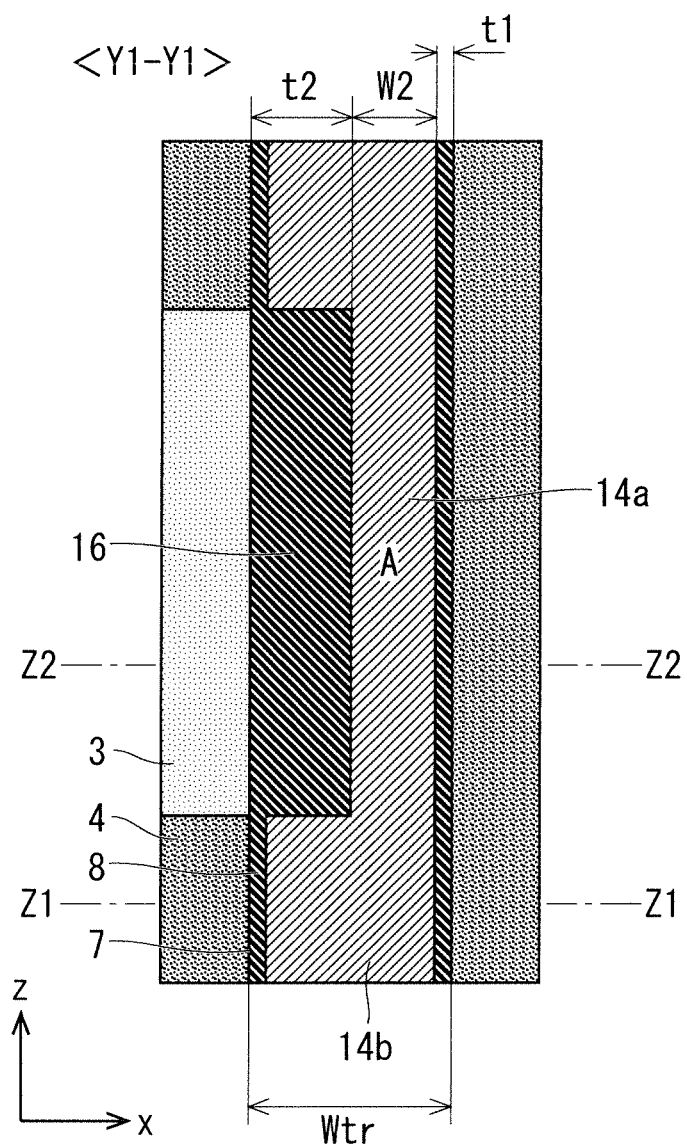
FIG. 40 is a plan view showing a configuration of a semiconductor element according to a first modification of the second preferred embodiment.
Figure 41:
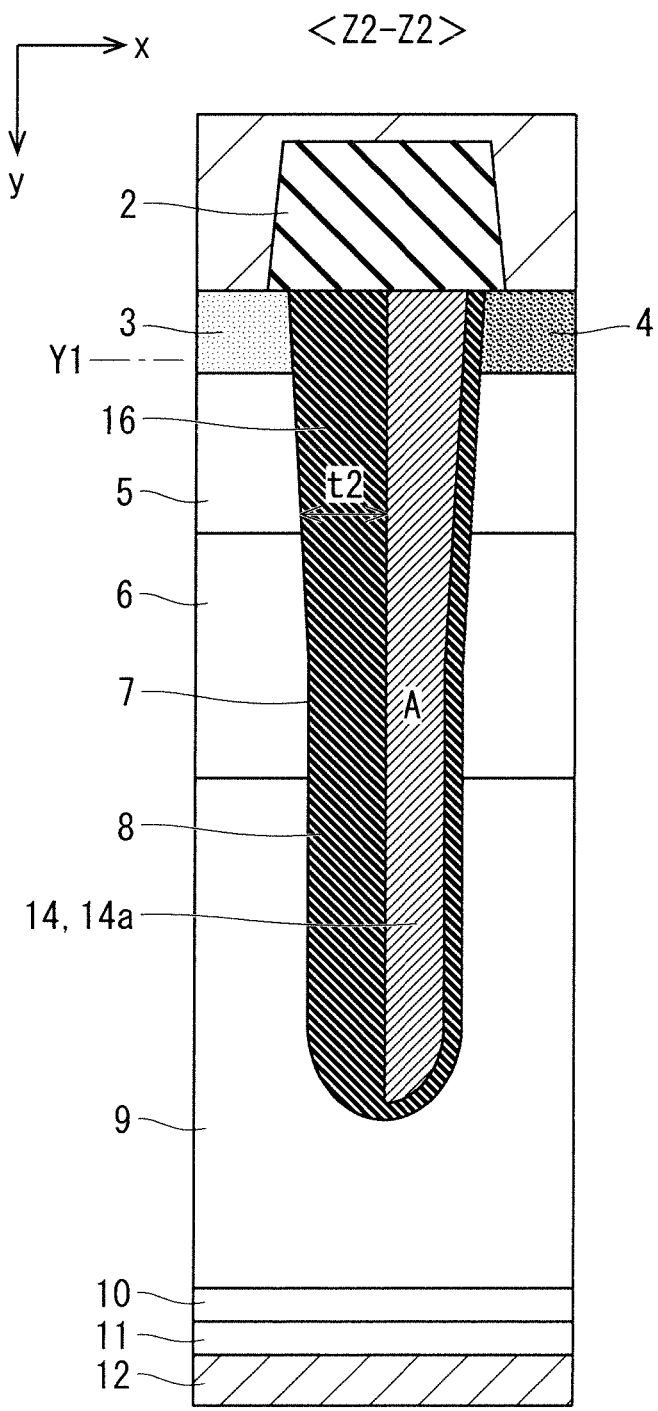
FIG. 41 is a sectional view showing the configuration of the semiconductor element according to the first modification of the second preferred embodiment.

As shown in FIGS. 40 and 41, the source layer 4, rather than the contact layer 3, may be provided on the side opposite to the buried insulation portion 16 with respect to the first gate sub-portion 14a. Such a configuration is capable of increasing a current density.

<Second Modification>

Figure 42:
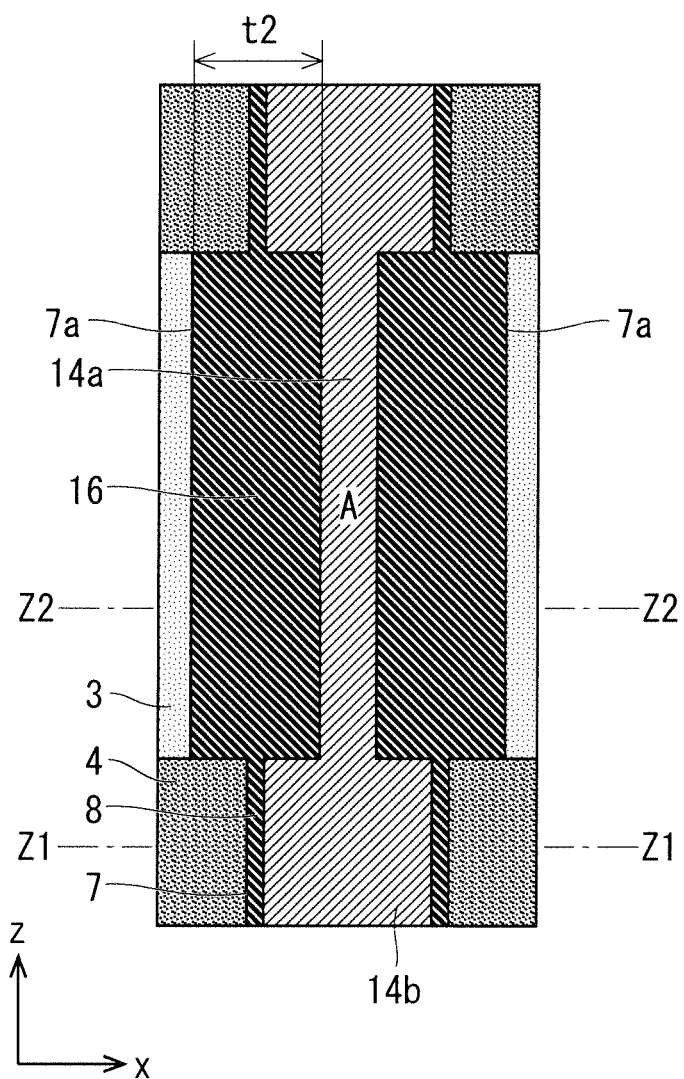
FIG. 42 is a plan view showing a configuration of a semiconductor element according to a second modification of the second preferred embodiment.
Figure 43:
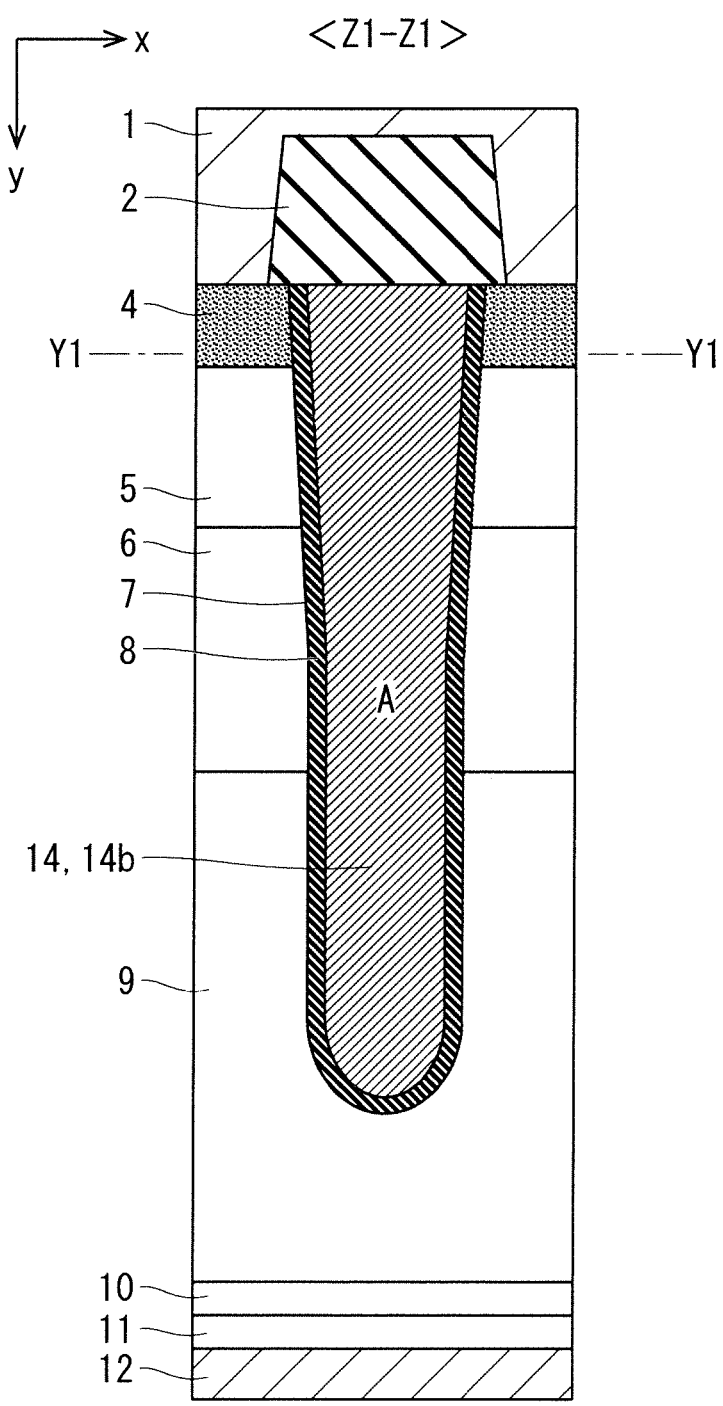
FIGS. 43 to 45 are sectional views showing the configuration of the semiconductor element according to the second modification of the second preferred embodiment.
Figure 44:
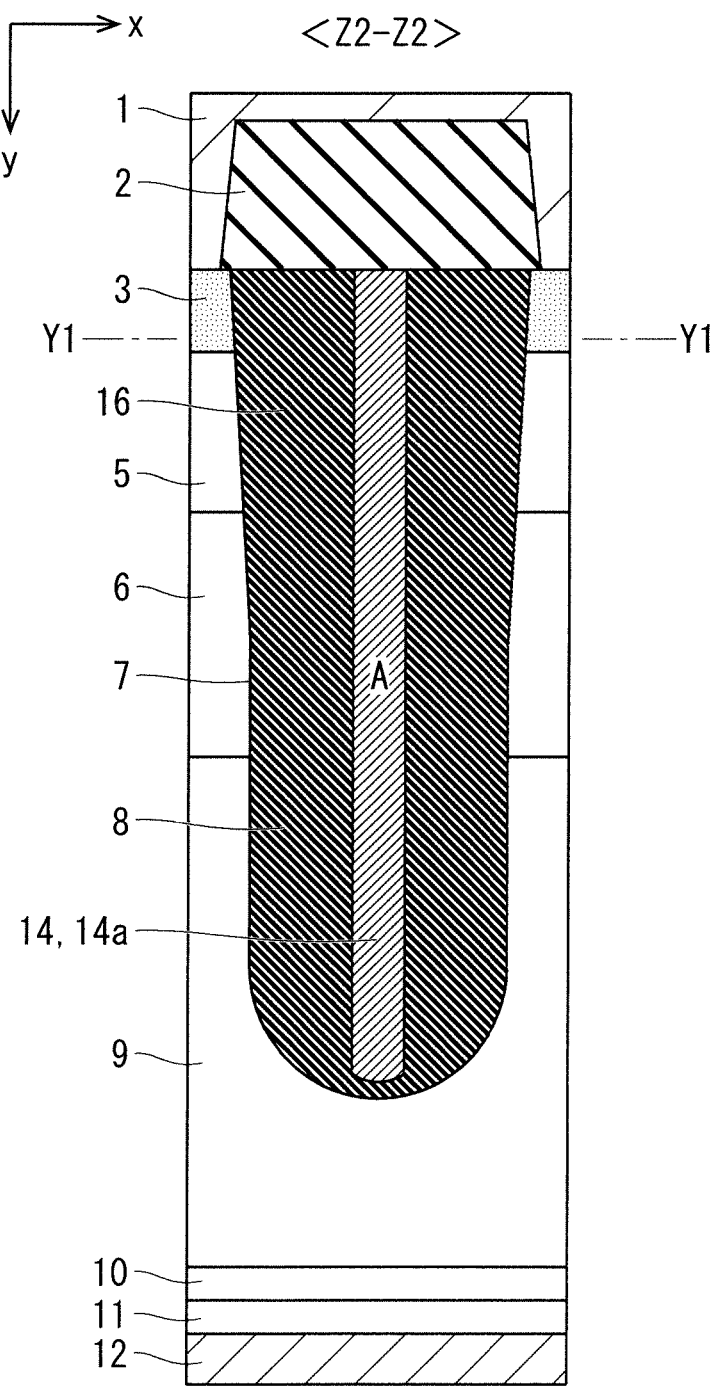

Although the width of the first trench 7 is constant in the second preferred embodiment as shown in FIG. 33, the present disclosure is not limited to this. For example, as shown in FIG. 42 and in FIGS. 43 and 44 that are sectional views of FIG. 42, a protruding portion 7a protruding toward the contact layer 3 and contacting the contact layer 3 may be provided on the sides of the first trench 7 as seen in plan view, and the buried insulation portion 16 may be provided in the protruding portion 7a. Such a configuration is capable of increasing the thickness of the buried insulation portion 16 to increase the distance between the base layer 5 and the first gate sub-portion 14a of the gate portion 14 which form the gate-emitter capacitance Cge, thereby reducing the gate-emitter capacitance Cge.

Figure 45:
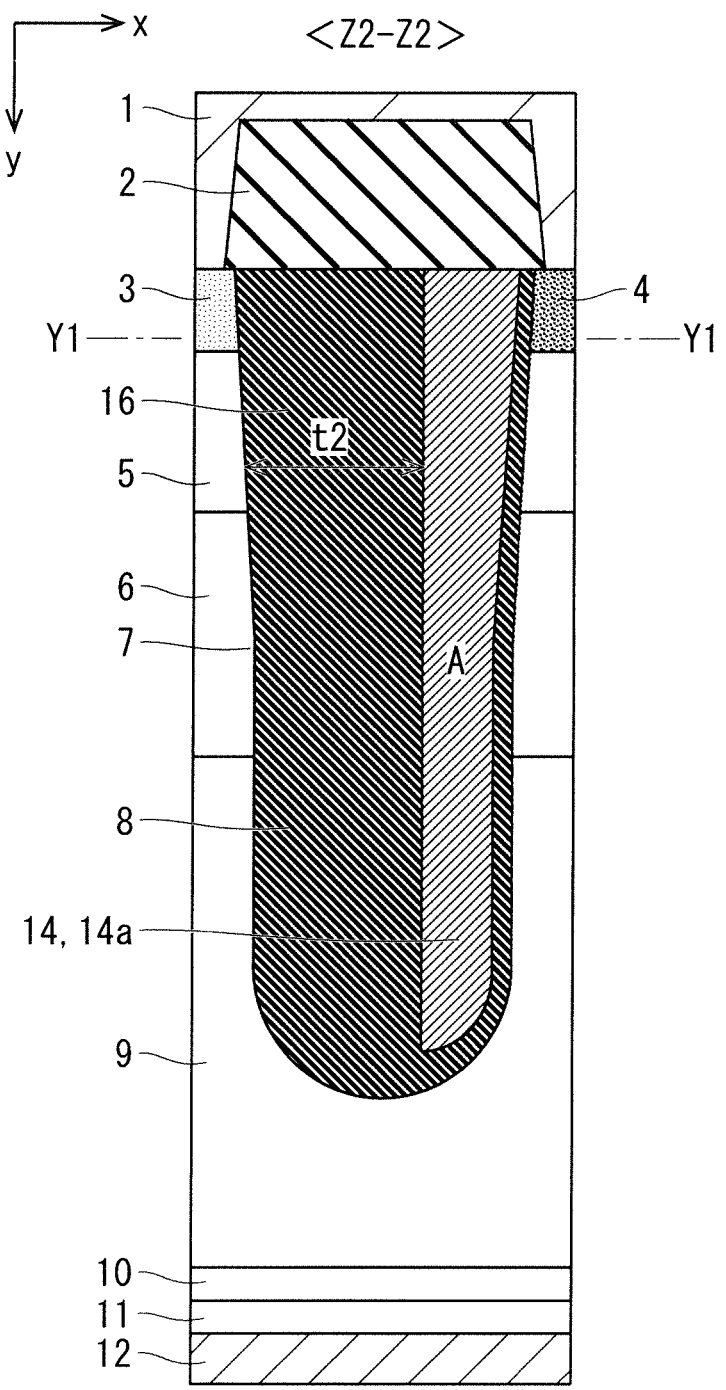

As shown in FIG. 45, the second modification of the second preferred embodiment may be combined with the first modification thereof. Specifically, this combination may be configured such that the second gate sub-portion 14b protrudes from only one side of the first gate sub-portion 14a, such that the protruding portion 7a is provided on the sides of the first trench 7, and such that the buried insulation portion 16 is provided in the protruding portion 7a. Such a configuration is capable of reducing the gate-emitter capacitance Cge while increasing the current density.

Figure 46:
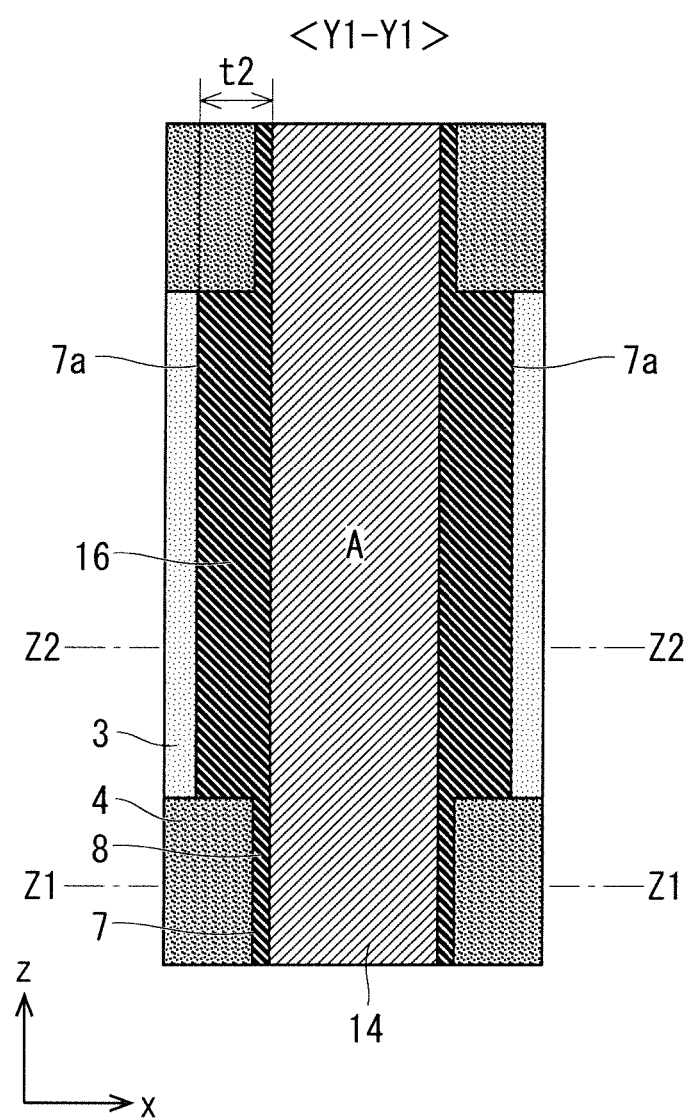
FIG. 46 is a plan view showing the configuration of the semiconductor element according to the second modification of the second preferred embodiment.
Figure 47:
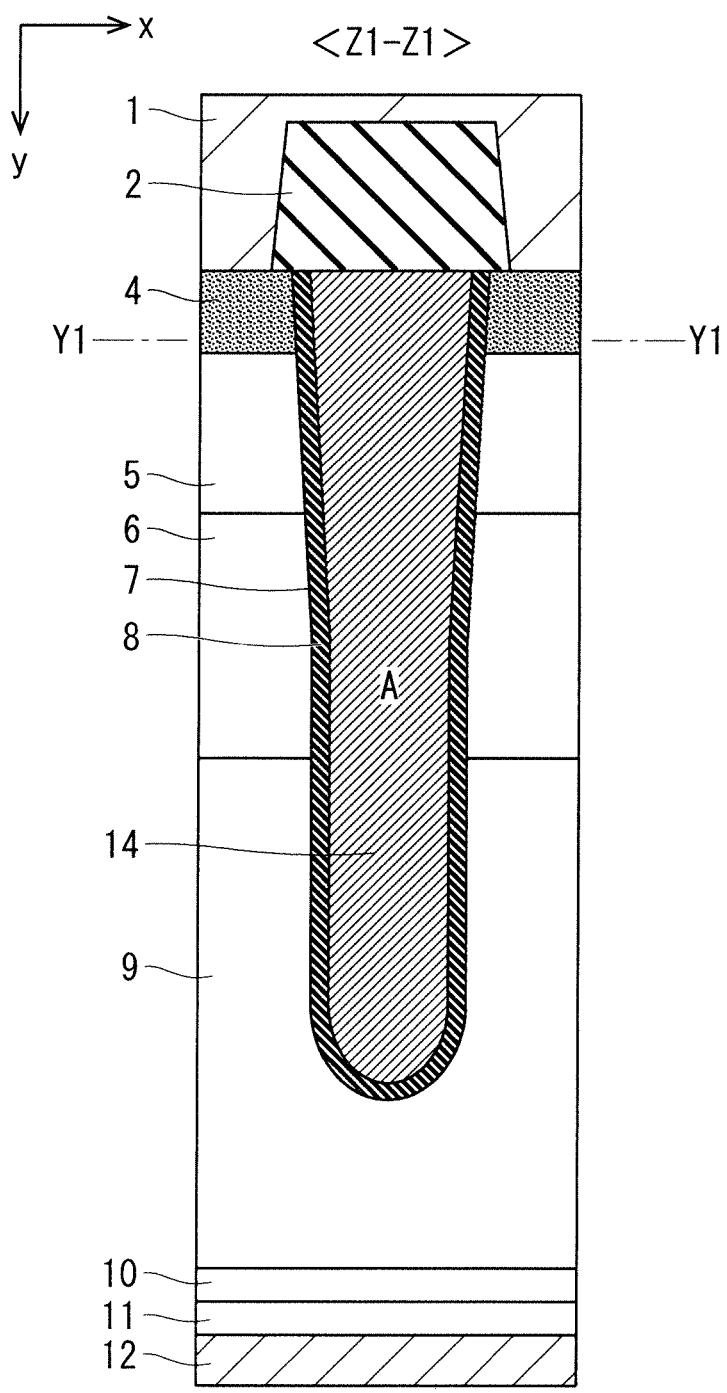
FIGS. 47 and 48 are sectional views showing the configuration of the semiconductor element according to the second modification of the second preferred embodiment.
Figure 48:
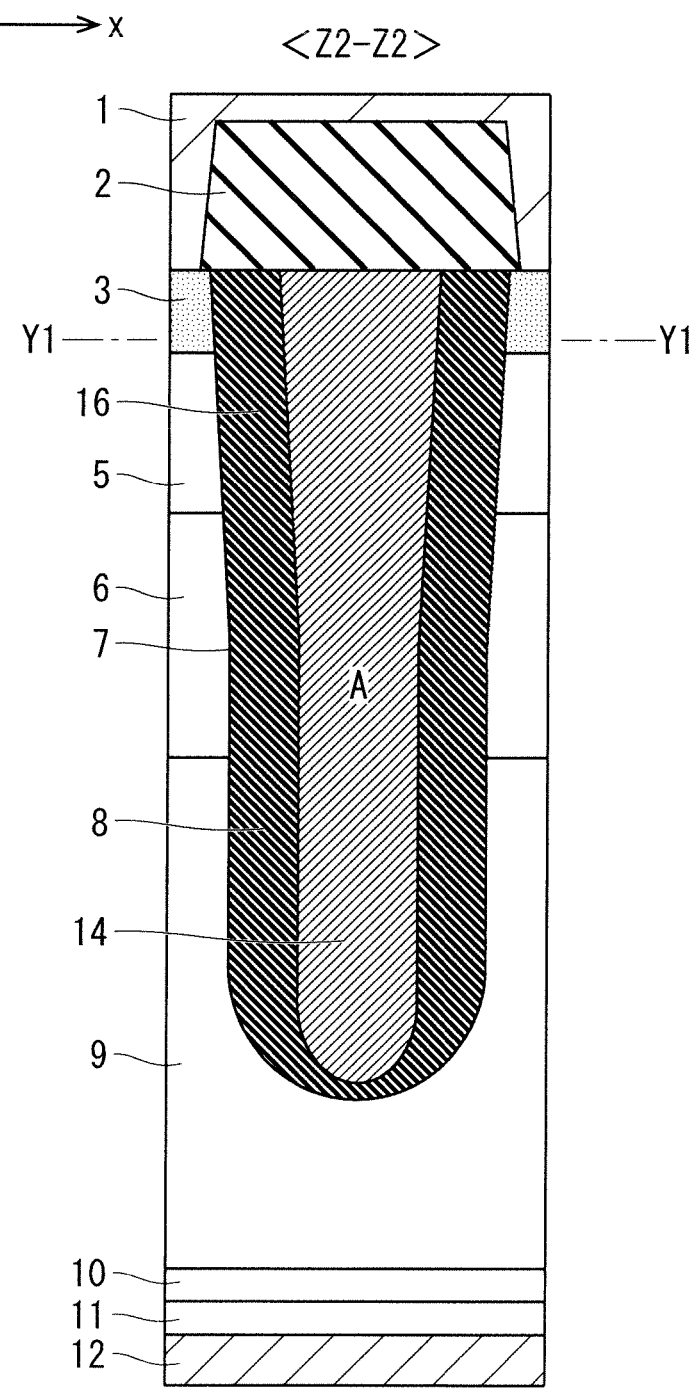

As shown in FIG. 46 and in FIGS. 47 and 48 that are sectional views of FIG. 46, for example, the recessed portion need not be provided in the gate portion 14. In other words, the width of the gate portion 14 may be generally constant. Then, the protruding portion 7a may be provided on the sides of the first trench 7, and the buried insulation portion 16 may be provided in the protruding portion 7a. Such a configuration, in which the protruding portion 7a is provided on the sides of the first trench 7, is capable of increasing the thickness of the buried insulation portion 16 to reduce the gate-emitter capacitance Cge. The wiring resistance of the gate portion 14 is reduced.

Figure 49:
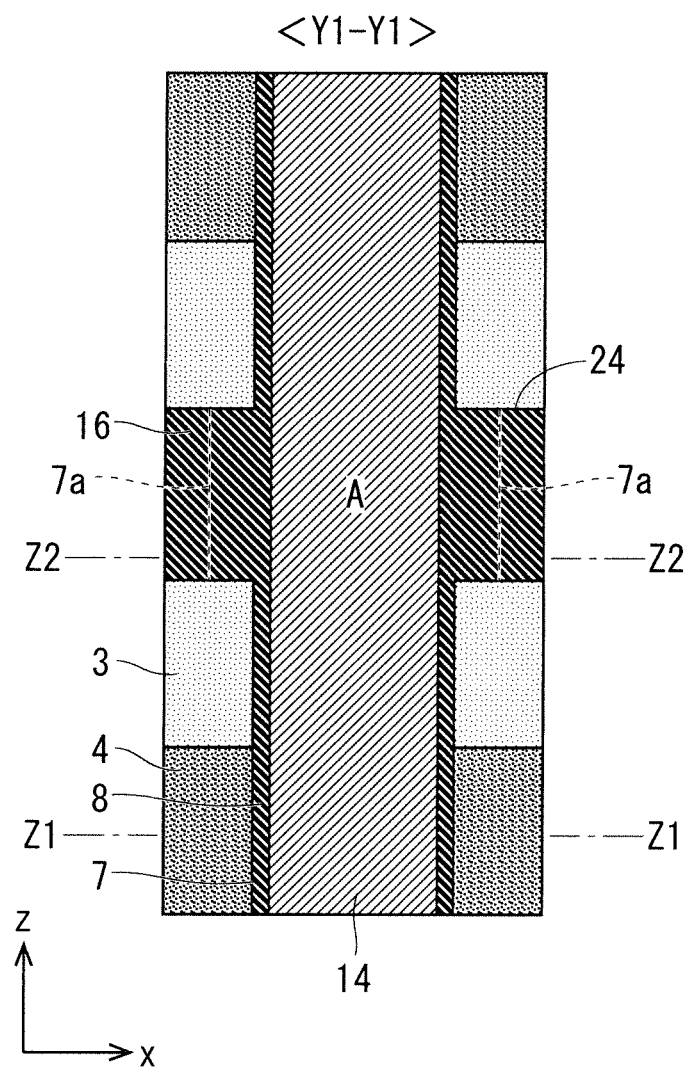
FIG. 49 is a plan view showing the configuration of the semiconductor element according to the second modification of the second preferred embodiment.
Figure 50:
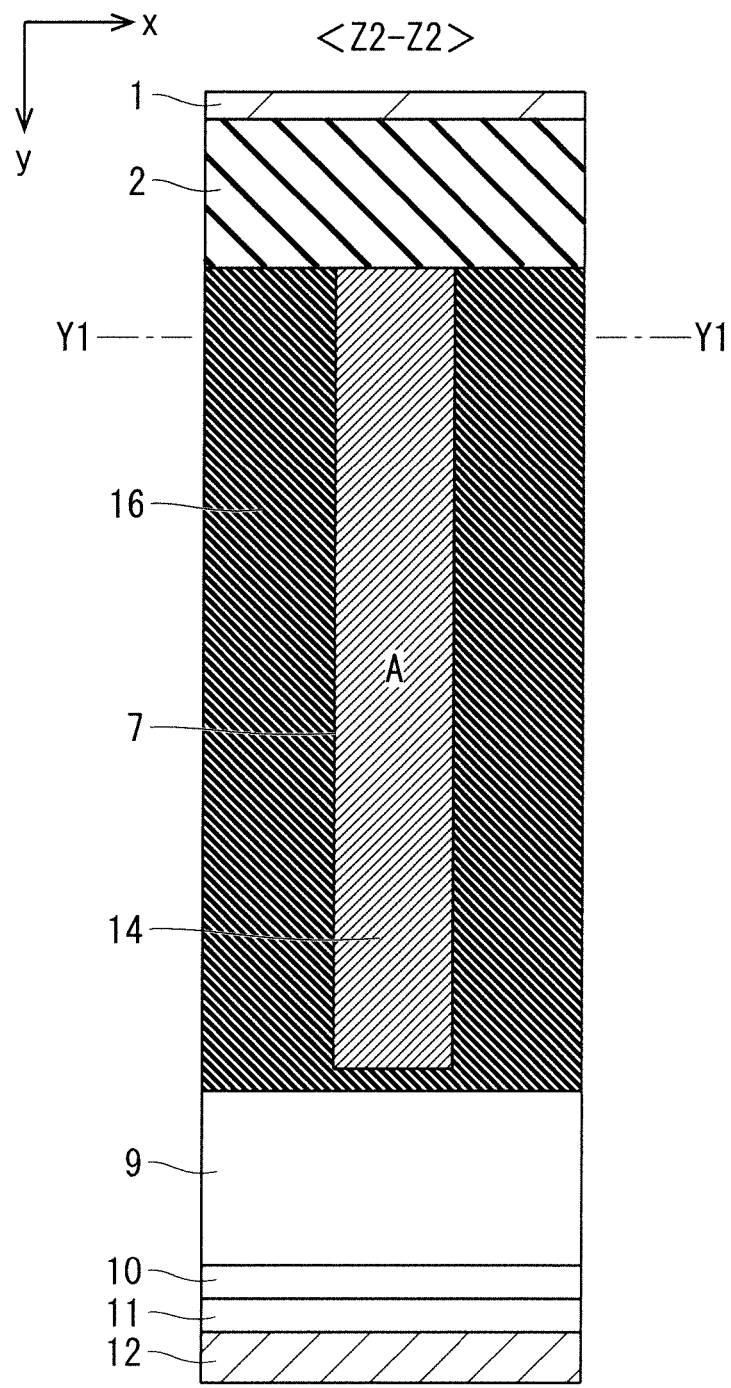
FIG. 50 is a sectional view showing the configuration of the semiconductor element according to the second modification of the second preferred embodiment.

As seen in plan view in FIG. 49, for example, the protruding portion 7a of the first trench 7 extending in the z direction may be connected to a second trench 24 extending in the x direction, so that a lattice-shaped trench is provided. The second trench 24 may extend through the contact layer 3 as seen in plan view. Then, as shown in FIG. 49 and in FIG. 50 that is a sectional view of FIG. 49, the buried insulation portion 16 may be provided in the second trench 24. Such a configuration is capable of reducing the gate-emitter capacitance Cge because the buried insulation portion 16 has a thicker portion.

<Third Modification>

Figure 51:
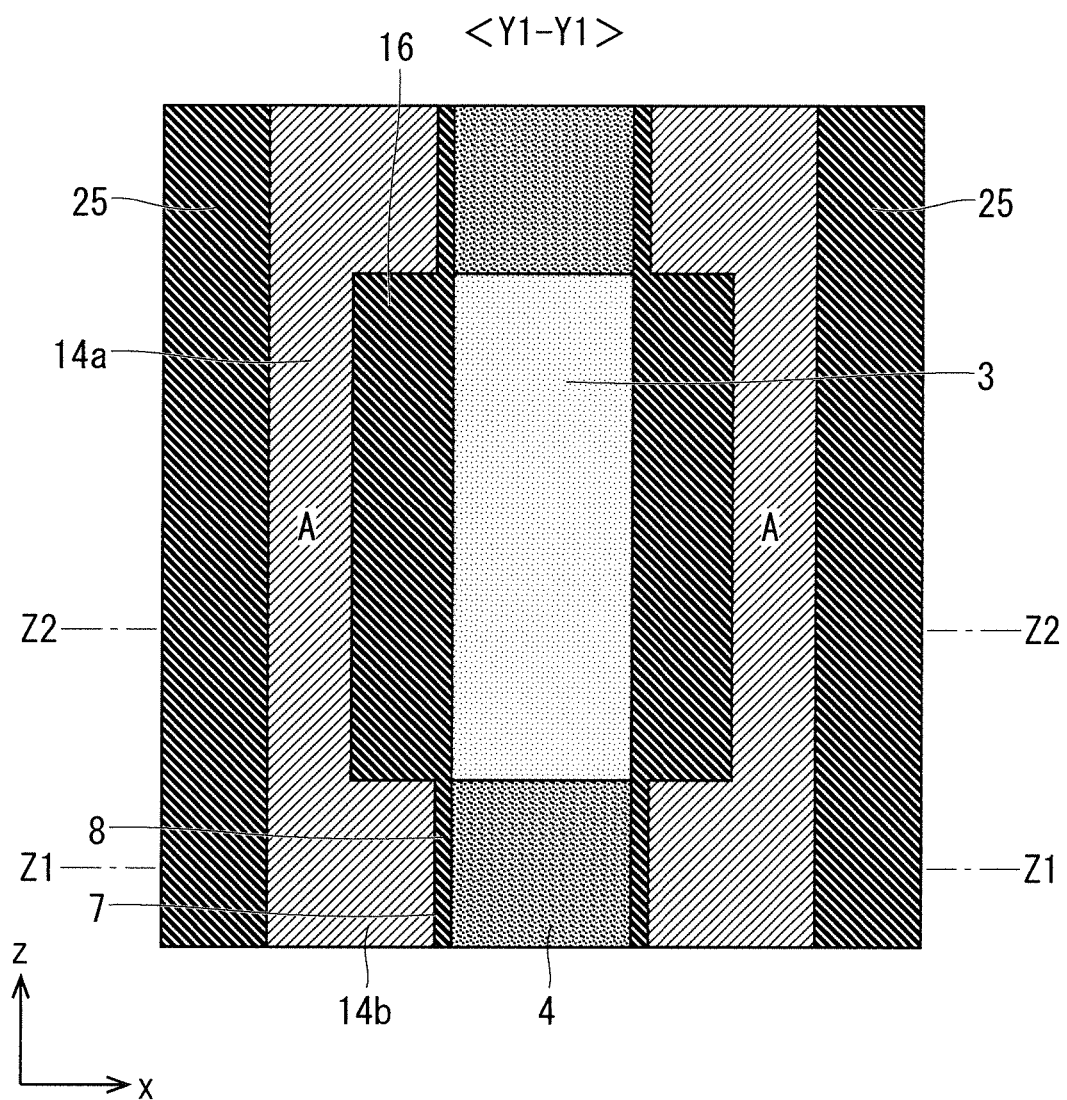
FIG. 51 is a plan view showing a configuration of a semiconductor element according to a third modification of the second preferred embodiment.
Figure 52:
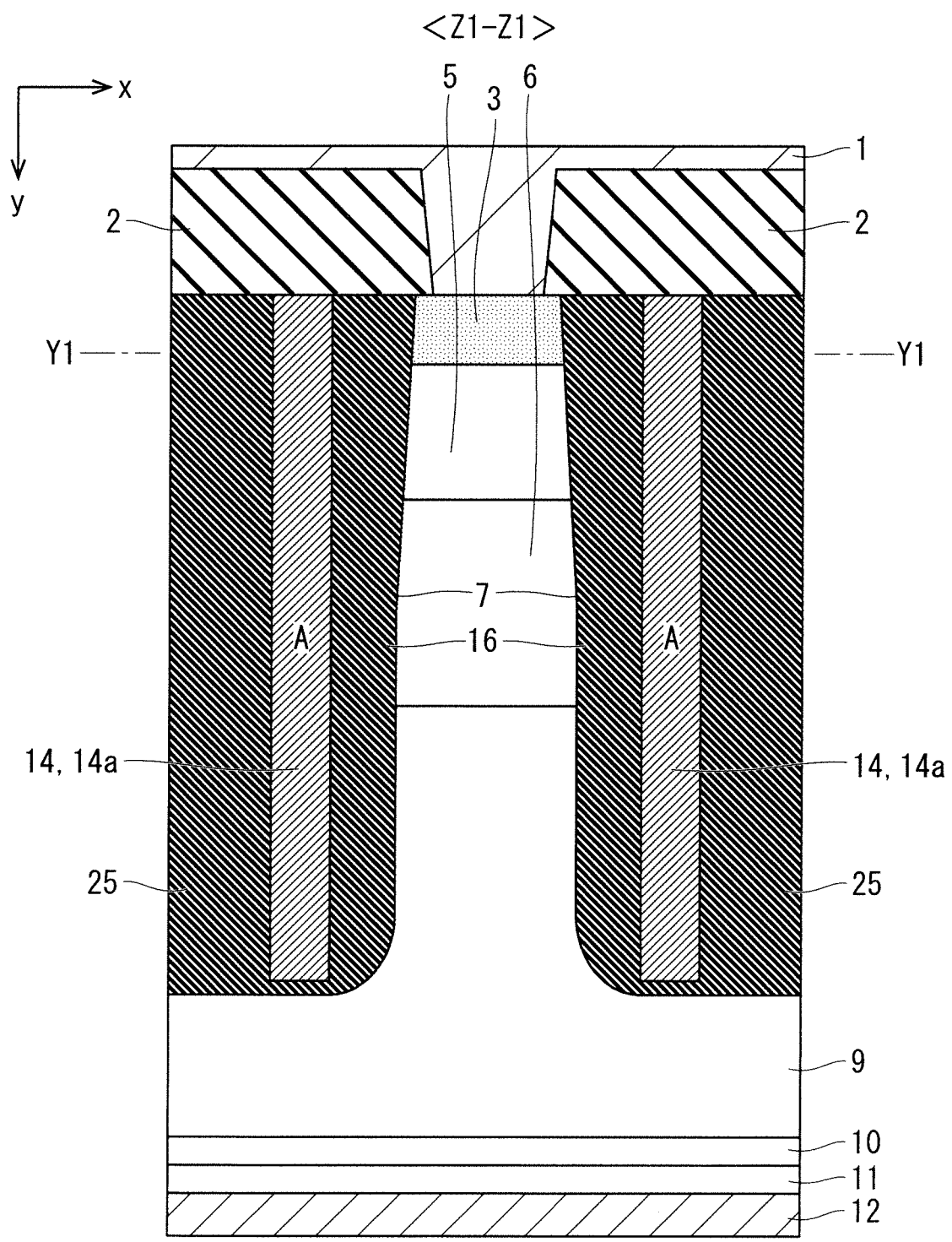
FIGS. 52 and 53 are sectional views showing the configuration of the semiconductor element according to the third modification of the second preferred embodiment.
Figure 53:
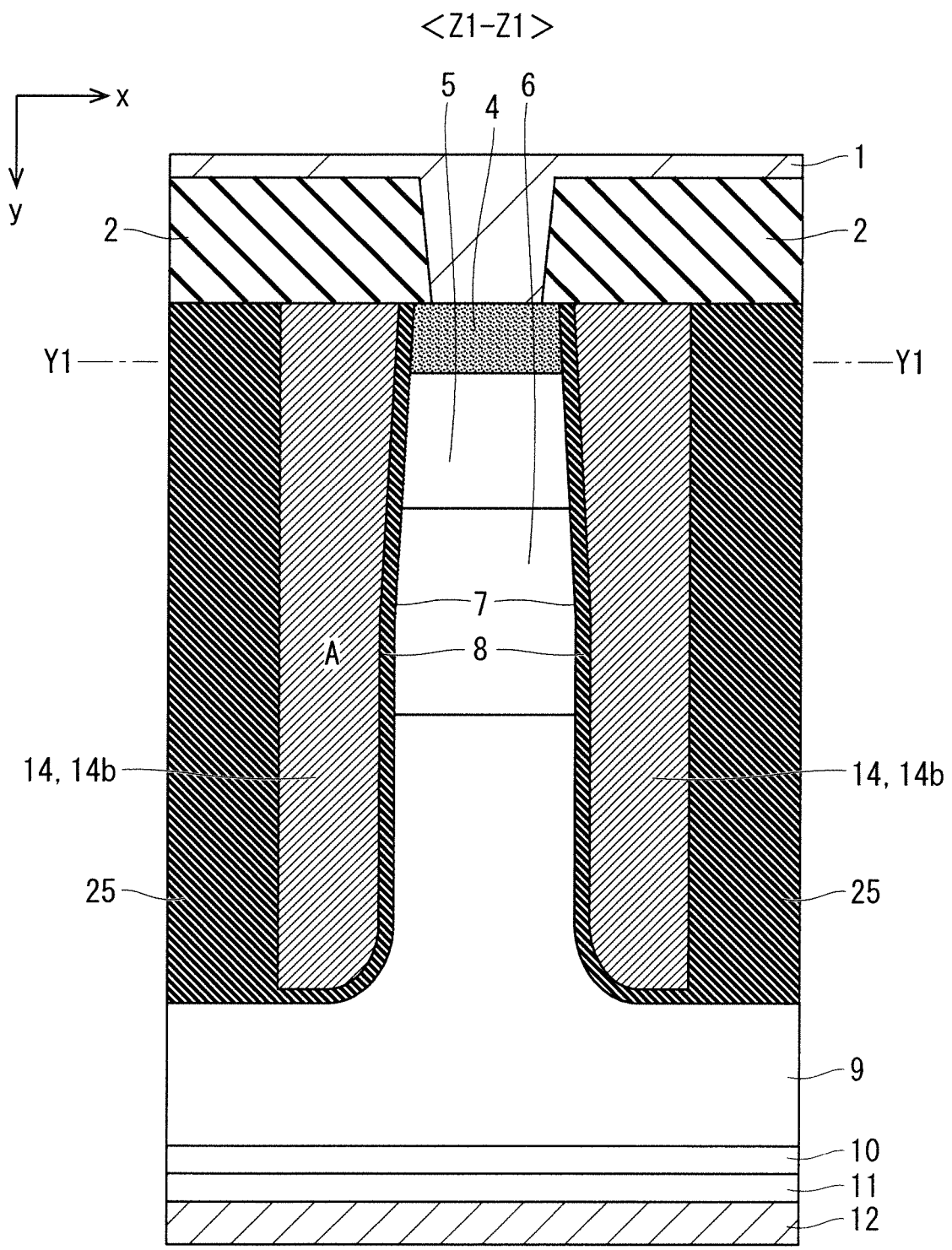

In the first modification of the second preferred embodiment of FIG. 40, the gate oxide film 8 is provided on the side opposite to the source layer 4 with respect to the second gate sub-portion 14b as seen in plan view. However, the present disclosure is not limited to this. For example, as shown in FIG. 51 and in FIGS. 52 and 53 that are sectional views of FIG. 51, a buried insulation portion 25 that is a second insulation portion having a width greater than that of the gate oxide film 8 may be provided on the side opposite to the source layer 4 with respect to second gate sub-portion 14b as seen in plan view. Such a configuration is capable of reducing the gate-emitter capacitance Cge and the gate-collector capacitance Cgc in the first trench 7 in which an electron current flows. Also, the increase in width of the first trench 7 increases the amount of hole accumulation to reduce the on-state voltage. The gate-collector capacitance Cgc is reduced by the buried insulation portion 16.

<Fourth Modification>

Figure 54:
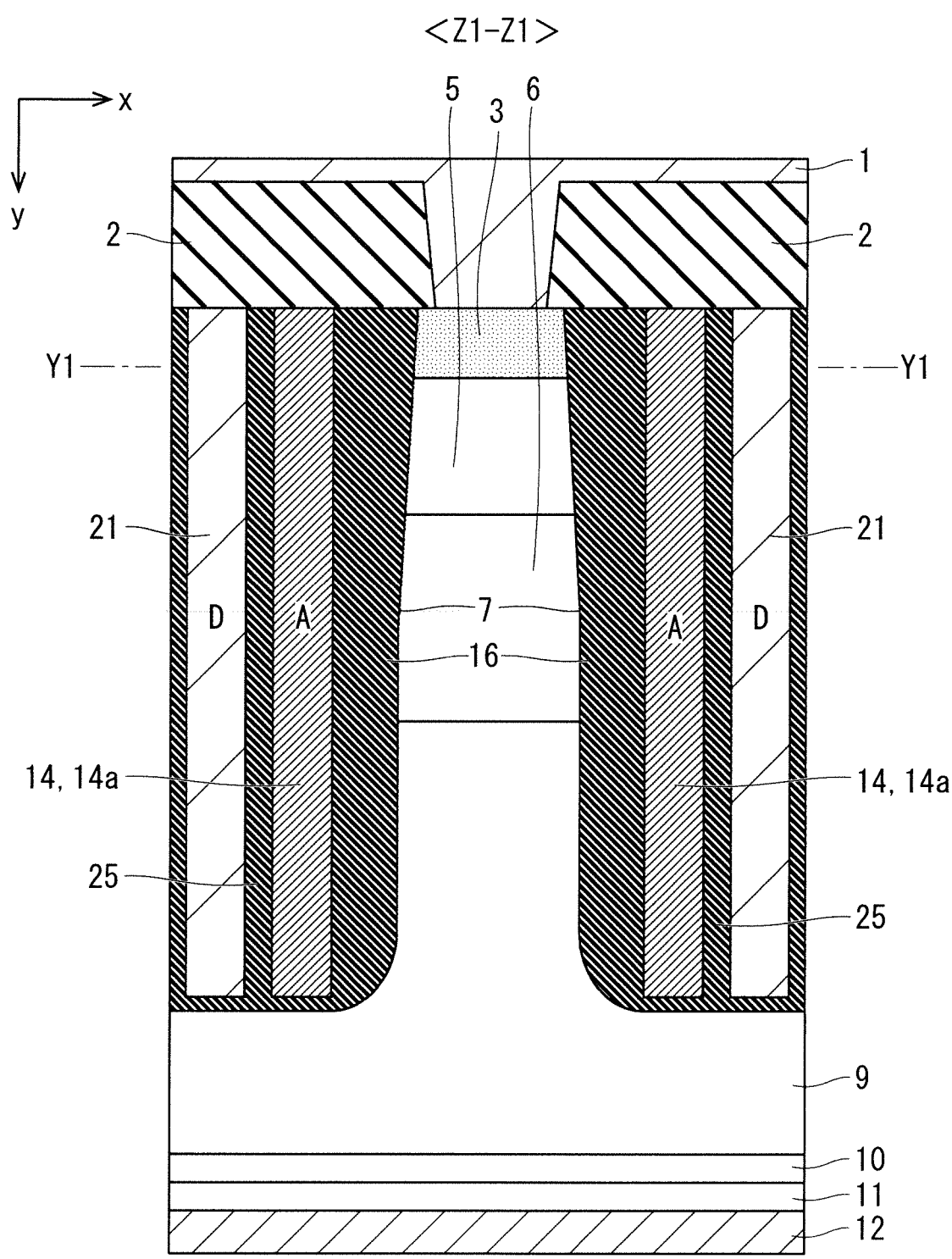
FIGS. 54 to 56 are sectional views showing a configuration of a semiconductor element according to a fourth modification of the second preferred embodiment.

In the second preferred embodiment, a dummy portion may be provided as in the fourth modification of the first preferred embodiment. For example, as shown in FIG. 54, the dummy portion 21 made of polysilicon, insulated from the gate portion 14, and electrically connected to the emitter electrode 1 may be further provided in the first trench 7. The dummy portion 21 may be insulated from the gate portion 14 by the buried insulation portion 25. In such a configuration, the unfixed potential of the buried insulation portion 25 is fixed by the dummy portion 21. This increases the breakdown voltage of the semiconductor element.

Figure 55:
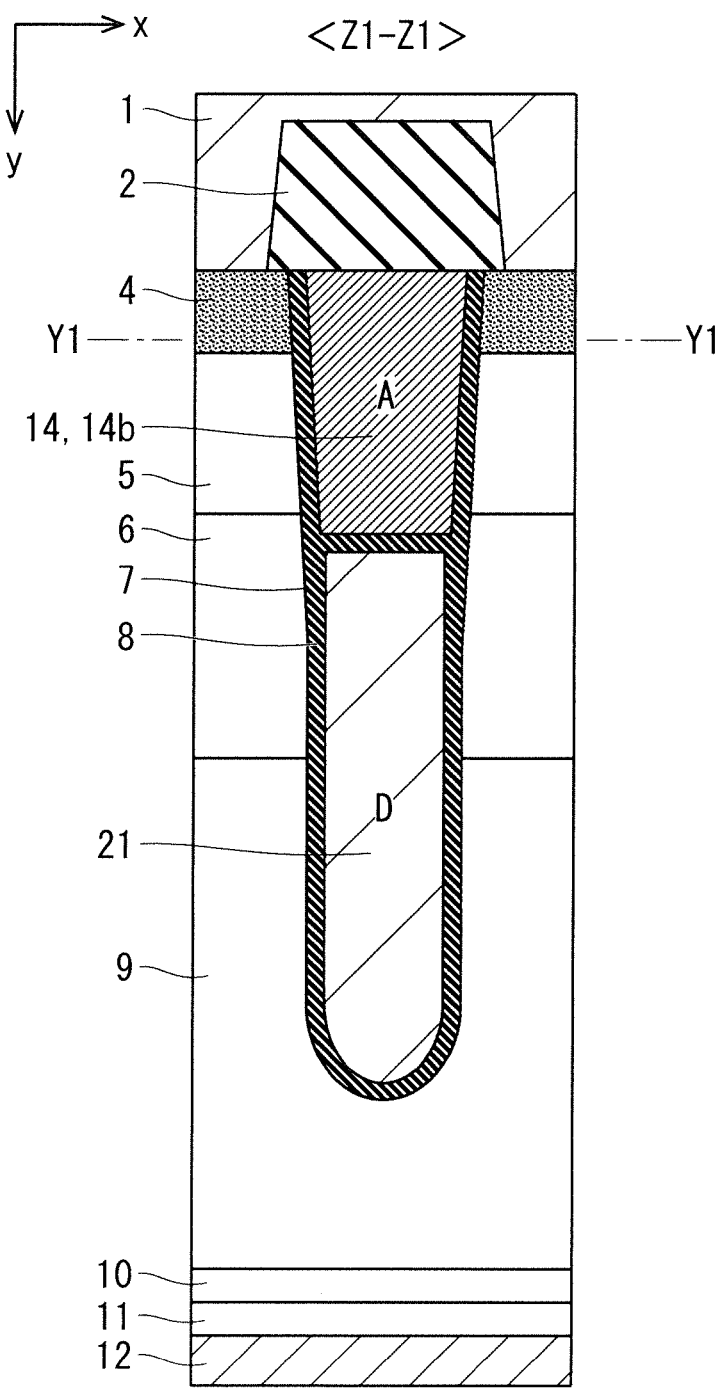
Figure 56:
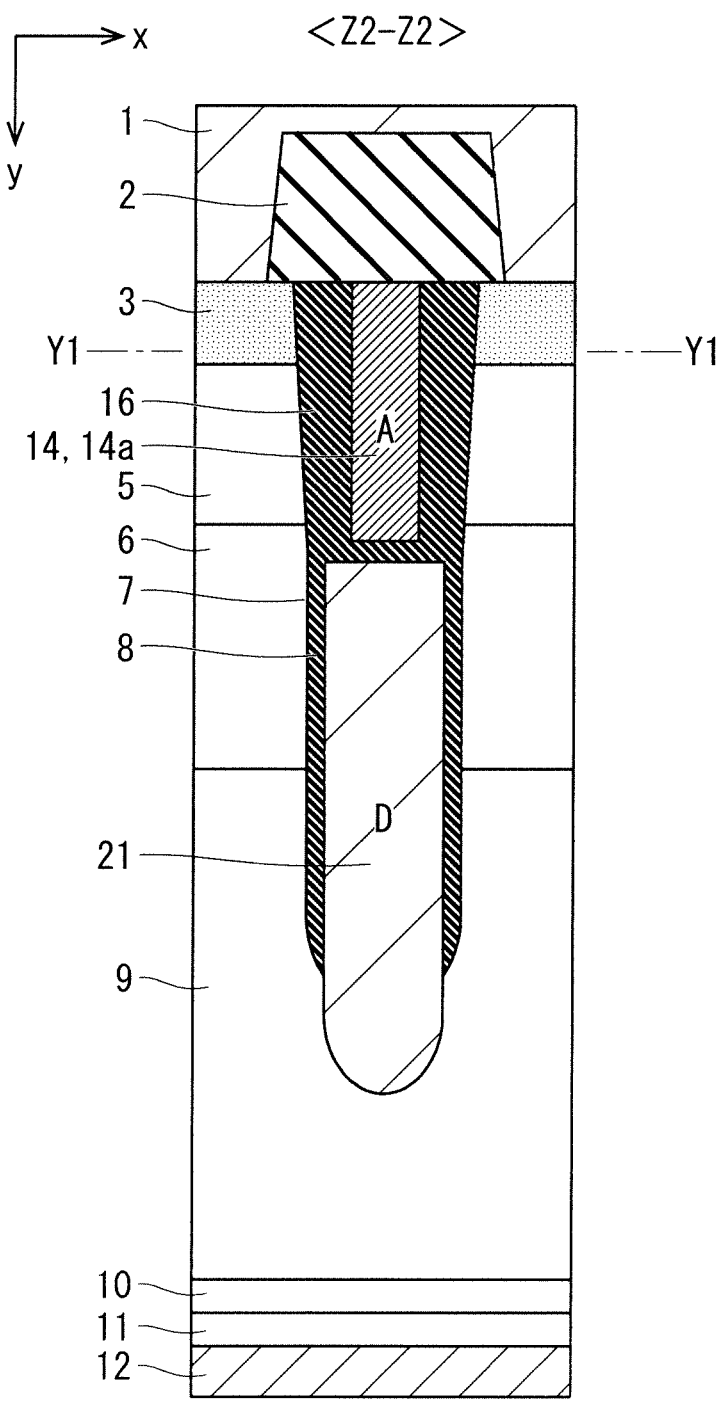

As shown in FIGS. 55 and 56, the dummy portion 21 may be provided below the gate portion 14 in the respective configurations of FIGS. 31 and 32 in the second preferred embodiment. Such a configuration is capable of increasing the breakdown voltage of the semiconductor element.

Figure 57:
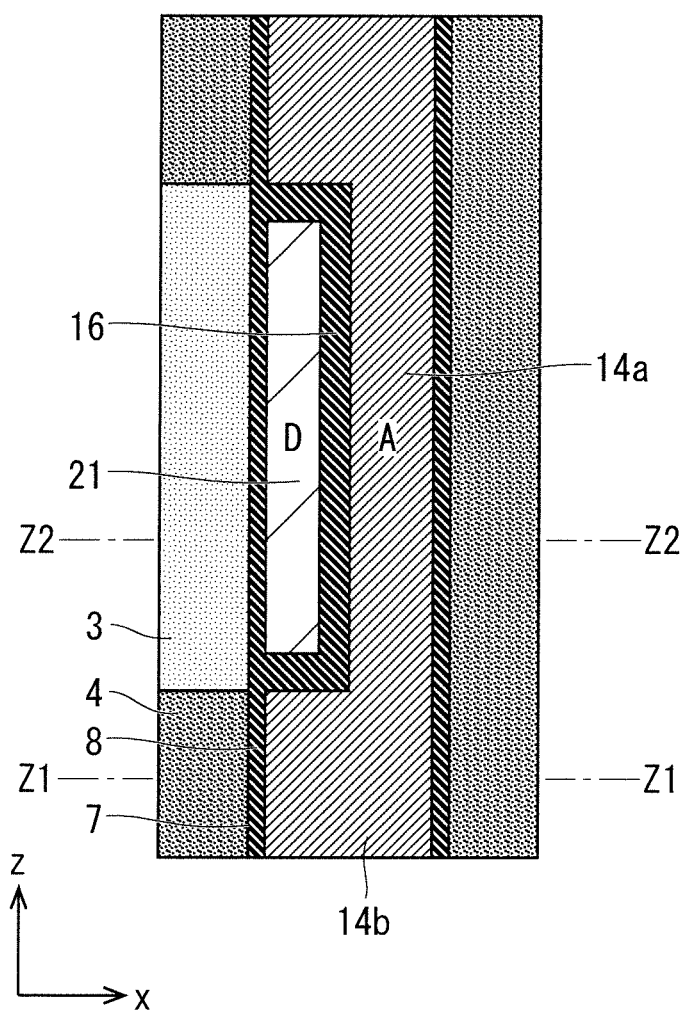
FIG. 57 is a plan view showing the configuration of the semiconductor element according to the first modification of the second preferred embodiment.
Figure 58:
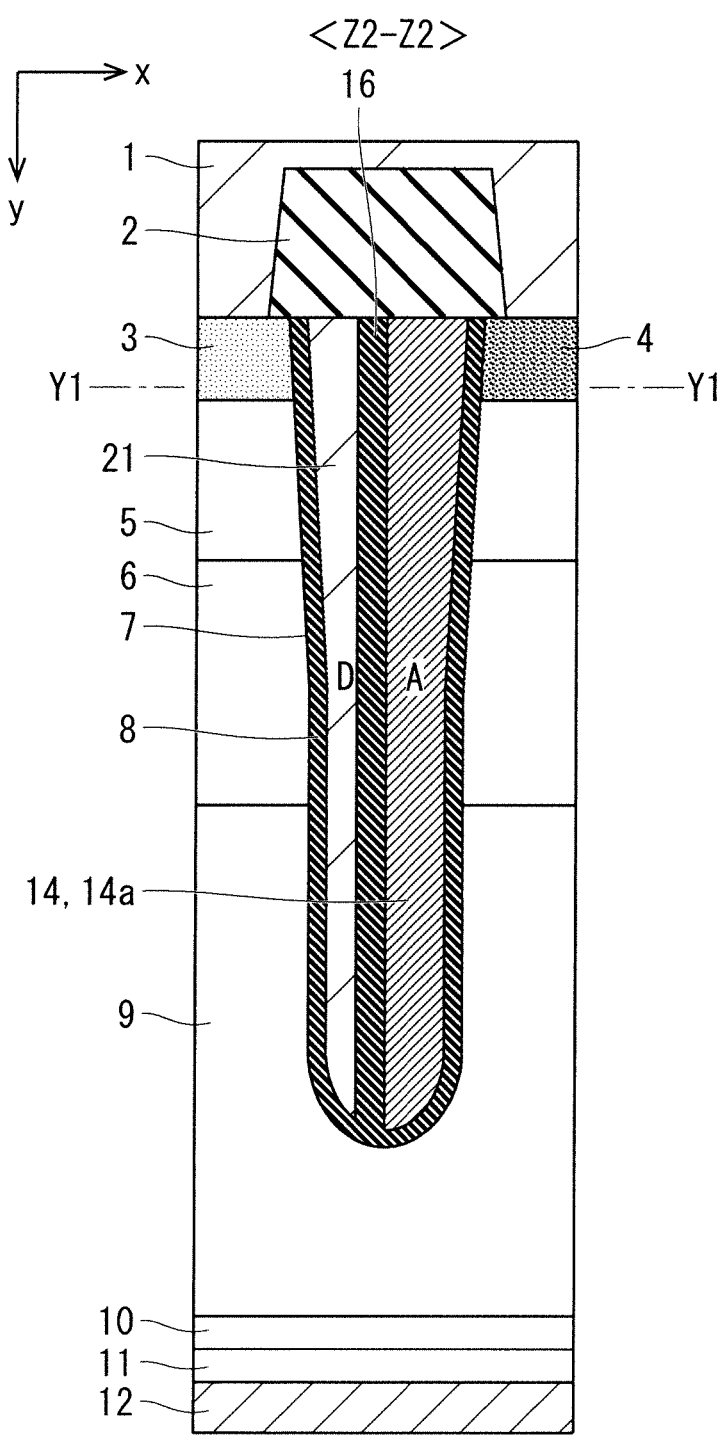
FIG. 58 is a sectional view showing the configuration of the semiconductor element according to the first modification of the second preferred embodiment.

As shown in FIGS. 57 and 58, the dummy portion 21 may be insulated from the gate portion 14 by the buried insulation portion 16 in the respective configurations of FIGS. 40 and 41 in the second preferred embodiment. In other words, the dummy portion 21 may be provided in the recessed portion of the gate portion 14. In general, a region where the buried insulation portion 16 is provided, which has no emitter potential, is prone to increase in electric field. The configuration of FIGS. 57 and 58, however, is capable of increasing the breakdown voltage of the semiconductor element, because the dummy portion 21 reduces the electric field.

<Fifth Modification>

Figure 59:
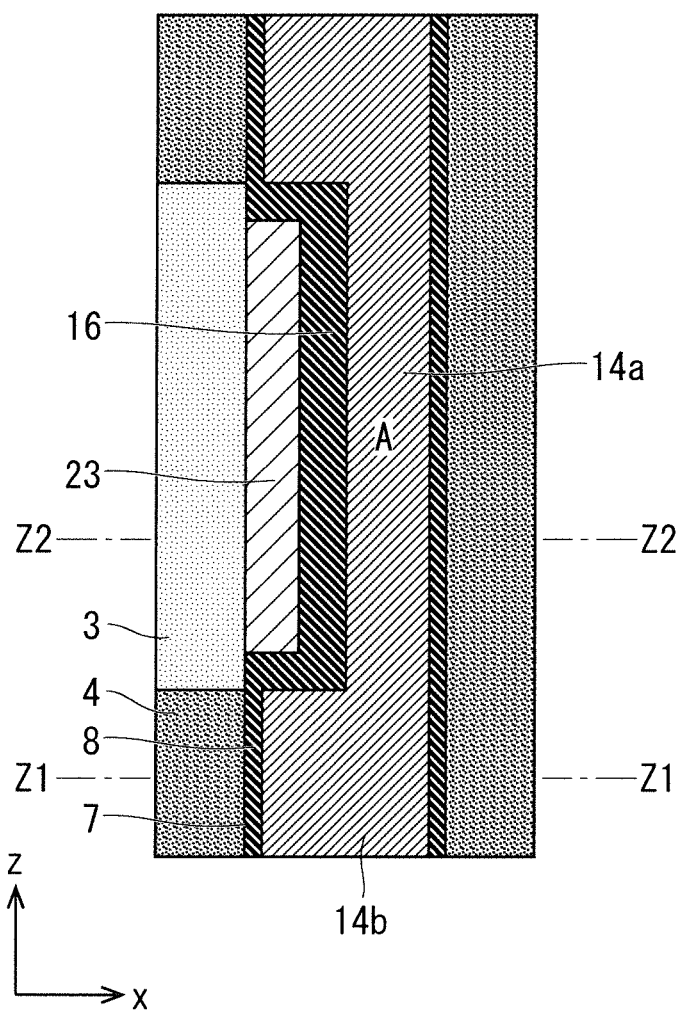
FIG. 59 is a plan view showing the configuration of the semiconductor element according to the first modification of the second preferred embodiment.

In the second preferred embodiment, a Schottky metal portion may be provided as in the sixth modification of the first preferred embodiment. For example, as shown in FIGS. 59 and 60, the Schottky metal portion 23 that is a metal portion insulated from the gate portion 14 by the buried insulation portion 16 and electrically connected to the emitter electrode 1 may be further provided in the first trench 7.

The Schottky metal portion 23 is in Schottky contact with at least one of the carrier storage layer 6 and the drift layer 9. The Schottky metal portion 23 may have the function of a diode. Such a configuration is capable of increasing the breakdown voltage of the semiconductor element in a manner similar to the dummy portion 21.

Third Preferred Embodiment

Figure 61:
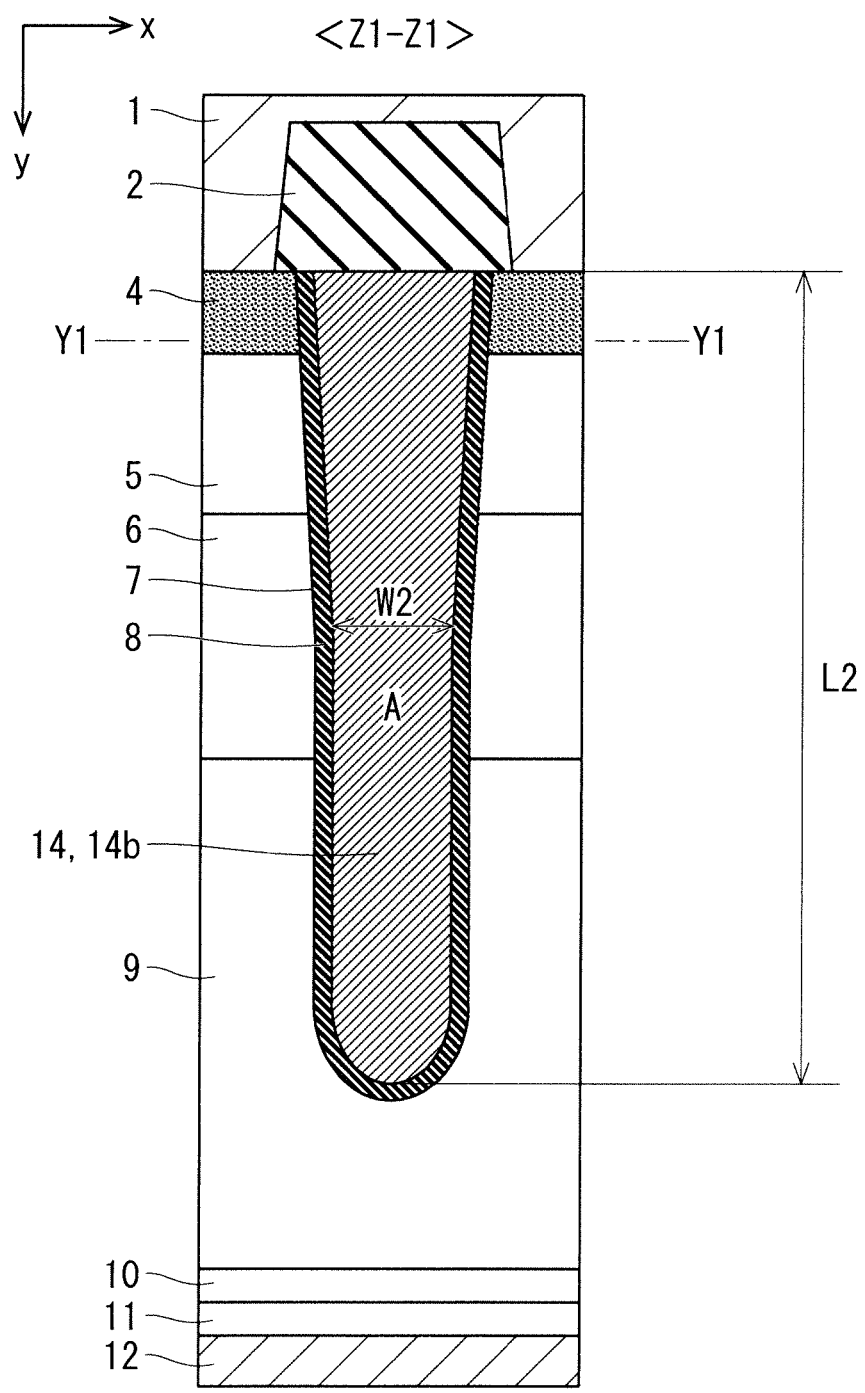
FIGS. 61 and 62 are sectional views showing a configuration of a semiconductor element according to a third preferred embodiment.
Figure 62:
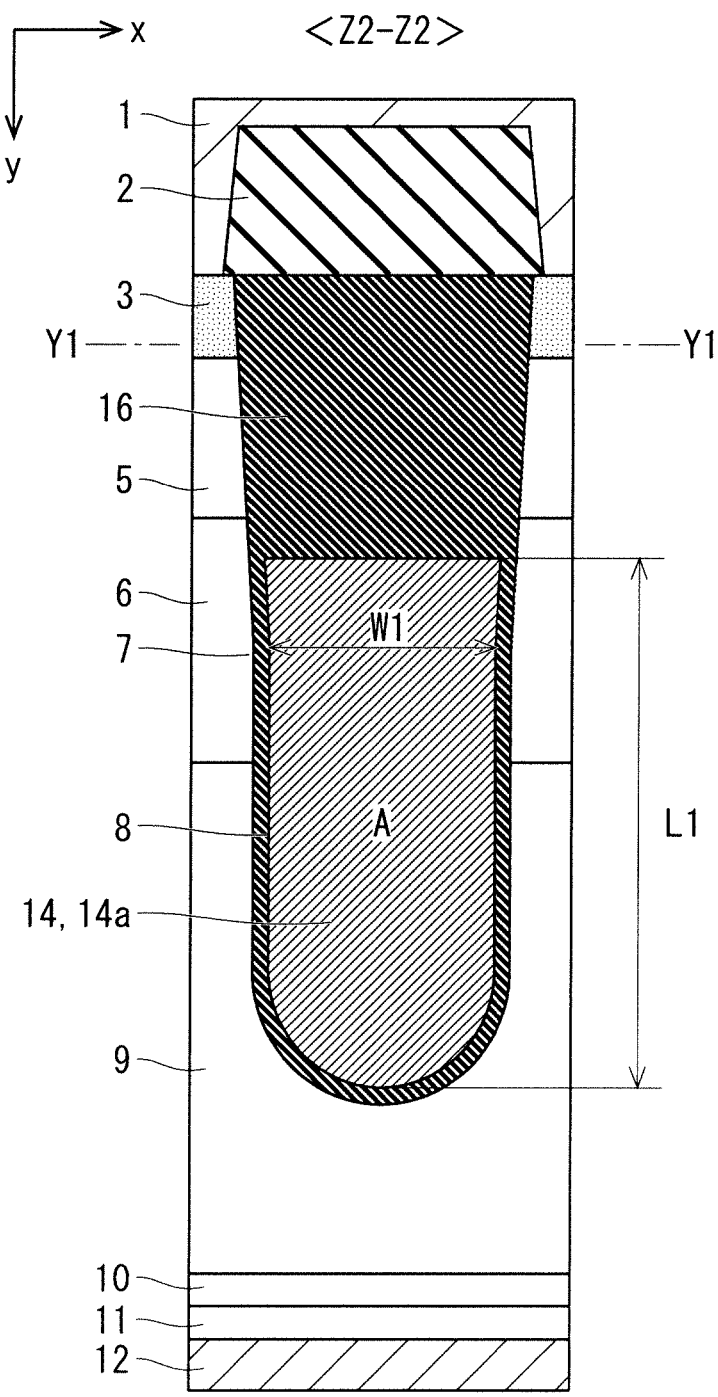
Figure 63:
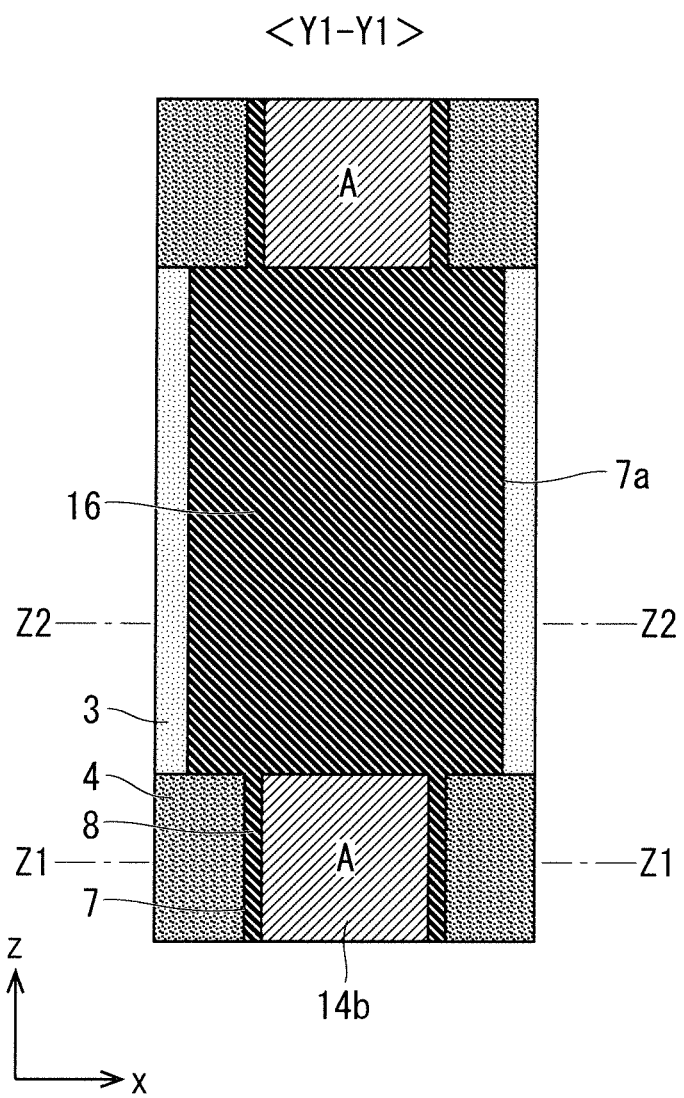
FIG. 63 is a plan view showing the configuration of the semiconductor element according to the third preferred embodiment.

FIGS. 61 and 62 are sectional views showing a configuration of a semiconductor element included in a semiconductor device according to a third preferred embodiment. FIG. 63 is a plan view showing the configuration of the semiconductor element. Specifically, FIG. 61 is a sectional view taken along the line Z1-Z1 of FIG. 63, and FIG. 62 is a sectional view taken along the line Z2-Z2 of FIG. 63. FIG. 63 is a plan view taken along the line Y1-Y1 of FIGS. 61 and 62.

In the second modification of the second preferred embodiment (with reference to FIG. 42), the protruding portion 7a is provided on the sides of the first trench 7 as seen in plan view. A similar configuration may be applied to the first preferred embodiment. Specifically, as shown in FIGS. 61 to 63, the protruding portion 7a may be provided on the sides of the first trench 7 as seen in plan view in the configuration of the first preferred embodiment in which the recessed portion of the gate portion 14 has an opening facing upward. Then, the first gate sub-portion 14a and the buried insulation portion 16 may be provided in the protruding portion 7a. Specifically, the width (as designated by W1 in FIG. 62) of part of the first trench 7 where the buried insulation portion 16 and the first gate sub-portion 14a are provided may be greater than the width (as designated by W2 in FIG. 61) of part of the first trench 7 where the second gate sub-portion 14b is provided.

<Summary of Third Preferred Embodiment>

In a configuration in which the cross-sectional area of the first gate sub-portion 14a is less than that of the second gate sub-portion 14b due to the provision of the buried insulation portion 16, the gate wiring resistance of the gate portion 14 becomes higher in some degree in the first gate sub-portion 14a.

On the other hand, the third preferred embodiment increases the cross-sectional area of the first gate sub-portion 14a because the buried insulation portion 16 and the first gate sub-portion 14a are provided in the protruding portion 7a of the first trench 7. This reduces the gate wiring resistance of the gate portion 14.

Figure 64:
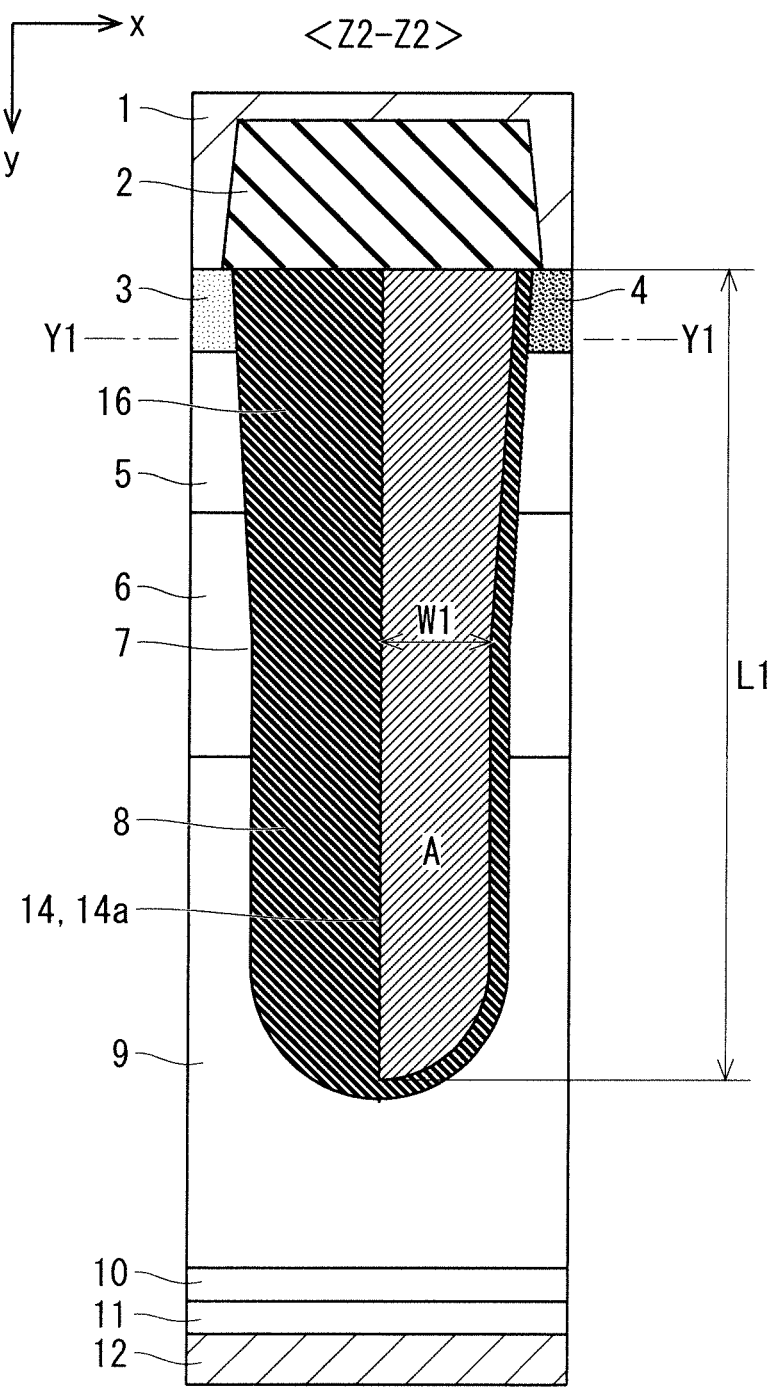
FIG. 64 is a sectional view showing the configuration of the semiconductor element according to the third preferred embodiment.

The first gate sub-portion 14a and the second gate sub-portion 14b may be configured so that the relational expression L1×W1≥L2×W2 is satisfied where L1 and W1 are the height and width, respectively, of the first gate sub-portion 14a, and L2 and W2 are the height and width, respectively, of the second gate sub-portion 14b. In such a configuration, the cross-sectional area of the first gate sub-portion 14a is not less than that of the second gate sub-portion 14b. This sufficiently reduces the gate wiring resistance of the gate portion 14. As shown in FIG. 64, this relational expression may be satisfied similarly, for example, in the configuration of the second modification of the second preferred embodiment of FIG. 45.

Figure 65:
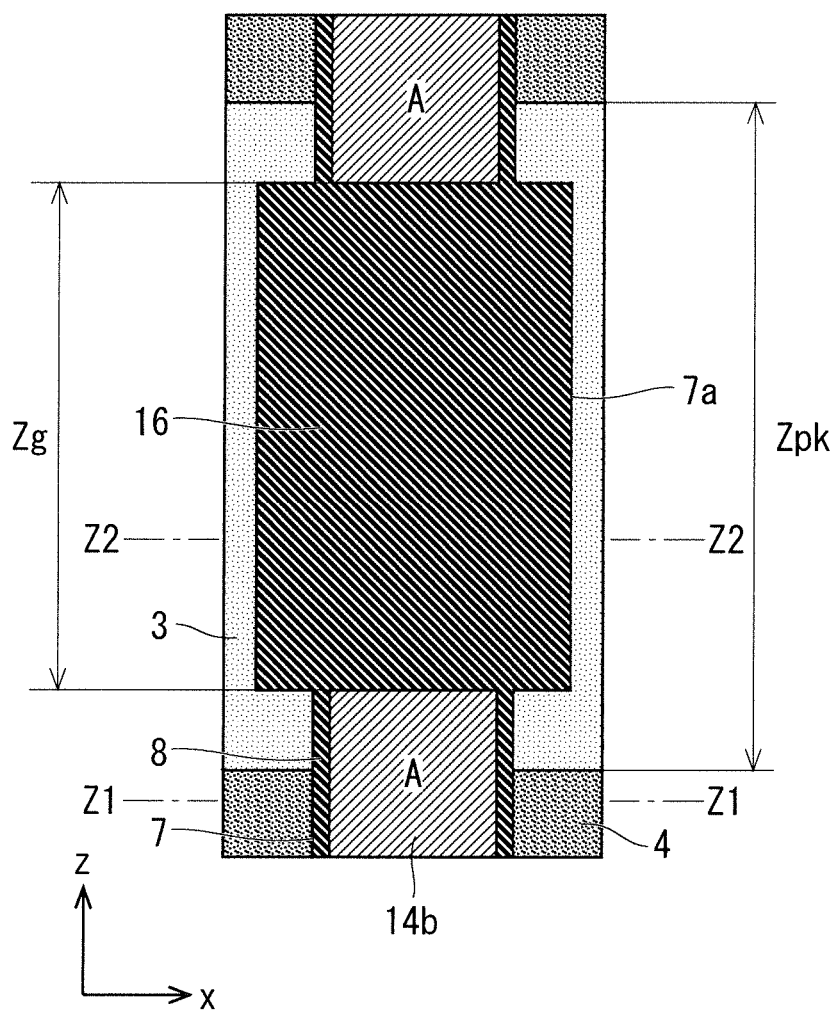
FIG. 65 is a plan view showing the configuration of the semiconductor element according to the third preferred embodiment.

As shown in FIG. 63, if the first gate sub-portion 14a and the buried insulation portion 16 are provided in the protruding portion 7a, the area of the contact layer 3 becomes smaller, which in turn makes it difficult for holes to be discharged. Thus, there is apprehension about the reduction in latch-up resistance. To avoid this, the second gate sub-portion 14b may face the contact layer 3 across the gate oxide film 8, for example, as shown in FIG. 65. Then, a configuration may be made so that the relational expression Zpk>Zg is satisfied where Zpk is the length of the contact layer 3 in the direction of extension (e.g., in the z direction) of the first trench 7 as seen in plan view, and Zg is the length of the buried insulation portion 16 in that direction. Such a configuration is capable of promoting the discharge of holes to increase the latch-up resistance as in the second modification of the first preferred embodiment.

<Modifications>

Figure 66:
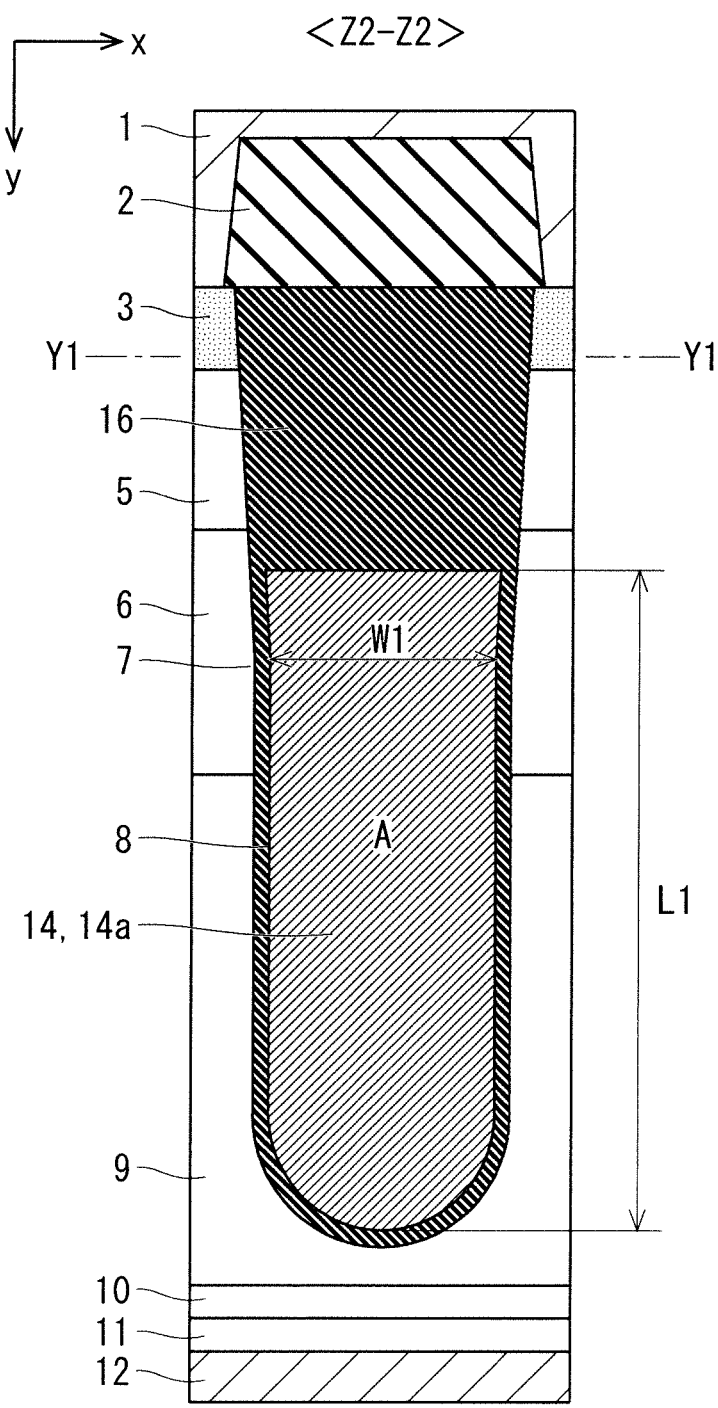
FIG. 66 is a sectional view showing a configuration of a semiconductor element according to a modification of the third preferred embodiment.

Although increasing the width of the first trench 7 is described in the third preferred embodiment, the present disclosure is not limited to this. For example, as shown in FIG. 66, a lower part of the first gate sub-portion 14a may be positioned below a lower part of the second gate sub-portion 14b. For example, the relational expression L1>L2 may be satisfied. Also, the first gate sub-portion 14a and the second gate sub-portion 14b may be configured so that the relational expression L1×W1≥L2×W2 is satisfied where L1 and W1 are the height and width, respectively, of the first gate sub-portion 14a, and L2 and W2 are the height and width, respectively, of the second gate sub-portion 14b. The aforementioned configuration is capable of reducing the gate wiring resistance of the gate portion 14 in a manner similar to the third preferred embodiment.

In the example of FIG. 66, the width of part of the first trench 7 where the first gate sub-portion 14a and the buried insulation portion 16 are provided is greater than the width of part of the first trench 7 where the second gate sub-portion 14b is provided. However, both of the widths may be equal to each other. This modification is not limited to the configuration of FIG. 62, but may be applied to the configuration of FIG. 64 and the like.

Fourth Preferred Embodiment

Figure 67:
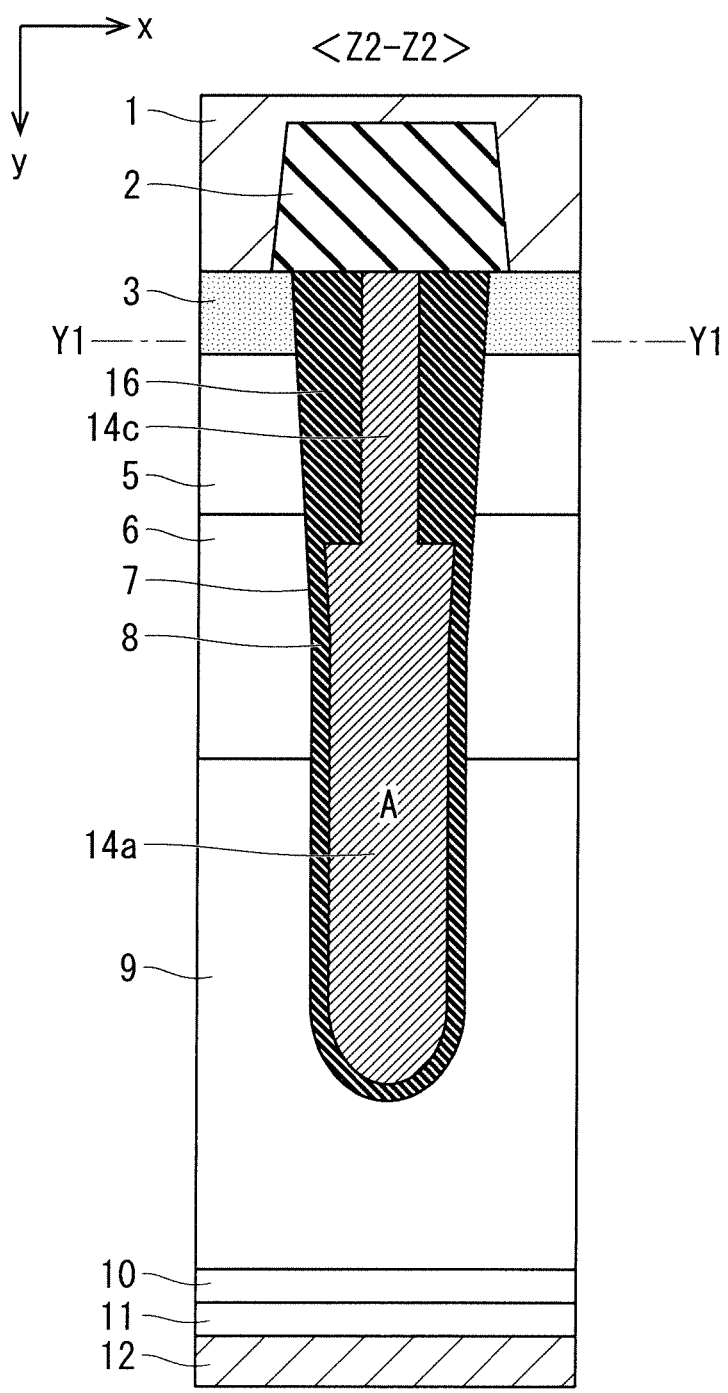
FIG. 67 is a sectional view showing a configuration of a semiconductor element according to a fourth preferred embodiment.

FIG. 67 is a sectional view showing a configuration of a semiconductor element included in a semiconductor device according to a fourth preferred embodiment. FIG. 68 is a plan view showing the configuration of the semiconductor element. Specifically, FIG. 67 is a sectional view taken along the line Z2-Z2 of FIG. 68. A sectional view taken along the line Z1-Z1 of FIG. 68 is similar to that of FIG. 61.

In the fourth preferred embodiment, the gate portion 14 in the configuration of the first preferred embodiment includes not only the first gate sub-portion 14a and the second gate sub-portion 14b but also a third gate sub-portion 14c. This third gate sub-portion 14c is provided on the first gate sub-portion 14a, and has a width smaller than those of the first gate sub-portion 14a and the second gate sub-portion 14b. In such a configuration, the cross-sectional area of the third gate sub-portion 14c is added to the cross-sectional area of the first gate sub-portion 14a. This reduces the gate wiring resistance of the gate portion 14.

Figure 69:
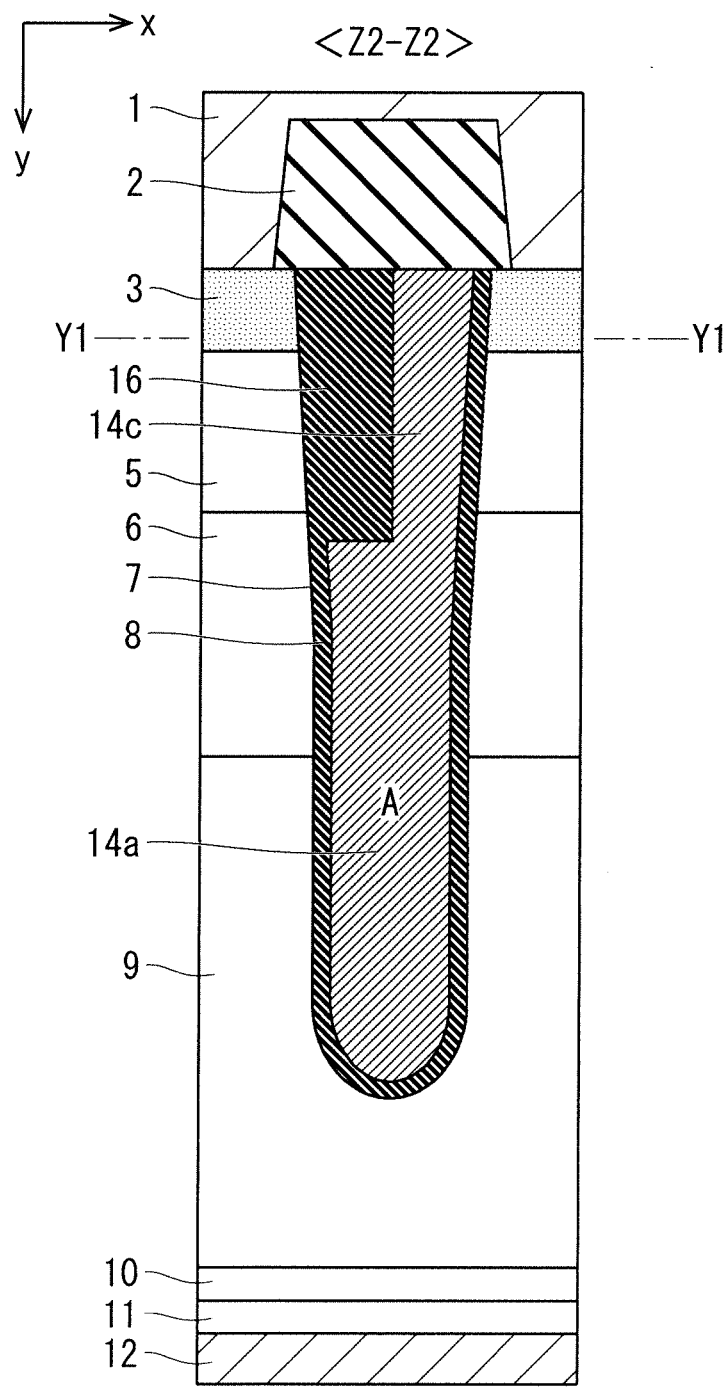
FIG. 69 is a sectional view showing the configuration of the semiconductor element according to the fourth preferred embodiment.
Figure 70:
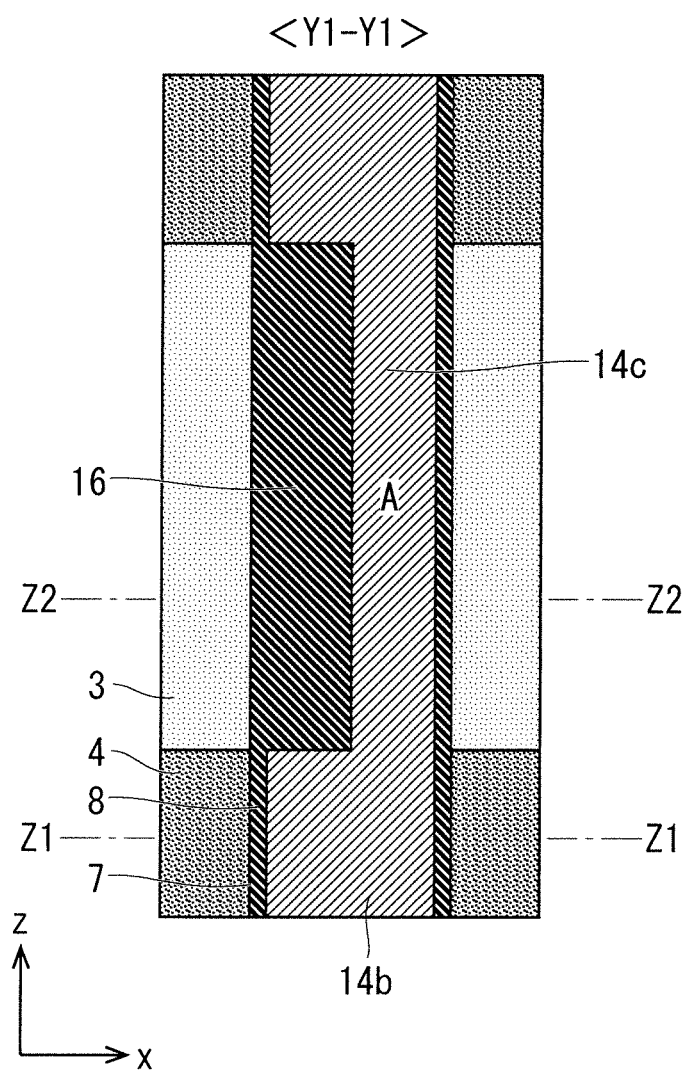
FIG. 70 is a plan view showing the configuration of the semiconductor element according to the fourth preferred embodiment.

As shown in FIGS. 69 and 70, the third gate sub-portion 14c may be disposed eccentrically to one side of the gate portion 14 as seen in plan view or in cross section. Such a configuration is capable of increasing the thickness of the third gate sub-portion 14c to further reduce the gate wiring resistance of the gate portion 14.

<First Modification>

Figure 71:
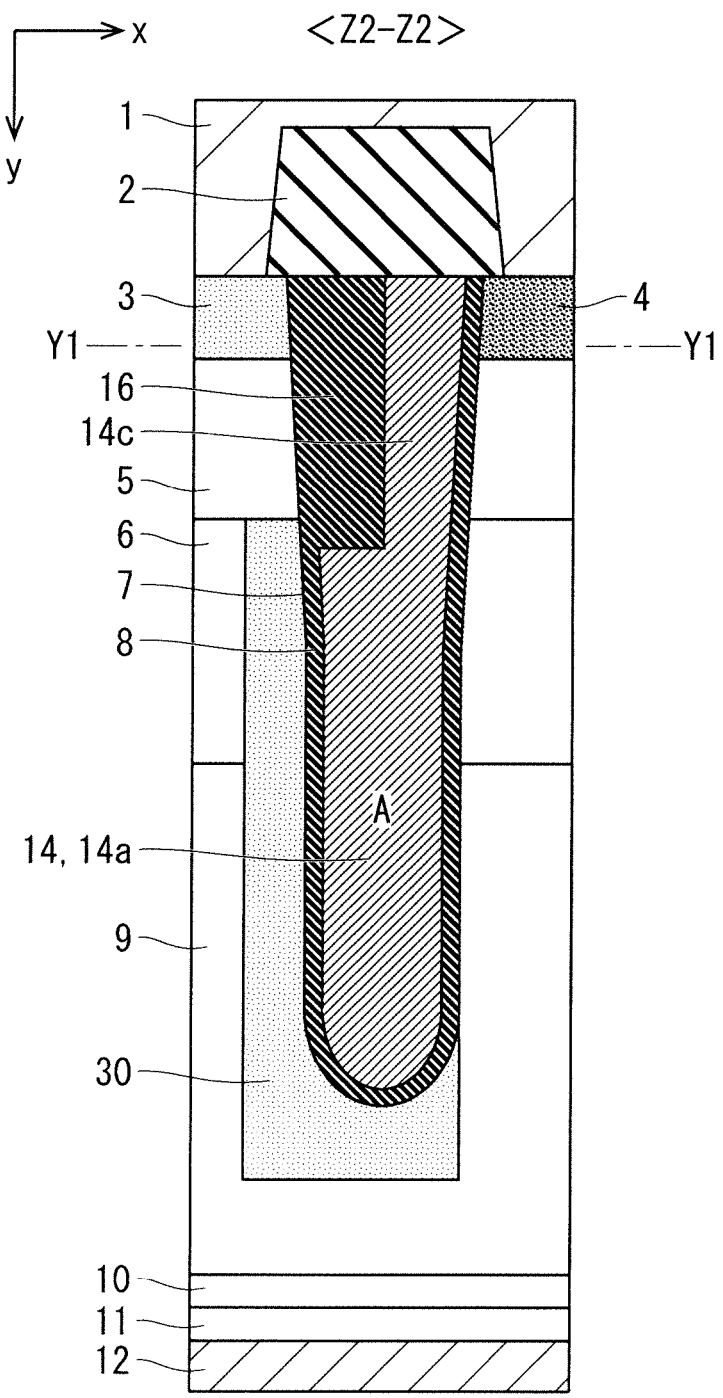
FIGS. 71 to 73 are sectional views showing a configuration of a semiconductor element according to a first modification of the fourth preferred embodiment.

In a first modification of the fourth preferred embodiment, as shown in FIG. 71, one side of the third gate sub-portion 14c of FIG. 69 faces the source layer 4 across the gate oxide film 8. A p type protective layer 30 is provided partially between the first trench 7 and the drift layer 9, and is connected to the base layer 5. In the example of FIG. 71, the protective layer 30 is provided on the bottom of the first trench 7 and on one side of the first trench 7 opposite to the source layer 4 under the contact layer 3. At least part of the buried insulation portion 16 is provided between the third gate sub-portion 14c of the gate portion 14 and the protective layer 30.

Figure 72:
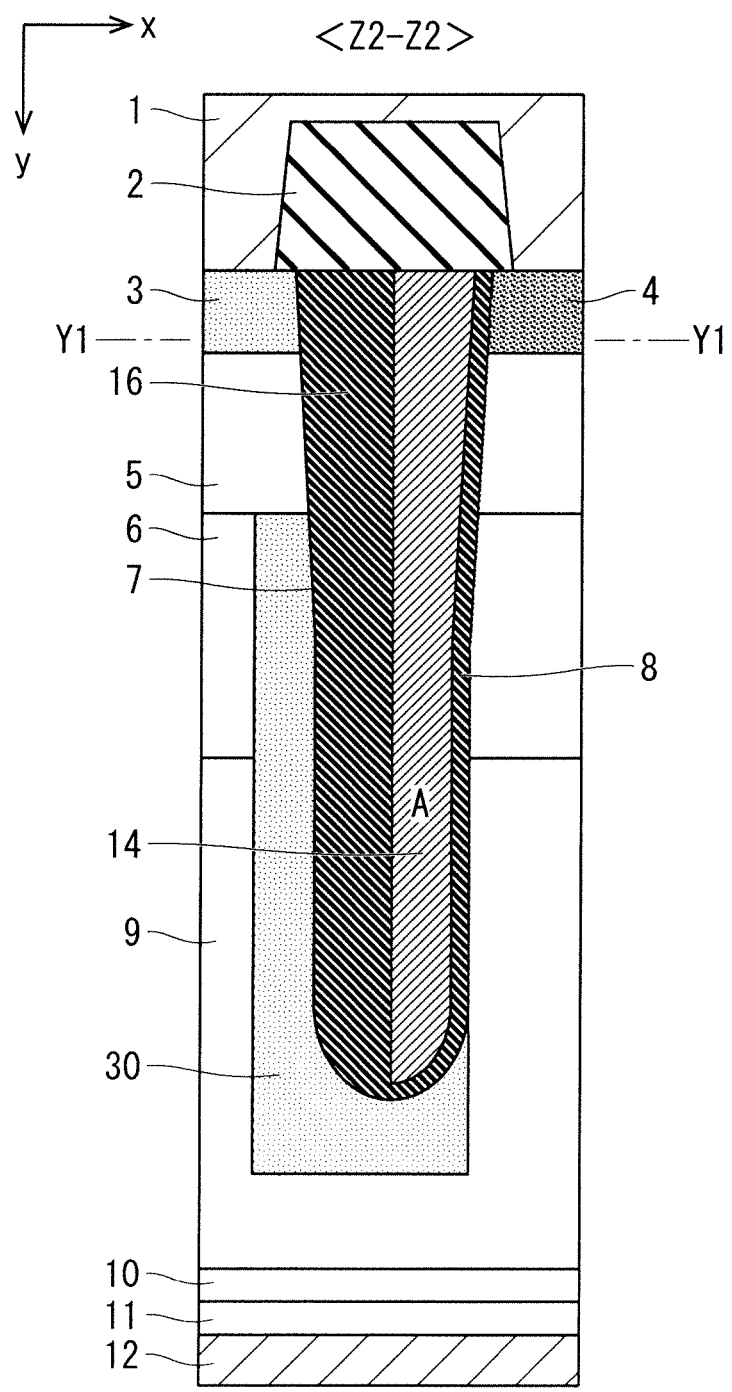
Figure 73:
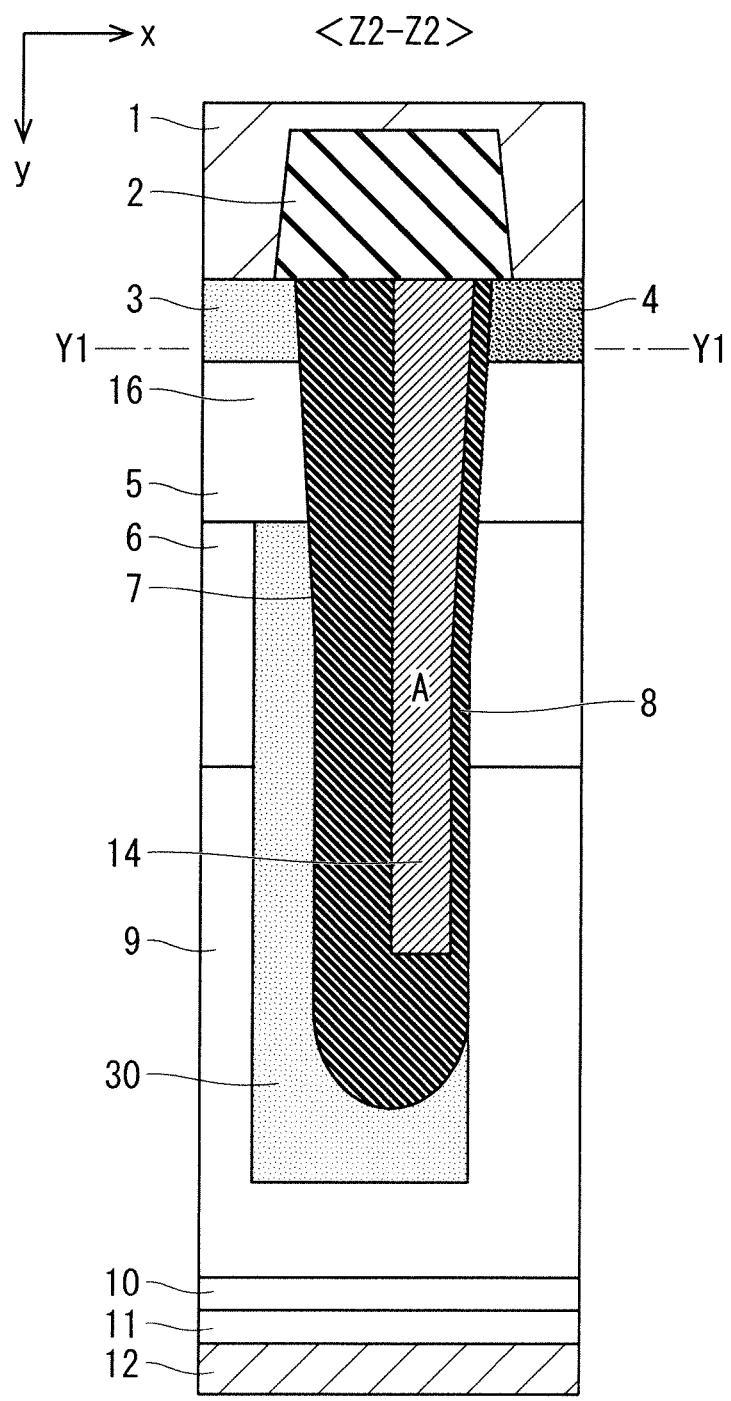

In general, no current path is formed by the protective layer 30 in a region where the protective layer 30 is provided in contact with the first trench 7. For this reason, even if the gate portion 14 is present in the vicinity of the protective layer 30, only the gate-emitter capacitance Cge increases but no current flows. The provision of at least part of the buried insulation portion 16 between the gate portion 14 and the protective layer 30 reduces the gate-emitter capacitance Cge in the region where no current path is formed. As shown in FIGS. 72 and 73, a configuration in which part of the gate portion 14 which is close to the protective layer 30 is reduced is capable of further reducing the gate-emitter capacitance Cge. This first modification is not limited to the configuration of the fourth preferred embodiment but may be applied to the configurations of the first to third preferred embodiments.

<Second Modification>

Figure 74:
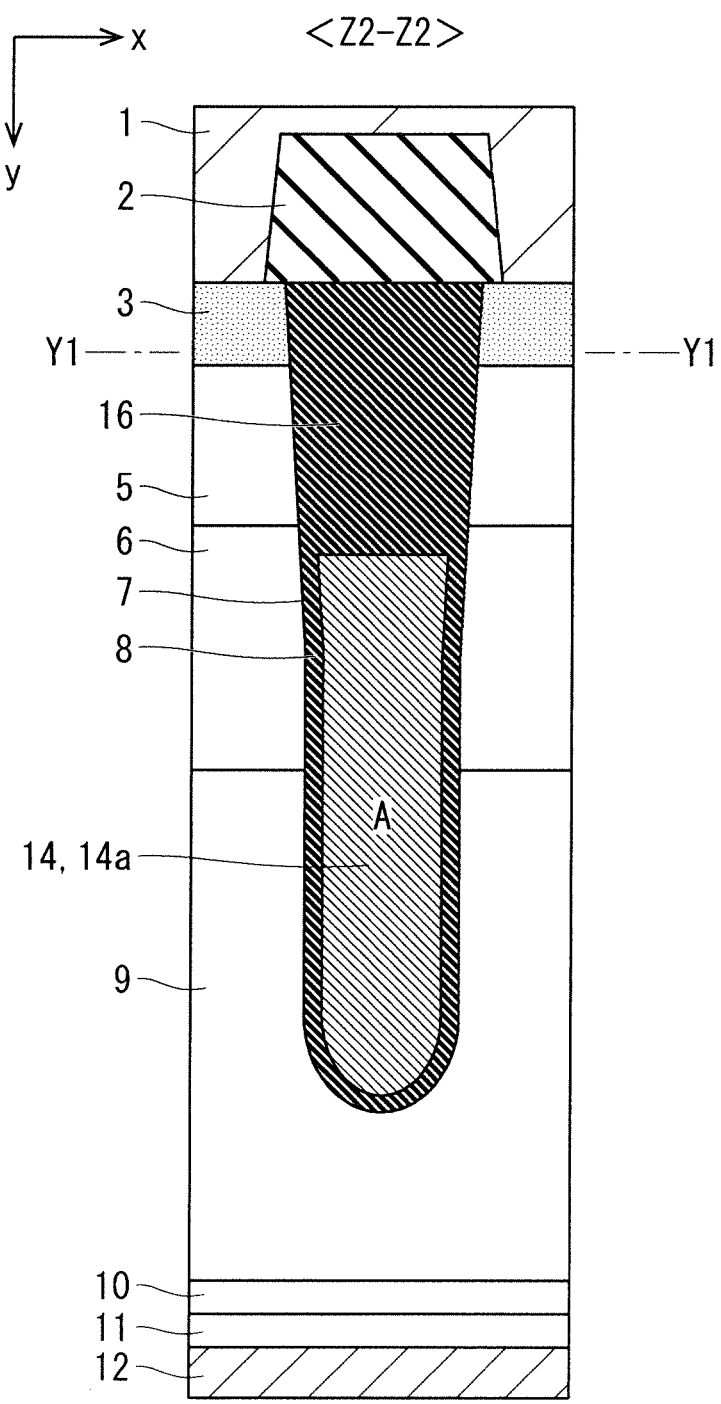
FIGS. 74 and 75 are sectional views showing a configuration of a semiconductor element according to a second modification of the fourth preferred embodiment.

The material of the first gate sub-portion 14a is polysilicon in the aforementioned configurations, but is not limited to this. For example, as shown in FIG. 74, the material of the first gate sub-portion 14a may be metal that is lower in electrical resistance than polysilicon. Such a configuration is capable of reducing the gate wiring resistance. Also, the material of the second gate sub-portion 14b may be metal, rather than polysilicon.

Figure 75:
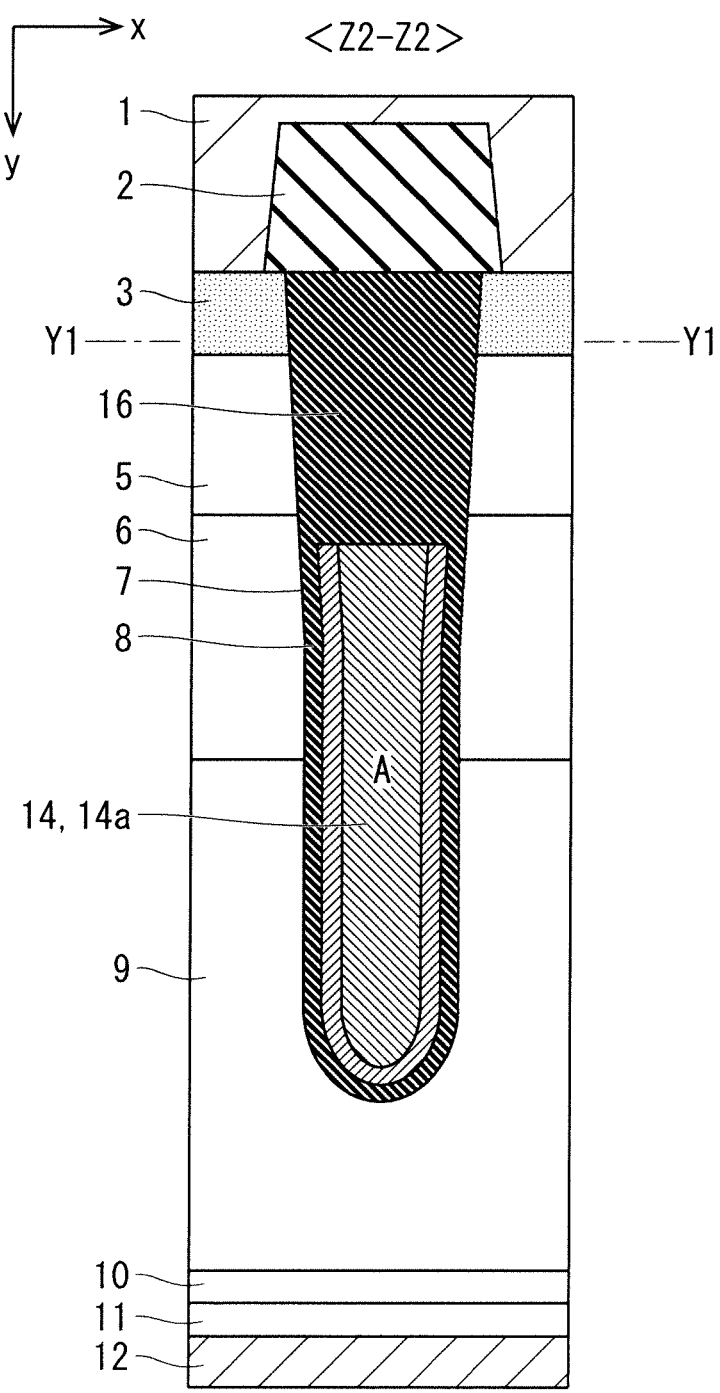

As shown in FIG. 75, the material of at least one of the first and second gate portions 14a and 14b may be a double-layer structure comprised of polysilicon and metal. A double-layer structure in which polysilicon covers metal is illustrated in FIG. 75 as the material of at least one of the first and second gate portions 14a and 14b. However, a double-layer structure in which metal covers polysilicon may be used. This second modification is not limited to the configuration of the fourth preferred embodiment but may be applied to the configurations of the first to third preferred embodiments.

Fifth Preferred Embodiment

In a fifth preferred embodiment, a lower part of the contact layer 3 is disposed in a lower position for the purpose of increasing the latch-up resistance by promoting the discharge of holes. While the configuration based on the first preferred embodiment, i.e. the configuration in which the recessed portion of the gate portion 14 has an opening facing upward, will be mainly described below, the same holds true for the configuration based on the second preferred embodiment, i.e. the configuration in which the recessed portion of the gate portion 14 has an opening facing sideward.

Figure 76:
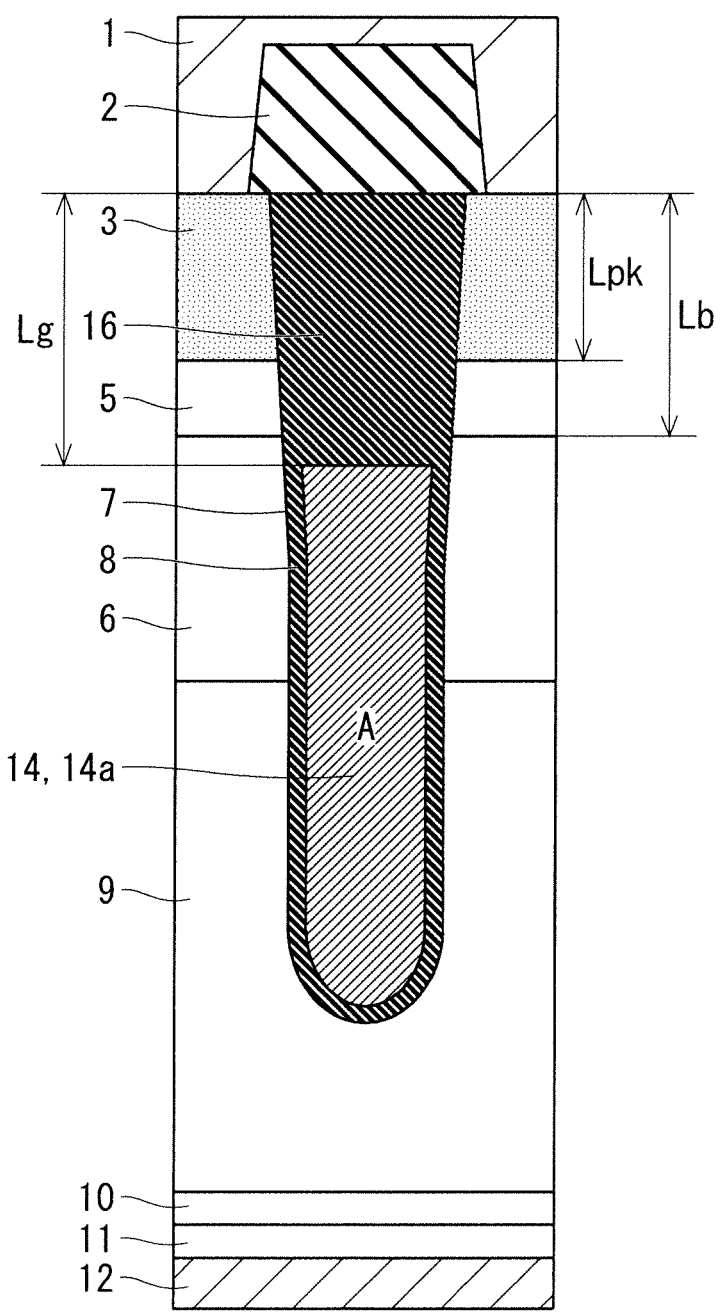
FIG. 76 is a sectional view showing a configuration of a semiconductor element according to a fifth preferred embodiment.

FIG. 76 is a sectional view showing a configuration of a semiconductor element included in a semiconductor device according to the fifth preferred embodiment, and is a sectional view corresponding to FIG. 2 of the first preferred embodiment. The lower part of the contact layer 3 of FIG. 76 is disposed in a position lower than the lower part of the contact layer 3 of FIG. 2.

Figure 77:
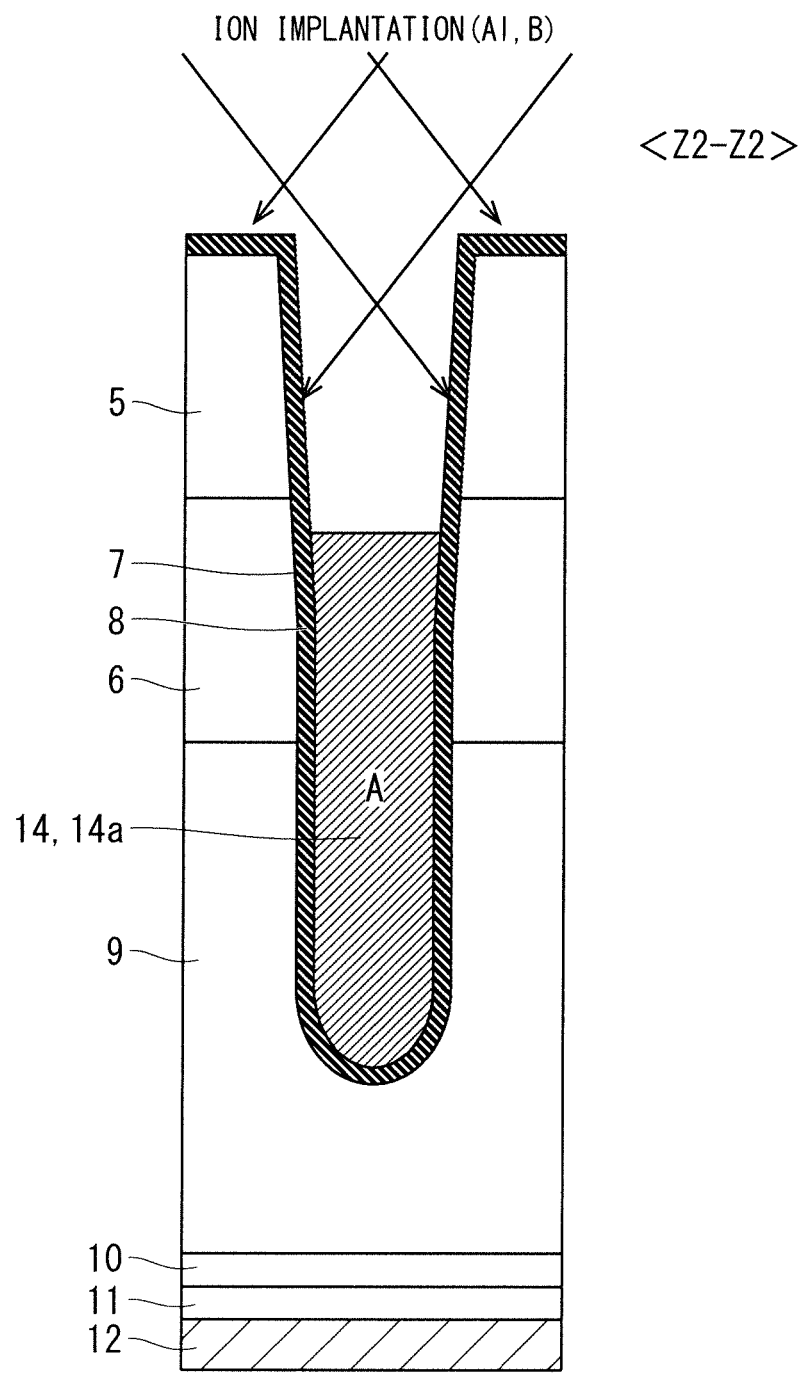
FIG. 77 is a sectional view for illustrating a method of manufacturing the semiconductor element according to the fifth preferred embodiment.
Figure 78:
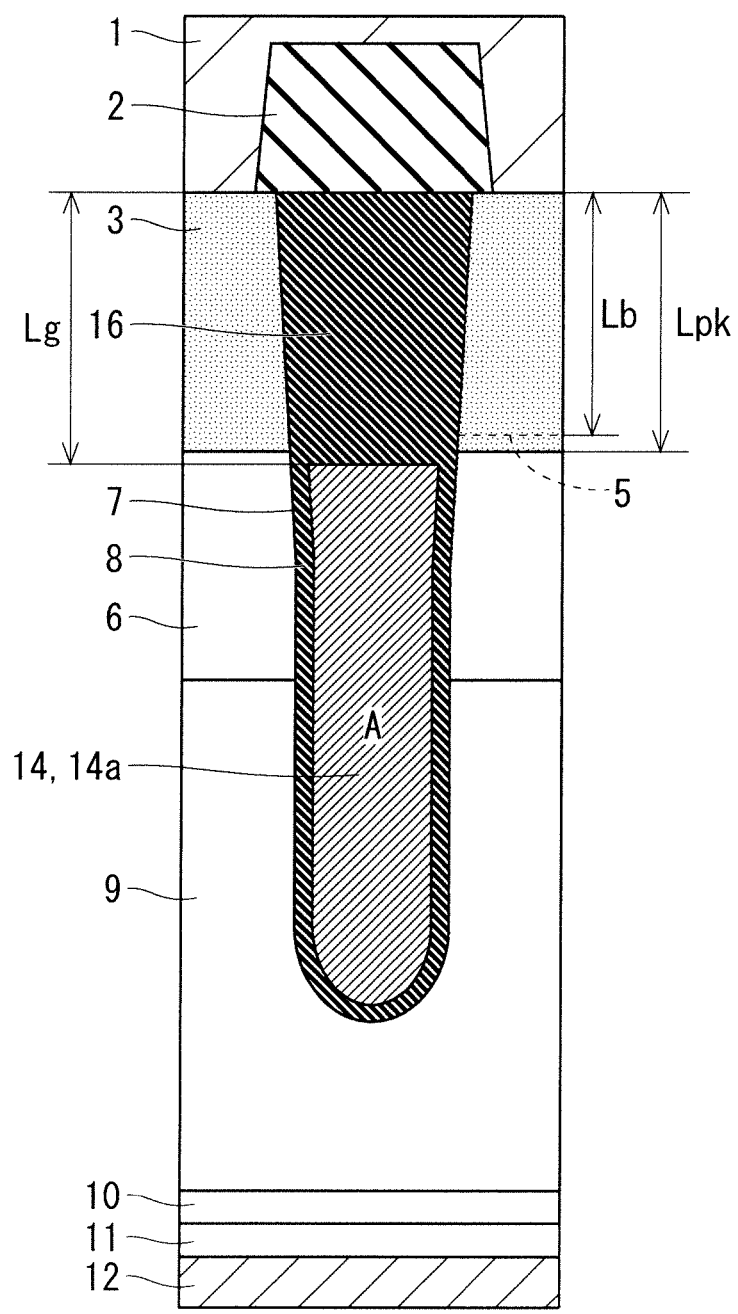
FIGS. 78 and 79 are sectional views showing the configuration of the semiconductor element according to the fifth preferred embodiment.

FIG. 77 is a sectional view for illustrating a method of manufacturing the semiconductor element according to the fifth preferred embodiment, and specifically a method of forming the contact layer 3. With reference to FIG. 77, the first gate sub-portion 14a and the second gate sub-portion 14b are formed by selectively etching polysilicon. In the manufacturing method of the fifth preferred embodiment, the contact layer 3 is thereafter selectively formed by an oblique ion implantation process in which p type impurities such as boron (B) or aluminum (Al) are implanted into the inner wall of the first trench 7 on the first gate sub-portion 14a. Such a manufacturing method is capable of forming the contact layer 3 to a deep position to thereby increase the latch-up resistance As shown in FIG. 78, a configuration may be made so that the relational expression Lpk>Lb is satisfied where Lpk is a distance from the upper surface of the semiconductor substrate to the lower part of the contact layer 3, and Lb is the distance from the upper surface of the semiconductor substrate to the lower part of the base layer 5. In other words, the contact layer 3 may be selectively formed on the upper surface side of the carrier storage layer 6 or the drift layer 9, rather than the base layer 5. Such a configuration is capable of further increasing the latch-up resistance.

Figure 79:
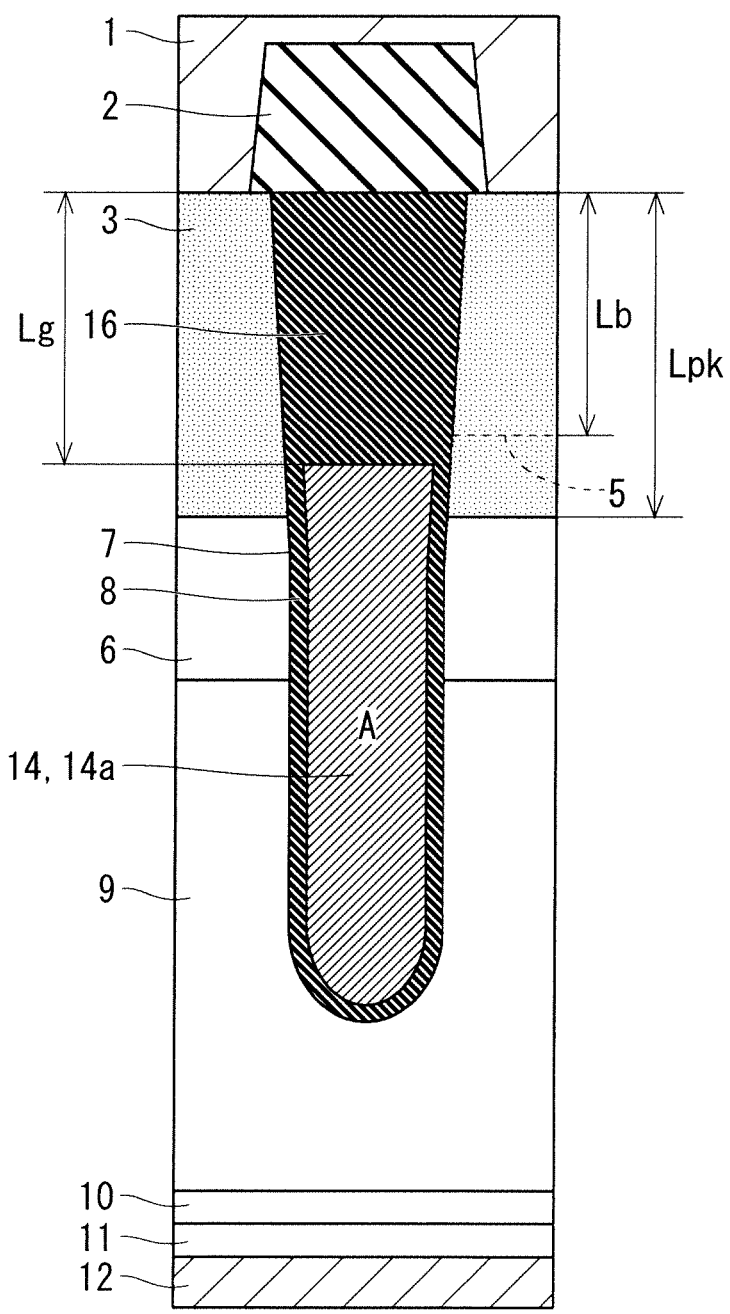

As shown in FIG. 79, a configuration may be made so that the relational expression Lpk>Lg is satisfied where Lg is the distance from the upper surface of the semiconductor substrate to the upper part of the first gate sub-portion 14a. Such a configuration is capable of further increasing the latch-up resistance.

<First Modification>

Figure 80:
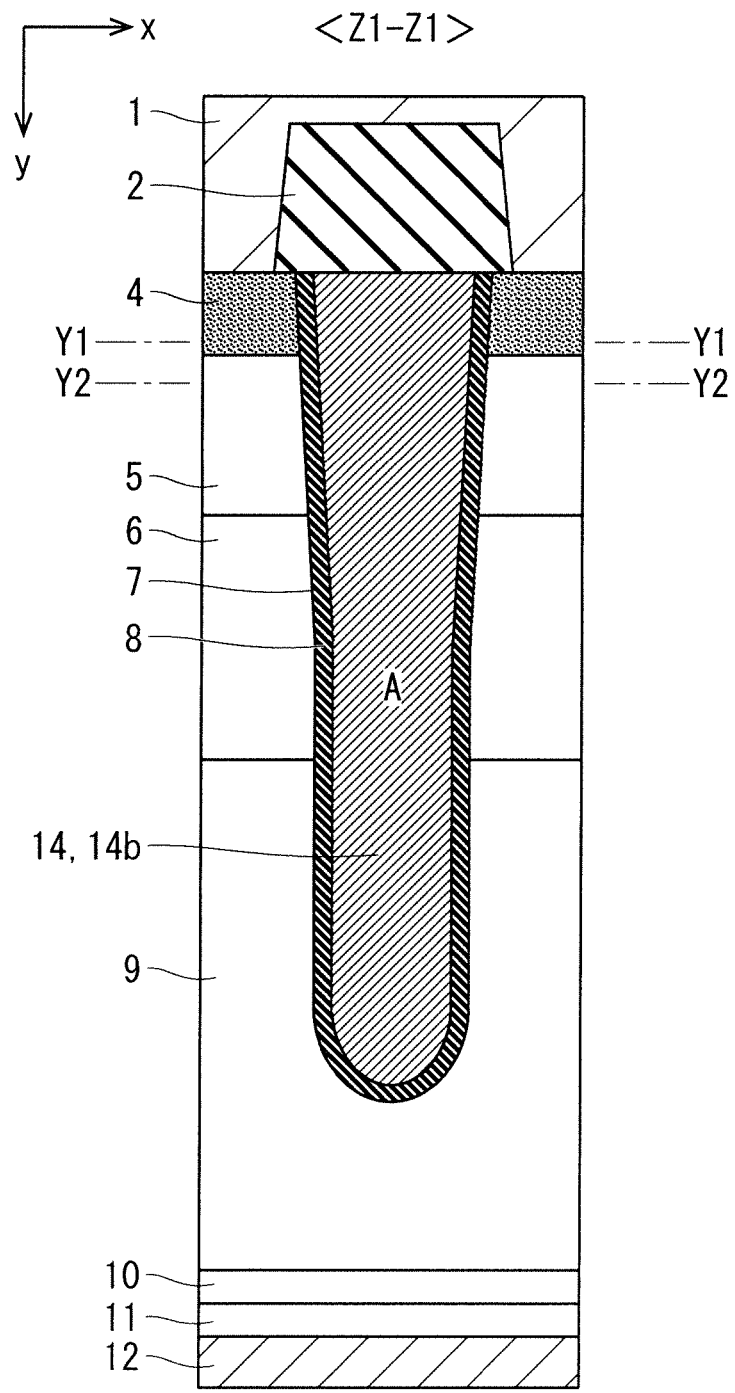
FIGS. 80 and 81 are sectional views showing a configuration of a semiconductor element according to a first modification of the fifth preferred embodiment.
Figure 81:
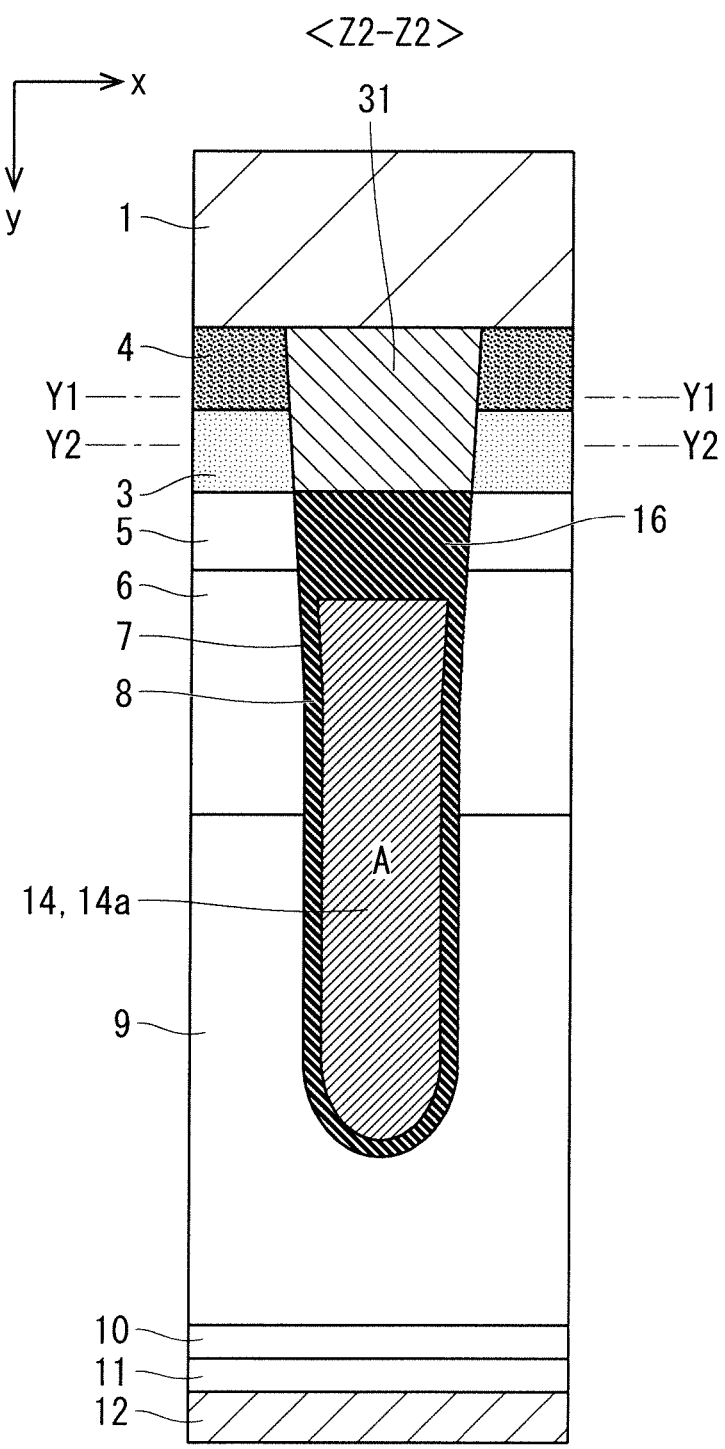
Figure 82:
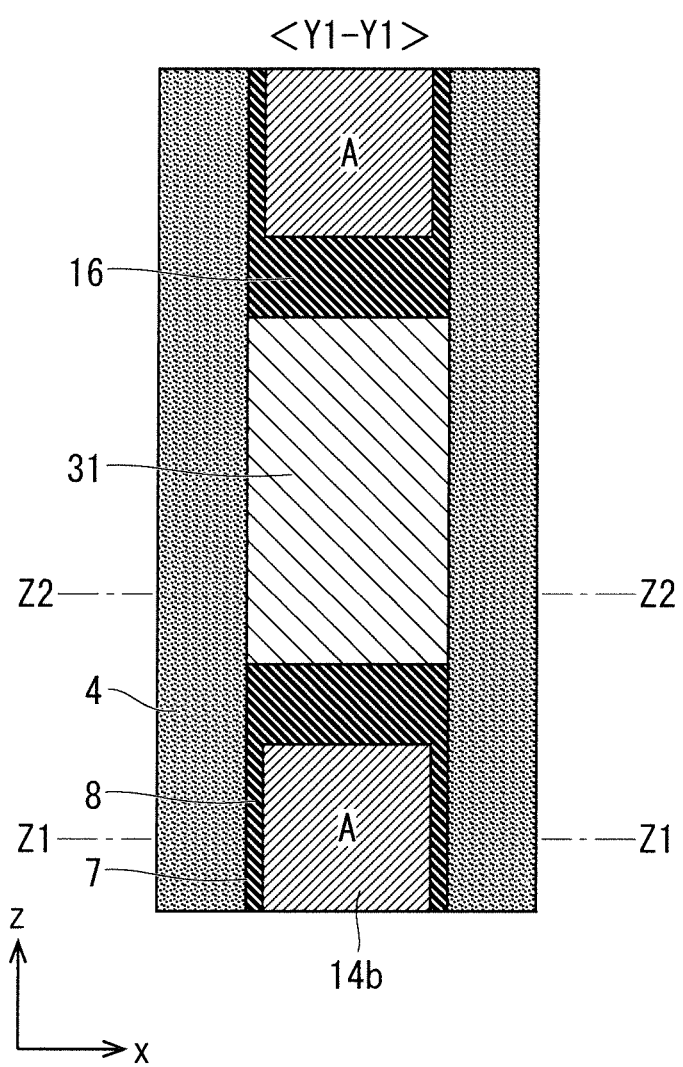
FIGS. 82 and 83 are plan views showing the configuration of the semiconductor element according to the first modification of the fifth preferred embodiment.
Figure 83:
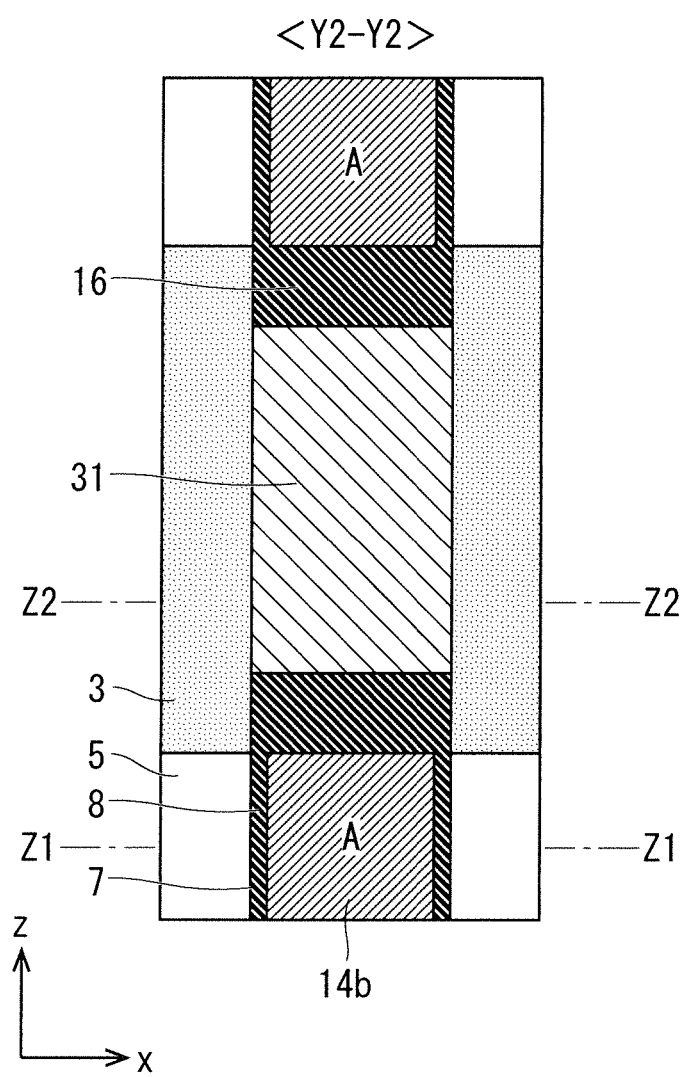
Figure 84:
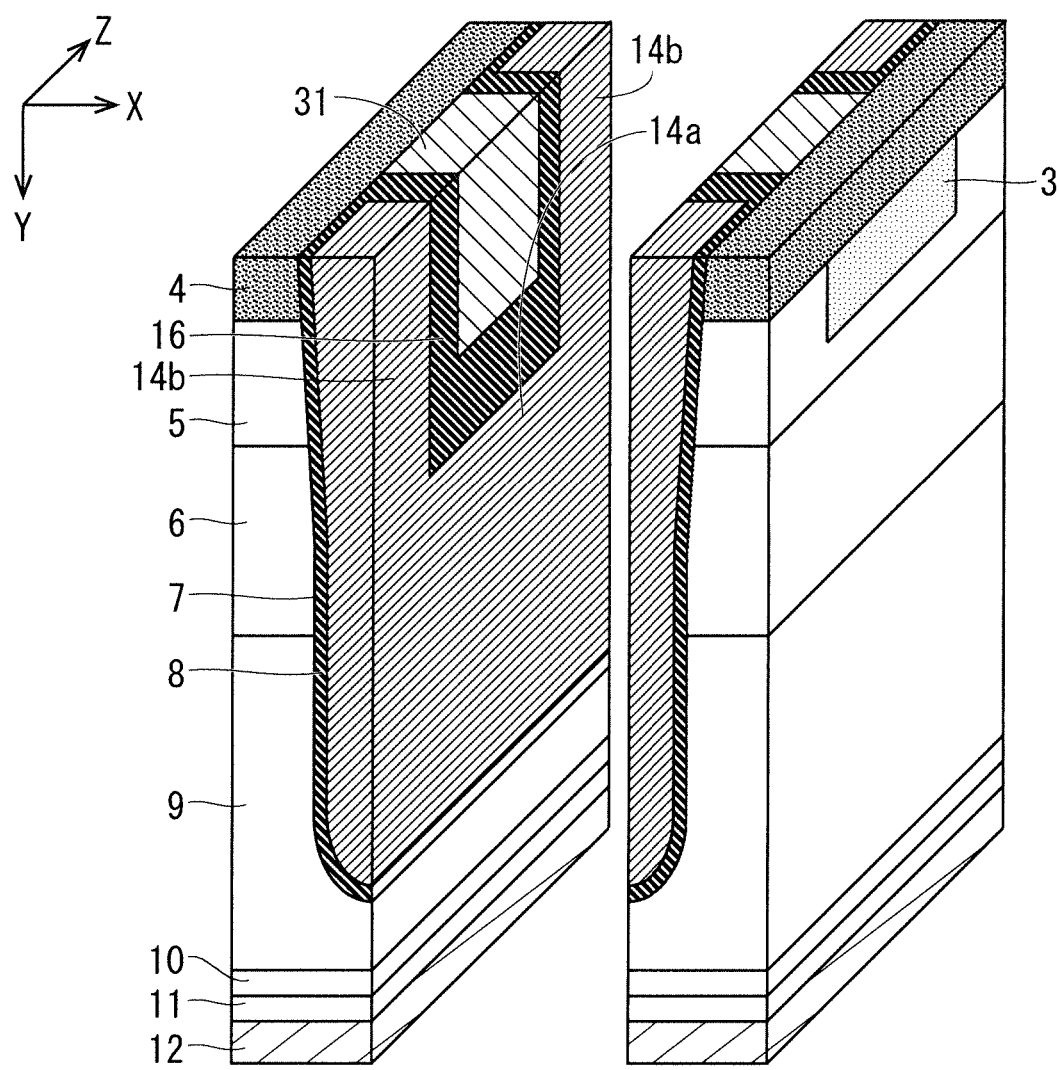
FIG. 84 is a perspective view showing the configuration of the semiconductor element according to the first modification of the fifth preferred embodiment.

FIGS. 80 and 81 are sectional views showing a configuration of a semiconductor element included in a semiconductor device according to a first modification of the fifth preferred embodiment. FIGS. 82 and 83 are plan views showing the configuration of the semiconductor element. FIG. 84 is a cutaway perspective view showing the configuration of the semiconductor element. Specifically, FIG. 80 is a sectional view taken along the line Z1-Z1 of FIGS. 82 and 83, and FIG. 81 is a sectional view taken along the line Z2-Z2 of FIGS. 82 and 83. FIG. 82 is a plan view taken along the line Y1-Y1 of FIGS. 80 and 81, and FIG. 83 is a plan view taken along a line Y2-Y2 of FIGS. 80 and 81. FIG. 84 is a cutaway perspective view showing the configuration of the semiconductor element.

In the first modification of the fifth preferred embodiment, the contact layer 3 is provided between the base layer 5 and the source layer 4 as seen in a vertical direction, as shown in FIGS. 80 to 84. This allows a region in which the source layer 4 of the first modification of the fifth preferred embodiment is provided to be wider than a region in which the source layer 4 of the first preferred embodiment is provided, so that the region in which the source layer 4 is provided is the same as a region in which the base layer 5 is provided. As a result, this eliminates the need for a mask for the source layer 4 to reduce the manufacturing costs.

FIG. 85 is a sectional view for illustrating a method of manufacturing the semiconductor element according to the first modification of the fifth preferred embodiment, and specifically a method of forming the contact layer 3. In FIG. 85, the first gate sub-portion 14a and the second gate sub-portion 14b not shown are formed, and the source layer 4 is provided in the inner wall of the first trench 7 above the first gate sub-portion 14a. In the manufacturing method of the first modification of the fifth preferred embodiment, the contact layer 3 is selectively formed under the source layer 4 by an oblique ion implantation process in which p type impurities such as boron (B) or aluminum (Al) are implanted into the inner wall of the first trench 7 above the first gate sub-portion 14a. Such a manufacturing method is capable of forming the contact layer 3 to a deep position to thereby increase the latch-up resistance.

The impurity concentration of the contact layer 3 may be lower than that of the source layer 4. Such a configuration allows the contact layer 3 to be formed on the lower surface of the source layer 4 while the source layer 4 is left even when the contact layer 3 is formed by ion implantation as shown in FIG. 85.

As shown in FIGS. 80 to 84, a buried metal portion 31 that is a metal portion insulated from the gate portion 14 by the buried insulation portion 16 and in ohmic contact with the contact layer 3 and the source layer 4 may be provided in the first trench 7. The buried metal portion 31 may or may not be part of the emitter electrode 1. Such a configuration eliminates the need for the provision of a contact region for the emitter electrode 1 in the mesa region. This makes the mesa region smaller to reduce the on-state voltage.

In the aforementioned description, the contact layer 3 is formed in a deep position in the semiconductor substrate by the oblique ion implantation process. However, the present disclosure is not limited to this. For example, the contact layer 3 may be formed in a deep position in the semiconductor substrate by a high energy ion implantation process.

<Second Modification>

Figure 86:
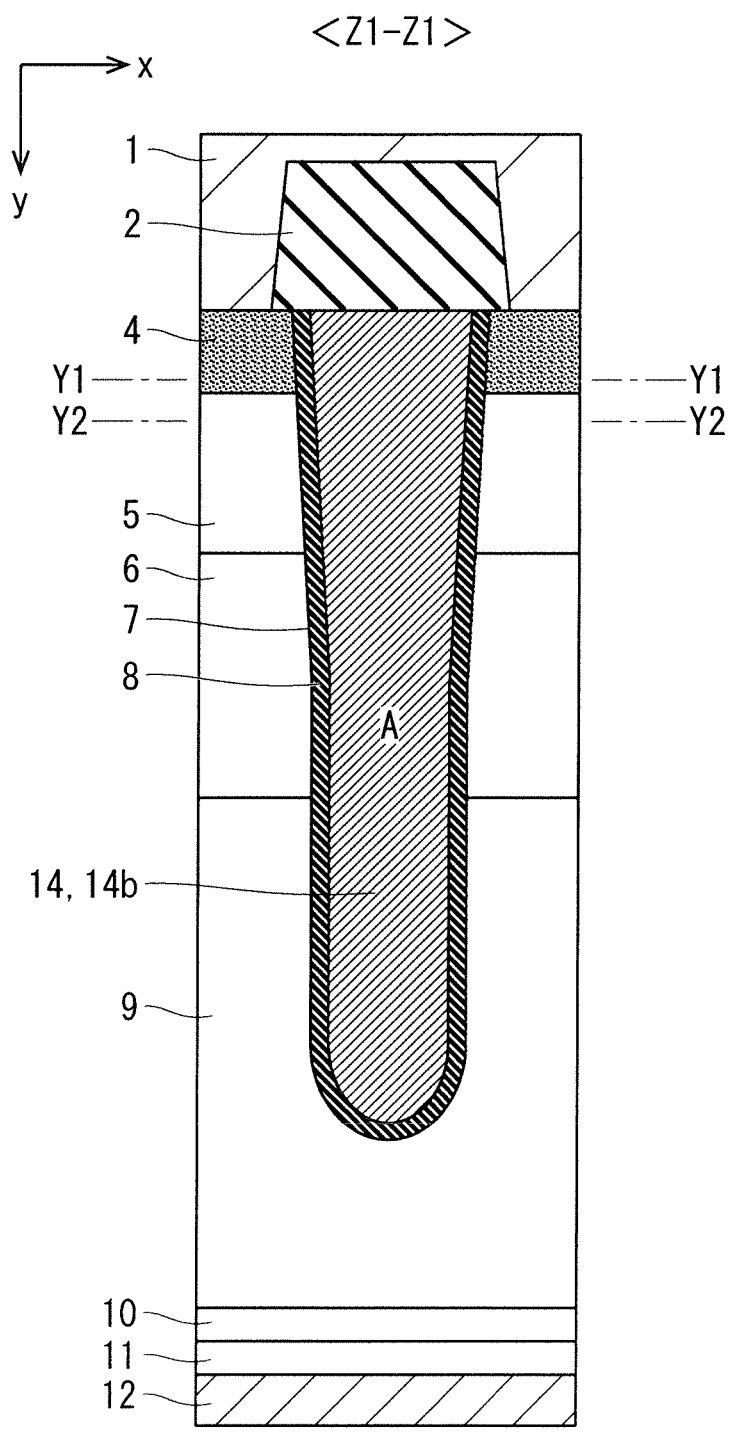
FIGS. 86 and 87 are sectional views showing a configuration of a semiconductor element according to a second modification of the fifth preferred embodiment.
Figure 87:
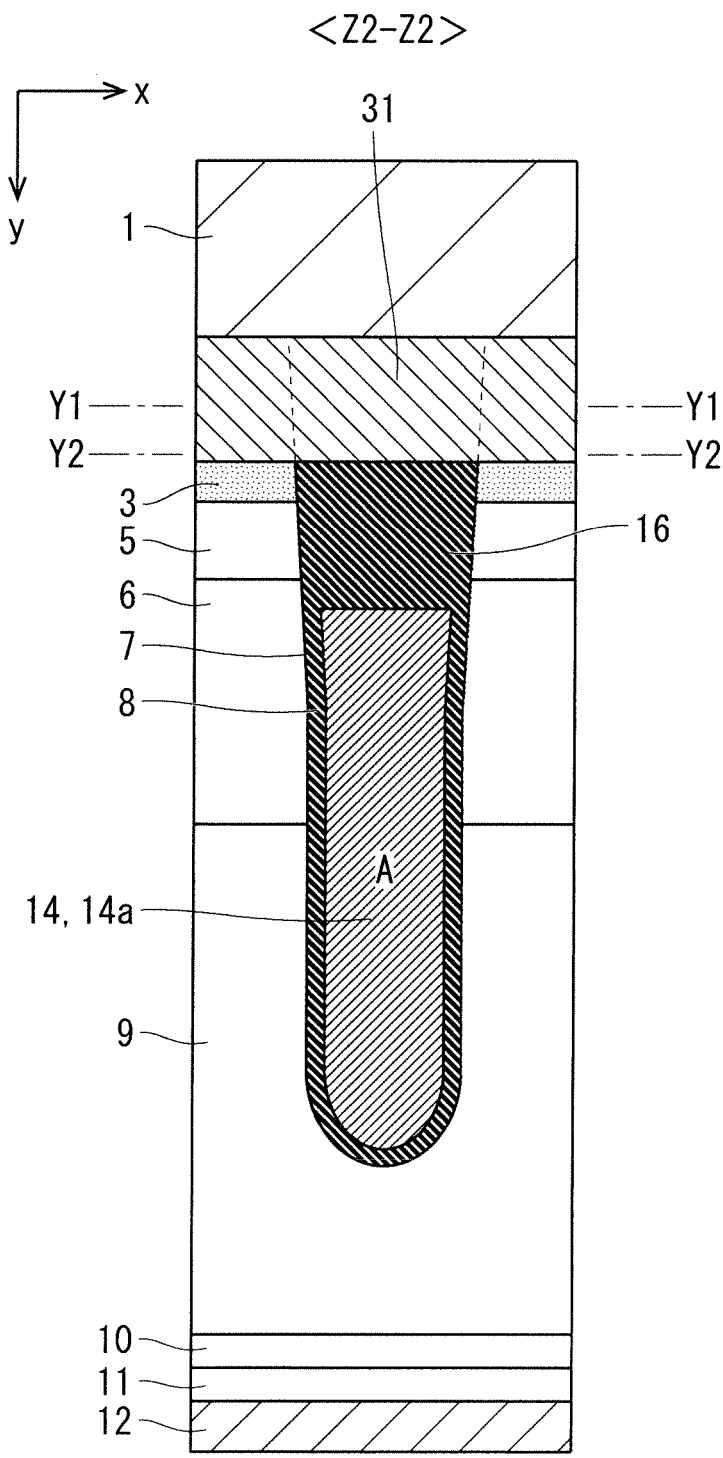
Figure 88:
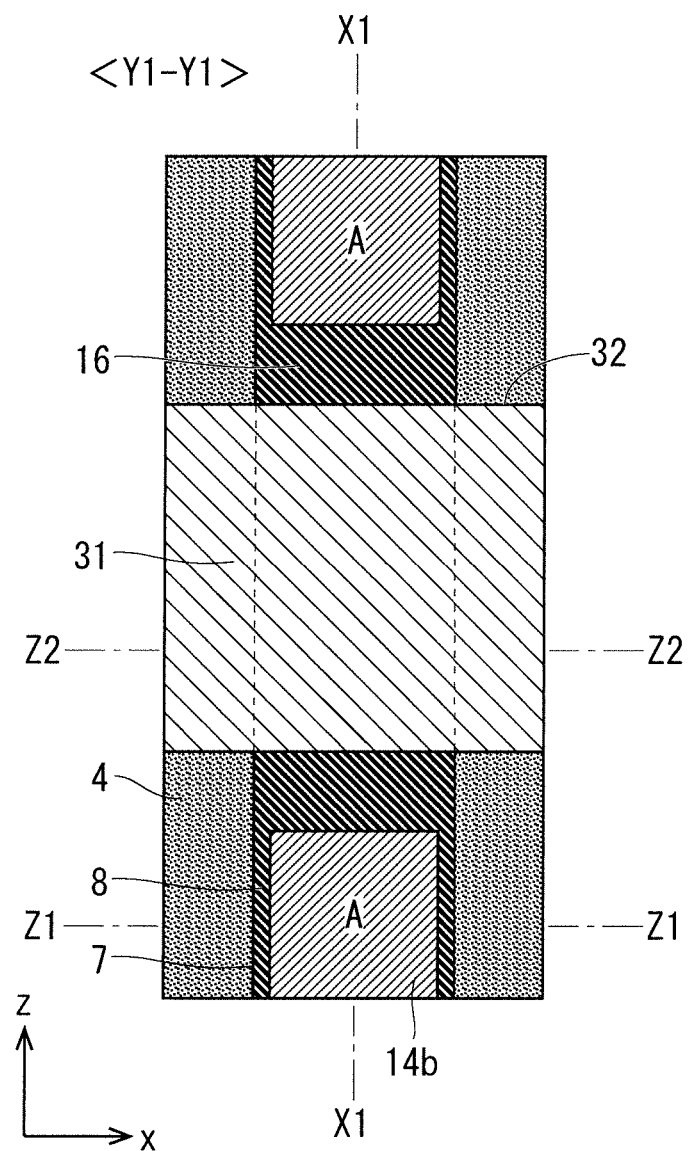
FIGS. 88 and 89 are plan views showing the configuration of the semiconductor element according to the second modification of the fifth preferred embodiment.
Figure 89:
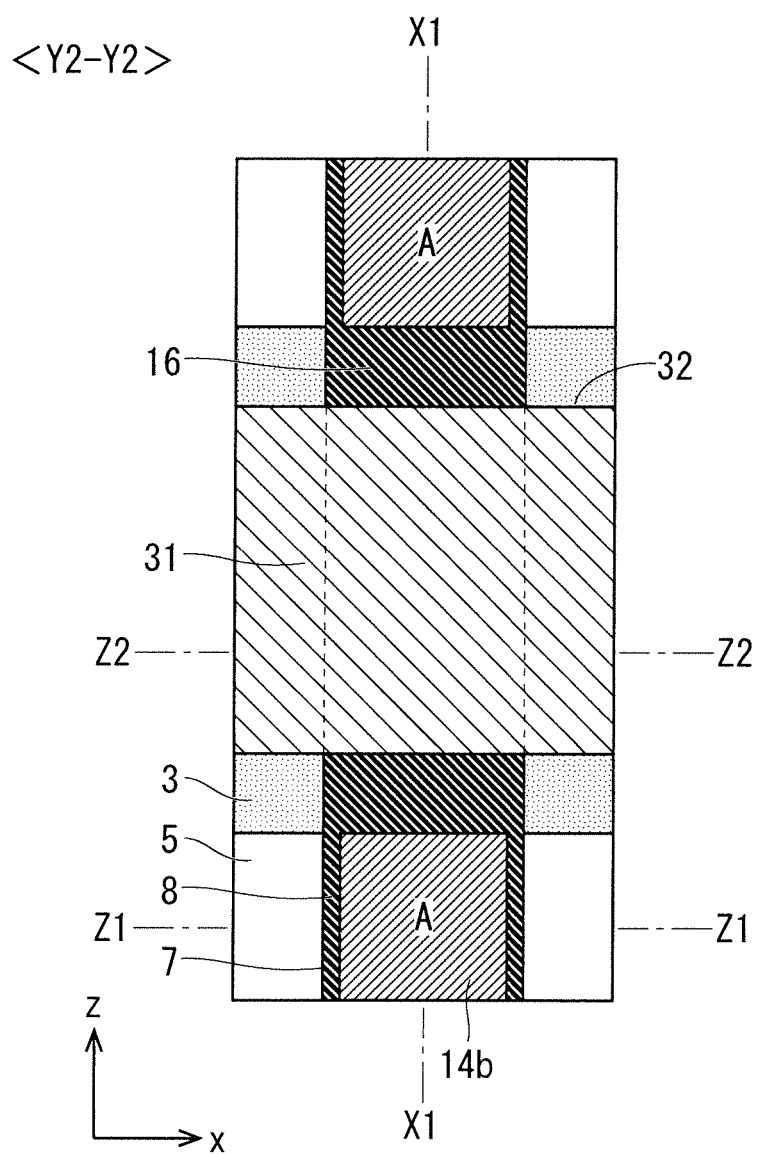
Figure 90:
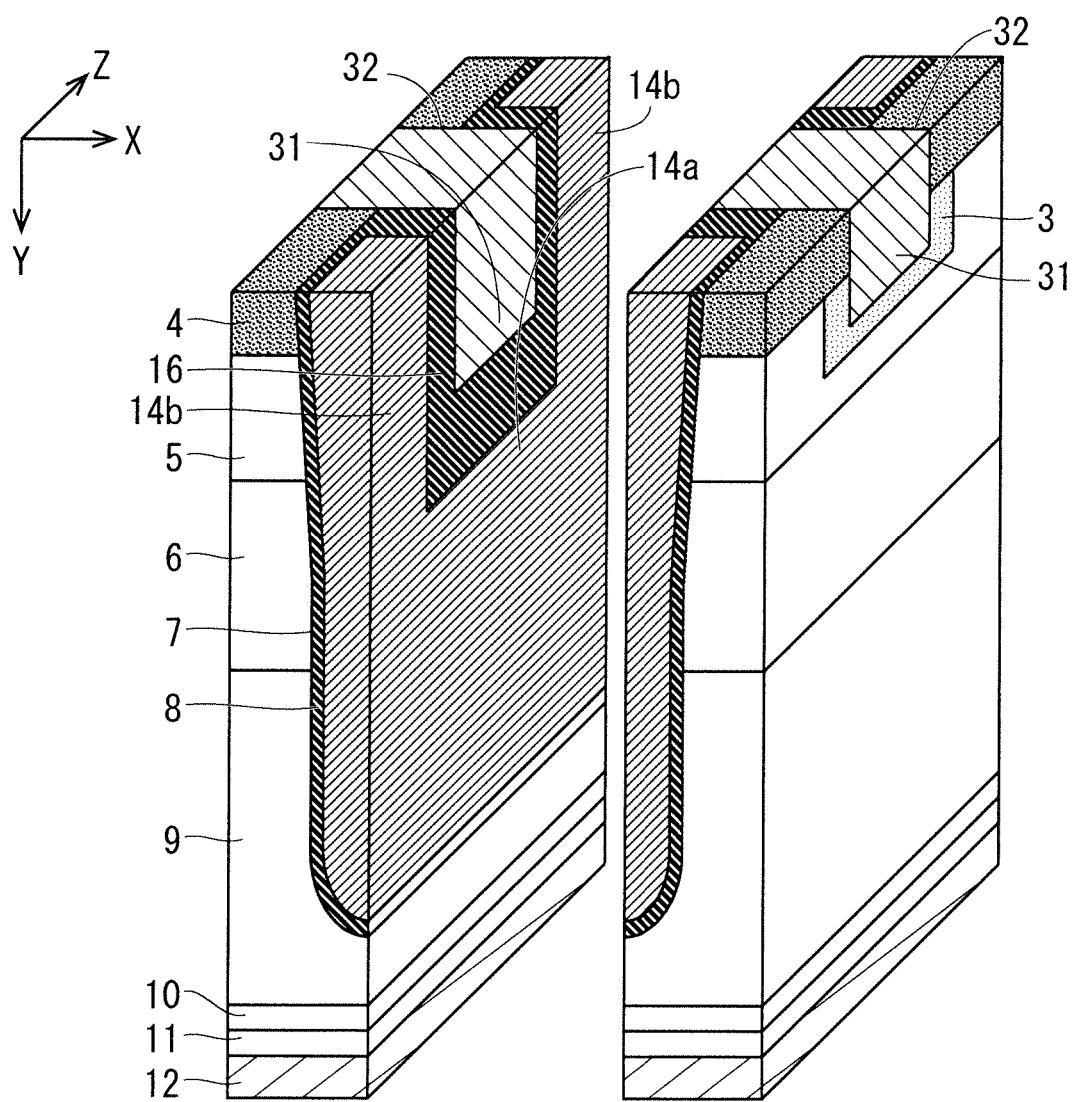
FIG. 90 is a perspective view showing the configuration of the semiconductor element according to the second modification of the fifth preferred embodiment.

FIGS. 86 and 87 are sectional views showing a configuration of a semiconductor element included in a semiconductor device according to a second modification of the fifth preferred embodiment. FIGS. 88 and 89 are plan views showing the configuration of the semiconductor element. FIG. 90 is a cutaway perspective view showing the configuration of the semiconductor element. FIGS. 86 to 90 correspond to FIGS. 80 to 84, respectively.

As shown in FIGS. 88 and 89, in the configuration of the first modification of the fifth preferred embodiment shown in FIGS. 82 and 83, the sides of the first trench 7 as seen in plan view are connected to a second trench 32 being in contact with both the source layer 4 and the contact layer 3 and extending in the x direction. The buried metal portion 31 is provided in the first trench 7 and in the second trench 32. As shown in FIGS. 89 and 90, the buried metal portion 31 provided in the second trench 32 is in ohmic contact with the contact layer 3 and the source layer 4 on the sides of the second trench 32.

Such a configuration is capable of increasing the latch-up resistance because holes are discharged from a deeper position in the semiconductor substrate. In particular, the buried metal portion 31 as seen in plan view extends in the x direction so as to penetrate the buried insulation portion 16, whereby gate leakage resulting from a short circuit between the second gate sub-portion 14b and the buried metal portion 31 is suppressed even if the mesa width is reduced. This reduces the mesa width to reduce the on-state voltage.

<Third Modification>

Figure 91:
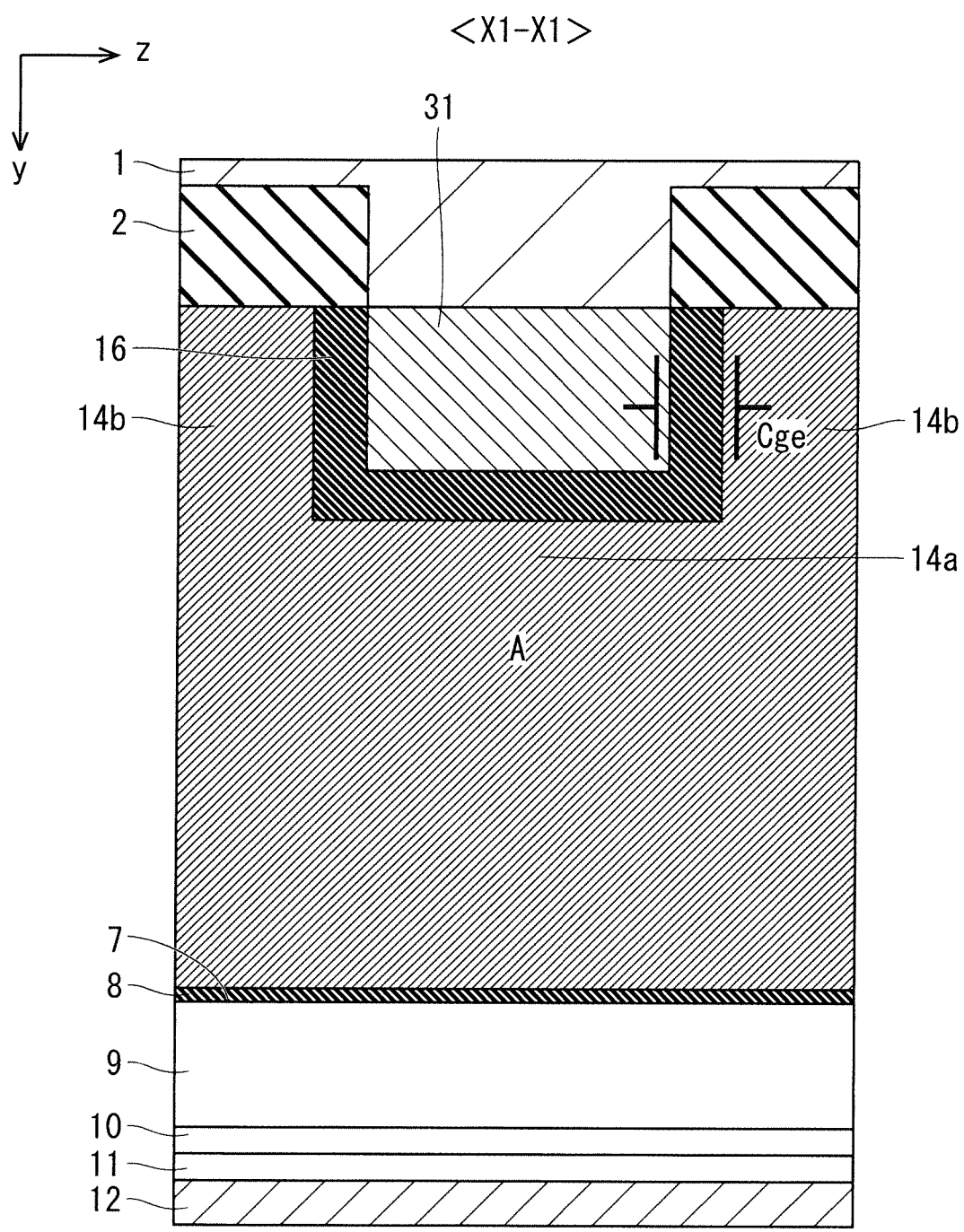
FIG. 91 is a sectional view showing the configuration of the semiconductor element according to the second modification of the fifth preferred embodiment.

Prior to the description about a semiconductor element included in a semiconductor device according to a third modification of the fifth preferred embodiment, the semiconductor element according to the second modification of the fifth preferred embodiment with reference to FIGS. 86 to 90 will be described. FIG. 91 is a sectional view of the semiconductor element according to the second modification of the fifth preferred embodiment taken along the line X1-X1 of FIGS. 88 and 89. In the semiconductor element according to the second modification of the fifth preferred embodiment, the gate-emitter capacitance Cge increases because the gate-emitter capacitance Cge is generated between the buried metal portion 31 and the gate portion 14 in the first trench 7, as shown in FIG. 91. On the other hand, the third modification of the fifth preferred embodiment is capable of reducing the gate-emitter capacitance Cge.

Figure 92:
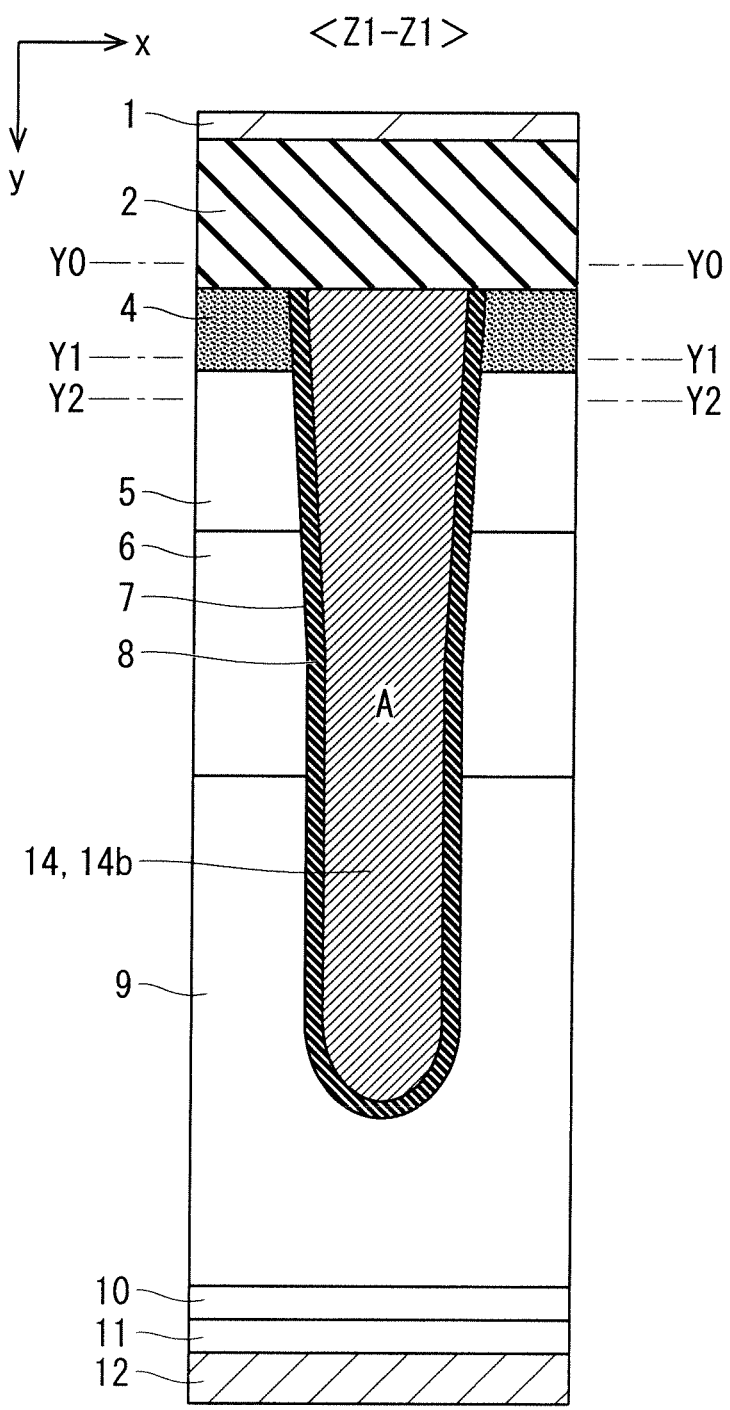
FIGS. 92 and 93 are sectional views showing a configuration of a semiconductor element according to a third modification of the fifth preferred embodiment.
Figure 93:
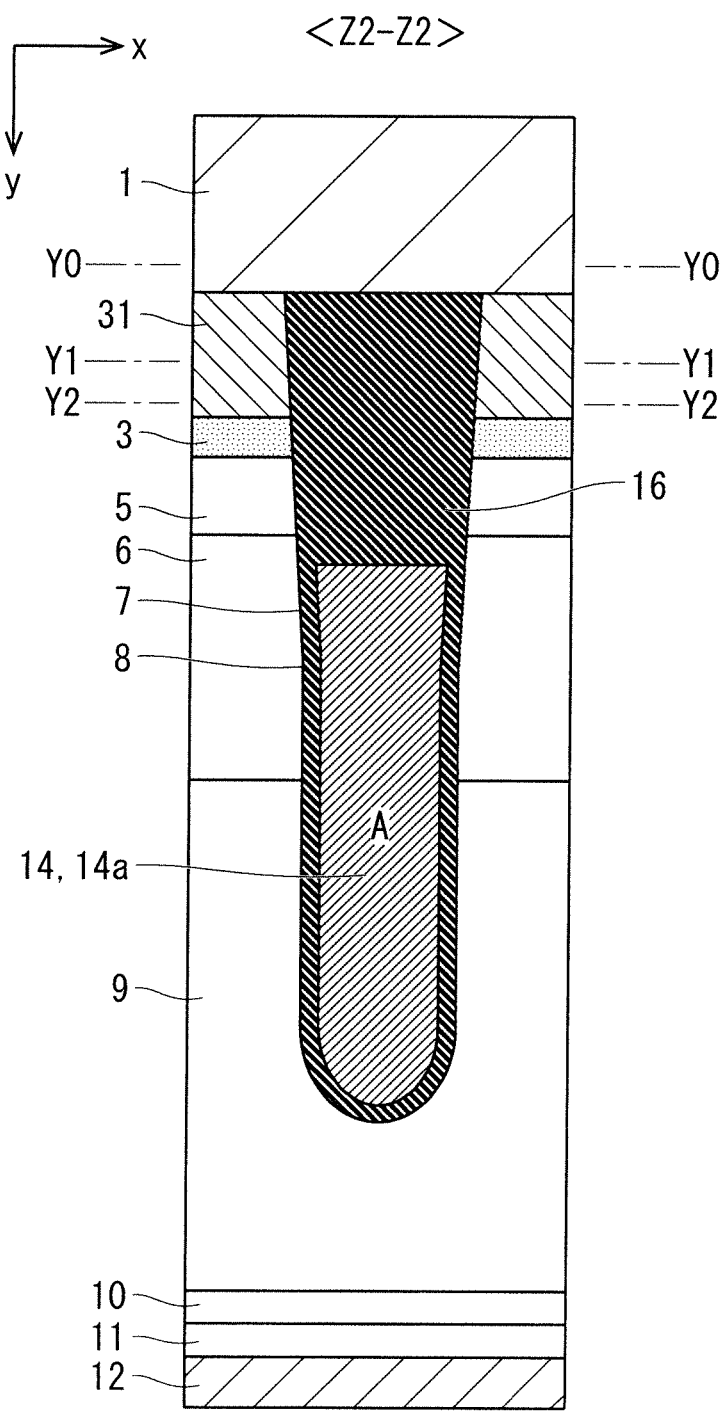
Figure 94:
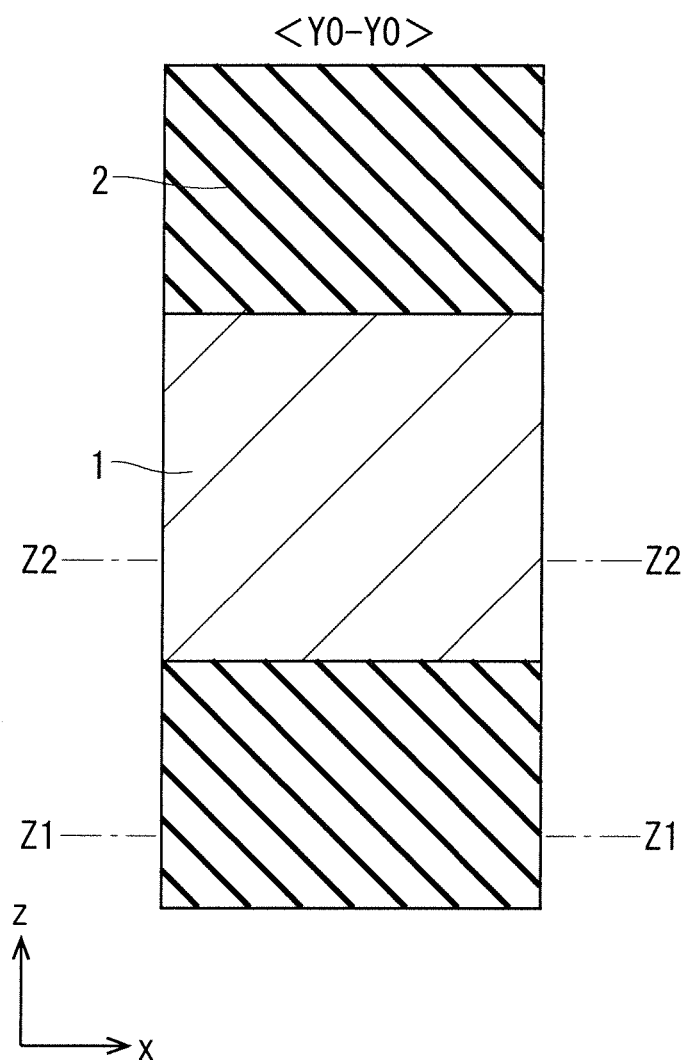
FIGS. 94 to 96 are plan views showing the configuration of the semiconductor element according to the third modification of the fifth preferred embodiment.
Figure 95:
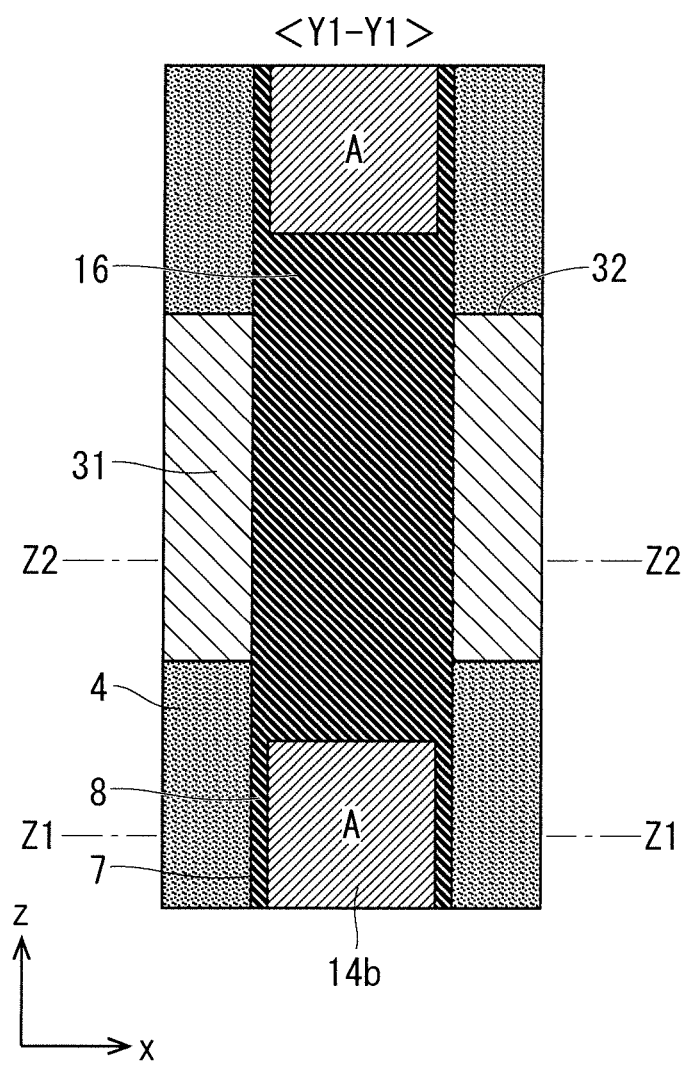
Figure 96:
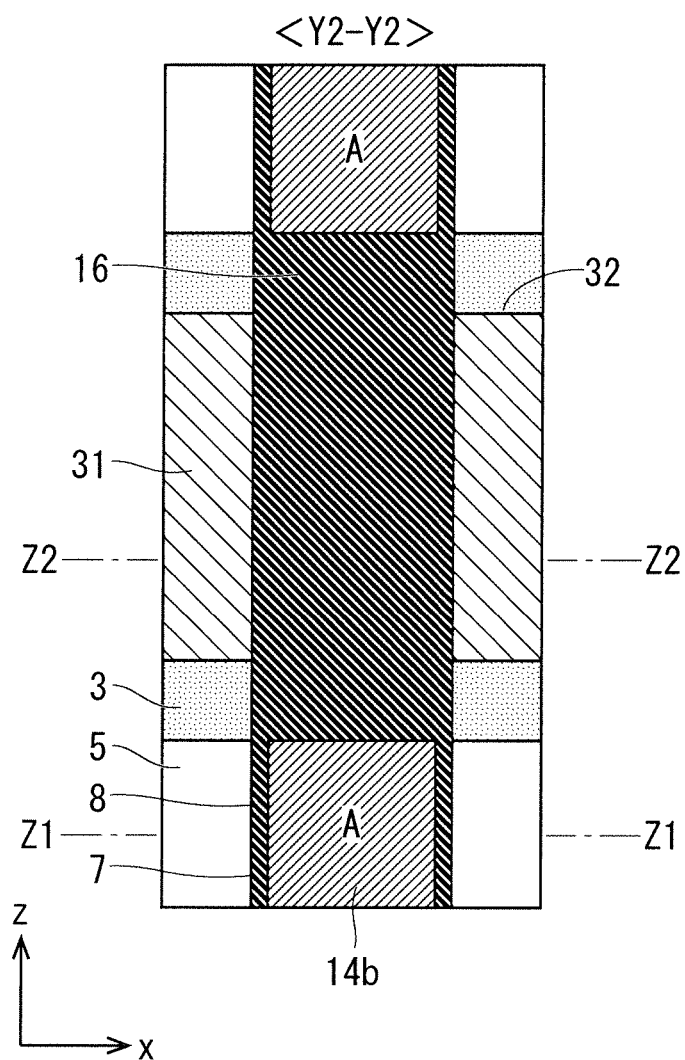
Figure 97:
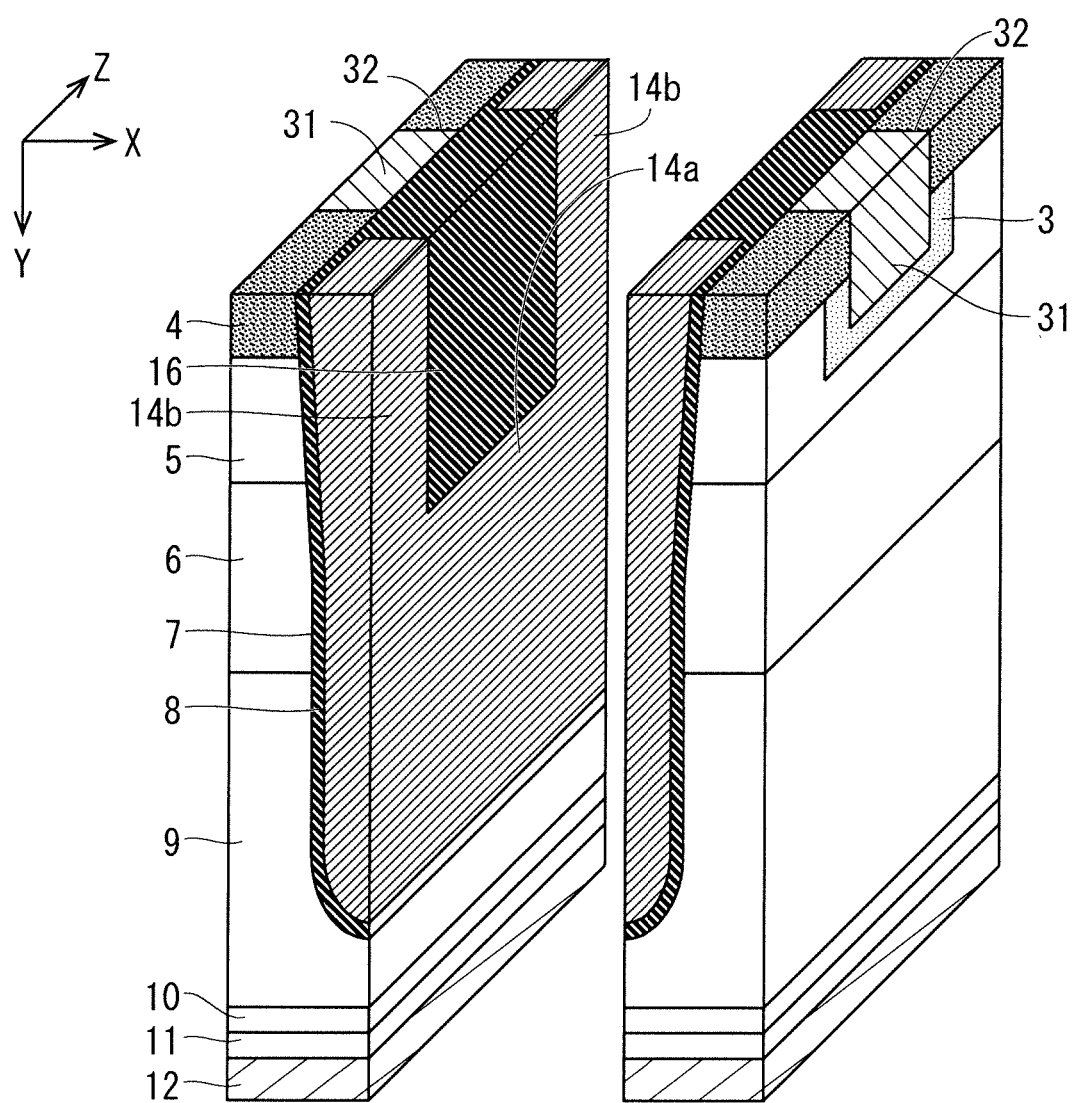
FIG. 97 is a perspective view showing the configuration of the semiconductor element according to the third modification of the fifth preferred embodiment.

FIGS. 92 and 93 are sectional views showing a configuration of the semiconductor element included in the semiconductor device according to the third modification of the fifth preferred embodiment. FIGS. 94, 95 and 96 are plan views showing the configuration of the semiconductor element. Specifically, FIG. 92 is a sectional view taken along the line Z1-Z1 of FIGS. 94 to 96, and FIG. 93 is a sectional view taken along the line Z2-Z2 of FIGS. 94 to 96. FIG. 94 is a plan view taken along a line Y0-Y0 of FIGS. 92 and 93, FIG. 95 is a plan view taken along the line Y1-Y1 of FIGS. 92 and 93, and FIG. 96 is a plan view taken along the line Y2-Y2 of FIGS. 92 and 93. FIG. 97 is a cutaway perspective view showing the configuration of the semiconductor element.

In the third modification of the fifth preferred embodiment, the buried metal portion 31 of the second modification of the fifth preferred embodiment is not provided above the gate portion 14 but is provided in the second trench 32. In other words, the buried metal portion 31 is not provided in the first trench 7 but is provided in the second trench 32. As shown in FIG. 93, an upper part of the buried metal portion 31 provided in the second trench 32 is electrically connected to a lower part of the emitter electrode 1. The thickness of the buried insulation portion 16 may be sufficiently greater than the that of the gate oxide film 8, for example, about three times the thickness of the gate oxide film 8.

The configuration of the third modification of the fifth preferred embodiment as described above is capable of increasing the distance between the gate portion 14 and the buried metal portion 31 to reduce the gate-emitter capacitance Cge.

<Fourth Modification>

Figure 98:
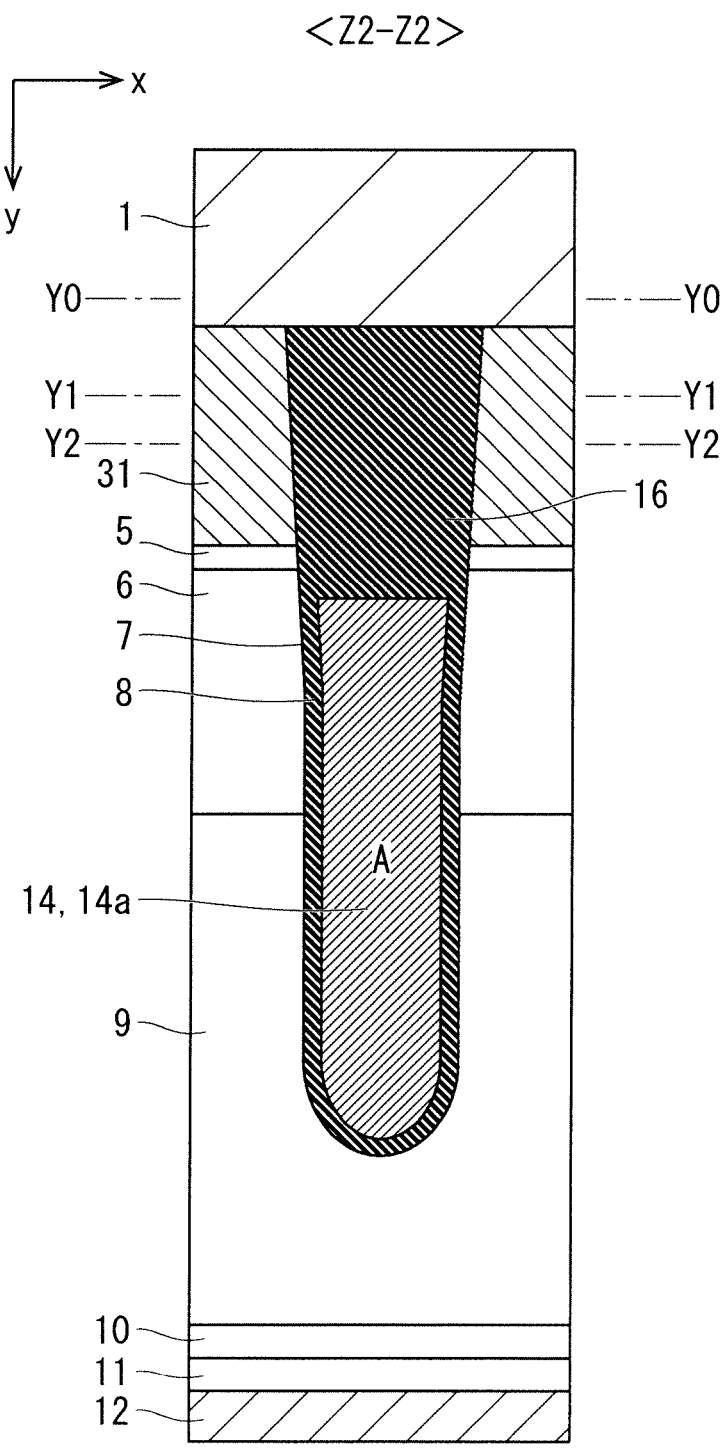
FIG. 98 is a sectional view showing a configuration of a semiconductor element according to a fourth modification of the fifth preferred embodiment.
Figure 99:
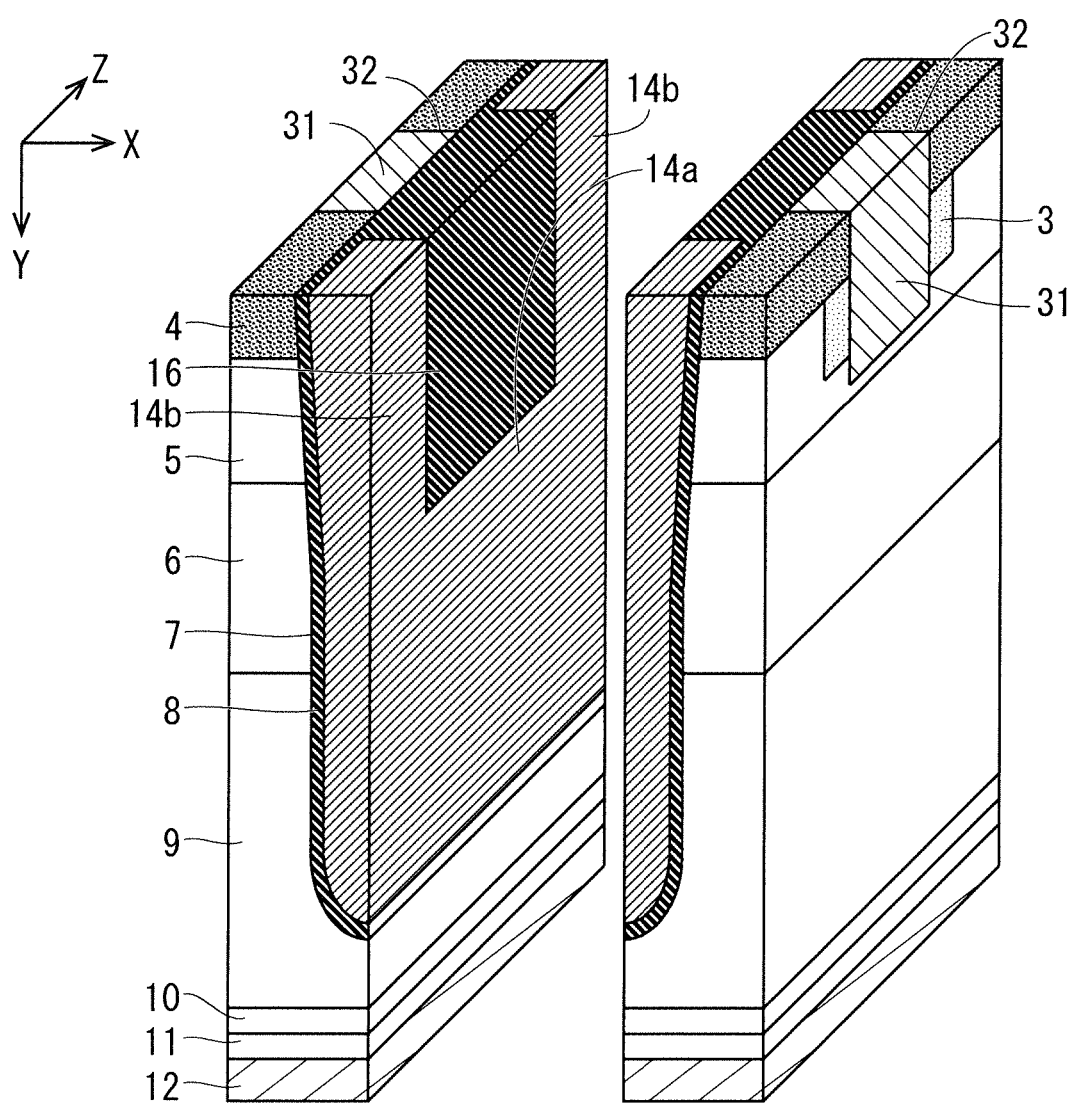
FIG. 99 is a perspective view showing the configuration of the semiconductor element according to the fourth modification of the fifth preferred embodiment.

FIG. 98 is a sectional view showing a configuration of a semiconductor element included in a semiconductor device according to a fourth modification of the fifth preferred embodiment. FIG. 99 is a cutaway perspective view showing the configuration of the semiconductor element.

For improvement in latch-up resistance, it is necessary to reduce the resistance of the p type base layer 5 and the p type contact layer 3 which are paths of holes to the emitter electrode 1. To this end, the bottom of the second trench 32 is positioned below the lower part of the contact layer 3 and above the upper part of the first gate sub-portion 14a in the fourth modification of the fifth preferred embodiment so that the second trench 32 is in contact with the base layer 5, as shown in FIG. 99. The bottom of the second trench 32 may be positioned lower than $Lb \times 3/4$ from the surface of the semiconductor substrate where Lb is the distance from the surface of the semiconductor substrate to the lower surface of the base layer 5. The configuration of the fourth modification of the fifth preferred embodiment as described above is capable of shortening the distance from the lower surface of the base layer 5 to the bottom of the second trench 32 to promote the discharge of holes, thereby increasing the latch-up resistance.

If a lower part of the second trench 32, i.e. a lower part of the buried metal portion 31 in the second trench 32, is positioned below the upper part of the first gate sub-portion 14a, the gate-emitter capacitance Cge is generated between the first gate sub-portion 14a and the buried metal portion 31 in the second trench 32. In the fourth modification of the fifth preferred embodiment, on the other hand, the lower part of the second trench 32, i.e. the lower part of the buried metal portion 31 in the second trench 32, is positioned above the upper part of the first gate sub-portion 14a. This reduces the gate-emitter capacitance Cge.

<Fifth Modification>

Figure 100:
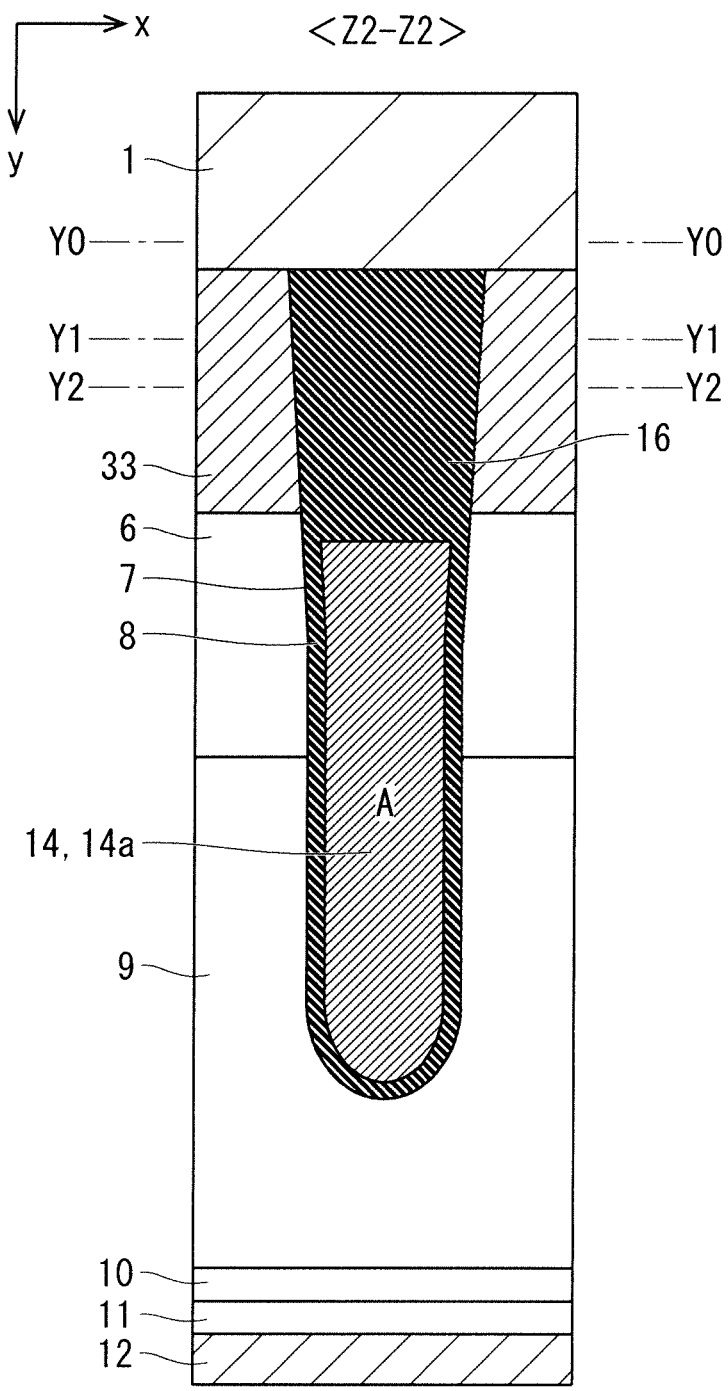
FIG. 100 is a sectional view showing a configuration of a semiconductor element according to a fifth modification of the fifth preferred embodiment.

FIG. 100 is a sectional view showing a configuration of a semiconductor element included in a semiconductor device according to a fifth modification of the fifth preferred embodiment. FIG. 101 is a cutaway perspective view showing the configuration of the semiconductor element.

If the buried metal portion 31 in the second trench 32 is provided in a deep position, there is a likelihood that a short circuit occurs between the emitter electrode 1 and the drift layer 9. Thus, a configuration may be made so that the lower part of the second trench 32, i.e. the lower part of the buried metal portion 31 in the second trench 32, is positioned below the lower part of the base layer 5 and above the upper part of the first gate sub-portion 14a. Then, a Schottky metal portion 33 in Schottky contact with at least one of the carrier storage layer 6 and the drift layer 9 may be provided in place of the buried metal portion 31. Such a configuration is capable of increasing the latch-up resistance because holes are discharged from a position deeper than the base layer 5.

Sixth Preferred Embodiment

Figure 102:
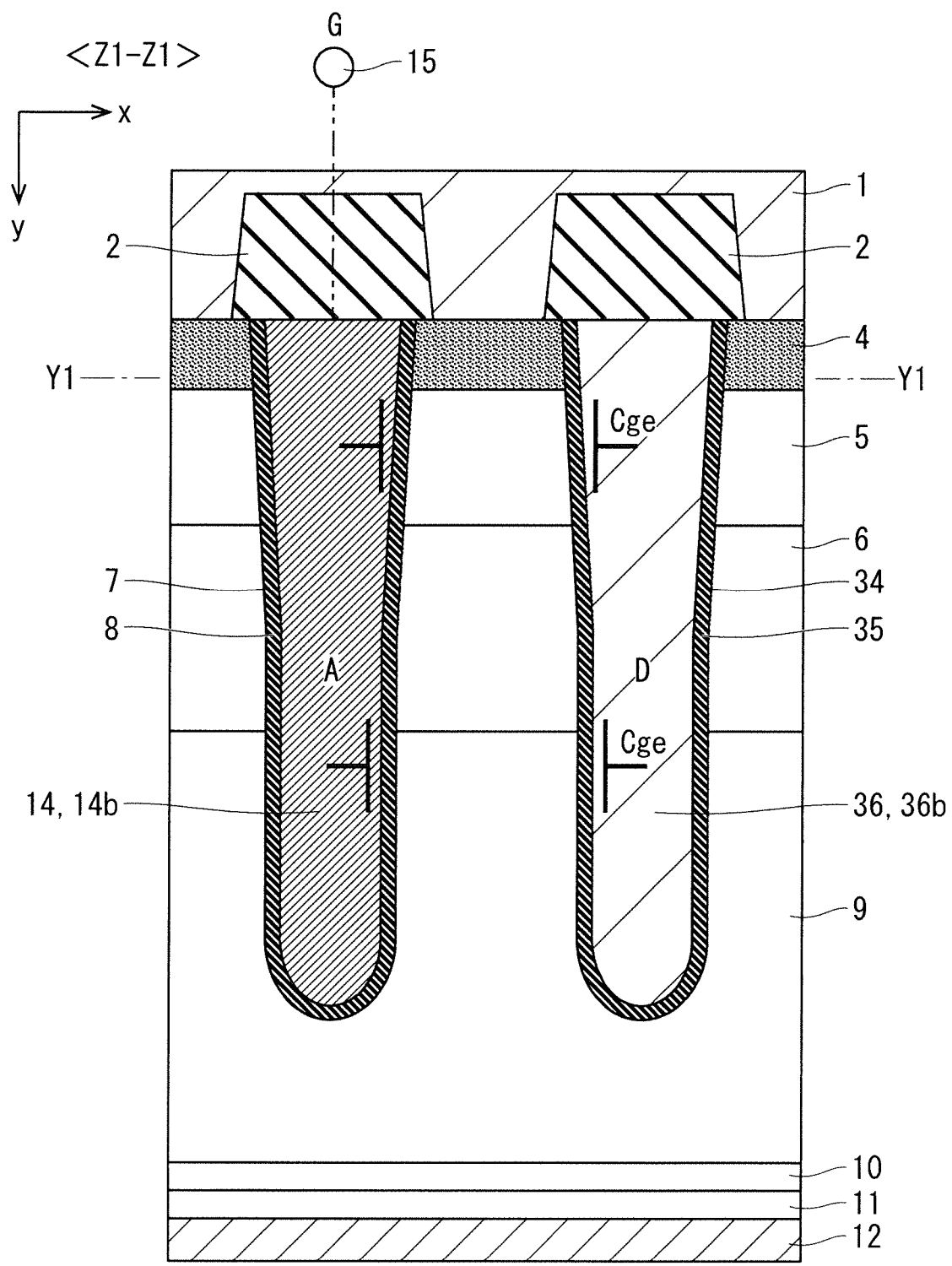
FIGS. 102 and 103 are sectional views showing a configuration of a semiconductor element according to a sixth preferred embodiment.
Figure 103:
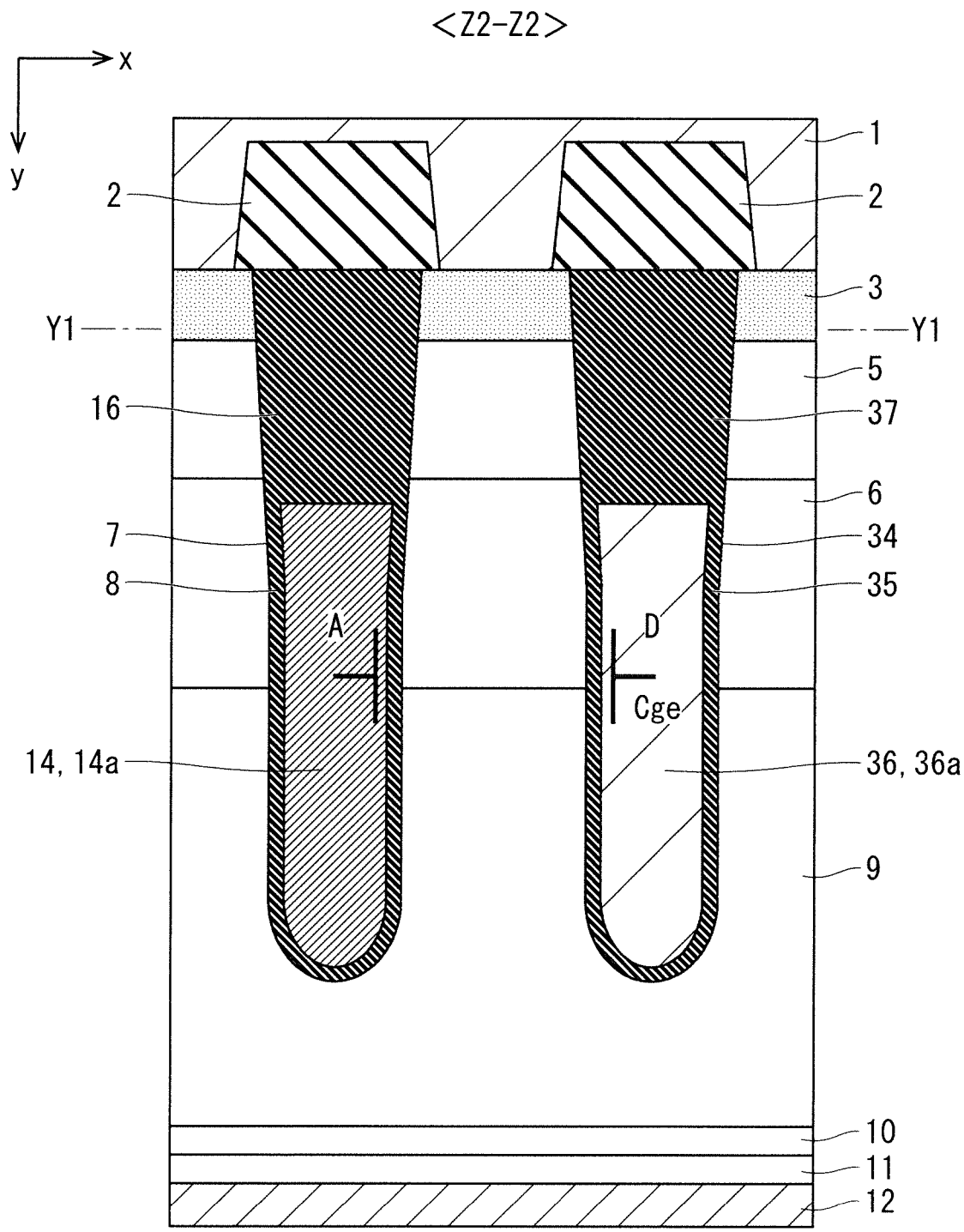
Figure 104:
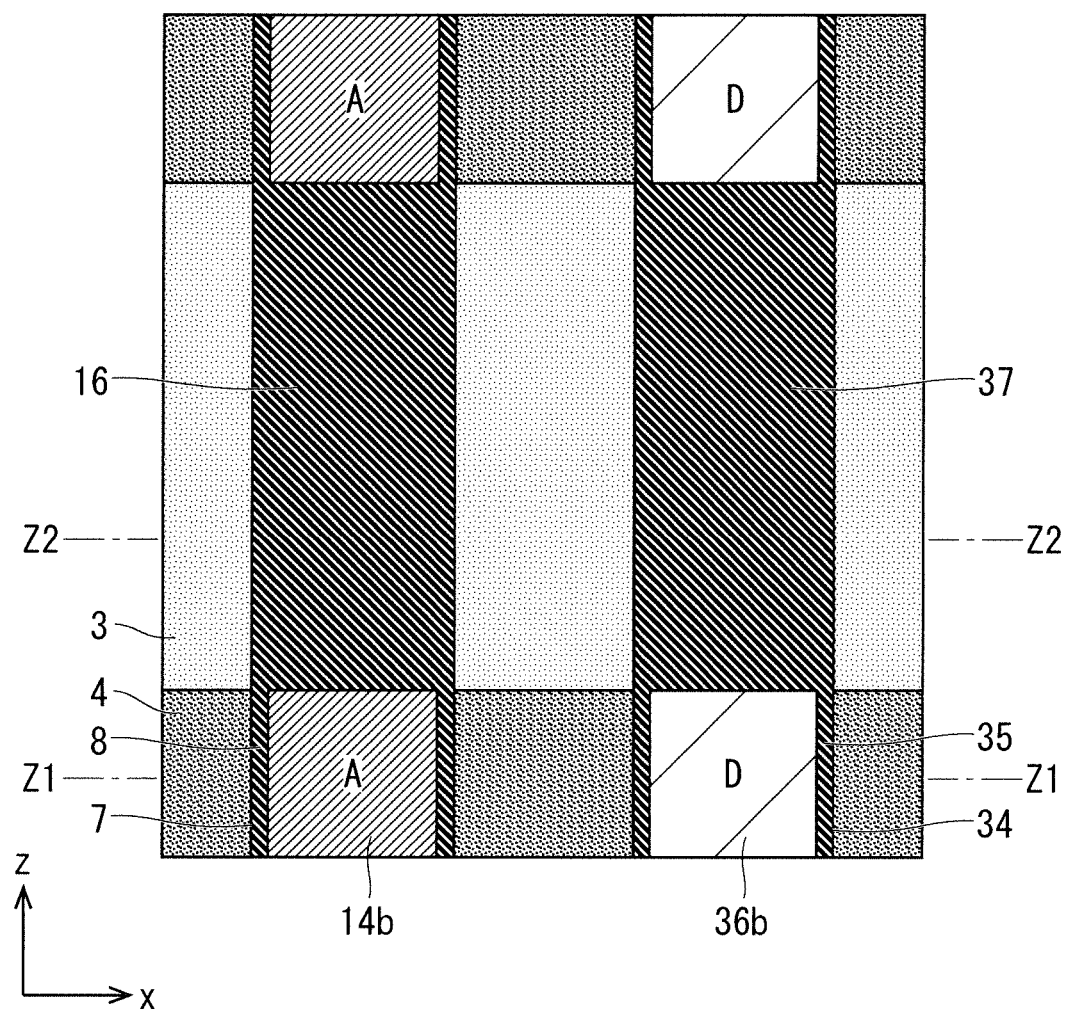
FIG. 104 is a plan view showing the configuration of the semiconductor element according to the sixth preferred embodiment.

FIGS. 102 and 103 are sectional views showing a configuration of a semiconductor element included in a semiconductor device according to a sixth preferred embodiment. FIG. 104 is a plan view showing the configuration of the semiconductor element. Specifically, FIG. 102 is a sectional view taken along the line Z1-Z1 of FIG. 104, and FIG. 103 is a sectional view taken along the line Z2-Z2 of FIG. 104. FIG. 104 is a plan view taken along the line Y1-Y1 of FIGS. 102 and 103.

In the sixth preferred embodiment, a second trench 34 in contact with the contact layer 3, the source layer 4, the base layer 5, and the drift layer 9 is provided along the first trench 7 as seen in plan view, as shown in FIG. 104. A dummy portion 36 electrically connected to the emitter electrode 1 is provided in the second trench 34, with a gate oxide film 35 as a second gate insulation film therebetween.

The dummy portion 36 according to the sixth preferred embodiment is provided with a recessed portion with the bottom farther away from the base layer 5 than the sides thereof. The recessed portion has an opening facing upward. Like the gate portion 14, the dummy portion 36 includes a first dummy sub-portion 36a and a second dummy sub-portion 36b. The second dummy sub-portion 36b is connected to the first dummy sub-portion 36a in the direction of extension (e.g., in the z direction) of the second trench 34 as seen in plan view, and protrudes upwardly above the first dummy sub-portion 36a. The first dummy sub-portion 36a includes the bottom of the recessed portion of the dummy portion 36, and the second dummy sub-portion 36b includes the sides of the recessed portion of the dummy portion 36. A buried insulation portion 37 serving as the second insulation film is provided in the recessed portion of the dummy portion 36 in the second trench 34.

Figure 105:
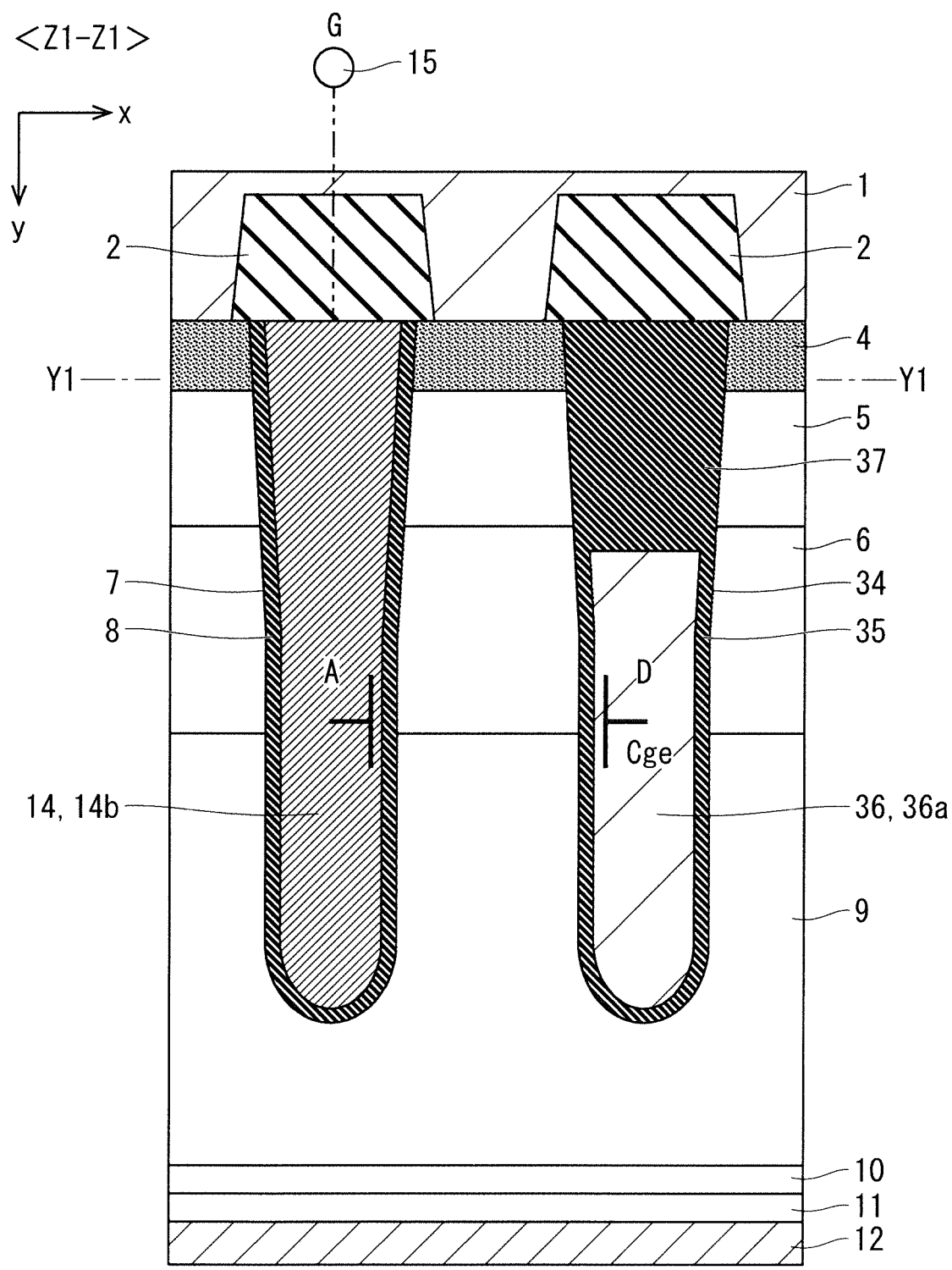
FIGS. 105 and 106 are sectional views showing a configuration of a semiconductor element according to a first modification of the sixth preferred embodiment.
Figure 106:
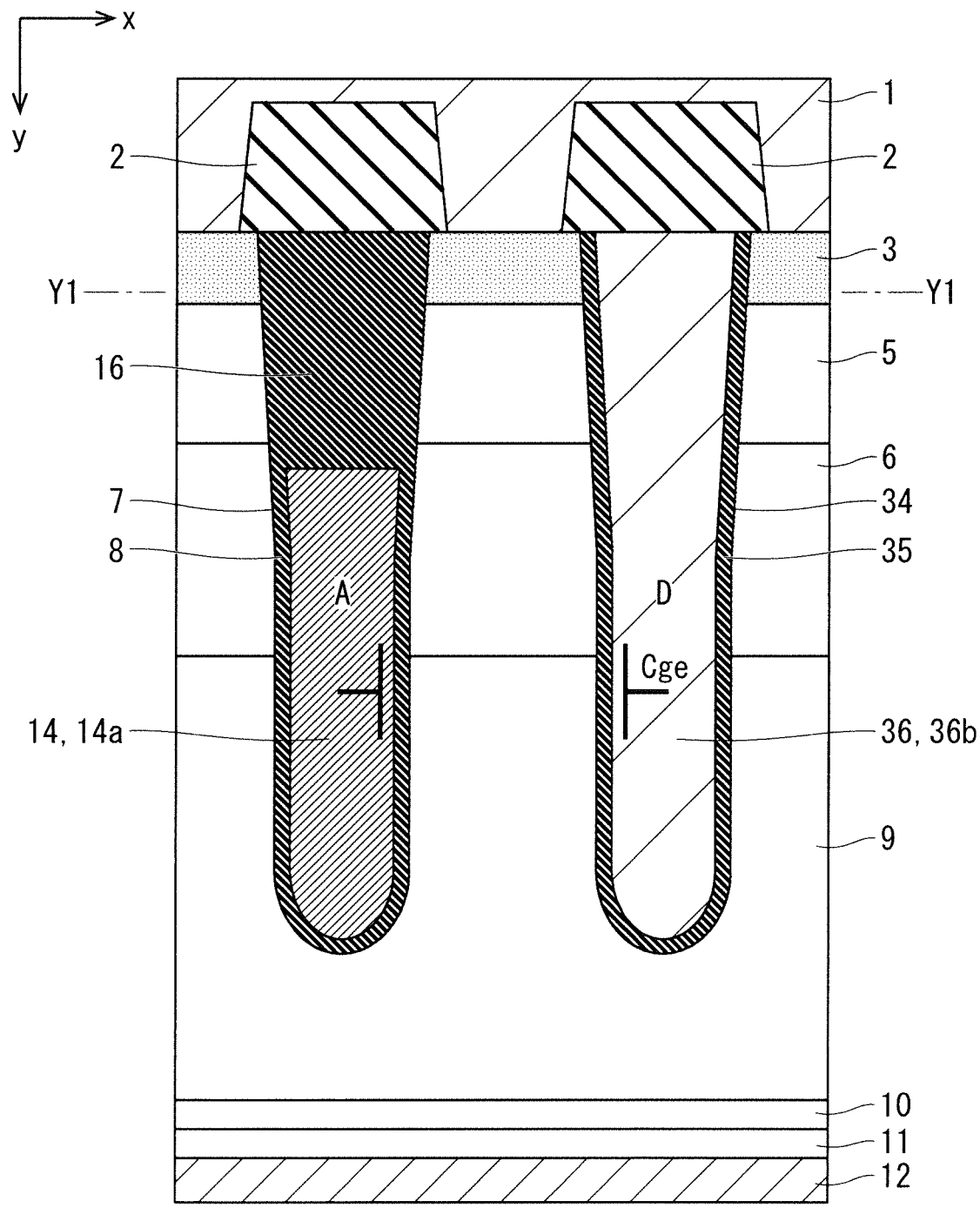
Figure 107:
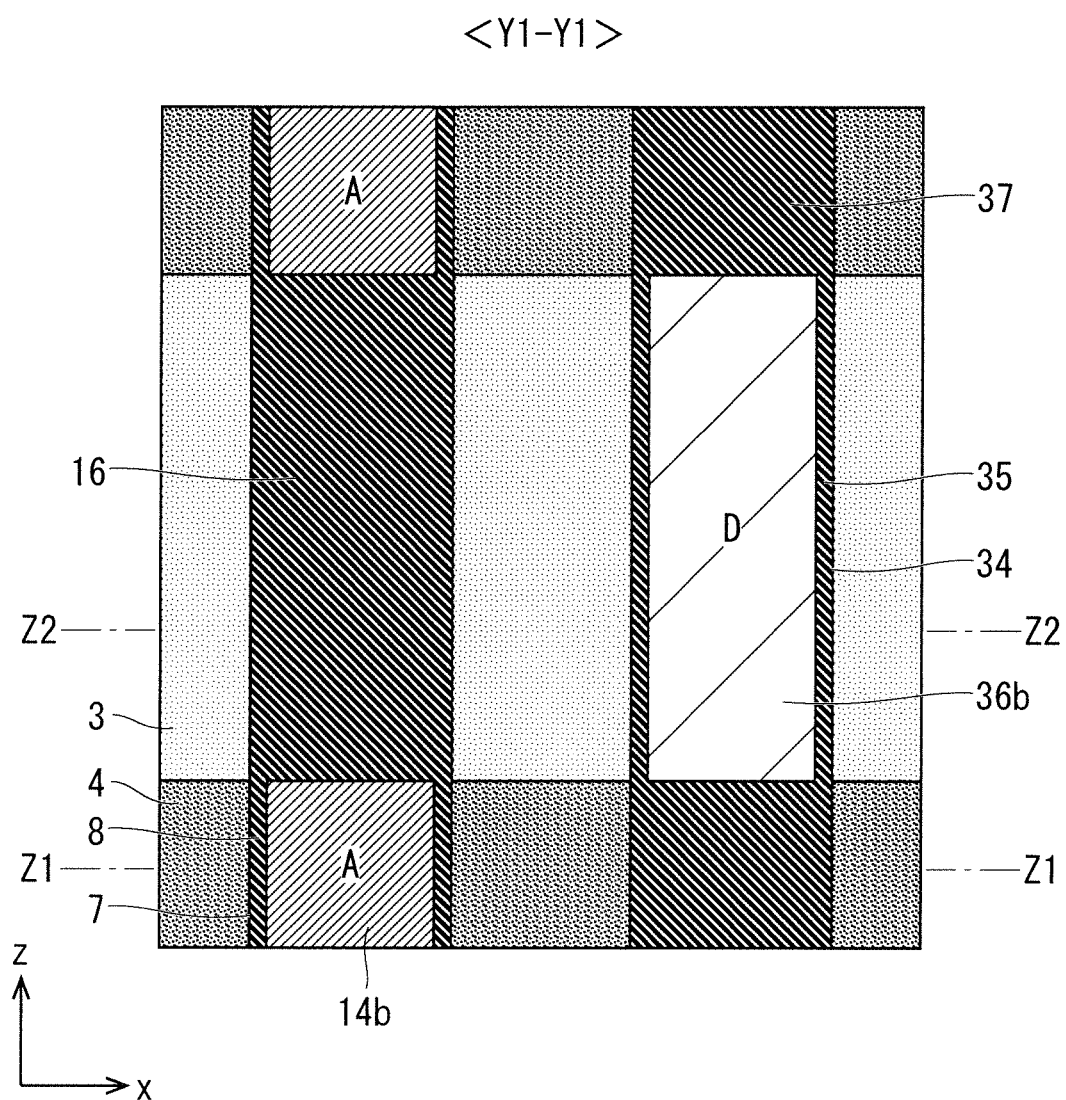
FIG. 107 is a plan view showing the configuration of the semiconductor element according to the first modification of the sixth preferred embodiment.

In the configuration of the sixth preferred embodiment as described above, the dummy portion 36 includes the first dummy sub-portion 36a having a relatively small gate-emitter capacitance Cge and the second dummy sub-portion 36b having a relatively large gate-emitter capacitance Cge. The gate-emitter capacitance Cge is adjustable by changing the ratio between the first dummy sub-portion 36a and the second dummy sub-portion 36b. If there is no need to adjust the gate-emitter capacitance Cge, the recessed portion and the buried insulation portion 37 need not be provided in the dummy portion 36.
<First Modification>
In the configuration of the sixth preferred embodiment of FIG. 102, a relatively large gate-emitter capacitance Cge is generated between the second gate sub-portion 14b and the second dummy sub-portion 36b. As shown in FIGS. 105 to 107, the first dummy sub-portion 36a may be aligned with the second gate sub-portion 14b as seen in plan view, and the second dummy sub-portion 36b may be aligned with the first gate sub-portion 14a as seen in plan view. In other words, the first dummy sub-portion 36a and the buried insulation portion 37 may be provided so as to be adjacent to the second gate sub-portion 14b, rather than adjacent to the first gate sub-portion 14a and the buried insulation portion 16, in the x direction, and the second dummy sub-portion 36b may be provided so as to be adjacent to the first gate sub-portion 14a and the buried insulation portion 16, rather than adjacent to the second gate sub-portion 14b, in the x direction.

Figure 108:
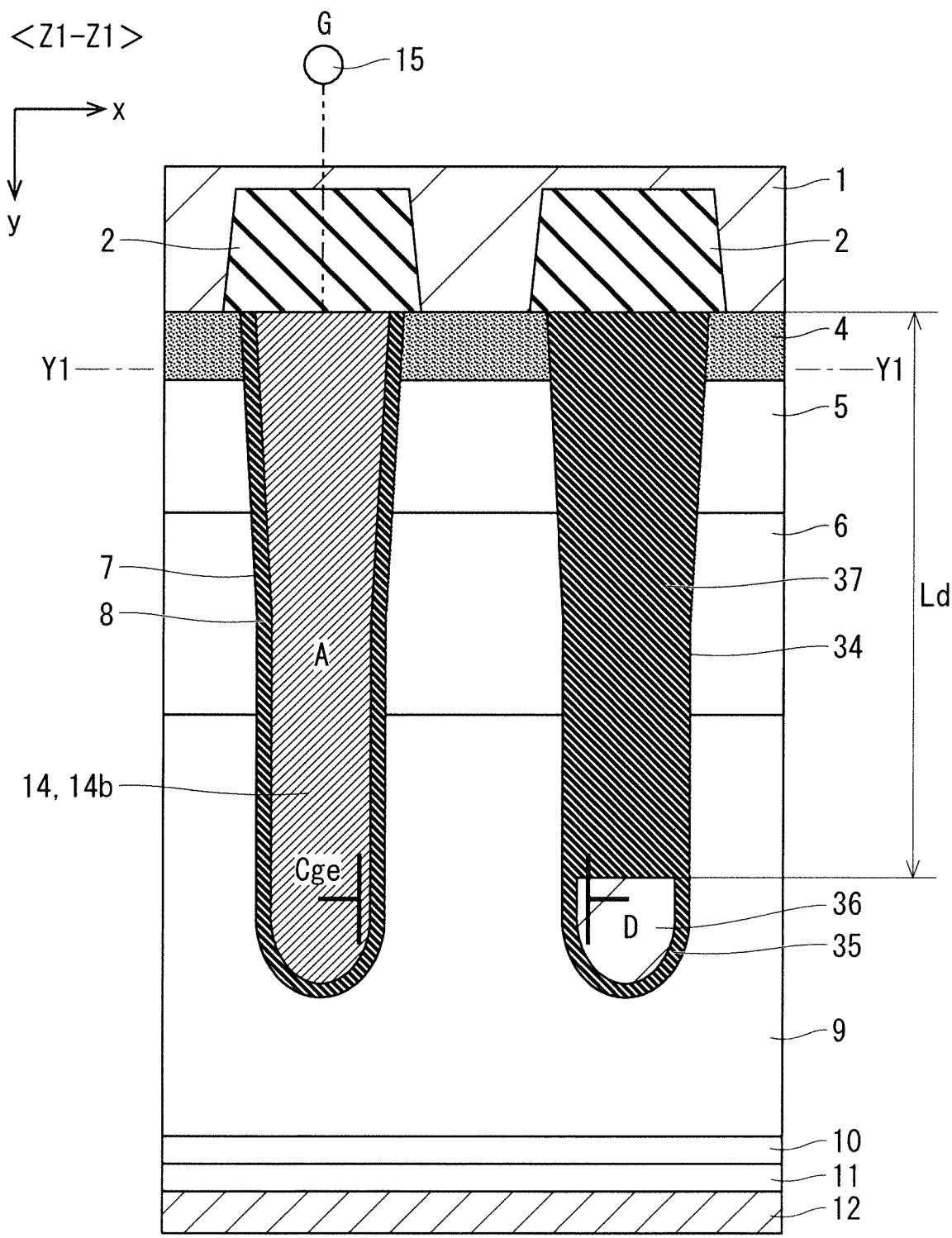
FIGS. 108 and 109 are sectional views showing a configuration of a semiconductor element according to a second modification of the sixth preferred embodiment.
Figure 109:
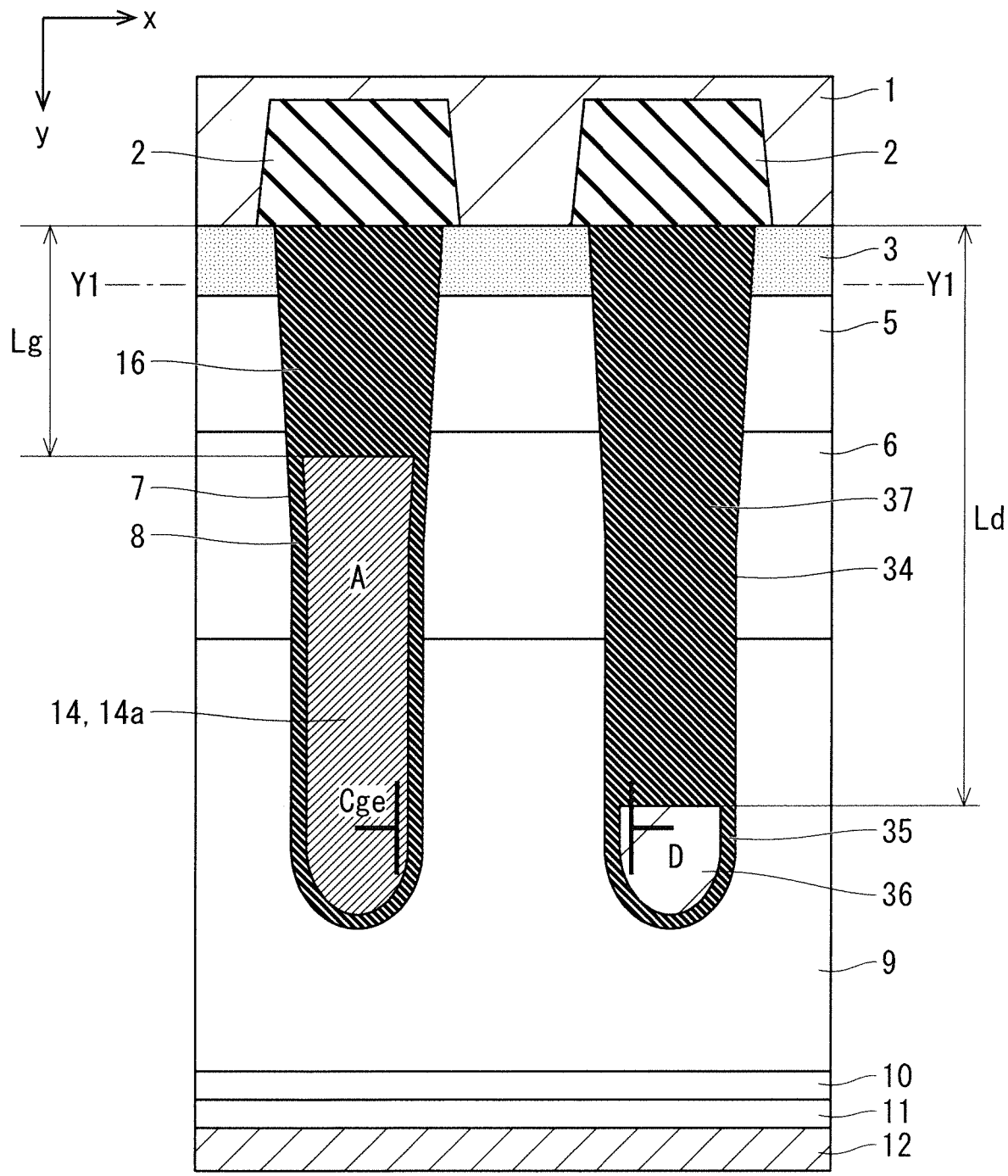
Figure 110:
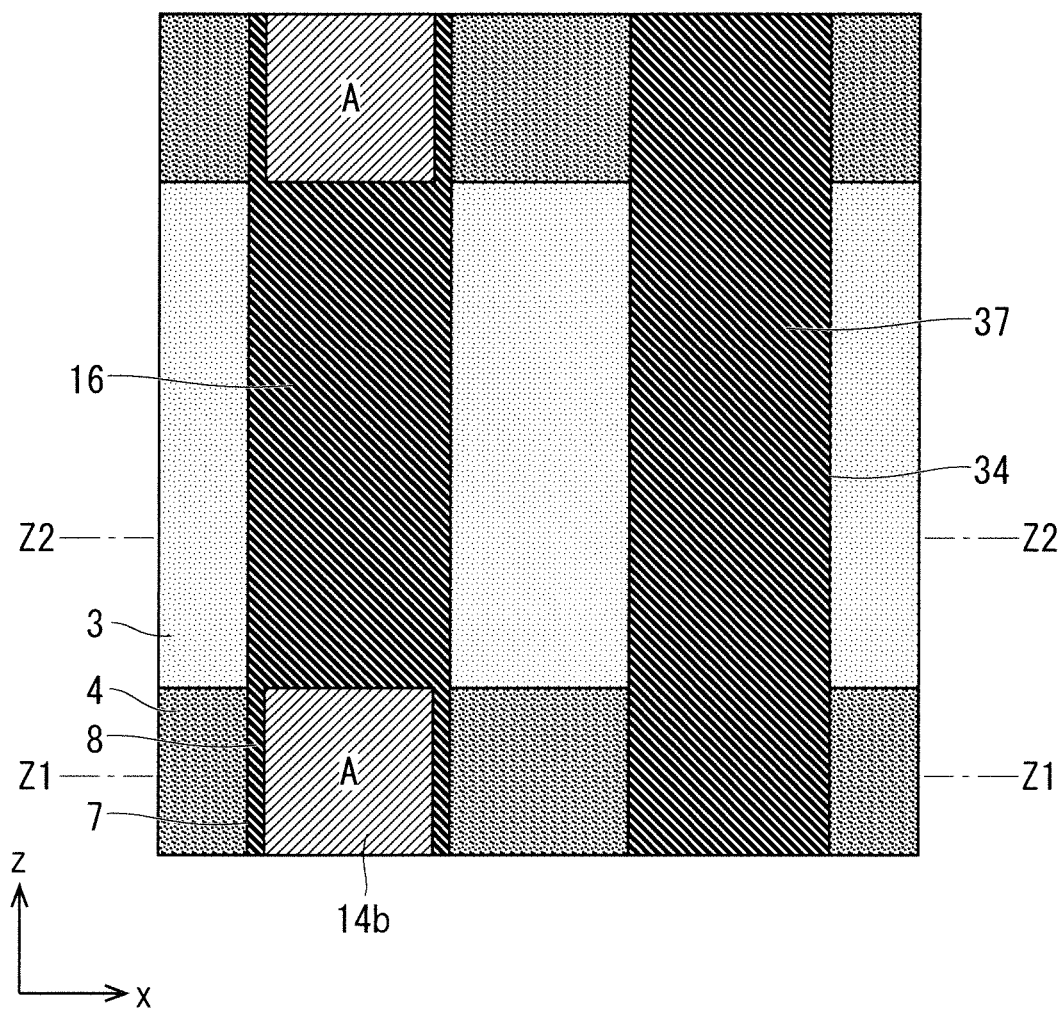
FIG. 110 is a plan view showing the configuration of the semiconductor element according to the second modification of the sixth preferred embodiment.
Figure 111:
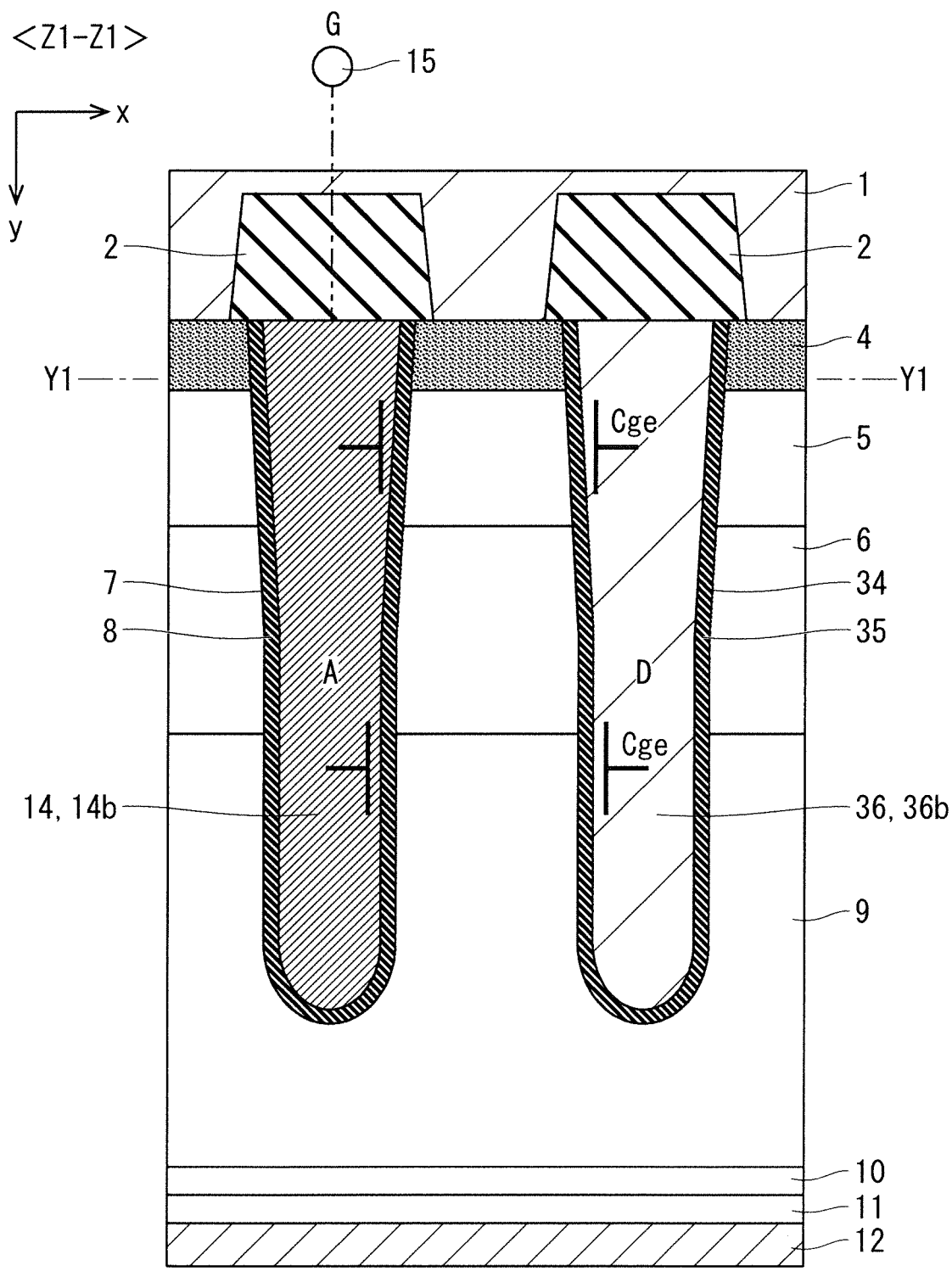
FIGS. 111 and 112 are sectional views showing a configuration of a semiconductor element according to a third modification of the sixth preferred embodiment.
Figure 112:
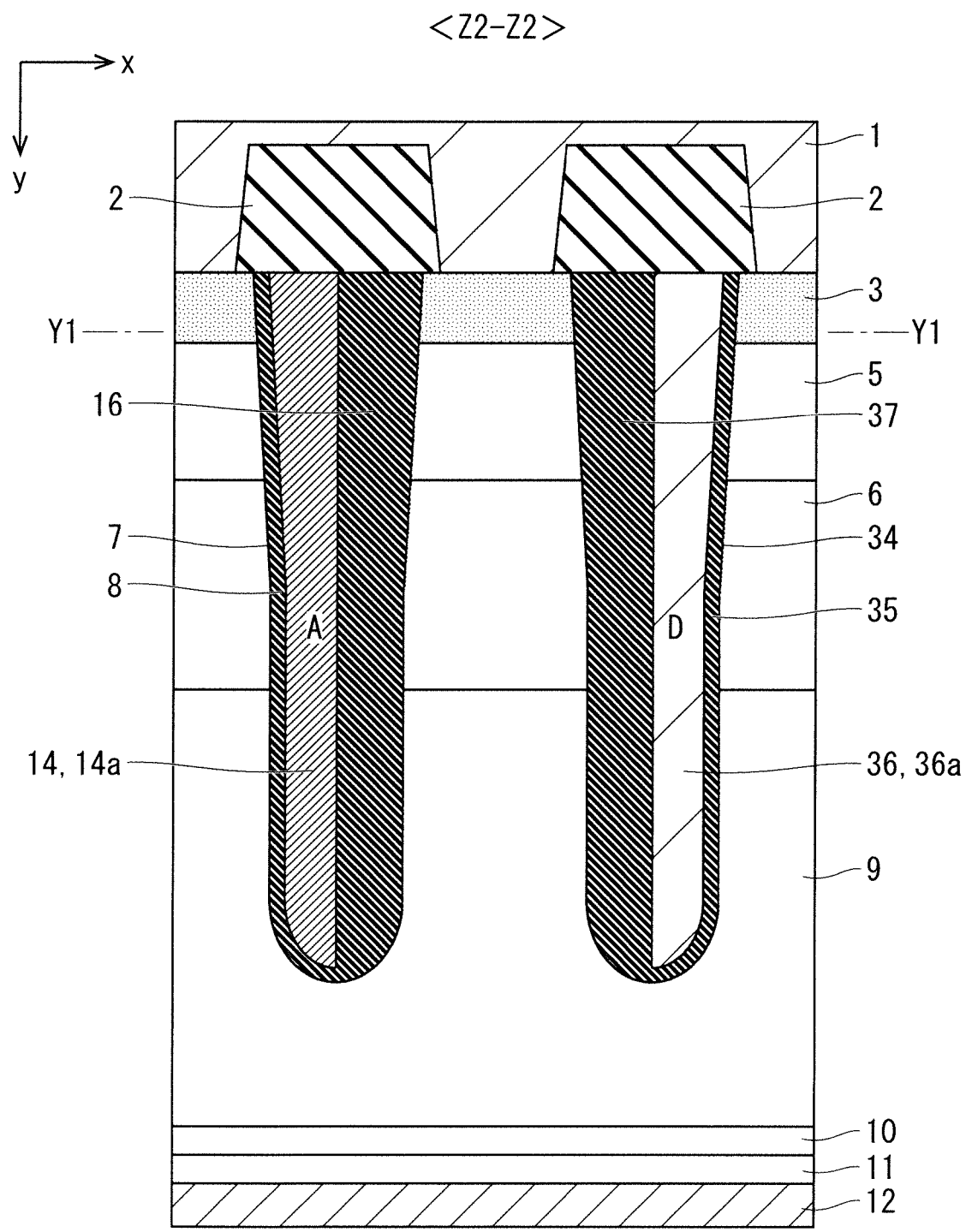
Figure 113:
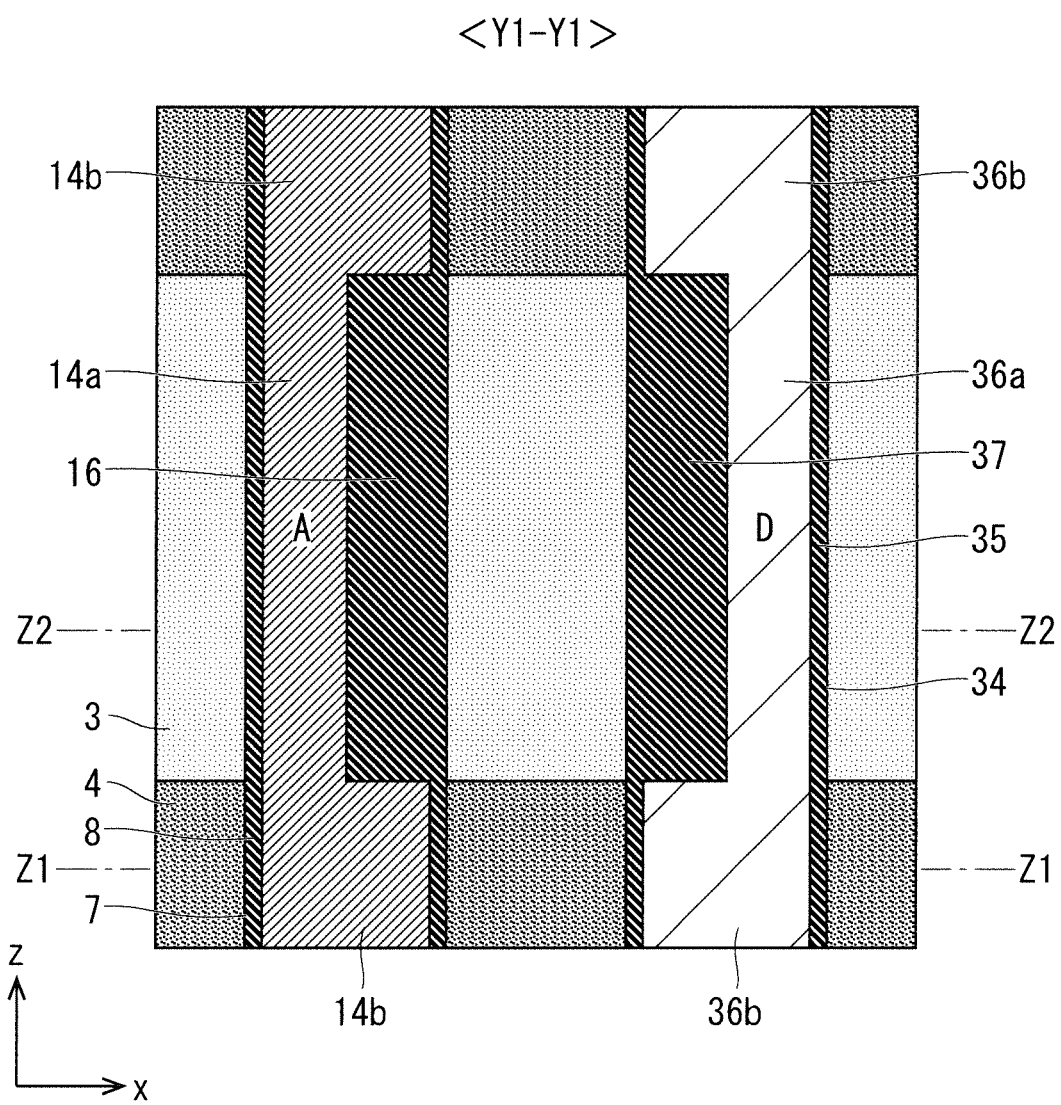
FIG. 113 is a plan view showing the configuration of the semiconductor element according to the third modification of the sixth preferred embodiment.

Such a configuration is capable of reducing a coupling capacitance between the gate portion 14 and the dummy portion 36 to reduce the gate-emitter capacitance Cge.
<Second Modification>
As shown in FIGS. 108 to 110, a configuration may be made so that the relational expression Ld>Lg is satisfied where Lg is the distance from the upper surface of the semiconductor substrate to the upper part of the first gate sub-portion 14a, and Ld is a distance from the upper surface of the semiconductor substrate to an upper part of the dummy portion 36. Such a configuration is capable of reducing the area in which the dummy portion 36 faces the gate portion 14 to reduce the gate-emitter capacitance Cge.
<Third Modification>
In the sixth preferred embodiment, the dummy portion 36 having the recessed portion is provided in the configuration of the first preferred embodiment. However, the dummy portion 36 having the recessed portion may be provided in the configuration of the second preferred embodiment. For example, as shown in FIGS. 111 to 113, the opening of the recessed portion of the gate portion 14 and the opening of the recessed portion of the dummy portion 36 may face sideward. Specifically, the second dummy sub-portion 36b may be connected to the first dummy sub-portion 36a in the direction of extension (e.g., in the z direction) of the second trench 34 as seen in plan view, and may protrude sidewardly beyond the first dummy sub-portion 36a. Such a configuration is capable of reducing the gate-emitter capacitance Cge. In the configuration of FIGS. 111 to 113, the first dummy sub-portion 36a may be aligned with the second gate sub-portion 14b as seen in plan view, and the second dummy sub-portion 36b may be aligned with the first gate sub-portion 14a as seen in plan view, as in the first modification of the sixth preferred embodiment.

Seventh Preferred Embodiment

Figure 114:
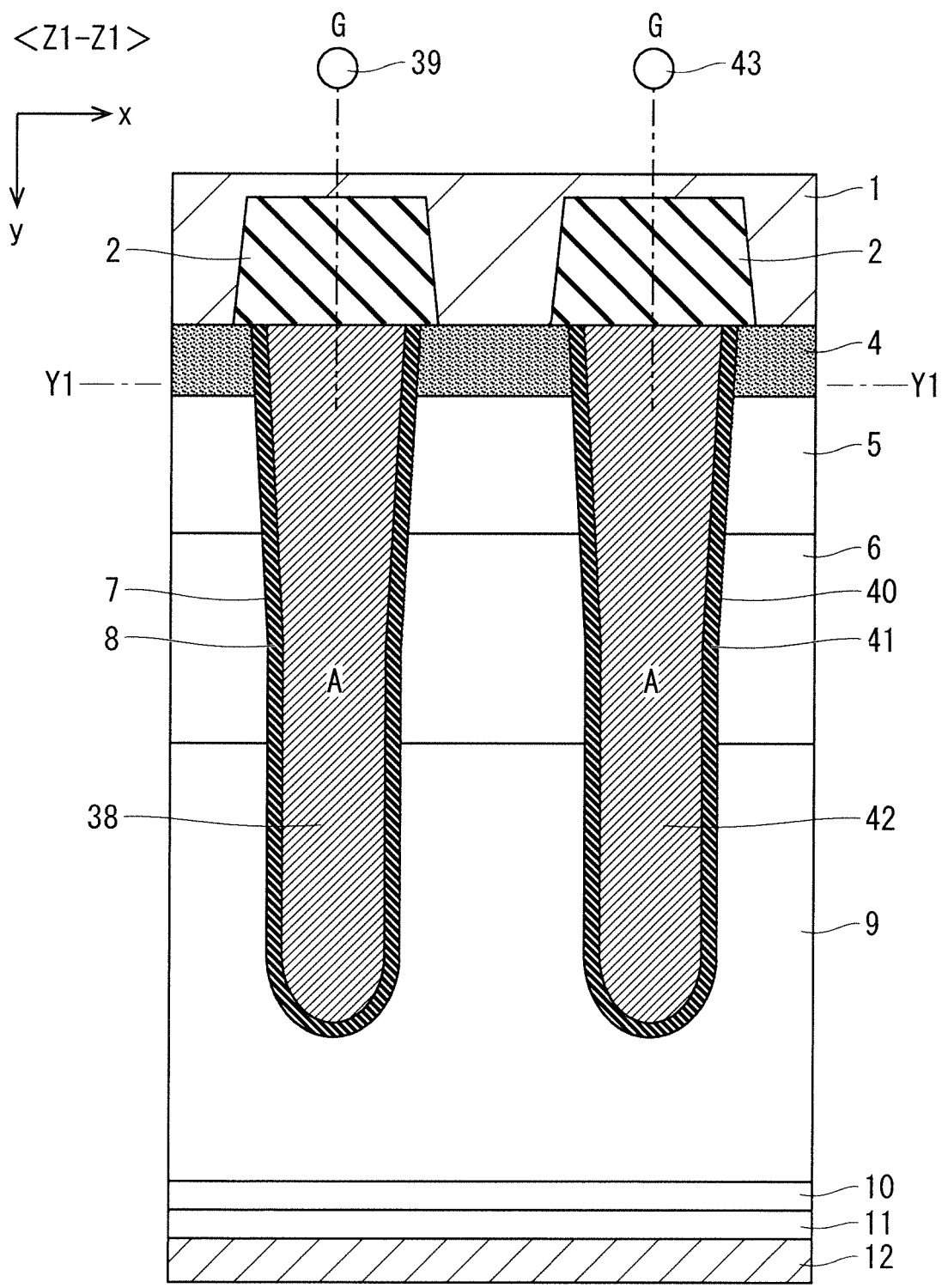
FIGS. 114 and 115 are sectional views showing a configuration of a semiconductor element according to a seventh preferred embodiment.
Figure 115:
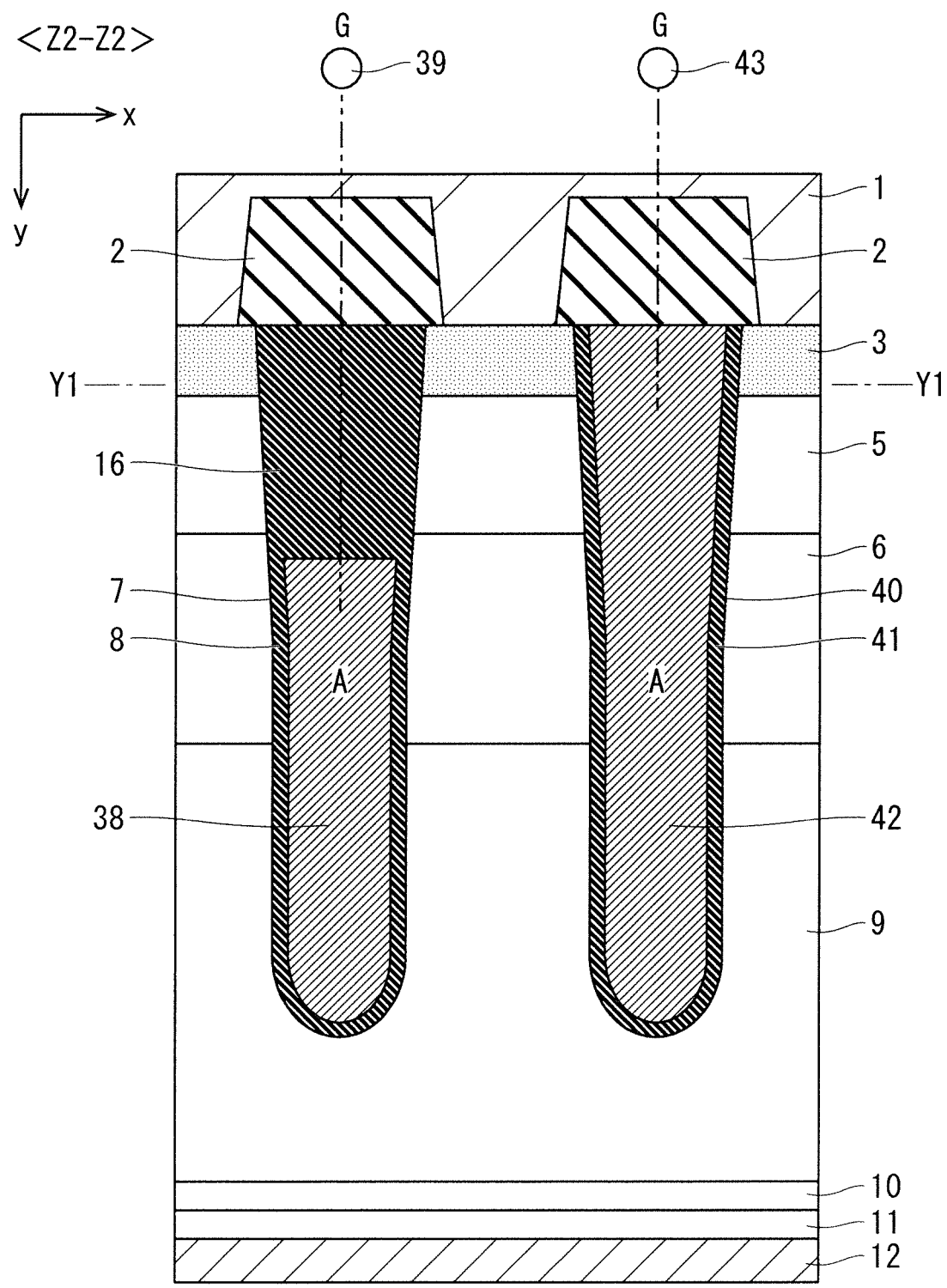
Figure 116:
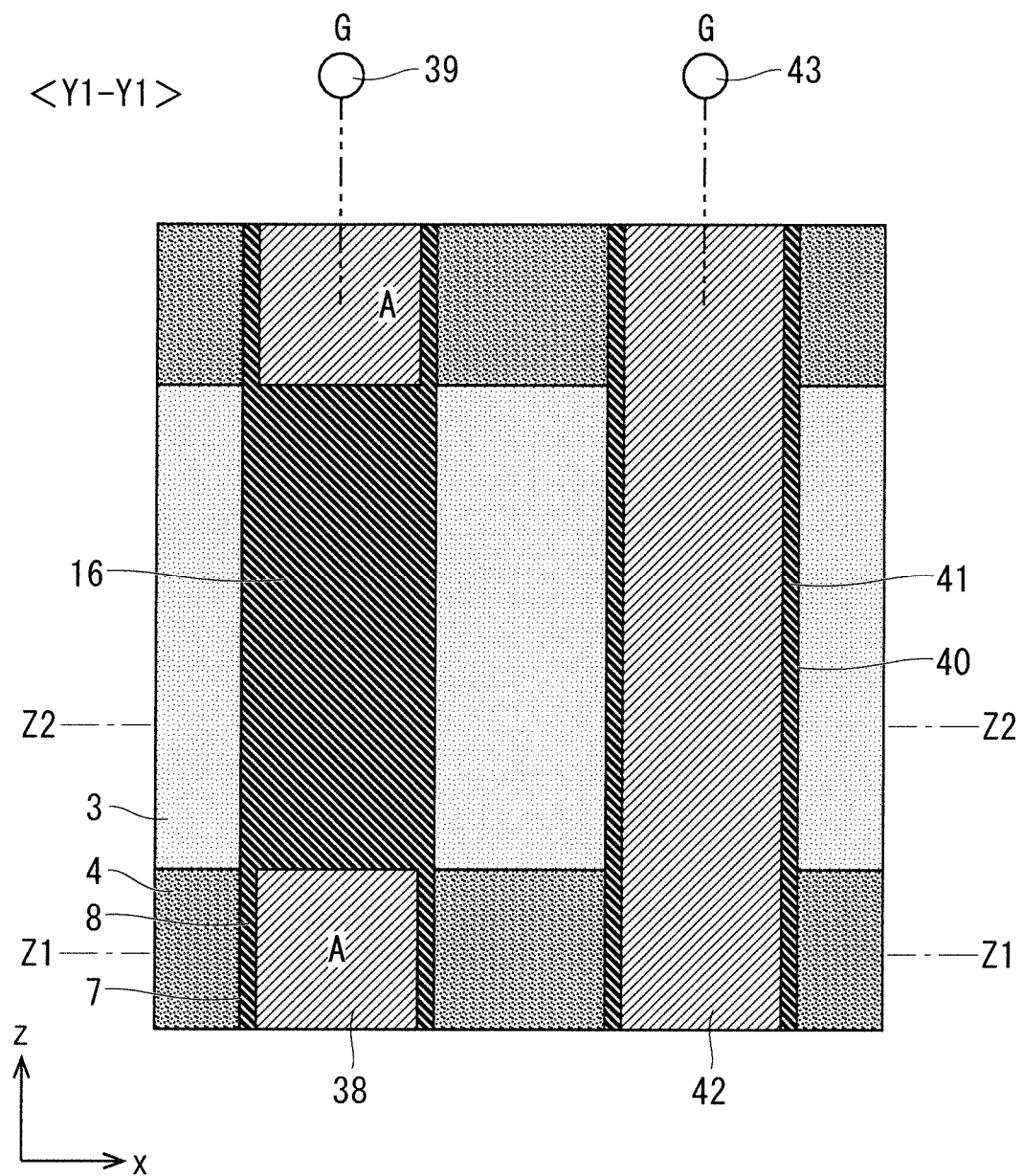
FIG. 116 is a plan view showing the configuration of the semiconductor element according to the seventh preferred embodiment.

FIGS. 114 and 115 are sectional views showing a configuration of a semiconductor element included in a semiconductor device according to a seventh preferred embodiment. FIG. 116 is a plan view showing the configuration of the semiconductor element. Specifically, FIG. 114 is a sectional view taken along the line Z1-Z1 of FIG. 116, and FIG. 115 is a sectional view taken along the line Z2-Z2 of FIG. 116. FIG. 116 is a plan view taken along the line Y1-Y1 of FIGS. 114 and 115.

In the seventh preferred embodiment, the aforementioned gate portion 14 and the aforementioned gate electrode 15 are described as a first gate portion 38 and a first gate electrode 39, respectively. In other words, the first gate portion 38 electrically connected to the first gate electrode 39 is provided in the first trench 7, with the gate oxide film 8 serving as the first gate insulation film therebetween, in the seventh preferred embodiment.

In the seventh preferred embodiment, a second trench 40 in contact with the contact layer 3, the source layer 4, the base layer 5, and the drift layer 9 is provided along the first trench 7 as seen in plan view, as shown in FIG. 115. A second gate portion 42 electrically connected to a second gate electrode 43 is provided in the second trench 40, with a gate oxide film 41 serving as the second gate insulation film therebetween.

In the seventh preferred embodiment, the proportion of the recessed portion of the first gate portion 38 to the first trench 7 as seen in plan view and the proportion of the recessed portion of the second gate portion 42 to the second trench 40 as seen in plan view are different from each other. The proportion of the recessed portion, as that term is used herein, corresponds to the proportion of a buried insulation portion.

The second gate portion 42 may or may not be provided with the recessed portion in a manner similar to the first gate portion 38. In the example of FIGS. 114 to 116, the first gate portion 38 is provided with the recessed portion, and the second gate portion 42 is not provided with the recessed portion. Thus, the proportion of the recessed portion and the buried insulation portion of the first gate portion 38 are greater than the proportion of the recessed portion and the buried insulation portion of the second gate portion 42.

Turning off the first gate electrode 39 connected to the first gate portion 38 prior to the second gate electrode 43 connected to the second gate portion 42 when the proportion of the recessed portion of the first gate portion 38 is greater than the proportion of the recessed portion of the second gate portion 42 allows the gate-emitter capacitance Cge to reduce at the timing during a drop in current. Turning on the first gate electrode 39 after the second gate electrode 43 allows the gate-emitter capacitance Cge to reduce at the timing during a drop in current because this increases dI/dt as described in the first preferred embodiment to reduce the turn-on power losses.

On the other hand, the aforementioned operation may be reversed when the proportion of the recessed portion of the first gate portion 38 is greater than the proportion of the recessed portion of the second gate portion 42. Specifically, the operations of turning off the second gate electrode 43 prior to the first gate electrode 39 and turning on the second gate electrode 43 after the first gate electrode 39 may be performed. In this case, noise is reduced because dI/dt that becomes a radiation noise source is reduced.

Thus, the seventh preferred embodiment is capable of reducing the turn-on power losses or noise by performing an operation referred to generally as double gate drive, i.e., the operation of turning on/off the first gate electrode 39 and the second gate electrode 43 at different times.

<Modifications>

Figure 117:
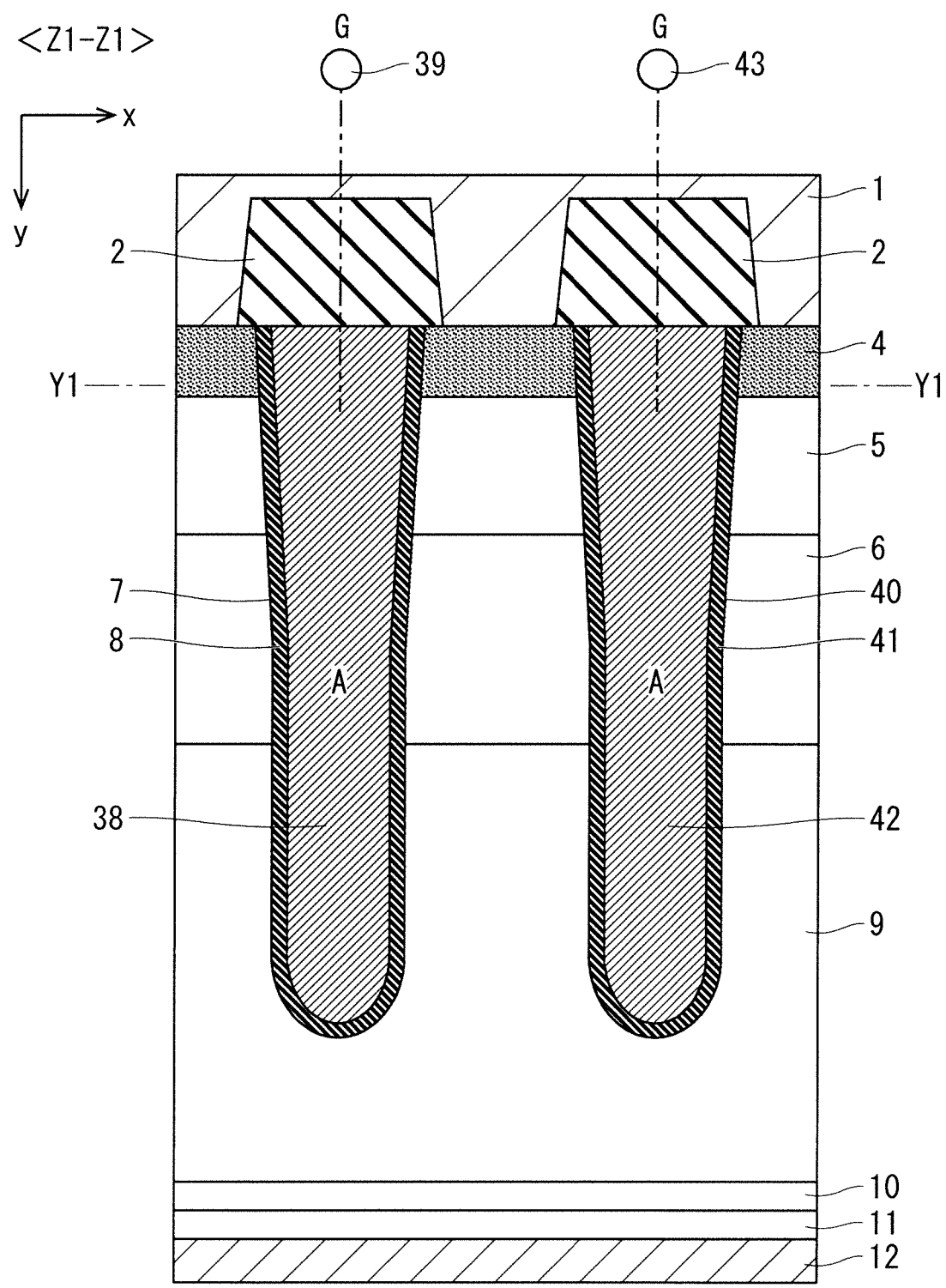
FIGS. 117 and 118 are sectional views showing a configuration of a semiconductor element according to a modification of the seventh preferred embodiment.
Figure 118:
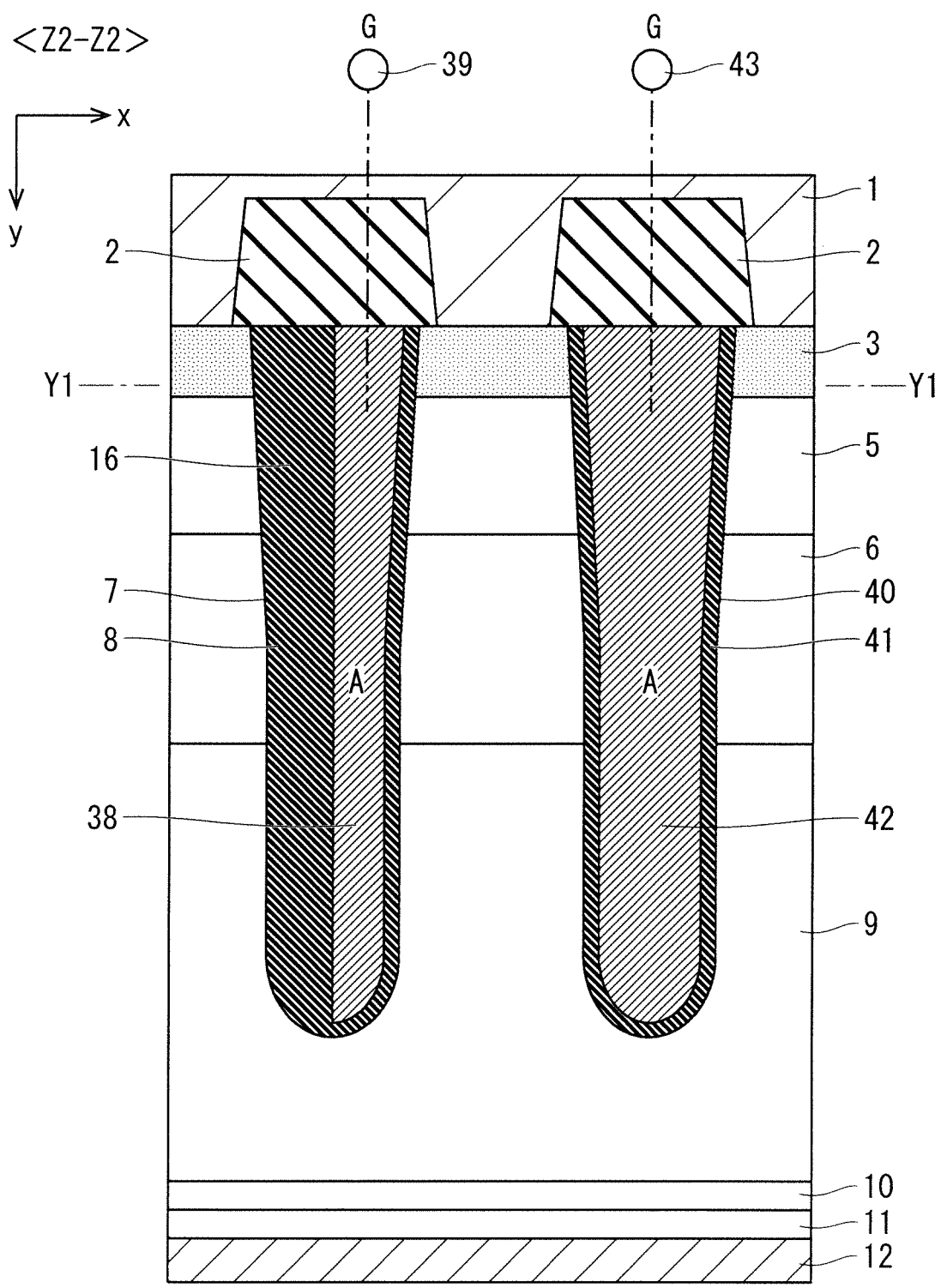
Figure 119:
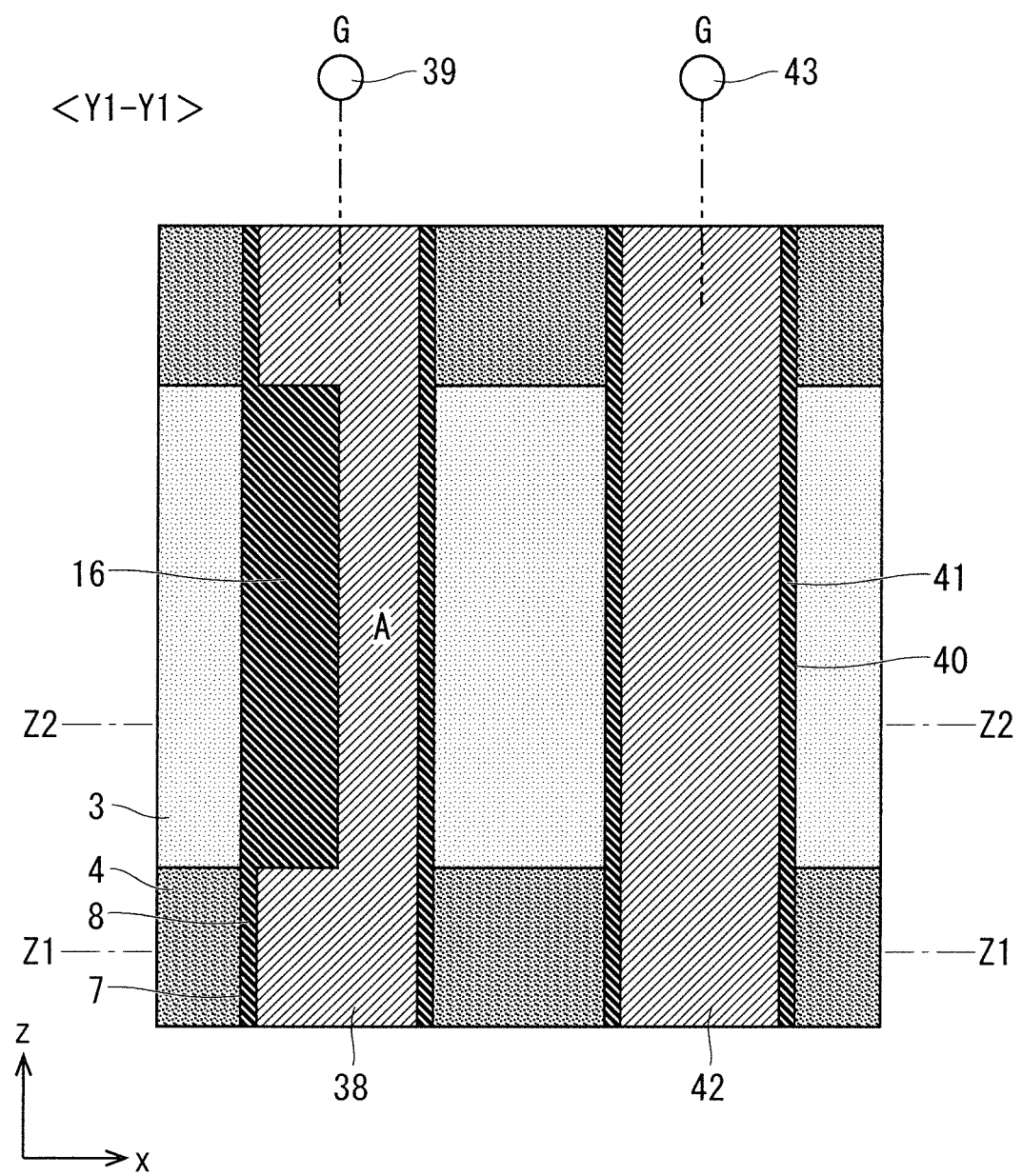
FIG. 119 is a plan view showing the configuration of the semiconductor element according to the modification of the seventh preferred embodiment.

The seventh preferred embodiment is configured such that the second gate electrode 43 and the second gate portion 42 are added to the configuration of the first preferred embodiment. However, the present disclosure is not limited to this. As shown in FIGS. 117 to 119, the second gate electrode 43 and the second gate portion 42 may be added to the configuration of the second preferred embodiment. Then, the proportion of the recessed portion of the first gate portion 38 to the first trench 7 as seen in plan view and the proportion of the recessed portion of the second gate portion 42 to the second trench 40 as seen in plan view may be different from each other. This also reduce the turn-on power losses or noise by performing the double gate drive.

Eighth Preferred Embodiment

Figure 120:
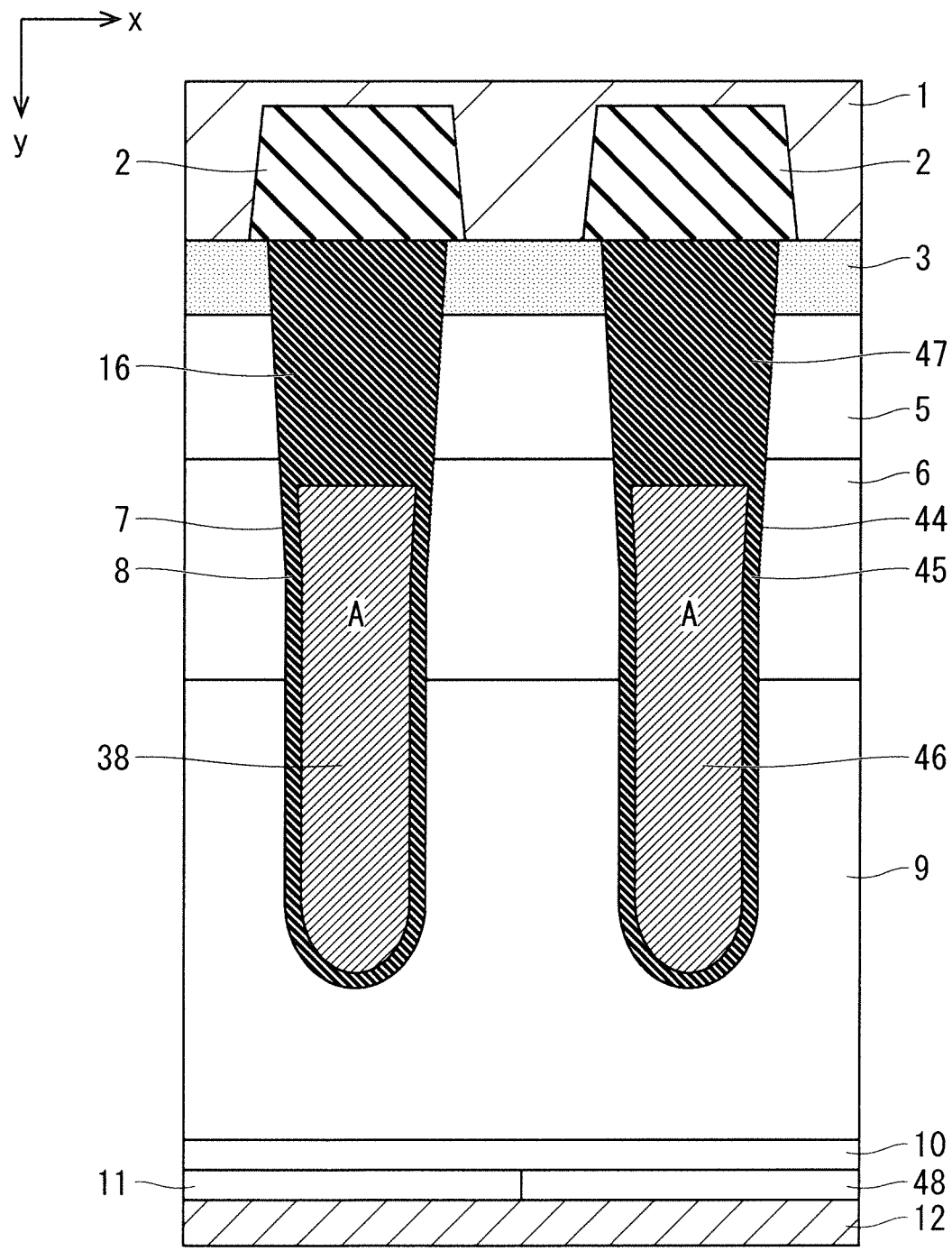
FIG. 120 is a sectional view showing a configuration of a semiconductor element according to an eighth preferred embodiment.

FIG. 120 is a sectional view showing a configuration of a semiconductor element included in a semiconductor device according to an eighth preferred embodiment.

In the eighth preferred embodiment, the configurations of the first to seventh preferred embodiments are applied to an RC-IGBT (Reverse Conducting IGBT). The RC-IGBT includes an IGBT region functioning as an IGBT and a diode region functioning as a diode in the semiconductor substrate.

The configuration of the first gate portion 38 of the seventh preferred embodiment shown in FIG. 115 is applied to the IGBT region of FIG. 120, and the first gate portion 38 is used as the gate of the RC-IGBT. This allows a reduction in gate-emitter capacitance Cge of the RC-IGBT.

In the diode region of the RC-IGBT, a second trench 44 is provided along the first trench 7. A second gate portion 46 that is a conductor electrically connected to the gate electrode is provided in the second trench 44, with a gate oxide film 45 as the second gate insulation film therebetween. The second gate portion 46 is provided with a recessed portion with the bottom farther away from the base layer 5 than the sides thereof. A buried insulation portion 47 serving as the second insulation portion is provided in the recessed portion of the second gate portion 46 in the second trench 44. On the back surface side of the drift layer 9 in the diode region, an n type cathode layer 48 is provided in place of the p type collector layer 11 in the IGBT region.

The proportion of the buried insulation portion 47 to the second trench 44 as seen in plan view may be greater than the proportion of the buried insulation portion 16 to the first trench 7 as seen in plan view. Such a configuration is capable of reducing the gate-emitter capacitance Cge. If there is no need to reduce the gate-emitter capacitance Cge, the second gate portion 46 need not be provided with the recessed portion and the buried insulation portion 37.

<First Modification>

Figure 121:
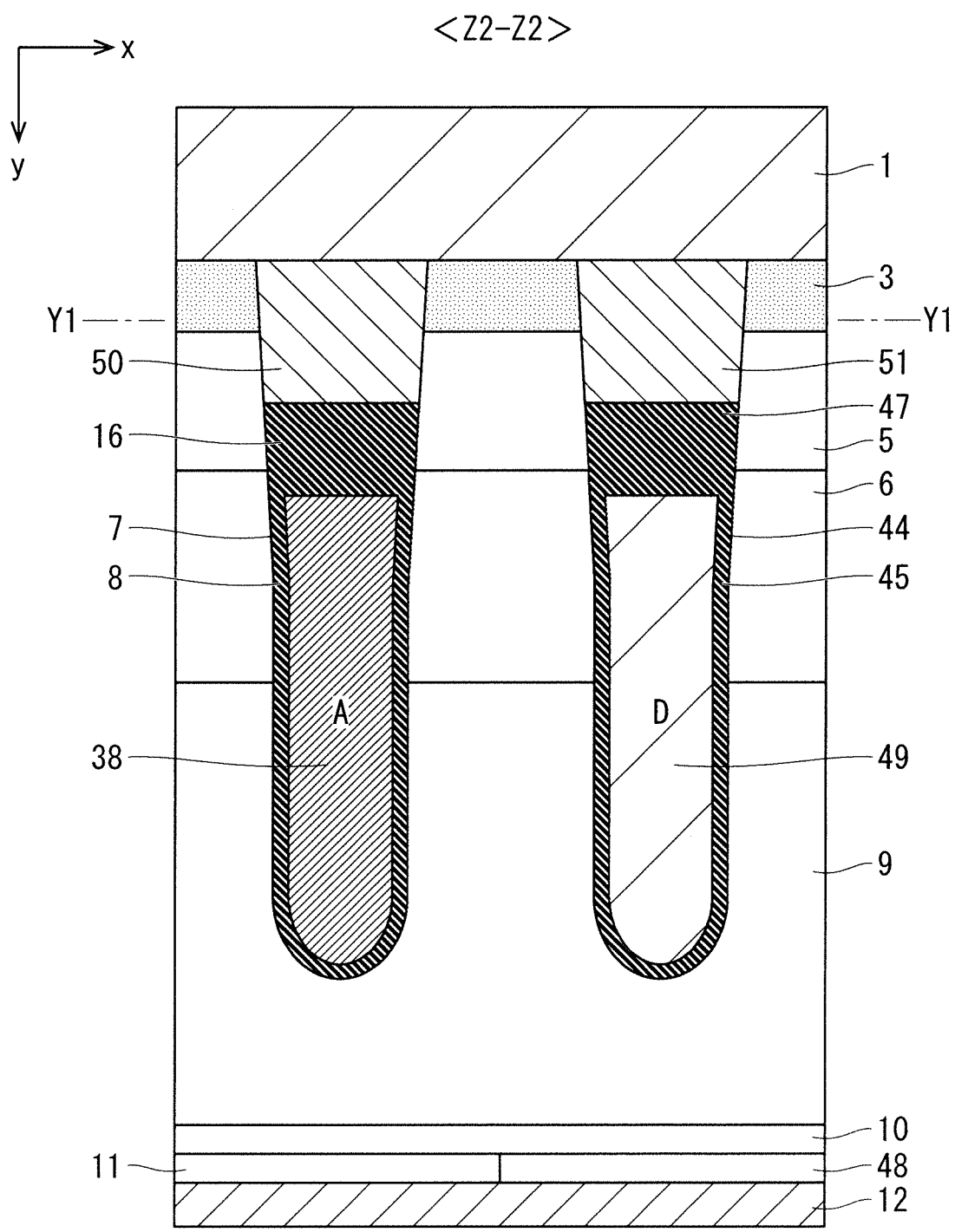
FIG. 121 is a sectional view showing a configuration of a semiconductor element according to a first modification of the eighth preferred embodiment.
Figure 122:
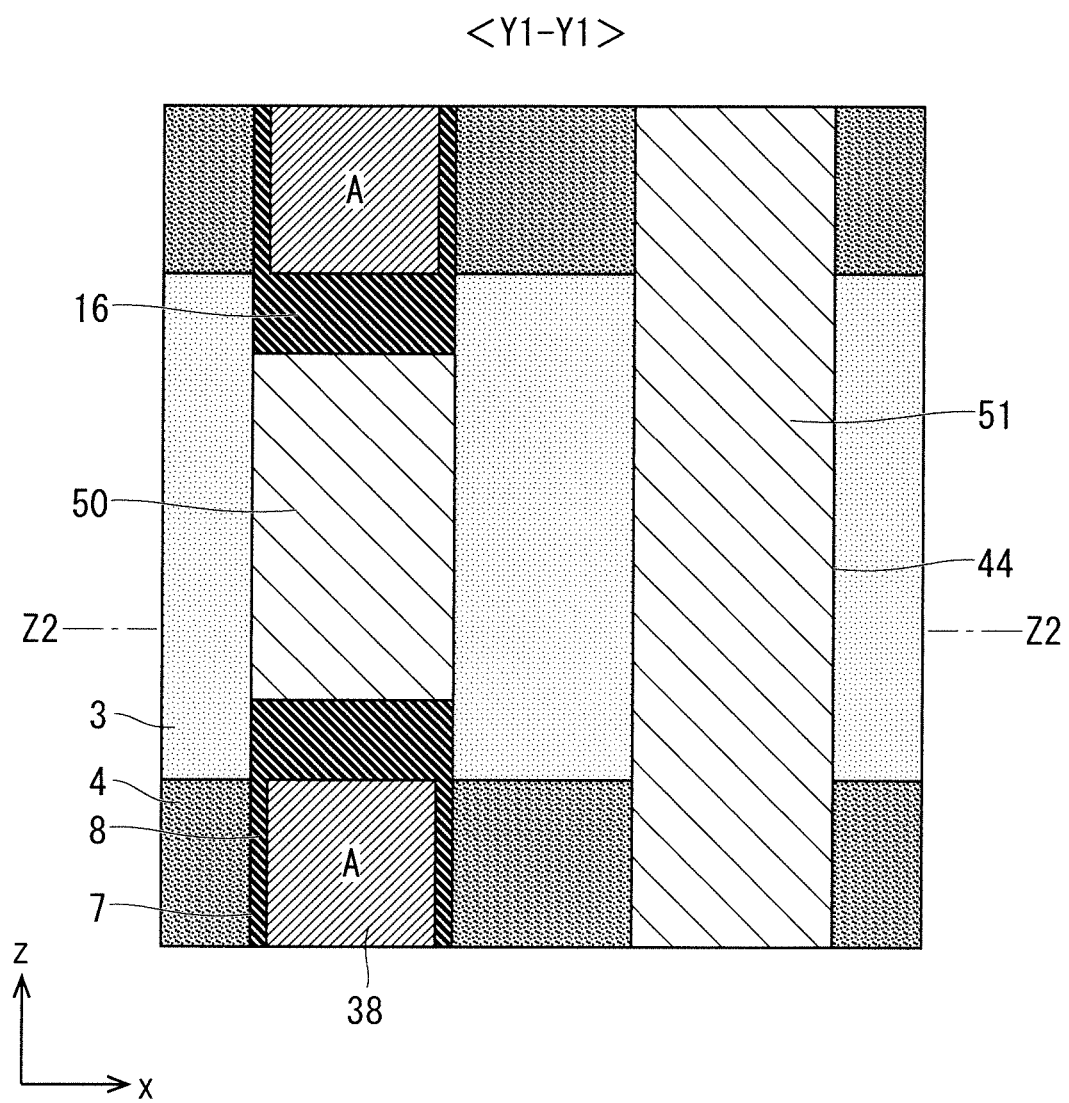
FIG. 122 is a plan view showing the configuration of the semiconductor element according to the first modification of the eighth preferred embodiment.

FIG. 121 is a sectional view showing a configuration of a semiconductor element included in a semiconductor device according to a first modification of the eighth preferred embodiment. FIG. 122 is a plan view showing the configuration of the semiconductor element. In the eighth preferred embodiment, the second gate portion 46 electrically connected to the gate electrode is provided as a conductor in the second trench 44, with the gate oxide film 45 as the second gate insulation film therebetween. However, the present disclosure is not limited to this.

For example, a dummy portion 49 electrically connected to the emitter electrode 1 may be provided as a conductor in the second trench 44, with the gate oxide film 45 as the second gate insulation film therebetween, as in this first modification of the eighth preferred embodiment. Such a configuration is capable of reducing the gate-emitter capacitance Cge and the gate-collector capacitance Cgc.

As shown in FIGS. 121 and 122, a first buried metal portion 50 that is a first metal portion insulated from the first gate portion 38 by the buried insulation portion 16 and electrically connected to the emitter electrode 1 may be further provided in the first trench 7. Similarly, a second buried metal portion 51 that is a second metal portion insulated from the dummy portion 49 by the buried insulation portion 47 and electrically connected to the emitter electrode 1 may be further provided in the second trench 44. As shown in FIG. 122, the proportion of the second buried metal portion 51 to the second trench 44 as seen in plan view in the diode region may be greater than the proportion of the first buried metal portion 50 to the first trench 7 as seen in plan view in the IGBT region. Such a configuration is capable of promoting the discharge of holes from the second buried metal portion 51 to reduce the recovery losses.

<Second Modification>

Figure 123:
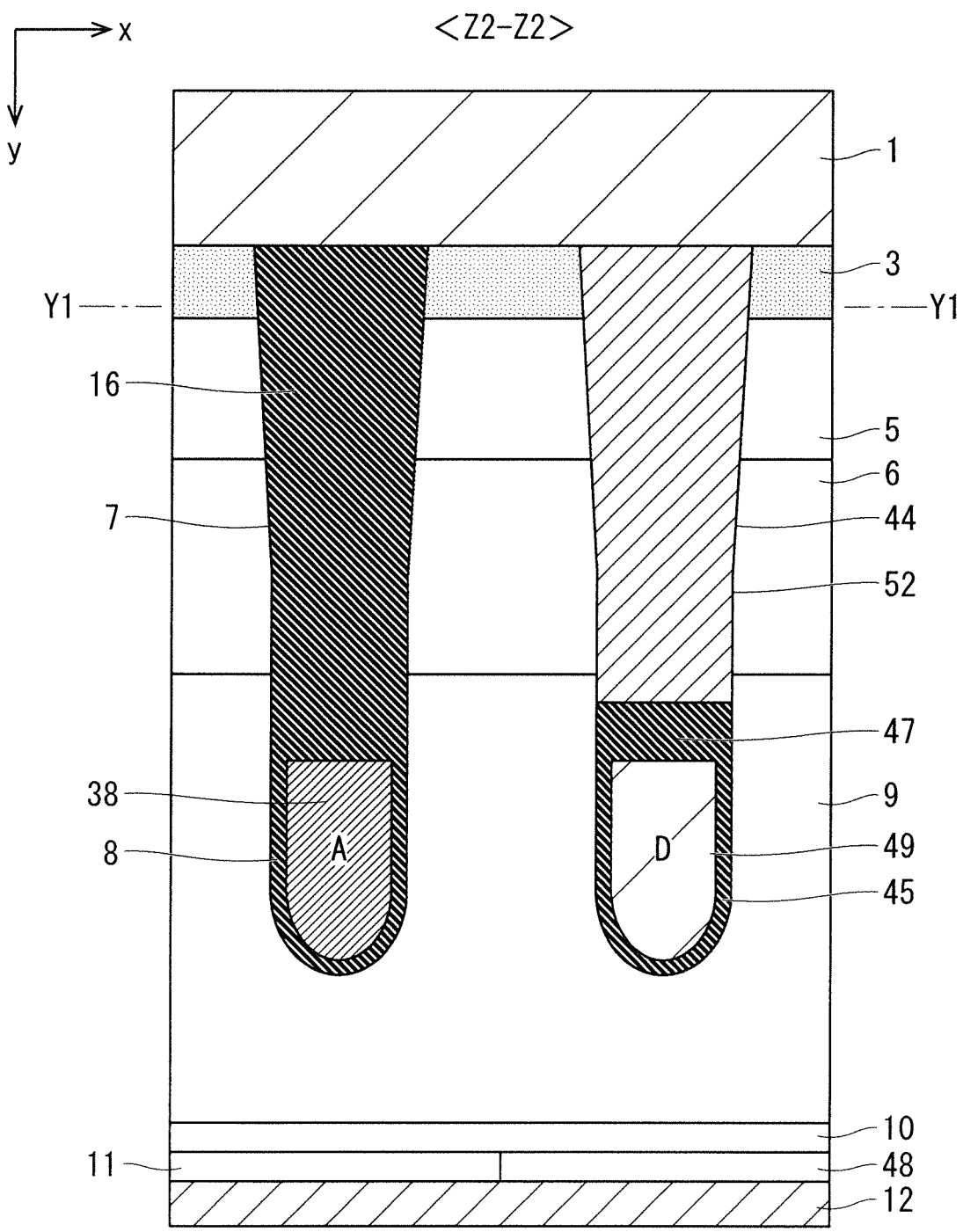
FIG. 123 is a sectional view showing a configuration of a semiconductor element according to a second modification of the eighth preferred embodiment.
Figure 124:
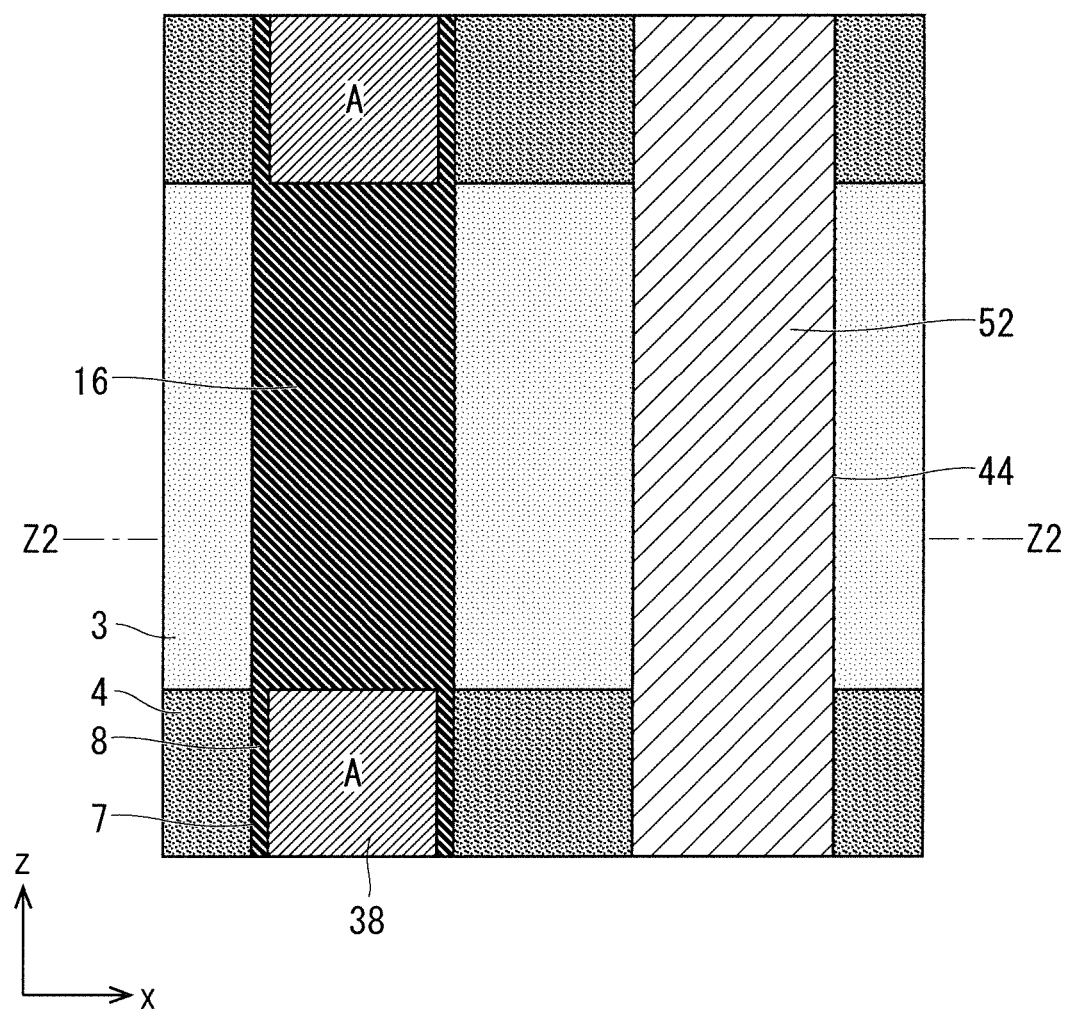
FIG. 124 is a plan view showing the configuration of the semiconductor element according to the second modification of the eighth preferred embodiment.
Figure 125:
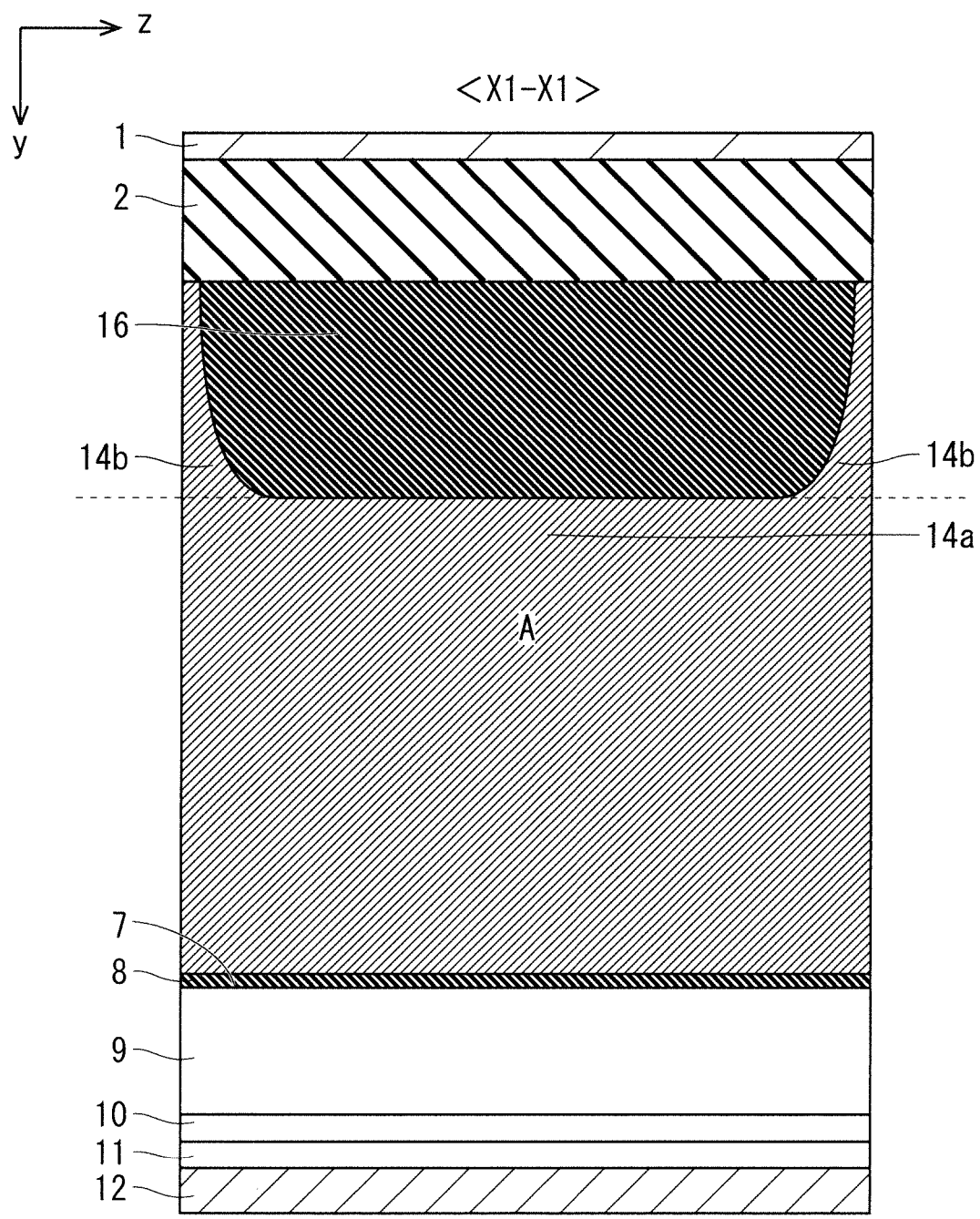
FIG. 125 is a sectional view showing the configuration of the semiconductor element according to the first preferred embodiment.
Figure 126:
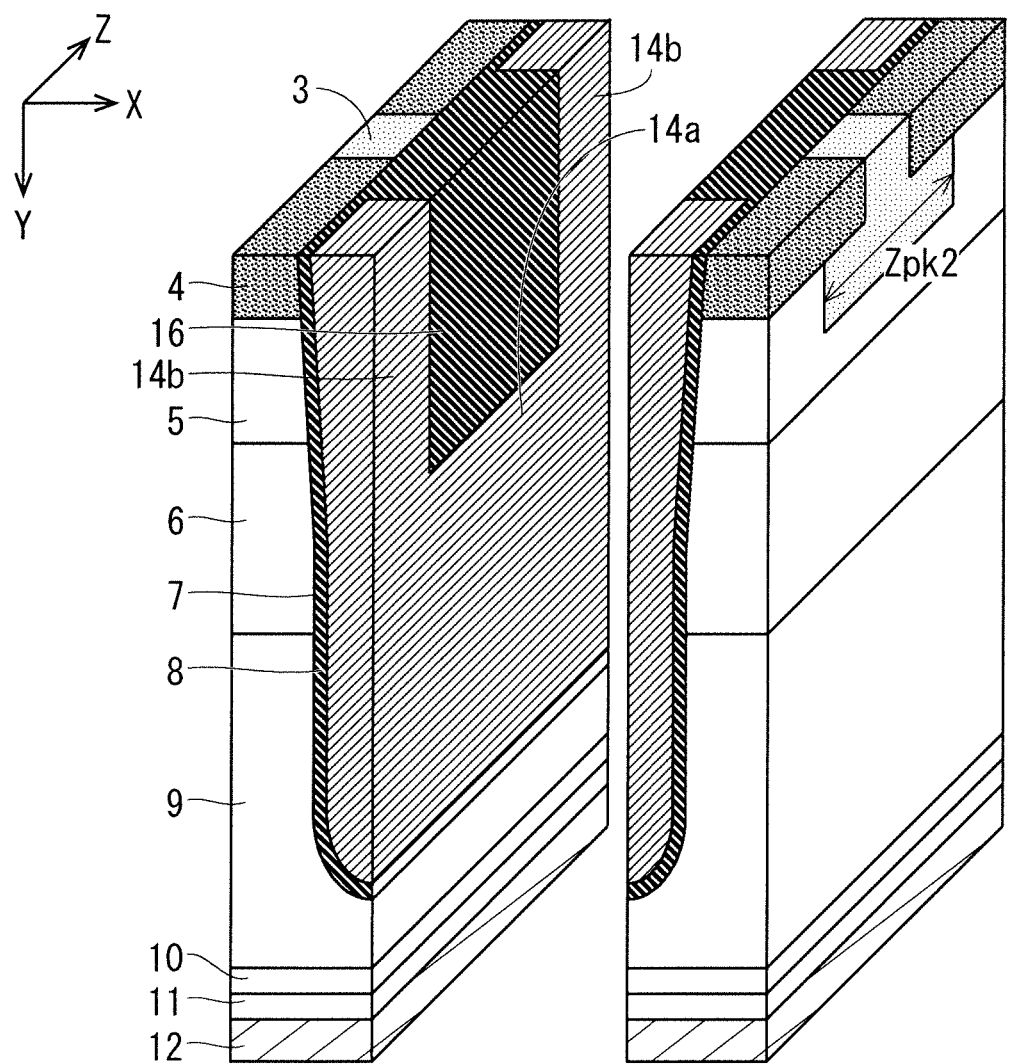
FIG. 126 is a perspective view showing the configuration of the semiconductor element according to the third modification of the first preferred embodiment.

FIG. 123 is a sectional view showing a configuration of a semiconductor element included in a semiconductor device according to a second modification of the eighth preferred embodiment. FIG. 124 is a plan view showing the configuration of the semiconductor element. In the second modification of the eighth preferred embodiment, the dummy portion 49 electrically connected to the emitter electrode 1 is provided as a conductor in the second trench 44, with the gate oxide film 45 as the second gate insulation film therebetween, as in the first modification of the eighth preferred embodiment.

In such a configuration, a Schottky metal portion 52 that is a metal portion insulated from the dummy portion 49 by the buried insulation portion 47 and electrically connected to the emitter electrode 1 may be provided in the second trench 44 in the diode region, as shown in FIGS. 123 and 124. The Schottky metal portion 52 is in Schottky contact with at least one of the carrier storage layer 6 and the drift layer 9. In such a configuration, a Schottky junction is capable of increasing the amount of electron current when the diode in the diode region operates. This reduces the recovery losses.

The Schottky metal portion may be provided only in the diode region as shown in FIGS. 123 and 124 or may be provided in each of the IGBT region and the diode region. In a configuration in which the Schottky metal portion is provided in each of the IGBT region and the diode region, the proportion of the Schottky metal portion to the second trench 44 in the diode region may be greater than the proportion of the Schottky metal portion to the first trench 7 in the IGBT region as seen in plan view.

<Ninth Preferred Embodiment>

In a ninth preferred embodiment, the configurations of the first to seventh preferred embodiments are applied to a MOSFET (Metal Oxide Semiconductor Field Effect Transistor). Specifically, the gate portion 14 is used as the gate of the MOSFET. Such a configuration is capable of reducing the gate-emitter capacitance Cge of the MOSFET.

Tenth Preferred Embodiment

In a tenth preferred embodiment, the semiconductor substrate of the first to ninth preferred embodiments includes a wide bandgap semiconductor. The wide bandgap semiconductor includes, for example, silicon carbide, gallium nitride materials, gallium oxide, or diamond. Such a configuration is capable of increasing the breakdown voltage of a semiconductor device. The threshold voltage is often made lower for purposes of a lower channel resistance in silicon carbide semiconductor devices using silicon carbide than in silicon semiconductor devices using silicon because silicon carbide is poorer in channel characteristics than silicon. Specifically, the thickness of a gate oxide film is often designed to be smaller in silicon carbide semiconductor devices for purposes of reduction in threshold voltage than in silicon semiconductor devices. The gate-emitter capacitance Cge of silicon carbide semiconductor devices is often larger than that of silicon semiconductor devices because the gate-emitter capacitance Cge is inversely proportional to the thickness of the gate oxide film. It is hence effective to apply the first to ninth preferred embodiments which are capable of reducing the gate-emitter capacitance Cge to silicon carbide semiconductor devices having a relatively large gate-emitter capacitance Cge.

The preferred embodiments and the modifications may be freely combined or the preferred embodiments may be changed and dispensed with, as appropriate.

While the disclosure has been shown and described in detail, the foregoing description is in all aspects illustrative and not restrictive. It is therefore understood that numerous modifications and variations can be devised.

What is claimed is:

1. A semiconductor device comprising:
   a semiconductor substrate having an upper surface and a lower surface and including a drift layer of a first conductivity type provided between the upper and lower surfaces;
   a base layer of a second conductivity type provided on the upper surface side of the drift layer in the semiconductor substrate;
   a contact layer of the second conductivity type provided selectively on the upper surface side of the drift layer or the base layer in the semiconductor substrate and having an impurity concentration higher than that of the base layer;
   a source layer of the first conductivity type provided selectively on the upper surface side of the base layer in the semiconductor substrate and having an impurity concentration higher than that of the drift layer;
   a gate portion provided in a first trench, with a first gate insulation film therebetween, the first trench being in contact with the contact layer, the source layer, the base layer, and the drift layer, the gate portion being electrically connected to a gate electrode, the gate portion being provided with a recessed portion with a bottom farther away from the base layer than a side thereof; and
   a first insulation portion provided in the recessed portion of the gate portion in the first trench.

2. The semiconductor device according to claim 1, wherein:
   the gate portion includes
   a first gate sub-portion, and
   a second gate sub-portion connected to the first gate sub-portion in a direction of extension of the first trench as seen in plan view and protruding upwardly above the first gate sub-portion, the second gate sub-portion facing the source layer across the first gate insulation film;
   the first gate sub-portion includes the bottom of the recessed portion of the gate portion; and
   the second gate sub-portion includes the side of the recessed portion of the gate portion.

3. The semiconductor device according to claim 2, further comprising
   a carrier storage layer provided between the base layer and the drift layer,
   wherein an upper part of the first gate sub-portion is positioned below an upper part of the carrier storage layer.

4. The semiconductor device according to claim 3, wherein
   the upper part of the first gate sub-portion is positioned below a lower part of the carrier storage layer.

5. The semiconductor device according to claim 2, wherein:
   the second gate sub-portion faces the contact layer across the first gate insulation film; and
   a relational expression Zpk>Zg is satisfied where Zpk is the length of the contact layer as measured in the direction of extension of the first trench as seen in plan view and Zg is the length of the first insulation portion as measured in that direction.

6. The semiconductor device according to claim 2, wherein:
the first insulation portion faces the source layer; and
a relational expression Zpk<Zg is satisfied where Zpk is the length of the contact layer as measured in the direction of extension of the first trench as seen in plan view and Zg is the length of the first insulation portion as measured in that direction.

7. The semiconductor device according to claim 2, further comprising
a dummy portion made of polysilicon and provided in the first trench, the dummy portion being insulated from the gate portion and being electrically connected to an emitter electrode.

8. The semiconductor device according to claim 7, wherein
the dummy portion is insulated from the gate portion by the first insulation portion.

9. The semiconductor device according to claim 7, wherein
the dummy portion is provided below the gate portion.

10. The semiconductor device according to claim 2, further comprising
a metal portion provided in the first trench, the metal portion being insulated from the gate portion by the first insulation portion and being electrically connected to an emitter electrode.

11. The semiconductor device according to claim 2, further comprising:
a carrier storage layer provided between the base layer and the drift layer; and
a metal portion provided in the first trench, the metal portion being insulated from the gate portion by the first insulation portion and being electrically connected to an emitter electrode,
wherein the metal portion is in Schottky contact with at least one of the carrier storage layer and the drift layer.

12. The semiconductor device according to claim 2, wherein
the first trench as seen in cross section includes:
a first portion in which the first gate sub-portion is positioned; and
a second portion in which the first insulation portion is positioned,
the second portion being wider than the first portion.

13. The semiconductor device according to claim 2, wherein
the first insulation portion is in contact with part of the semiconductor substrate other than the base layer.

14. The semiconductor device according to claim 2, further comprising
a metal portion provided in the first trench, the metal portion being insulated from the gate portion by the first insulation portion and being electrically connected to an emitter electrode,
wherein the metal portion is in Schottky contact with part of the semiconductor substrate other than the base layer.

15. The semiconductor device according to claim 2, further comprising
a second insulation portion provided on the side opposite to the source layer with respect to the second gate sub-portion as seen in plan view and having a width greater than that of the first gate insulation film.

16. The semiconductor device according to claim 2, wherein:
a protruding portion is provided on a side of the first trench as seen in plan view; and
the first gate sub-portion and the first insulation portion are provided in the protruding portion.

17. The semiconductor device according to claim 16, wherein
the second gate sub-portion faces the contact layer across the first gate insulation film.

18. The semiconductor device according to claim 2, wherein
a relational expression L1×W1>L2×W2 is satisfied where L1 and W1 are the height and width, respectively, of the first gate sub-portion, and L2 and W2 are the height and width, respectively, of the second gate sub-portion.

19. The semiconductor device according to claim 2, wherein
a lower part of the first gate sub-portion is positioned below a lower part of the second gate sub-portion.

20. The semiconductor device according to claim 2, wherein
the gate portion further includes
a third gate sub-portion provided on the first gate sub-portion and having a width smaller than those of the first and second gate sub-portions.

21. The semiconductor device according to claim 20, wherein
the third gate sub-portion is disposed eccentrically to one side of the gate portion as seen in plan view or in cross section.

22. The semiconductor device according to claim 2, wherein
a relational expression Lpk>Lb is satisfied where Lpk is a distance from the upper surface of the semiconductor substrate to a lower part of the contact layer, and Lb is a distance from the upper surface of the semiconductor substrate to a lower part of the base layer.

23. The semiconductor device according to claim 22, wherein
a relational expression Lpk>Lg is satisfied where Lpk is the distance from the upper surface of the semiconductor substrate to the lower part of the contact layer, and Lg is a distance from the upper surface of the semiconductor substrate to an upper part of the first gate sub-portion.

24. A method of manufacturing a semiconductor device as recited in claim 22, comprising the steps of:
forming the first gate sub-portion and the second gate sub-portion; and
thereafter selectively forming the contact layer by an oblique ion implantation process in which impurities of the second conductivity type are implanted into an inner wall of the first trench above the first gate sub-portion.

25. The semiconductor device according to claim 2, wherein:
the contact layer is provided between the base layer and the source layer; and
the contact layer has an impurity concentration lower than that of the source layer.

26. The semiconductor device according to claim 25, further comprising
a metal portion provided in the first trench, the metal portion being insulated from the gate portion by the first insulation portion and being in ohmic contact with the contact layer and the source layer.

27. The semiconductor device according to claim 25, wherein
a side of the first trench as seen in plan view is connected to a second trench in contact with the source layer and the contact layer,
the semiconductor device further comprising
a metal portion provided in the second trench, the metal portion being insulated from the gate portion by the first insulation portion and being in ohmic contact with the contact layer and the source layer.

28. The semiconductor device according to claim 27, wherein
a lower part of the second trench is positioned below a lower part of the contact layer and above an upper part of the first gate sub-portion.

29. The semiconductor device according to claim 28, further comprising
a carrier storage layer provided between the base layer and the drift layer,
wherein the lower part of the second trench is positioned below a lower part of the base layer and above the upper part of the first gate sub-portion, and
wherein the metal portion is in Schottky contact with at least one of the carrier storage layer and the drift layer.

30. The semiconductor device according to claim 2, further comprising:
a dummy portion provided in a second trench, with a second gate insulation film therebetween, the second trench being in contact with the contact layer, the source layer, the base layer, and the drift layer, the dummy portion being electrically connected to an emitter electrode, the dummy portion being provided with a recessed portion with a bottom farther away from the base layer than a side thereof; and
a second insulation portion provided in the recessed portion of the dummy portion in the second trench.

31. The semiconductor device according to claim 30, wherein:
the second trench is provided along the first trench as seen in plan view;
the dummy portion includes
a first dummy sub-portion aligned with the second gate sub-portion as seen in plan view, and
a second dummy sub-portion aligned with the first gate sub-portion as seen in plan view and connected to the first dummy sub-portion in a direction of extension of the second trench as seen in plan view, the second dummy sub-portion protruding upwardly above or sidewardly beyond the first dummy sub-portion;
the first dummy sub-portion includes the bottom of the recessed portion of the dummy portion; and
the second dummy sub-portion includes the side of the recessed portion of the dummy portion.

32. The semiconductor device according to claim 30, wherein
a relational expression Ld>Lg is satisfied where Lg is a distance from the upper surface of the semiconductor substrate to an upper part of the first gate sub-portion, and Ld is a distance from the upper surface of the semiconductor substrate to an upper part of the dummy portion.

33. The semiconductor device according to claim 1, wherein:
the gate portion includes
a first gate sub-portion, and
a second gate sub-portion connected to the first gate sub-portion in a direction of extension of the first trench as seen in plan view and protruding sidewardly beyond the first gate sub-portion, the second gate sub-portion facing the source layer across the first gate insulation film;
the first gate sub-portion includes the bottom of the recessed portion of the gate portion; and
the second gate sub-portion includes the side of the recessed portion of the gate portion.

34. The semiconductor device according to claim 33, wherein
a lower part of the first gate insulation film has a thickness greater than that of part of the first gate insulation film other than the lower part as seen in cross section.

35. The semiconductor device according to claim 33, wherein
a relational expression $t1 \times 3 < t2 \leq Wtr/2 - W2$ is satisfied where Wtr is a dimension of the first trench as measured in a width direction of the first trench as seen in plan view, W2 is a dimension of the first gate sub-portion as measured in the width direction, t1 is a dimension of the first gate insulation film as measured in the width direction, and t2 is a dimension of the first insulation portion as measured in the width direction.

36. The semiconductor device according to claim 33, wherein
the second gate sub-portion protrudes from only one side of the first gate sub-portion as seen in plan view.

37. The semiconductor device according to claim 1, wherein:
a protruding portion is provided on a side of the first trench as seen in plan view; and
the first insulation portion is provided in the protruding portion.

38. The semiconductor device according to claim 37, wherein
the protruding portion is connected to a second trench.

39. The semiconductor device according to claim 1, further comprising
a protective layer of the second conductivity type provided partially between the first trench and the drift layer,
wherein at least part of the first insulation portion is provided between the gate portion and the protective layer.

40. The semiconductor device according to claim 1, wherein
the gate portion is made of polysilicon, metal, or a double-layer structure comprised of polysilicon and metal.

41. The semiconductor device according to claim 1, wherein
the gate portion and the gate electrode are a first gate portion and a first gate electrode, respectively,
the semiconductor device further comprising
a second gate portion provided in a second trench, with a second gate insulation film therebetween, the second trench being in contact with the contact layer, the source layer, the base layer, and the drift layer, the second gate portion being electrically connected to a second gate electrode,
wherein the proportion of the recessed portion of the first gate portion to the first trench as seen in plan view and the proportion of a recessed portion of the second gate portion to the second trench as seen in plan view are different from each other.

42. The semiconductor device according to claim 1, wherein
the gate portion is used as the gate of an RC-IGBT.

43. The semiconductor device according to claim 42, further comprising:
a conductor provided in a second trench in a diode region of the RC-IGBT, with a second gate insulation film therebetween, the conductor being provided with a recessed portion with a bottom farther away from the base layer than a side thereof; and
a second insulation portion provided in the recessed portion of the conductor in the second trench,
wherein the proportion of the second insulation portion to the second trench as seen in plan view is greater than the proportion of the first insulation portion to the first trench as seen in plan view.

44. The semiconductor device according to claim 42, further comprising:
a conductor provided in a second trench in a diode region of the RC-IGBT, with a second gate insulation film therebetween, the conductor being provided with a recessed portion with a bottom farther away from the base layer than a side thereof;
a second insulation portion provided in the recessed portion of the conductor in the second trench;
a first metal portion provided in the first trench, the first metal portion being insulated from the gate portion by the first insulation portion and being electrically connected to an emitter electrode; and
a second metal portion provided in the second trench, the second metal portion being insulated from the conductor by the second insulation portion and being electrically connected to the emitter electrode,
wherein the proportion of the second metal portion to the second trench as seen in plan view is greater than the proportion of the first metal portion to the first trench as seen in plan view.

45. The semiconductor device according to claim 42, further comprising:
a carrier storage layer provided between the base layer and the drift layer;
a conductor provided in a second trench in a diode region of the RC-IGBT, with a second gate insulation film therebetween, the conductor being provided with a recessed portion with a bottom farther away from the base layer than a side thereof;
a second insulation portion provided in the recessed portion of the conductor in the second trench; and
a metal portion provided in the second trench, the metal portion being insulated from the conductor by the second insulation portion and being electrically connected to an emitter electrode,
wherein the metal portion is in Schottky contact with at least one of the carrier storage layer and the drift layer.

46. The semiconductor device according to claim 1, wherein
the gate portion is used as the gate of a MOSFET.

47. The semiconductor device according to claim 1, wherein
the semiconductor substrate includes a wide bandgap semiconductor.

48. A semiconductor device comprising:
a semiconductor substrate having an upper surface and a lower surface and including a drift layer of a first conductivity type provided between the upper and lower surfaces;
a base layer of a second conductivity type provided on the upper surface side of the drift layer in the semiconductor substrate;
a contact layer of the second conductivity type provided selectively on the upper surface side of the drift layer or the base layer in the semiconductor substrate and having an impurity concentration higher than that of the base layer;
a source layer of the first conductivity type provided selectively on the upper surface side of the base layer in the semiconductor substrate and having an impurity concentration higher than that of the drift layer; and
a gate portion provided in a first trench, with a first gate insulation film therebetween, the first trench being in contact with the contact layer, the source layer, the base layer, and the drift layer, the gate portion being electrically connected to a gate electrode,
wherein a protruding portion protruding toward the base layer is provided on a side of the first trench as seen in plan view,
the protruding portion extends below a lower surface of the base layer, and
the semiconductor device further comprising
a first insulation portion provided in the protruding portion between the gate portion and the base layer.

* * * * *